US012716917B2

(12) United States Patent
Miyamoto et al.

(10) Patent No.: US 12,716,917 B2
(45) Date of Patent: Aug. 25, 2026

(54) CURRENT SENSOR

(71) Applicant: DENSO CORPORATION, Kariya-city (JP)

(72) Inventors: Ryo Miyamoto, Kariya-city (JP); Akito Sasaki, Kariya-city (JP); Kenji Tokunaga, Kariya-city (JP)

(73) Assignee: DENSO CORPORATION, Kariya-city (JP)

(*) Notice: Subject to any disclaimer, the term of this patent is extended or adjusted under 35 U.S.C. 154(b) by 103 days.

(21) Appl. No.: 18/660,914

(22) Filed: May 10, 2024

(65) Prior Publication Data

US 2024/0295587 A1 Sep. 5, 2024

Related U.S. Application Data

(63) Continuation of application No. PCT/JP2022/041774, filed on Nov. 9, 2022.

(30) Foreign Application Priority Data

Nov. 16, 2021 (JP) ................................ 2021-186438
Apr. 5, 2022 (JP) ................................ 2022-063126
Jul. 1, 2022 (JP) ................................ 2022-107381
Oct. 6, 2022 (JP) ................................ 2022-161915

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC .. G01R 19/0092; G01R 15/207; G01R 33/00; G01R 33/12–16
USPC ....................... 324/117 R, 123 R, 158.1, 127
See application file for complete search history.

(56) References Cited

U.S. PATENT DOCUMENTS 5,734,264 A 3/1998 Berna et al.
6,426,617 B1 7/2002 Haensgen
2006/0043960 A1* 3/2006 Itoh ..................... G01R 15/185 324/117 R
2006/0182036 A1 8/2006 Sasagawa et al.
2006/0232262 A1 10/2006 Tanizawa et al.
2008/0048642 A1 2/2008 Aratani et al.
2010/0090685 A1 4/2010 Andrieu et al.
(Continued)

FOREIGN PATENT DOCUMENTS

CN 106706990 A 5/2023
EP 2124067 A 11/2009
(Continued)

OTHER PUBLICATIONS

U.S. Appl. No. 18/661,086 to Ryo Miyamoto, filed May 10, 2024 (209 pages).

*Primary Examiner* — Lee E Rodak
*Assistant Examiner* — Taqi R Nasir
(74) *Attorney, Agent, or Firm* — Nixon & Vanderhye P.C.

(57) ABSTRACT

A current sensor includes a bus bar, a core having a core hole, a gap forming portion, a core lateral portion, and a core bottom portion, a detection unit. The detection unit is located in a gap. A magnetic permeability of the core lateral portion is different from a magnetic permeability of the core bottom portion.

9 Claims, 77 Drawing Sheets

(56) References Cited

U.S. PATENT DOCUMENTS

| | | | | |
|---|---|---|---|---|
| 2010/0207625 | A1* | 8/2010 | Ueno | G01R 15/20 324/260 |
| 2015/0204916 | A1* | 7/2015 | Akimoto | G01R 15/207 702/64 |
| 2015/0260762 | A1 | 9/2015 | Sakamoto et al. | |
| 2015/0377932 | A1 | 12/2015 | Tsukamoto et al. | |
| 2016/0327593 | A1 | 11/2016 | Labbe | |
| 2018/0321281 | A1 | 11/2018 | Fukuhara | |
| 2020/0408809 | A1* | 12/2020 | Esaka | G01R 33/091 |

FOREIGN PATENT DOCUMENTS

| | | | | | |
|---|---|---|---|---|---|
| JP | 3-113822 | | | 11/1991 | |
| JP | H11194141 | A | * | 7/1999 | G01R 15/20 |
| JP | 2003-215169 | | | 7/2003 | |
| JP | 2009300196 | A | | 12/2009 | |
| JP | 2012-163454 | | | 8/2012 | |
| JP | 2013-54016 | | | 3/2013 | |
| JP | 2014106101 | A | | 6/2014 | |
| JP | 2014174042 | A | | 9/2014 | |
| JP | 2014219221 | A | | 11/2014 | |
| JP | 2021032796 | A | | 3/2021 | |
| WO | 2023090224 | A1 | | 5/2023 | |
| WO | 2023090225 | A1 | | 5/2023 | |
| WO | 2023090227 | A1 | | 5/2023 | |
| WO | 2023090228 | A1 | | 5/2023 | |

* cited by examiner

DW
DL
DT
70
700
701
702
704
R1
R2
R3
C1_in_top
C1_out_top
C1_in_btm
C2_in_top
C2_out_top
C2_in_btm
C3_in_top
C3_out_top
C3_in_btm
100
101
102
110
111
114
115
116
117
118
120
1121
1131
200
201
202
210
211
214
215
216
217
218
220
2122
2132
300
301
302
310
311
314
315
316
317
318
320
3123
3133
Ps1
Ps2
Ps3
Ps4
Ps5
Ps6
711
712
713
721
722
723
731
732
733
741
742
743

CURRENT SENSOR

CROSS REFERENCE TO RELATED APPLICATION

The present application is a continuation application of International Patent Application No. PCT/JP2022/041774 filed on Nov. 9, 2022, which designated the U.S. and claims the benefit of priority from Japanese Patent Applications No. 2021-186438 filed on Nov. 16, 2021, No. 2022-063126 filed on Apr. 5, 2022, No. 2022-107381 filed on Jul. 1, 2022, and No. 2022-161915 filed on Oct. 6, 2022. The entire disclosures of all of the above applications are incorporated herein by reference.

TECHNICAL FIELD

The present disclosure relates to a current sensor.

BACKGROUND ART

Conventionally, there has been known a current sensor that detects an ac current flowing in an electric device.

SUMMARY

According to an aspect of the present disclosure, a current sensor comprises a bus bar, a core inserted with the bus bar and having a gap, and a detection unit located in the gap.

BRIEF DESCRIPTION OF THE DRAWINGS

The above and other objects, features and advantages of the present disclosure will become more apparent from the following detailed description made with reference to the accompanying drawings. In the drawings.

DESCRIPTION OF EMBODIMENTS

Figure 1:
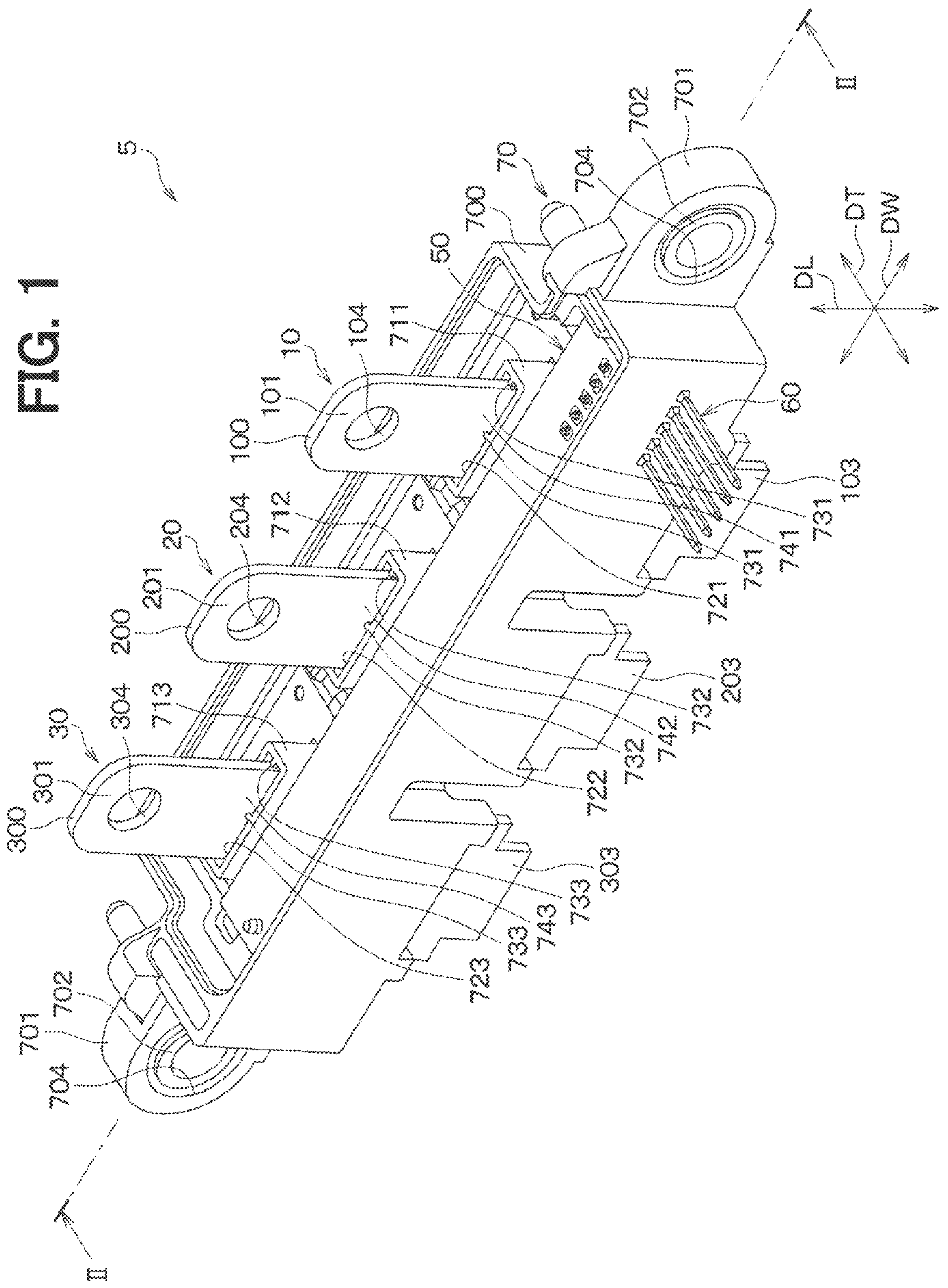
FIG. 1 is a perspective view of a current sensor according to a first embodiment.

Hereinafter, examples of the present disclosure will be described.

According to an example of the present disclosure, a current sensor detects an ac current flowing in an inverter for driving an ac motor for a hybrid vehicle or an electric vehicle. This current sensor includes a bus bar in which the ac current in the inverter flows, a core through which a magnetic field generated by the ac current flowing in the bus bar passes, and a sensor chip located in a gap formed in the core. The sensor chip detects the magnetic field passing through the core gap, and thus the current sensor detects the ac current flowing in the inverter.

According to the study conducted by the present inventors, it is required to expand a range of a magnitude of a current detected by a current sensor. However, when the magnitude of the current detected by the current sensor increases, in a current sensor, core magnetic saturation would occur, and accordingly it would be difficult to expand the range of the magnitude of the current detected by the current sensor.

According to an example of the present disclosure, a current sensor comprises:

a bus bar formed in a plate shape;

a core having a core hole in which the bus bar is inserted, a gap forming portion including a first end surface facing a width direction of the bus bar, a second end surface facing the first end surface in the width direction, and a gap defined by the first end surface and the second end surface to communicate with the core hole and an outside, a core lateral portion connected to the gap forming portion and extends in a thickness direction of the bus bar, and a core bottom portion connected to the core lateral portion, extends in the width direction, and forms the core hole together with the gap forming portion and the core lateral portion; and a detection unit located in the gap to detect a strength of a magnetic field generated in the gap by a current flowing in the bus bar, wherein a magnetic permeability of the core lateral portion is higher than a magnetic permeability of the core bottom portion.

As a result, the linear region of the magnetic flux density of the core lateral portion with respect to the strength of the magnetic field becomes larger than the linear region of the magnetic flux density of the core bottom portion with respect to the strength of the magnetic field. This suppresses the magnetic saturation of the core lateral portion. Therefore, this suppresses the magnetic saturation of the core.

According to an example of the present disclosure, a current sensor comprises:

a bus bar formed in a plate shape;

a core having a core hole in which the bus bar is inserted, a gap forming portion including a first end surface facing a width direction of the bus bar, a second end surface facing the first end surface in the width direction, and a gap defined by the first end surface and the second end surface to communicate with the core hole and an outside, a core lateral portion connected to the gap forming portion and extends in a thickness direction of the bus bar, and a core bottom portion connected to the core lateral portion, extends in the width direction, and forms the core hole together with the gap forming portion and the core lateral portion;

a detection unit located in the gap to detect a strength of a magnetic field generated in the gap by a current flowing in the bus bar, wherein a magnetic permeability of the core lateral portion is lower than a magnetic permeability of the core bottom portion.

As a result, the linear region of the magnetic flux density of the core bottom portion with respect to the strength of the magnetic field becomes larger than the linear region of the magnetic flux density of the core lateral portion with respect to the strength of the magnetic field. This suppresses the magnetic saturation of the core bottom portion. Therefore, this suppresses the magnetic saturation of the core.

According to an example of the present disclosure, a current sensor comprises:

a bus bar formed in a plate shape;

a core having a core hole in which the bus bar is inserted, a gap forming portion including a first end surface facing a width direction of the bus bar, a second end surface facing the first end surface in the width direction, and a gap defined by the first end surface and the second end surface to communicate with the core hole and an outside, a core lateral portion connected to the gap forming portion and extends in a thickness direction of the bus bar, and a core bottom portion connected to the core lateral portion, extends in the width direction, and forms the core hole together with the gap forming portion and the core lateral portion;

a detection unit located in the gap to detect a strength of a magnetic field generated in the gap by a current flowing in the bus bar, wherein a length of the core bottom portion in the thickness direction is the same as a length of the core lateral portion in the width direction, and a magnetic permeability of the core lateral portion is different from a magnetic permeability of the core bottom portion.

As a result, by setting either the magnetic permeability of the core lateral portion or the magnetic permeability of the core bottom portion, the linear region of the magnetic flux density with respect to the strength of the magnetic field can be increased. This suppresses the magnetic saturation of the core.

Referring to the drawings, a description will be given below of embodiments. Note that parts in the following individual embodiments which are the same as or equal to each other are denoted by the same reference signs, and a description thereof is omitted.

First Embodiment

Figure 2:
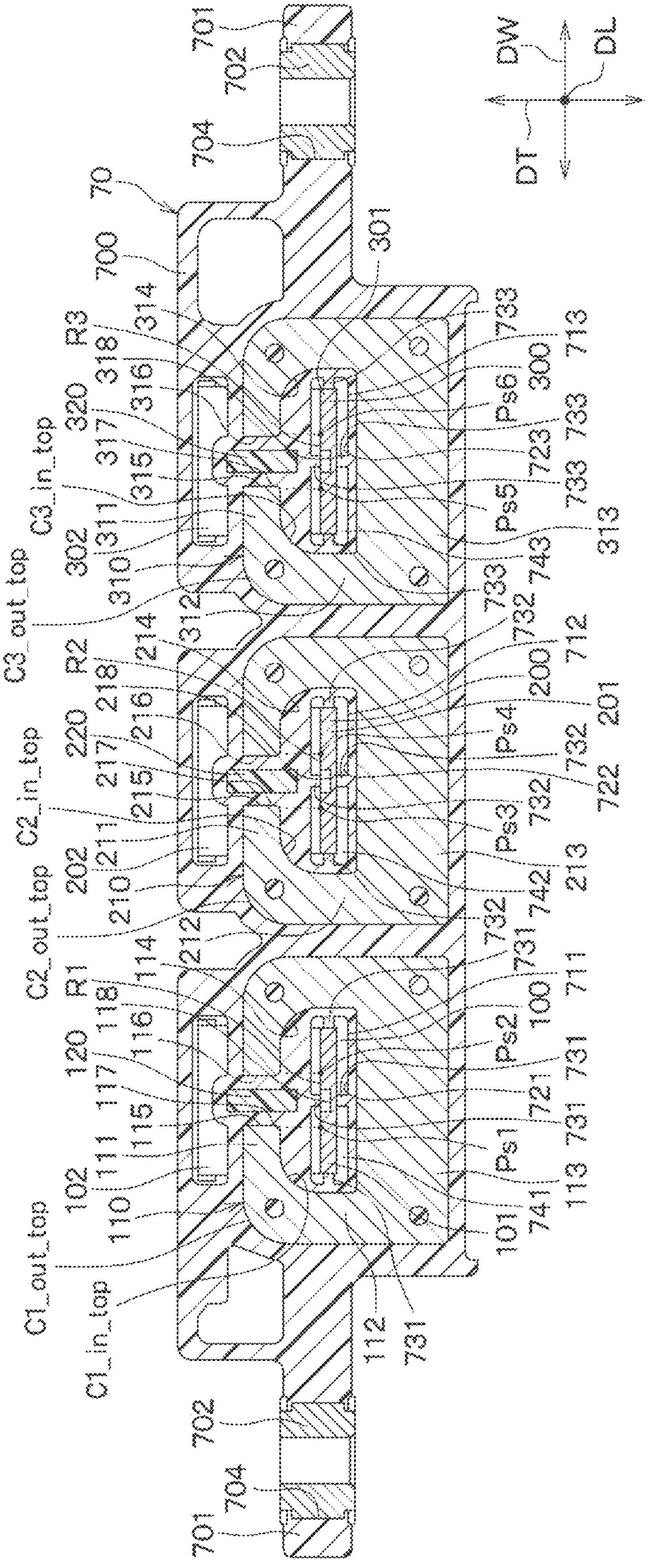
FIG. 2 is a cross-sectional view along a line 11-11 in FIG. 1.
Figure 3:
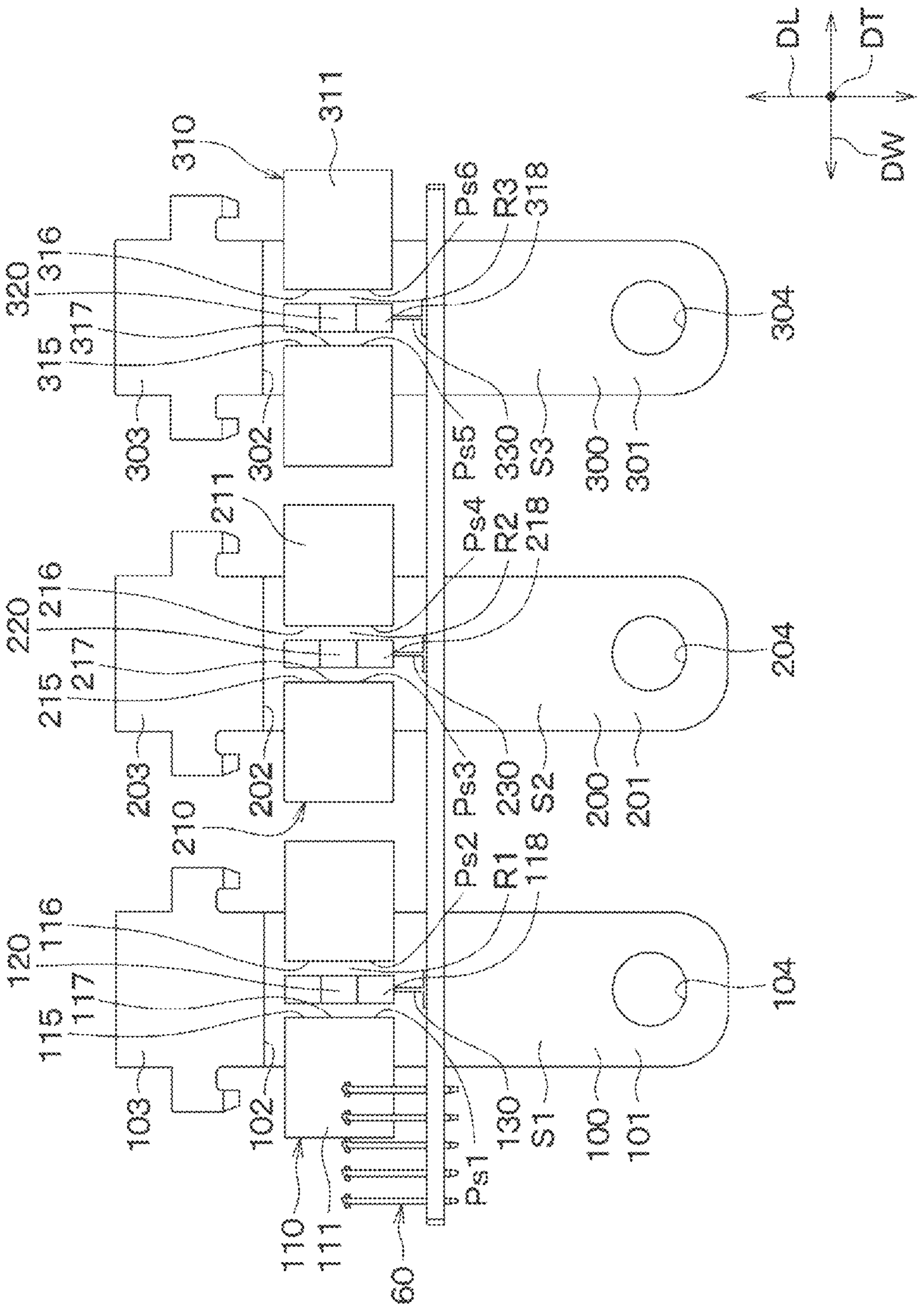
FIG. 3 is a top view of a bus bar, a core, a detection unit, lead wires, a circuit board, and terminals in the current sensor.

A current sensor 5 in the present embodiment is used in an inverter that drives a three-phase ac motor to be mounted in a vehicle not shown. Specifically, as illustrated in FIGS. 1 to 3, the current sensor 5 includes a first sensor 10, a second sensor 20, a third sensor 30, a circuit board 50, a plurality of terminals 60, and a case 70.

The first sensor 10 has a first bus bar 100, a first core 110, a first detection unit 120, and a first lead wire 130.

The first bus bar 100 is formed of copper or the like into a plate-like shape. In addition, a surface of the first bus bar 100 is plated as necessary to prevent oxidation of the surface. The first bus bar 100 has the plate portion 101, a first extending portion 102 and a second extending portion 103.

The first plate portion 101 includes a first bolt hole 104. In the first bolt hole 104 and a hole provided in the inverter, bolts not shown are inserted. Thus, the first plate portion 101 is connected to a portion of the inverter.

Hereinbelow, for the sake of convenience, a longitudinal direction DL of the first plate portion 101 is referred to simply as the longitudinal direction DL. Meanwhile, a width direction DW of the first plate portion 101 is referred to simply as the width direction DW. Meanwhile, a thickness direction DT of the first plate portion 101 is referred to simply as the thickness direction DT.

The first extending portion 102 is connected to a side of the first plate portion 101 opposite to the first bolt hole 104. In addition, the first extending portion 102 extends from a boundary portion between the first extending portion 102 and the first plate portion 101 in a thickness direction DT.

The second extending portion 103 is connected to a side of the first extending portion 102 opposite to the first plate portion 101. In addition, the second extending portion 103 extends from a boundary portion between the second extending portion 103 and the first extending portion 102 in the longitudinal direction DL. Furthermore, the second extending portion 103 is welded to a portion of the inverter to be connected to the portion of the inverter.

The first core 110 is formed of a soft magnetic material such as Permalloy or an oriented magnetic steel sheet into a letter-C shape. For example, the first core 110 is formed by bending a plate-like soft magnetic material into the letter-C shape. In addition, the first core 110 includes a first gap forming portion 111, first easy axis portions 112, a first hard axis portion 113, and a first core hole 114.

The first gap forming portion 111 is formed in a plate-like shape extending in the width direction DW. In addition, the first gap forming portion 111 is away from the first bus bar 100 in the thickness direction DT. Furthermore, each of first lateral outer corner portions C1_out_top, which are outer corner portions of the first gap forming portion 111 in the width direction DW, has an R-shape. Moreover, the first gap forming portion 111 includes a first core end surface 115, a second core end surface 116, and a first gap 117. When the second core end surface 116 is projected in the width direction DW, the first core end surface 115 overlaps the projected second core end surface 116. The first gap 117 is a space formed by being defined by the first core end surface 115 and the second core end surface 116. Furthermore, the first gap 117 communicates with the first core hole 114 and with the outside of the first core 110.

It is assumed herein that a surface of the first plate portion 101 which faces each of the first core end surface 115 and the second core end surface 116 in the thickness direction DT is a first plate surface S1. It is assumed that, when the first core end surface 115 is projected on the first plate surface S1 in the thickness direction DT, a portion of the first plate surface S1 which overlaps the projected first core end surface 115 is a first projection portion Ps1. It is assumed that, when the second core end surface 116 is projected on the first plate surface S1 in the thickness direction DT, a portion of the first plate surface S1 which overlaps the projected second core end surface 116 is a second projection portion Ps2. It is further assumed that a region of the first plate surface S1 which is formed by being defined by each of the first projection portion Ps1 and the second projection portion Ps2 is a first region R1. In addition, a first recessed portion 118 is formed to be recessed from at least a portion of the first region R1 in the thickness direction DT. The first recessed portion 118 is formed in a rectangular shape. Note that the first recessed portion 118 is not limited to being formed in the rectangular shape, and may also be formed in a polygonal shape or a circular shape.

Each of the first easy axis portions 112 is connected to the first gap forming portion 111. In addition, each of the first easy axis portions 112 extends from a boundary portion between the first easy axis portions 112 and the first gap forming portion 111 in the thickness direction DT. Furthermore, a first lateral inner corner portion C1_in_top inside the boundary portion between each of the first easy axis portions 112 and the first gap portion 111 has an R-shape. Each of the first easy axis portions 112 is away from the first bus bar 100 in the width direction DW.

Each of the first hard axis portion 113 is connected to the first easy axis portion 112. Additionally, the first hard axis portion 113 extends in the width direction DW. A magnetic permeability of the first hard axis portion 113 is lower than a magnetic permeability of each of the first easy axis portions 112. In addition, a saturation magnetic flux density of the first hard axis portion 113 is lower than a saturation magnetic flux density of each of the first easy axis portions 112. In addition, a length of the first hard axis portion 113 in the thickness direction DT is longer than a length of each of the first easy axis portions 112 in the width direction DW. Note that the magnetic permeability mentioned herein refers to, e.g., a maximum magnetic permeability which is a maximum value of a variation of a magnetic flux density with respect to a strength of a magnetic field.

The first core hole 114 is a space defined by the first gap forming portion 111, the first easy axis portions 112, and the first hard axis portion 113. In the first core hole 114, a portion of the first plate portion 101 of the first bus bar 100 is inserted.

The first detection unit 120 is located in the first gap 117. Accordingly, when the first core end surface 115 is projected in the width direction DW, the first detection unit 120 overlaps the projected first core end surface 115. Furthermore, when the second core end surface 116 is projected in the width direction DW, the first detection unit 120 overlaps the projected second core end surface 116. The first detection unit 120 includes, e.g., a Hall element, a TMR element, a GMR element, and an AMR element each not shown. Using these elements, the first detection unit 120 detects the strength of the magnetic field in the width direction DW which is applied to the first detection unit 120. The first detection unit 120 further outputs a signal according to the detected strength of the magnetic field to the outside. Each of the first lead wire 130 is connected to the first detection unit 120. Note that TMR is an abbreviation of Tunnel Magneto Resistive. GMR is an abbreviation of Giant Magneto Resistive. AMR is an abbreviation of Anisotropic Magneto Resistive.

The second sensor 20 has a second bus bar 200, a second core 210, a second detection unit 220, and a second lead wire 230.

The second bus bar 200 is formed of copper or the like into a plate-like shape. In addition, a surface of the second bus bar 200 is plated as necessary to prevent oxidation of the surface. The second bus bar 200 also has a second plate portion 201, a third extending portion 202, and a fourth extending portion 203.

The second plate portion 201 includes a second bolt hole 204. In the second bolt hole 204 and a hole provided in the inverter, bolts not shown are inserted. Thus, the second plate portion 201 is connected to a portion of the inverter.

The third extending portion 202 is connected to a side of the second plate portion 201 opposite to the second bolt hole 204. In addition, the third extending portion 202 extends from a boundary portion between the third extending portion 202 and the second plate portion 201 in a thickness direction DT.

The fourth extending portion 203 is connected to a side of the third extending portion 202 opposite to the second plate portion 201. The fourth extending portion 203 extends from a boundary portion between the fourth extending portion 203 and the third extending portion 202 in the longitudinal direction DL. Furthermore, the fourth extending portion 203 is welded to a portion of the inverter to be connected to the portion of the inverter.

The second core 210 is formed of a soft magnetic material such as Permalloy or an oriented magnetic steel sheet into a letter-C shape. For example, the second core 210 is formed by bending a plate-like soft magnetic material into the letter-C shape. In addition, the second core 210 includes a second gap forming portion 211, second easy axis portions 212, a second hard axis portion 213, and a second core hole 214.

The second gap forming portion 211 is formed in a plate-like shape extending in the width direction DW. In addition, the second gap forming portion 211 is away from the second bus bar 200 in the thickness direction DT. Furthermore, each of second lateral outer corner portions C2_out_top, which are outer corner portions of the second gap forming portion 211 in the width direction DW, has an R-shape. The second lateral outer corner portion C2_out_top and the first lateral outer corner portion C1_out_top face each other in the width direction DW. Moreover, the second gap forming portion 211 includes a third core end surface 215, a fourth core end surface 216, and a second gap 217. When the fourth core end surface 216 is projected in the width direction DW, the third core end surface 215 overlaps the projected fourth core end surface 216. The second gap

217 is a space formed by being defined by the third core end surface 215 and the fourth core end surface 216. The second gap 217 further communicates with the second core hole 214 and with the outside of the second core 210.

It is assumed herein that a surface of the second plate portion 201 which faces each of the third core end surface 215 and the fourth core end surface 216 in the thickness direction DT is a second plate surface S2. It is assumed that, when the third core end surface 215 is projected on the second plate surface S2 in the thickness direction DT, a portion of the second plate surface S2 which overlaps the projected third core end surface 215 is a third projection portion Ps3. It is assumed that, when the fourth core end surface 216 is projected on the second plate surface S2 in the thickness direction DT, a portion of the second plate surface S2 which overlaps the projected fourth core end surface 216 is a fourth projection portion Ps4. It is further assumed that a region of the second plate surface S2 which is formed by being defined by the third projection portion Ps3 and the fourth projection portion Ps4 is a second region R2. In addition, a second recessed portion 218 is formed to be recessed from at least a portion of the second region R2 in the thickness direction DT. The second recessed portion 218 is formed in a rectangular shape. Note that the second recessed portion 218 is not limited to being formed in the rectangular shape, and may also be formed in a polygonal shape or a circular shape.

Each of the second easy axis portions 212 is connected to the second gap forming portion 211. In addition, each of the second easy axis portions 212 extends from a boundary portion between the second easy axis portion 212 and the second gap forming portion 211 in the thickness direction DT. Furthermore, a second lateral inner corner portion C2_in_top inside the boundary portion between each of the second easy axis portions 212 and the second gap portion 211 has an R-shape. Each of the second easy axis portions 212 is away from the second bus bar 200 in the width direction DW.

Each of the second hard axis portions 213 is connected to the second easy axis portion 212. Additionally, the second hard axis portion 213 extends in the width direction DW. A magnetic permeability of the second hard axis portion 213 is lower than a magnetic permeability of each of the second easy axis portions 212. In addition, a saturation magnetic flux density of the second hard axis portion 213 is lower than a saturation magnetic flux density of each of the second easy axis portions 212. In addition, a length of the second hard axis portion 213 in the thickness direction DT is longer than a length of each of the second easy axis portions 212 in the width direction DW.

The second core hole 214 is a space defined by the second gap forming portion 211, the second easy axis portion 212, and the second hard axis portion 213. In the second core hole 214, a portion of the second plate portion 201 of the second bus bar 200 is inserted.

The second detection unit 220 is located in the second gap 217. Accordingly, when the third core end surface 215 is projected in the width direction DW, the second detection unit 220 overlaps the projected third core end surface 215. Furthermore, when the fourth core end surface 216 is projected in the width direction DW, the second detection unit 220 overlaps the projected fourth core end surface 216. The second detection unit 220 includes, e.g., a Hall element, a TMR element, a GMR element, and an AMR element each not shown. Using these elements, the second detection unit 220 detects the strength of the magnetic field in the width direction DW which is applied to the second detection unit 220. The second detection unit 220 further outputs a signal according to the detected strength of the magnetic field to the outside. Each of the second lead wire 230 is connected to the second detection unit 220.

The third sensor 30 has a third bus bar 300, a third core 310, a third detection unit 320, and a third lead wire 330.

The third bus bar 300 is formed of copper or the like into a plate-like shape. In addition, a surface of the third bus bar 300 is plated as necessary to prevent oxidation of the surface. The third bus bar 300 has a third plate portion 301, a fifth extending portion 302, a sixth extending portion 303.

The third plate portion 301 includes a third bolt hole 304. In the third bolt hole 304 and a hole provided in the inverter, bolts not shown are inserted. Thus, the third plate portion 301 is connected to a portion of the inverter.

The fifth extending portion 302 is connected to a side of the third plate portion 301 opposite to the third bolt hole 304. In addition, the fifth extending portion 302 extends from a boundary portion between the fifth extending portion 302 and the third plate portion 301 in a thickness direction DT.

The sixth extending portion 303 is connected to a side of the fifth extending portion 302 opposite to the third plate portion 301. The sixth extending portion 303 extends from a boundary portion between the sixth extending portion 303 and the fifth extending portion 302 in the longitudinal direction DL. Furthermore, the sixth extending portion 303 is welded to a portion of the inverter to be connected to the portion of the inverter.

The third core 310 is formed of a soft magnetic material such as Permalloy or an oriented magnetic steel sheet into a letter-C shape. For example, the third core 310 is formed by bending a plate-like soft magnetic material into the letter-C shape. In addition, the third core 310 includes a third gap forming portion 311, third easy axis portions 312, a third hard axis portion 313, and a third core hole 314.

The third gap forming portion 311 is formed in a plate-like shape extending in the width direction DW. In addition, the third gap portion 311 is also away from the third bus bar 300 in the thickness direction DT. Furthermore, each of third lateral outer corner portions C3_out_top, which are outer corner portions of the third gap forming portion 311 in the width direction DW, has an R-shape. The third lateral outer corner portion C3_out_top and the second lateral outer corner portion C2_out_top face each other in the width direction DW. Moreover, the third gap forming portion 311 includes a fifth core end surface 315, a sixth core end surface 316, and a third gap 317. When the sixth core end surface 316 is projected in the width direction DW, the fifth core end surface 315 overlaps the projected sixth core end surface 316. The third gap 317 is a space formed by being defined by the fifth core end surface 315 and the sixth core end surface 316. The third gap 317 further communicates with the third core hole 314 and the outside of the third core 310.

It is assumed herein that a surface of the third plate portion 301 which faces each of the fifth core end surface 315 and the sixth core end surface 316 in the thickness direction DT is a third plate surface S3. It is assumed that, when the fifth core end surface 315 is projected on the third plate surface S3 in the thickness direction DT, a portion of the third plate surface S3 which overlaps the projected fifth core end surface 315 is a fifth projection portion Ps5. It is assumed that, when the sixth core end surface 316 is projected on the third plate surface S3 in the thickness direction DT, a portion of the third plate surface S3 which overlaps the projected sixth core end surface 316 is a sixth projection portion Ps6. It is also assumed that a region of the third plate surface S3 formed by being defined by the fifth projection portion Ps5 and the sixth projection portion Ps6 is a third region R3. In addition, a third recessed portion 318 is formed to be recessed from at least a portion of the third region R3 in the thickness direction DT. The third recessed portion 318 is formed in a rectangular shape. Note that the third recessed portion 318 is not limited to being formed in the rectangular shape, and may also be formed in a polygonal shape or a circular shape.

Each of the third easy axis portions 312 is connected to the third gap forming portion 311. In addition, each of the third easy axis portions 312 extends from a boundary portion between the third easy axis portion 312 and the third gap forming portion 311 in the thickness direction DT. Furthermore, a third lateral inner corner portion C3_in_top inside the boundary portion between each of the third easy axis portions 312 and the third gap portion 311 has an R-shape. Each of the third easy axis portions 312 is away from the third bus bar 300 in the width direction DW.

Each of the third hard axis portion 313 is connected to the third easy axis portion 312. Additionally, the third hard axis portion 313 extends in the width direction DW. A magnetic permeability of the third hard axis portion 313 is lower than a magnetic permeability of each of the third easy axis portions 312. In addition, a saturation magnetic flux density of the third hard axis portion 313 is lower than a saturation magnetic flux density of each of the third easy axis portions 312. In addition, a length of the third hard axis portion 313 in the thickness direction DT is longer than a length of each of the third easy axis portions 312 in the width direction DW.

The third core hole 314 is a space defined by the third gap forming portion 311, the third easy axis portion 312, and the third hard axis portion 313. In the third core hole 314, a portion of the third plate portion 301 of the third bus bar 300 is inserted.

The third detection unit 320 is located in the third gap 317. Accordingly, when the fifth core end surface 315 is projected in the width direction DW, the third detection unit 320 overlaps the projected fifth core end surface 315. When the sixth core end surface 316 is projected in the width direction DW, the third detection unit 320 overlaps the projected sixth core end surface 316. The third detection unit 320 includes, e.g., a Hall element, a TMR element, a GMR element, and an AMR element each not shown. Using these elements, the third detection unit 320 detects the strength of the magnetic field in the width direction DW which is applied to the third detection unit 320. The third detection unit 320 further outputs a signal according to the detected strength of the magnetic field to the outside. Each of the third lead wire 330 is connected to the third detection unit 320.

The circuit board 50 is a printed circuit board. The circuit board 50 is connected by soldering or the like to each of the first lead wire 130, the second lead wire 230, and the third lead wire 330.

The terminals 60 are connected by soldering or the like to the circuit board 50. The terminals 60 are also connected to an arithmetic device not shown.

The case 70 is formed of a thermoplastic resin such as PBT. For example, the case 70 is formed by injection molding. The case 70 includes a containing portion 700, a guard portion 701, and a fixation collar 702. Note that PBT is an abbreviation of Poly Butylene Terephthalate.

The containing portion 700 is formed in a quadrangular tube shape. The containing portion 700 contains the first core 110, the second core 210, the third core 310, the first detection unit 120, the second detection unit 220, the third detection unit 320, the first lead wire 130, the second lead 230, and the third lead wire 330. The containing portion 700 further contains the circuit board 50 and portions of the terminals 60. In addition, a resin such as urethane not shown fills a space in the containing portion 700. This seals the inside of the containing portion 700, and accordingly each of the components contained in the containing portion 700 is protected. The containing portion 700 also contains the first extending portion 102 of the first bus bar 100, a portion of the second extending portion 103 thereof, the third extending portion 202 of the second bus bar 200, a portion of the fourth extending portion 203 thereof, the fifth extending portion 302 of the third bus bar 300, and a portion of the sixth extending portion 303. In addition, the containing portion 700 includes a first opening portion 711, a second opening portion 712, and a third opening portion 713.

The first opening portion 711 has a portion thereof inserted in the first core hole 114. In a space of the first opening portion 711, a portion of the first plate portion 101 of the first bus bar 100 is inserted. In addition, the first opening portion 711 includes first facing surfaces 721 and first protruding portions 731. The first facing surfaces 721 face the first plate portion 101 in the width direction DW and in the thickness direction DT. The first protruding portions 731 protrude from the first facing surfaces 721 in the thickness direction DT and in the width direction DW. The first protruding portions 731 are also in contact with the first plate portion 101. This positions the case 70 and the first bus bar 100 with respect to each other. Between the first facing surfaces 721 and the first plate portion 101, a first space 741 is further formed.

The second opening portion 712 has a portion thereof inserted in the second core hole 214. In a space of the second opening portion 712, a portion of the second plate portion 201 of the second bus bar 200 is inserted. In addition, the second opening portion 712 includes second facing surfaces 722 and second protruding portions 732. The second facing surfaces 722 face the second plate portion 201 in the width direction DW and in the thickness direction DT. The second protruding portions 732 protrude from the second facing surfaces 722 in the thickness direction DT and in the width direction DW. The second protruding portions 732 are also in contact with the second plate portion 201. This positions the case 70 and the second bus bar 200 with respect to each other. Between the second facing surfaces 722 and the second plate portion 201, a second space 742 is further formed.

The third opening portion 713 has a portion thereof inserted in the third core hole 314. In a space of the third opening portion 713, a portion of the third plate portion 301 of the third bus bar 300 is inserted. In addition, the third opening portion 713 includes third facing surfaces 723 and third protruding portions 733. The third facing surfaces 723 face the third plate portion 301 in the width direction DW and in the thickness direction DT. The third protruding portions 733 protrude from the third facing surfaces 723 in the thickness direction and in the width direction DW. The third protruding portions 733 are also in contact with the third plate portion 301. This positions the case 70 and the third bus bar 300 with respect to each other. Between the third facing surfaces 723 and the third plate portion 301, a third space 743 is further formed.

The guard portion 701 protrudes, in the width direction DW, from a portion of the containing portion 700 located on the width direction DW side. The guard portion 701 includes the guard portion hole 704. The guard portion hole 704 communicates with the outside in the thickness direction DT. In addition, in the guard portion hole 704, the fixation collar 702 is inserted. Into the fixation collar 702, an external shaft not shown is inserted to connect the case 70 to the outside, and the current sensor 5 is thus fixed to the outside.

As described above, the current sensor 5 in the first embodiment is configured. Next, a description will be given of detection of a three-phase ac current in the inverter by the current sensor 5.

The first plate portion 101 of the first bus bar 100 in the first sensor 10 is connected to a portion of the inverter. In addition, the second extending portion 103 of the first bus bar 100 is connected to a portion of the inverter. Accordingly, the ac current from the inverter flows in the first plate portion 101. At this time, by the ac current flowing in the first plate portion 101, a magnetic field in a circumferential direction around an axis extending in the longitudinal DL, while passing through the first plate portion 101, is generated. Due to the generated magnetic field, magnetic force lines pass through the first core 110, and consequently pass through the first gap 117. Accordingly, the magnetic force lines pass through the first detection unit 120. Therefore, the first detection unit 120 detects a strength of the magnetic field in the width direction DW. As a result, the first detection unit 120 detects the current from the inverter corresponding to the strength of this magnetic field. The first detection unit 120 outputs a signal according to the detected strength of the magnetic field to the external arithmetic device not shown via the first lead wire 130, the circuit board 50, and the terminals 60. Then, the arithmetic device arithmetically determines the current from the inverter on the basis of the signal from the first detection unit 120.

At this point, the magnetic field leaking from the first gap 117 enters the first plate portion 101, and a change in a frequency of the ac current from the inverter causes a time change in the magnetic field to result in generation of a dielectric electromotive force in a direction reverse a direction of the current flowing from the inverter in the first plate portion 101. A magnetic field caused by a current resulting from this dielectric electromotive force and flowing in the first plate portion 101 changes the magnetic field applied to the first gap 117. As a result, an error occurs in the current detected by the current sensor 5. As the frequency of the ac current from the inverter increases, due to a skin effect, the current caused by the dielectric electromotive force described above to flow across a surface of the first plate portion 101 increases, and accordingly the magnetic field applied to the first gap 117 is more likely to vary. Consequently, an error is more likely to occur in the current detected by the current sensor 5. However, in the first sensor 10, the first recessed portion 118 is formed in the first region R1 of the first plate portion 101, and accordingly the first plate portion 101 is more likely to move away from the first gap 117. As a result, the magnetic force lines that enter the first plate portion 101 from the first gap 117 are suppressed to suppress generation of the dielectric electromotive force in the direction reverse to the direction of the current flowing in the first plate portion 101. Consequently, an error is less likely to occur in the current detected by the current sensor 5, and accordingly a frequency characteristic of the current sensor 5 is improved.

Thus, the first sensor 10 detects one phase of the three-phase ac current from the inverter. Meanwhile, similarly to the first sensor 10, the second sensor 20 detects one phase of the three-phase ac current from the inverter. Accordingly, in a description of the second sensor 20, the first sensor 10 is read as the second sensor 20. The first bus bar 100 is read as the second bus bar 200. The plate portion 101 is read as the second plate portion 201. The second extending portion 103 is read as the fourth extending portion 203. The first core 110 is read as the second core 210. The first gap 117 is read as the second gap 217. The first detection unit 120 is read as the second detection unit 220. The first lead wire 130 is read as the second lead wire 230. The first region R1 is read as the second region R2. The first recessed portion 118 is read as the second recessed portion 218. Meanwhile, similarly to the first sensor 10, the third sensor 30 detects one phase of the three-phase ac current from the inverter. Accordingly, in a description of the third sensor 30, the first sensor 10 is read as the third sensor 30. The first bus bar 100 is read as the third bus bar 300. The plate portion 101 is read as the third plate portion 301. The second extending portion 103 is read as the sixth extending portion 303. The first core 110 is read as the third core 310. The first gap 117 is read as the third gap 317. The first detection unit 120 is read as the third detection unit 320. The lead wire 130 is read as the third lead wire 330. The first region R1 is read as the third region R3. The first recessed portion 118 is read as the third recessed portion 318.

As described above, the current sensor 5 detects the three-phase ac current in the inverter. Next, a description will be given of the improvement of the frequency characteristic in the current sensor 5.

In a comparative current sensor as described in JP2008-51704A, a magnetic field leaking from a core gap enters a bus bar, and a frequency change of an ac current causes a time change in the magnetic field, and consequently a dielectric electromotive force in a direction reverse to a direction of a current flowing in the bus bar occurs. A magnetic field caused by a current resulting from this dielectric electromotive force and flowing in the bus bar changes the magnetic field applied to the core gap. As a result, an error occurs in a current detected by the comparative current sensor. This deteriorates the frequency characteristic of the comparative current sensor.

By contrast, the current sensor 5 detects the ac current in the inverter. In addition, the current sensor 5 includes the first bus bar 100, the second bus bar 200, the third bus bar 300, the first core 110, the second core 210, the third core 310, the first detection unit 120, the second detection unit 220, and the third detection unit 320. The first bus bar 100, the second bus bar 200 and the third bus bar 300 are formed into a plate-like shape. The first core 110 has the first core hole 114 and the first gap forming portion 111. In the first core hole 114, the first bus bar 100 is inserted. The first gap forming portion 111 includes the first core end surface 115, the second core end surface 116, and the first gap 117. The first core end surface 115 faces the width direction DW. The second end surface 116 faces the first core end surface 115 in the width direction DW. The first gap 117 is defined by the first core end surface 115 and the second core end surface 116, while communicating with the first core hole 114 and with the outside. The second core 210 has the second core hole 214 and the second gap forming portion 211. In the second core hole 214, the second bus bar 200 is inserted. The second gap forming portion 211 includes the third core end surface 215, the fourth core end surface 216, and the second gap 217. The third core end surface 215 faces the width direction DW. The fourth end surface 216 faces the third core end surface 215 in the width direction DW. The second gap 217 is defined by the third core end surface 215 and the fourth core end surface 216, and communicating with the second core hole 214 and with the outside. The third core 310 has the third core hole 314 and the third gap forming portion 311. In the third core hole 314, the third bus bar 300 is inserted. The third gap forming portion 311 includes the fifth core end surface 315, the sixth core end surface 316, and the third gap 317. The fifth core end surface 315 faces the width direction DW. The sixth end surface 316 faces the fifth core end surface 315 in the width direction DW. The third gap 317 is defined by the fifth core end surface 315 and the sixth core end surface 316, then communicating with the third core hole 314 and with the outside. The first bus bar 100 also has the first projection portion Ps1, the second projection portion Ps2, the first region R1, and the first recessed portion 118. The first projection portion Ps 1 is the portion of the first bus bar 100 which overlaps the projected first core end surface 115 when the first core end surface 115 is projected on the first bus bar 100 in the thickness direction DT. The second projection portion Ps 2 is the portion of the first bus bar 100 which overlaps the projected second core end surface 116 when the second core end surface 116 is projected on the first bus bar 100 in the thickness direction DT. The first region R1 is the region between the first projection portion Ps1 and the second projection portion Ps2. The first recessed portion 118 is recessed from the first region R1 in the thickness direction DT. The second bus bar 200 also has the third projection portion Ps3, the fourth projection portion Ps4, the second region R2, and the second recessed portion 218. The third projection portion Ps 3 is the portion of the second bus bar 200 which overlaps the projected third core end surface 215 when the third core end surface 215 is projected on the second bus bar 200 in the thickness direction DT. The fourth projection portion Ps 4 is the portion of the second bus bar 200 which overlaps the projected fourth core end surface 216 when the fourth core end surface 216 is projected on the second bus bar 200 in the thickness direction DT. The second region R2 is the region between the third projection portion Ps3 and the fourth projection portion Ps4. The second recessed portion 218 is recessed from the second region R2 in the thickness direction DT. The third bus bar 300 also has the fifth projection portion Ps5, the sixth projection portion Ps6, the third region R3, and the third recessed portion 318. The fifth projection portion Ps5 is the portion of the third bus bar 300 which overlaps the projected fifth core end surface 315 when the fifth core end surface 315 is projected on the third bus bar 300 in the thickness direction DT. The sixth projection portion Ps6 is the portion of the third bus bar 300 which overlaps the projected sixth core end surface 316 when the sixth core end surface 316 is projected on the third bus bar 300 in the thickness direction DT. The third region R3 is the region between the fifth projection portion Ps5 and the sixth projection portion Ps6. The third recessed portion 318 is recessed from the third region R3 in the thickness direction DT. Note that each of the first bus bar 100, the second bus bar 200, and the third bus bar 300 corresponds to a bus bar. Each of the first core 110, the second core 210, and the third core 310 corresponds to a core. Each of the first detection unit 120, the second detection unit 220, and the third detection unit 320 corresponds to a detection unit. Each of the first core hole 114, the second core hole 214, and the third core hole 314 corresponds to a core hole. Each of the first gap forming portions 111, the second gap forming portions 211, and the third gap forming portions 311 corresponds to a gap forming portion. Each of the first core end surface 115, the third core end surface 215, and the fifth core end surface 315 corresponds to a first end surface. Each of the second core end surface 116, the fourth core end surface 216, and the sixth core end surface 316 corresponds to a second end surface. Each of the first gap 117, the second gap 217, and the third gap 317 corresponds to a gap. Each of the third projection portion Ps3 and the fifth projection portion Ps5 corresponds to the first projection portion Ps1. Each of the fourth projection portion Ps4 and the sixth projection portion Ps6 corresponds to the second projection portion Ps2. Each of the first region R1, the second region R2, and the third region R3 corresponds to a region. Each of the first recessed portion 118, the second recessed portion 218, and the third recessed portion 318 corresponds to a recessed portion.

The first recessed portion 118 allows the first plate portion 101 to be easily separated from the first gap 117. This suppresses the magnetic force lines entering the first plate portion 101 from the first gap 117. The second recessed portion 218 allows the second plate portion 201 to be easily separated from the second gap 217. This suppresses the magnetic force lines entering the second plate portion 201 from the second gap 217. The third recessed portion 318 allows the third plate portion 301 to be easily separated from the third gap 317. This suppresses the magnetic force lines entering the third plate portion 301 from the third gap 317. This suppresses generation of the dielectric electromotive force in each of directions reverse to the directions of currents flowing in the first plate portion 101, the second plate portion 201, and the third plate portion 301. Consequently, an error is less likely to occur in the current detected by the current sensor 5, and accordingly a frequency characteristic of the current sensor 5 is improved.

In addition, in the current sensor 5, effects described below are also achieved.

Figure 4:
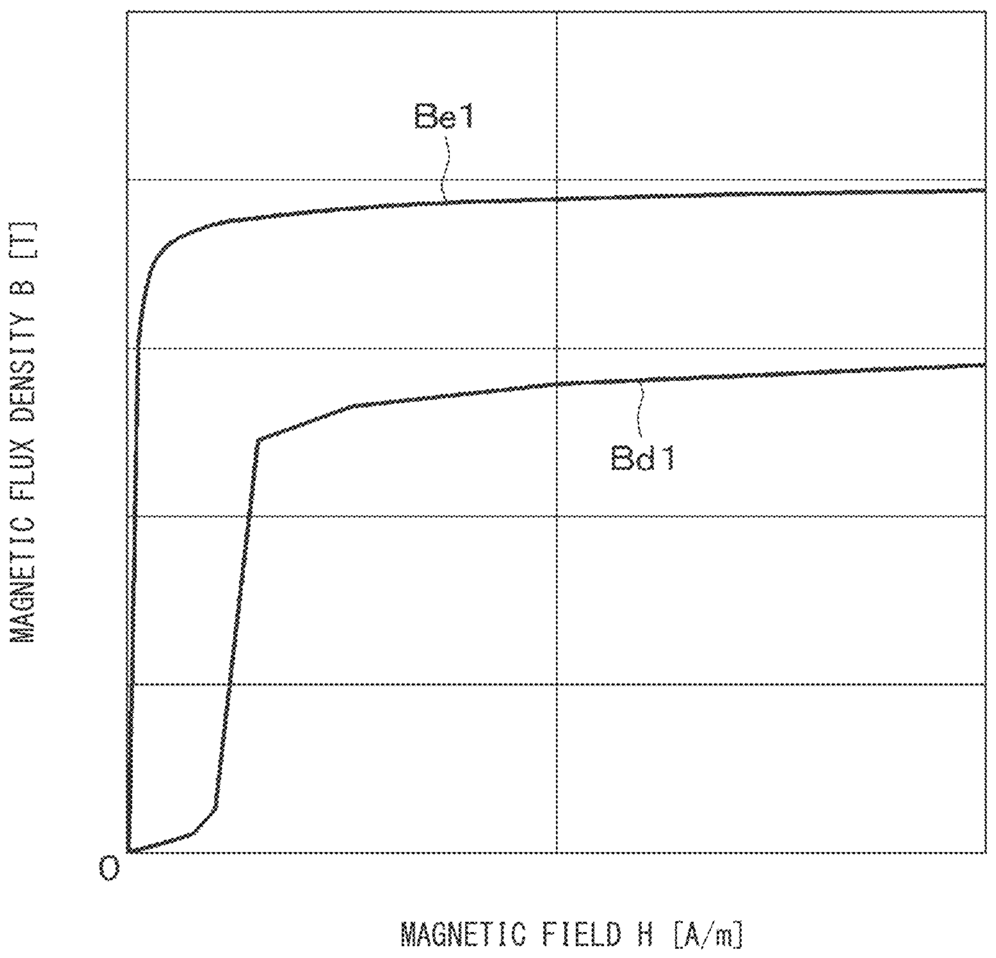
FIG. 4 is a relationship diagram of a strength of a magnetic field, a density of a magnetic flux applied to a first easy axis portion, and a density of a magnetic flux applied to a first hard axis portion.

[1-1] As described above, the magnetic permeability of the first hard axis portion 113 is lower than the magnetic permeability of each of the first easy axis portions 112, and accordingly the magnetic permeability of the first easy axis portion 112 is higher than the magnetic permeability of the first hard axis portion 113. Consequently, as illustrated in FIG. 4, a linear region of a magnetic flux density of each of the first easy axis portions 112 with respect to the strength of the magnetic field is larger than a linear region of a magnetic flux density of the first hard axis portion 113 with respect to the strength of the magnetic field. This suppresses magnetic saturation of the first easy axis portions 112, and can thus reduce lengths of the first easy axis portions 112 in the width direction DW and in the longitudinal direction DL. The magnetic permeability of the second easy axis portion 212 is higher than the magnetic permeability of the second hard axis portion 213. This suppresses magnetic saturation of the second easy axis portions 212, and can thus reduce lengths of the second easy axis portions 212 in the width direction DW and in the longitudinal direction DL. The magnetic permeability of the third easy axis portion 312 is higher than the magnetic permeability of the third hard axis portion 313. This suppresses magnetic saturation of the third easy axis portions 312, and can thus reduce lengths of the third easy axis portions 312 in the width direction DW and in the longitudinal direction DL. Therefore, it is possible to reduce a body size of the current sensor 5. Note that, in FIG. 4, the magnetic flux density of each of the first easy axis portions 112 with respect to the strength of the magnetic field is denoted by Bel. The magnetic flux density of each of the first hard axis portions 113 with respect to the strength of the magnetic field is denoted by Bd1. Each of the first easy axis portion 112, the second easy axis portion 212, and the third easy axis portion 312 corresponds to a core lateral portion. Each of the first hard axis portion 113, the second hard axis portion 213, and the third hard axis portion 313 corresponds to a core bottom portion.

Since the magnetic saturation of each of the first easy axis portions 112, the second easy axis portions 212, and the third easy axis portions 312 is suppressed, a range of a magnetic strength detected by the current sensor 5 with respect to the current from the inverter increases. This increases a range of a magnitude of the current detected by the current sensor 5.

[1-2] Each of the first easy axis portions 112 has a saturation magnetic flux density which is higher than a saturation magnetic flux density of the first hard axis portion 113. As a result, the linear region of the magnetic flux density of each of the first easy axis portions 112 with respect to the strength of the magnetic field is larger than the linear region of the magnetic flux density of the first hard axis portion 113 with respect to the strength of the magnetic field. This suppresses magnetic saturation of the first easy axis portions 112, and can thus reduce lengths of the first easy axis portions 112 in the width direction DW and in the longitudinal direction DL. Meanwhile, each of the second easy axis portions 212 has a saturation magnetic flux density which is higher than a saturation magnetic flux density of the second hard axis portion 213. This suppresses magnetic saturation of the second easy axis portions 212, and can thus reduce lengths of the second easy axis portions 212 in the width direction DW and in the longitudinal direction DL. Meanwhile, each of the third easy axis portions 312 has a saturation magnetic flux density which is higher than a saturation magnetic flux density of the third hard axis portion 313. This suppresses magnetic saturation of the third easy axis portions 312, and can thus reduce lengths of the third easy axis portions 312 in the width direction DW and in the longitudinal direction DL. Therefore, it is possible to reduce a body size of the current sensor 5.

Since the magnetic saturation of each of the first easy axis portions 112, the second easy axis portions 212, and the third easy axis portions 312 is suppressed, a range of a magnetic strength detected by the current sensor 5 with respect to the current from the inverter increases. This increases a range of a magnitude of the current detected by the current sensor 5.

[1-3] A length of the first hard axis portion 113 in the thickness direction DT is equal to or larger than a length of each of the first easy axis portions 112 in the width direction DW. As a result, the density of a magnetic flux applied to the first hard axis portion 113 is lower than the density of a magnetic flux applied to each of the first easy axis portions 112. This suppresses magnetic saturation of the first hard axis portion 113. Meanwhile, a length of the second hard axis portion 213 in the thickness direction DT is equal to or larger than a length of each of the second easy axis portions 212 in the width direction DW. As a result, the density of a magnetic flux applied to the second hard axis portion 213 is lower than the density of a magnetic flux applied to each of the second easy axis portions 212. This suppresses magnetic saturation of the second hard axis portion 213. Additionally, a length of the third hard axis portion 313 in the thickness direction DT is equal to or larger than a length of each of the third easy axis portions 312 in the width direction DW. As a result, the density of a magnetic flux applied to the third hard axis portion 313 is lower than the density of a magnetic flux applied to each of the third easy axis portions 312. This suppresses magnetic saturation of the third hard axis portion 313.

Since the magnetic saturation of each of the first hard axis portions 113, the second hard axis portions 213, and the hard axis portion 313 is suppressed, a range of a magnetic strength detected by the current sensor 5 with respect to the current from the inverter increases. This increases a range of a magnitude of the current detected by the current sensor 5.

[1-4] The current sensor 5 further includes the case 70. The case 70 contains the second core 210, the second core 210, and the third core 310. The case 70 further has the first opening portion 711, the second opening portion 712, and the third opening portion 713. The first opening portion 711 is inserted in the first core hole 114, and the first bus bar 100 is inserted in the first opening portion 711. In addition, the first opening portion 711 includes the first facing surfaces 721 and the first protruding portions 731. The first facing surfaces 721 face the first plate portion 101. The first protruding portions 731 protrude from the first facing surfaces 721 toward the first bus bar 100 to thus come into contact with the first bus bar 100. Between the first facing surfaces 721 and the first bus bar 100, the third space 741 is also formed. The second opening portion 712 is inserted in the second core hole 214, and the second bus bar 200 is inserted in the second opening portion 712. In addition, the second opening portion 712 includes the second facing surfaces 722 and the second protruding portions 732. The second facing surfaces 722 face the second plate portion 201. The second protruding portions 732 protrude from the second facing surfaces 722 toward the second bus bar 200 to thus come into contact with the second bus bar 200. Between the second facing surfaces 722 and the second plate portion 201, the second space 742 is also formed. The third opening portion 713 is inserted in the third core hole 314, and the third bus bar 300 is inserted in the third opening portion 713. In addition, the third opening portion 713 includes the third facing surfaces 723 and the third protruding portions 733. The third facing surfaces 723 face the third plate portion 301. The third protruding portions 733 protrude from the third facing surfaces 723 toward the third bus bar 300 to thus come into contact with the third bus bar 300. Between the third facing surfaces 723 and the third bus bar 300, the third space 743 is also formed. Note that each of the first opening portion 711, the second opening portion 712, and the third opening portion 713 corresponds to an opening. Each of the first facing surfaces 721, the second facing surfaces 722, and the third facing surfaces 723 corresponds to a facing surface. Each of the first protruding portion 731, the second protruding portion 732 and the third protruding portion 733 corresponds to a protruding portion.

A current flows in the first bus bar 100, the second bus bar 200, and the third bus bar 300 to thereby cause the first bus bar 100, the second bus bar 200, and the third bus bar 300 to generate heat. However, in the current sensor 5, the first protruding portions 731, the second protruding portions 732, and the third protruding portions 733 form the first space 741, the second space 742, and the third space 743. As a result, the heat generated by the first bus bar 100, the second bus bar 200 and the third bus bar 300 is less likely to be transferred to the case. Consequently, heat is less likely to be transferred from the case 70 to the first detection unit 120, the second detection unit 220, and the third detection unit 320. This suppresses characteristic changes and failures in the first detection unit 120, the second detection unit 220, and the third detection unit 320.

In addition, the first protruding portions 731 are in contact with the first plate portion 101 to position the case 70 with respect to the first bus bar 100. This reduces positional variations between the case 70 and the first bus bar 100. In addition, the second protruding portions 732 are in contact with the second plate portion 201 to position the case 70 with respect to the second bus bar 200. This reduces positional variations between the case 70 and the second bus bar 200. In addition, the third protruding portions 733 are in contact with the third plate portion 301 to position the case 70 with respect to the third bus bar 300. This reduces positional variations between the case 70 and the third bus bar 300.

Second Embodiment

Figure 5:
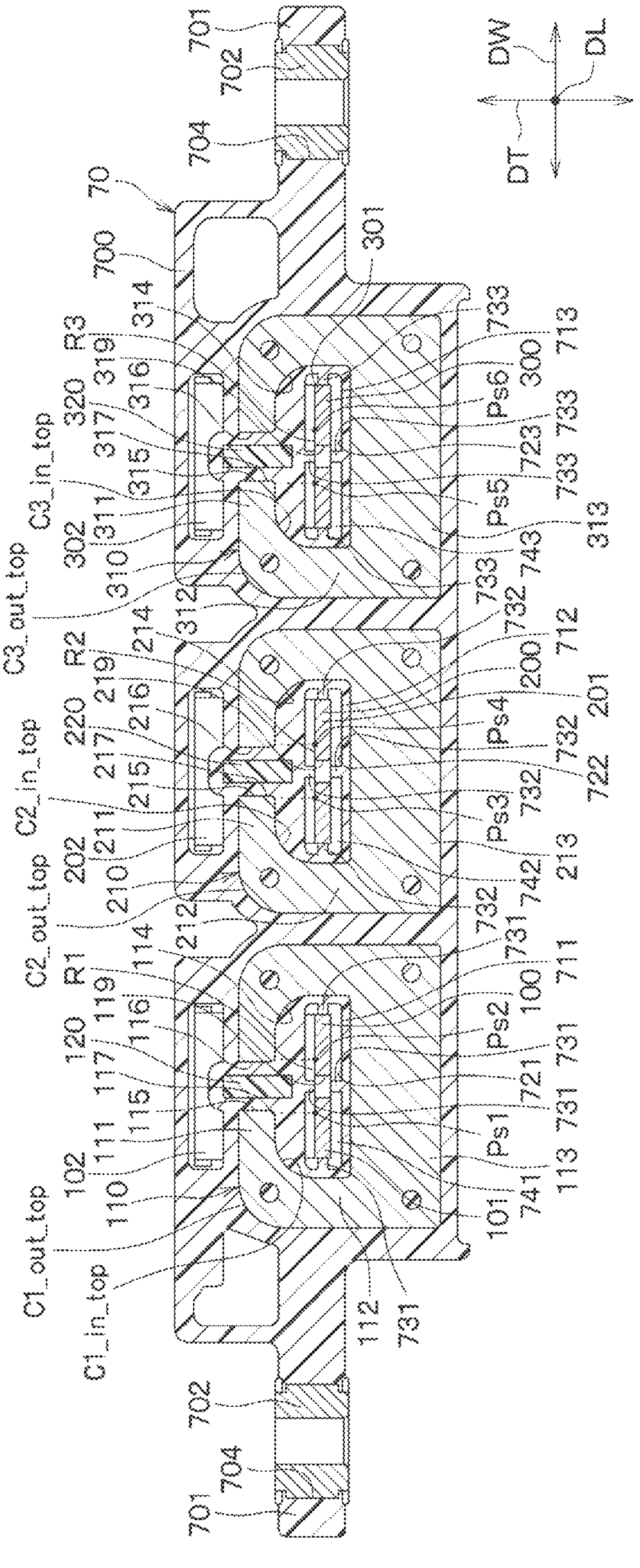
FIG. 5 is a cross-sectional view of the current sensor according to a second embodiment.

In the second embodiment, as illustrated in FIG. 5, forms of the first plate portion 101, the second plate portion 201, and the third plate portion 301 are different from those in the first embodiment. The second embodiment is similar to the first embodiment in other respects.

The first plate portion 101 includes a first through hole 119 instead of the first recessed portion 118. The first through hole 119 extends from at least a portion of the first region R1 therethrough in the thickness direction DT. The second plate portion 201 includes a second through hole 219 instead of the second recessed portion 218. The second through hole 219 extends from at least a portion of the second region R2 therethrough in the thickness direction DT. The third plate portion 301 includes a third through hole 319 instead of the third recessed portion 318. The third through hole 319 extends from at least a portion of the third region R3 therethrough in the thickness direction DT. Each of the first through hole 119, the second through hole 19, and the third through hole 319 is formed in a rectangular shape. Note that each of the first through hole 119, the second through hole 19, and the third through hole 319 corresponds to a through hole. Additionally, each of the first through hole 119, the second through hole 219, and the third through hole 319 is not limited to being formed in the rectangular shape, and may also be formed in a polygonal shape or a circular shape.

As described above, the current sensor 5 in the second embodiment is configured. In the second embodiment also, the same effects as those achieved in the first embodiment are achieved.

Third Embodiment

Figure 6:
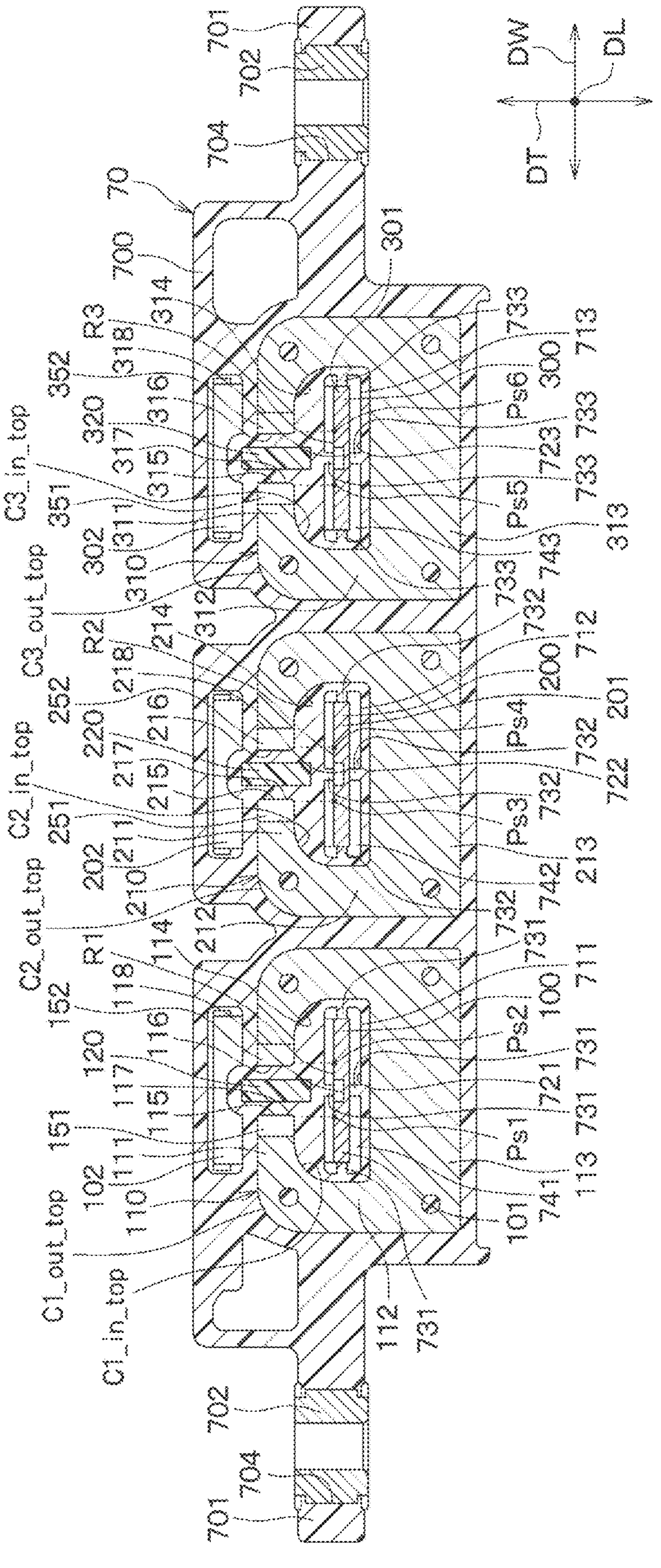
FIG. 6 is a cross-sectional view of the current sensor according to a third embodiment.
Figure 7:
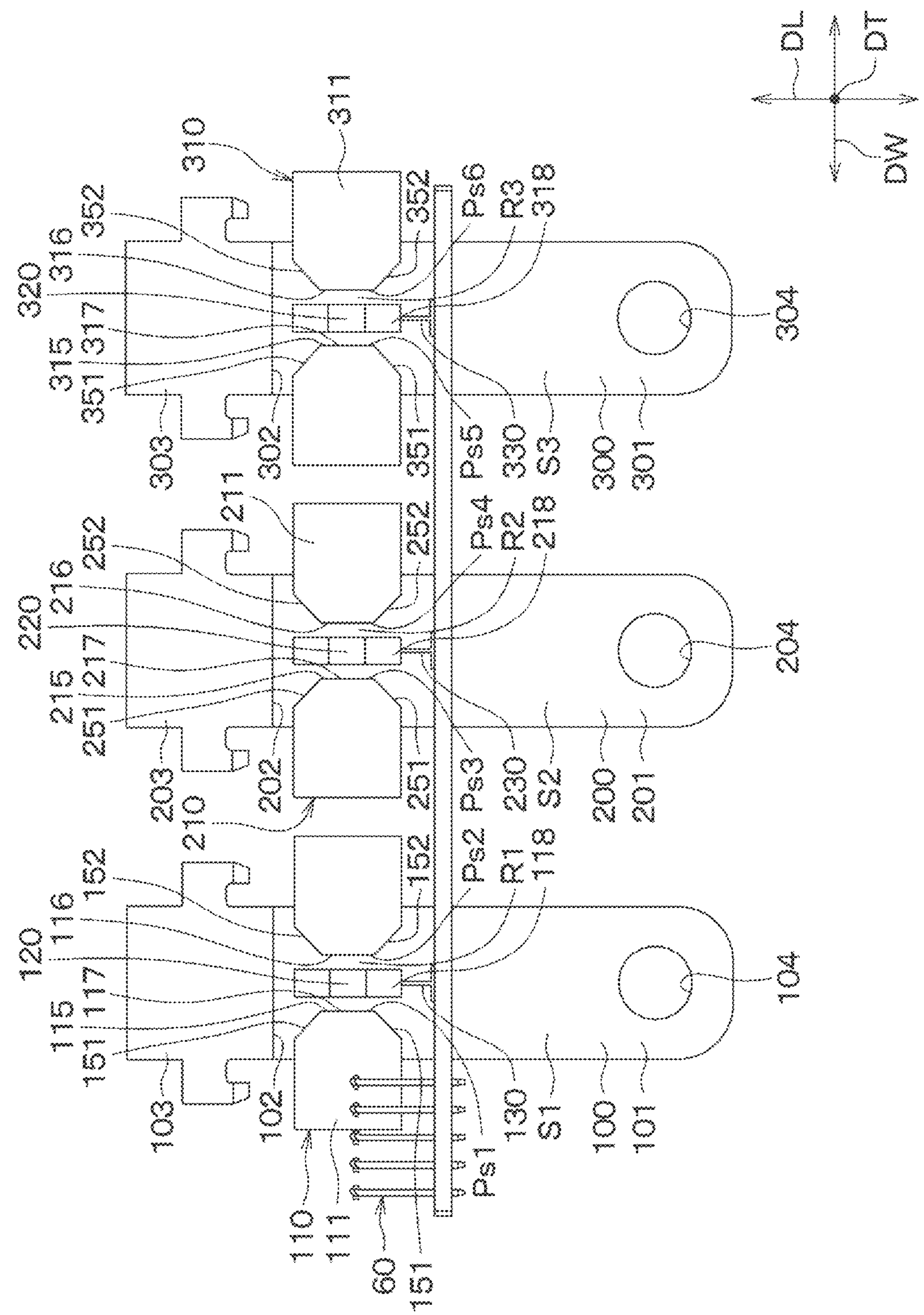
FIG. 7 is a top view of the bus bar, the core, the detection unit, the lead wires, the circuit board, and the terminals in the current sensor.

In the third embodiment, as illustrated in FIGS. 6 and 7, forms of the first gap forming portion 111, the second gap forming portion 211, and the third gap forming portion 311 are different from those in the first embodiment. The third embodiment is similar to the first embodiment in other respects.

The first gap forming portion 111 includes not only the first core end surface 115, the second core end surface 116, and the first gap 117, but also first inclined surfaces 151 and second inclined surfaces 152.

The first inclined surfaces 151 are connected to an edge of the first core end surface 115. In addition, the first inclined surfaces 151 extend from the edge of the first core end surface 115 in directions crossing the first core end surface 115. Consequently, the first inclined surfaces 151 are inclined with respect to the first core end surface 115 in directions away from the first gap 117.

The second inclined surfaces 152 are connected to an edge of the second core end surface 116. In addition, the second inclined surfaces 152 extend from the edge of the second core end surface 116 in directions crossing the second core end surface 116. Consequently, the second inclined surfaces 152 are inclined with respect to the second core end surface 216 in directions away from the second gap 217.

The second gap forming portion 211 includes not only the third core end surface 215, the fourth core end surface 216, and the second gap 217, but also third inclined surfaces 251 and fourth inclined surfaces 252.

The third inclined surfaces 251 are connected to an edge of the third core end surface 215. In addition, the third inclined surfaces 251 extend from the edge of the third core end surface 215 in directions crossing the third core end surface 215. Consequently, the third inclined surfaces 251 are inclined with respect to the third core end surface 215 in directions away from the second gap 217.

The fourth inclined surfaces 252 are connected to an edge of the fourth core end surface 216. In addition, the fourth inclined surfaces 252 extend from the edge of the fourth core end surface 216 in directions crossing the fourth core end surface 216. Consequently, the fourth inclined surfaces 252 are inclined with respect to the fourth core end surface 216 in directions away from the second gap 217.

The third gap forming portion 311 includes not only the fifth core end surface 315, the sixth core end surface 316, and the third gap 317, but also fifth inclined surfaces 351 and sixth inclined surfaces 352.

The fifth inclined surfaces 351 are connected to an edge of the fifth core end surface 315. In addition, the fifth inclined surfaces 351 extend from the edge of the fifth core end surface 315 in directions crossing the fifth core end surface 315. Consequently, the fifth inclined surfaces 351 are inclined with respect to the fifth core end surface 315 in directions away from the third gap 317.

The sixth inclined surfaces 352 are connected to an edge of the sixth core end surface 316. In addition, the sixth inclined surfaces 352 extend from the edge of the sixth core end surface 316 in directions crossing the sixth core end surface 316. Consequently, the sixth inclined surfaces 352 are inclined with respect to the sixth core end surface 316 in directions away from the third gap 317.

As described above, the current sensor 5 in the third embodiment is configured. In the third embodiment also, the same effects as those achieved in the first embodiment are achieved. In addition, the third embodiment also achieves effects described below.

[2] In a case where the first inclined surfaces 151 and the second inclined surfaces 152 are not present, extra magnetic force lines pass from corners of the first gap forming portion 111 through the first gap 117. However, in the third embodiment, due to the first inclined surfaces 151 and the second inclined surfaces 152, the corners of the first gap forming portion 111 are more easily separated from the first gap 117. Consequently, compared to the case where the first inclined surfaces 151 and the second inclined surfaces 152 are not present, the number of the extra magnetic force lines passing from the corners of the first gap forming portion 111 through the first gap 117 is reduced. This suppresses magnetic saturation of the first gap forming portion 111. Due to the third inclined surfaces 251 and the fourth inclined surfaces 252, the corners of the second gap forming portion 211 are more easily separated from the second gap 217. Consequently, compared to the case where the third inclined surfaces 251 and the fourth inclined surfaces 252 are not present, the number of the extra magnetic force lines passing from the corners of the second gap forming portion 211 through the second gap 217 is reduced. This suppresses magnetic saturation of the second gap forming portion 211. Due to the fifth inclined surfaces 351 and the sixth inclined surfaces 352, the corners of the third gap forming portion 311 are more easily separated from the third gap 317. Consequently, compared to the case where the fifth inclined surfaces 351 and the sixth inclined surfaces 352 are not present, the number of the extra magnetic force lines passing from the corners of the third gap forming portion 311 through the third gap 317 is reduced. This suppresses magnetic saturation of the third gap forming portion 311. Since the magnetic saturation of each of the first gap forming portions 111, the second gap forming portions 211, and the gap forming portions 311 is suppressed, a range of a magnetic strength detected by the current sensor 5 with respect to the current from the inverter increases. This increases a range of a magnitude of the current detected by the current sensor 5. Note that each of the first inclined surfaces 151, the third inclined surfaces 251, and the fifth inclined surface 351 corresponds to a first surface connected to an edge of the first end surface and also extending from the edge of the first end surface in a direction away from a gap. Note that each of the second inclined surfaces 152, the fourth inclined surfaces 252, and the sixth inclined surface 352 corresponds to a second surface connected to an edge of the second end surface and also extending from the edge of the second end surface in a direction away from a gap. In addition, an angle formed between each of the first inclined surfaces 151 and the first core end surface 115 may also be 90 degrees. In addition, an angle formed between each of the second inclined surfaces 152 and the second core end surface 116 also be 90 degrees. In addition, an angle formed between each of the third inclined surfaces 251 and the third core end surface 215 may also be 90 degrees. In addition, an angle formed between each of the fourth inclined surfaces 252 and the fourth core end surface 216 may also be 90 degrees. In addition, an angle formed between each of the fifth inclined surfaces 351 and the fifth core end surface 315 may also be 90 degrees. In addition, an angle formed between each of the sixth inclined surfaces 352 and the sixth core end surface 316 may also be 90 degrees.

Fourth Embodiment

Figure 8:
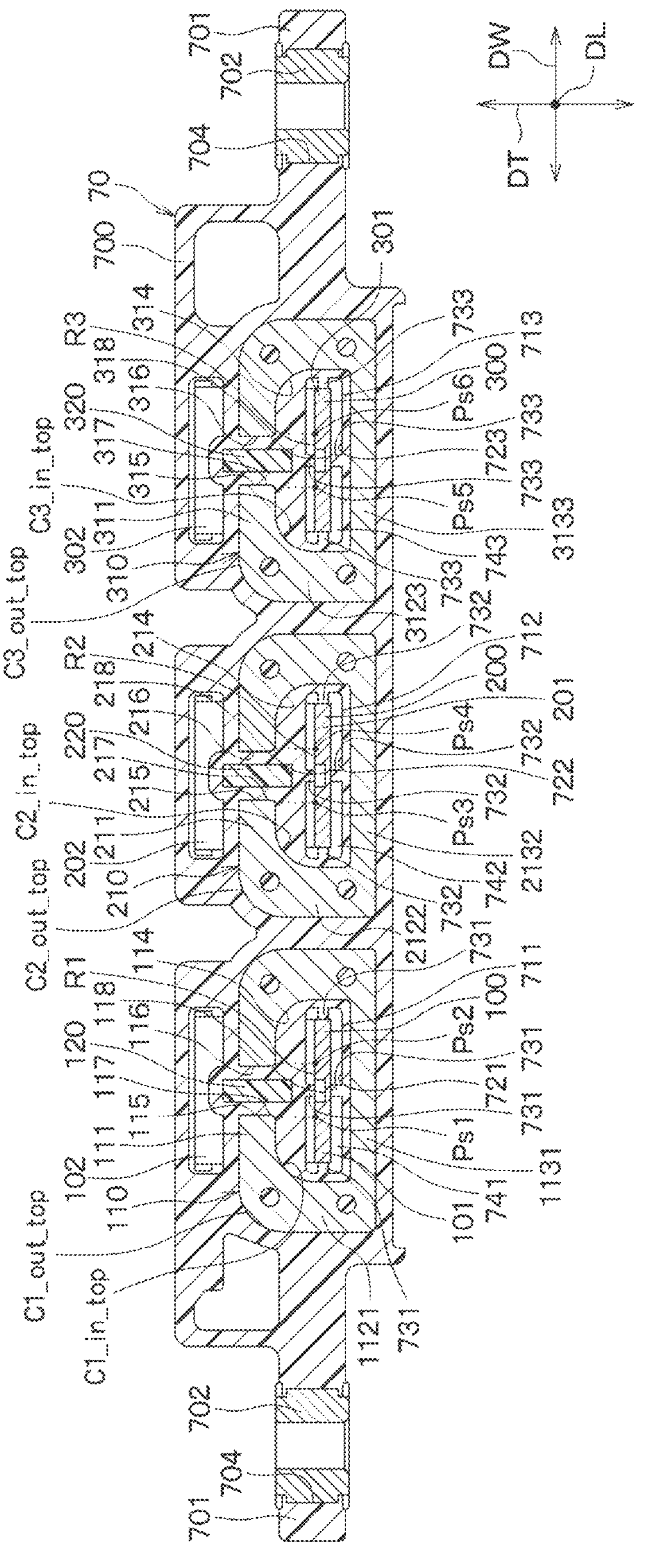
FIG. 8 is a cross-sectional view of the current sensor according to a fourth embodiment.

In the fourth embodiment, as illustrated in FIG. 8, forms of the first core 110, the core second 210, and the third core 310 are different from those in the first embodiment. The fourth embodiment is similar to the first embodiment in other respects.

The first core 110 includes, instead of the first easy axis portions 112 and the first hard axis portion 113, first core lateral portions 1121 and a first core bottom portion 1131.

The first core lateral portions 1121 are connected to the first gap forming portion 111. In addition, each of the first core lateral portions 1121 extends from a boundary portion between the first core lateral portion 1121 and the first gap forming portion 111 in the thickness direction DT. Furthermore, the first lateral inner corner portion C1_in_top inside the boundary portion between each of the first core lateral portion 1121 and the first gap portion 111 has an R-shape. In addition, each of the first core lateral portions 1121 is away from the first bus bar 100 in the width direction DW.

The first core bottom portions 1131 are connected to the first core lateral portion 1121. Additionally, the first core bottom portion 1131 extends in the width direction DW. Moreover, a magnetic permeability of the first core bottom portion 1131 is higher than a magnetic permeability of each of the first core lateral portions 1121. Furthermore, a saturation magnetic flux density of the first core bottom portion 1131 is higher than a saturation magnetic flux density of each of the first core lateral portions 1121. In addition, a length of the first core bottom portion 1131 in the thickness direction DT is shorter than a length of each of the first core lateral portions 1121 in the width direction DW. The first core hole 114 is a space defined by the first gap forming portion 111, the first lateral portion 1121, and the first core bottom portion 1131.

The second core 210 includes, instead of the second easy axis portions 212 and the second hard axis portion 213, second core lateral portions 2122 and a second core bottom portion 2132.

The second core lateral portions 2122 are connected to the second gap forming portion 211. Additionally, each of the core lateral portions 2122 extends in the thickness direction DT. Furthermore, the second lateral inner corner portion C2_in_top inside the boundary portion between each of the second core lateral portion 2122 and the second gap portion 211 has an R-shape. Furthermore, each of the second core lateral portions 2122 is away from the second bus bar 200 in the width direction DW.

The second core bottom portions 2132 are connected to the second core lateral portion 2122. Additionally, the second core bottom portion 2132 extends in the width direction DW. Moreover, a magnetic permeability of the second core bottom portion 2132 is higher than a magnetic permeability of each of the second core lateral portions 2122. Furthermore, a saturation magnetic flux density of the second core bottom portion 2132 is higher than a saturation magnetic flux density of each of the second core lateral portions 2122. In addition, a length of the second core bottom portion 2132 in the thickness direction DT is shorter than a length of each of the second core lateral portions 2122 in the width direction DW. The second core hole 214 is a space defined by the second gap forming portion 211, the second lateral portion 2122, and the second core bottom portion 2132.

The third core 310 includes, instead of the third easy axis portions 312 and the third hard axis portion 313, third core lateral portions 3123 and a third core bottom portion 3133.

The third core lateral portions 3123 are connected to the third gap forming portion 311. Moreover, each of the third core lateral portions 3123 extends in the thickness direction DT from a boundary portion between the third core lateral portion 3123 and the third gap forming portion 311. Furthermore, the third lateral inner corner portion C3_in_top inside the boundary portion between each of the third core lateral portions 3123 and the third gap portion 311 has an R-shape. In addition, each of the third core lateral portions 3123 is away from the third bus bar 300 in the width direction DW.

The third core bottom portions 3133 are connected to the third core lateral portion 3123. Additionally, the third core bottom portion 3133 extends in the width direction DW. Moreover, a magnetic permeability of the third core bottom portion 3133 is higher than a magnetic permeability of each of the third core lateral portions 3123. Furthermore, a saturation magnetic flux density of the third core bottom portion 3133 is higher than a saturation magnetic flux density of each of the third core lateral portions 3123. In addition, a length of the third core bottom portion 3133 in the thickness direction DT is shorter than a length of each of the third core lateral portions 3123 in the width direction DW. The third core hole 314 is a space defined by the third gap forming portion 311, the third lateral portion 3123, and the third core bottom portion 3133.

As described above, the current sensor 5 in the fourth embodiment is configured. In the fourth embodiment also, the same effects as those achieved in the first embodiment are achieved. In addition, the fourth embodiment also achieves effects described below.

[3] A length of the first core bottom portion 113 in the thickness direction DT is smaller than a length of each of the first core lateral portions 1121 in the width direction DW. As a result, the density of the magnetic flux applied to each of the first core lateral portions 1121 is lower than the density of the magnetic flux applied to the first core bottom portion 1131. This suppresses magnetic saturation of the first core lateral portion 1211. Additionally, a length of the second core bottom portion 2132 in the thickness direction DT is smaller than a length of each of the second core lateral portions 2122 in the width direction DW. As a result, the density of the magnetic flux applied to each of the second core lateral portions 2122 is lower than the density of the magnetic flux applied to the second core bottom portion 2132. This suppresses magnetic saturation of the second core lateral portion 2122. Furthermore, a length of the third core bottom portion 3133 in the thickness direction DT is smaller than a length of each of the third core lateral portions 3123 in the width direction DW. As a result, the density of the magnetic flux applied to each of the third core lateral portions 3123 is lower than the density of the magnetic flux applied to the third core bottom portion 3133. This suppresses magnetic saturation of the third core lateral portion 3123.

A magnetic permeability of the first core bottom portion 1121 is lower than a magnetic permeability of each of the first core bottom portions 1131. Accordingly, the linear region of the magnetic flux density of the first core bottom portion 1131 with respect to the strength of the magnetic field is larger than the linear region of the magnetic flux density of each of the first core lateral portions 1121 with respect to the strength of the magnetic field. This suppresses the magnetic saturation of the first core bottom portion 1131, and can therefore reduce the lengths of the first core bottom portion 1131 in the thickness direction DT and in the longitudinal direction DL. A magnetic permeability of the second core bottom portion 2122 is lower than a magnetic permeability of each of the second core bottom portions 2132. Accordingly, the linear region of the magnetic flux density of the second core bottom portion 2132 with respect to the strength of the magnetic field is larger than the linear region of the magnetic flux density of each of the second core lateral portions 2122 with respect to the strength of the magnetic field. This suppresses the magnetic saturation of the second core bottom portion 2132, and can therefore reduce the lengths of the second core bottom portion 2132 in the thickness direction DT and in the longitudinal direction DL. A magnetic permeability of the third core bottom portion 3123 is lower than a magnetic permeability of each of the third core bottom portions 3133. Accordingly, the linear region of the magnetic flux density of the third core bottom portion 3133 with respect to the strength of the magnetic field is larger than the linear region of the magnetic flux density of each of the third core lateral portions 3123 with respect to the strength of the magnetic field. This suppresses the magnetic saturation of the third core bottom portion 3133, and can therefore reduce the lengths of the third core bottom portion 3133 in the thickness direction DT and in the longitudinal direction DL.

Fifth Embodiment

Figure 9:
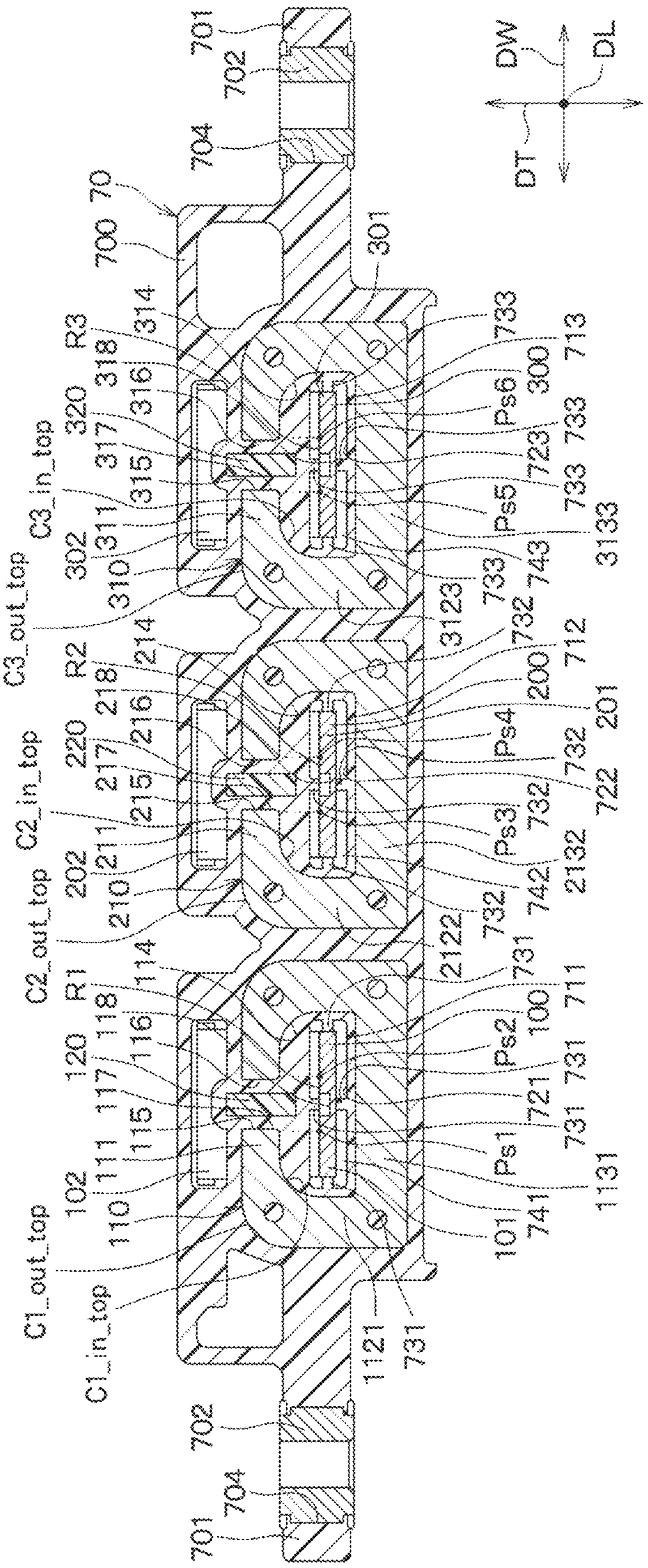
FIG. 9 is a cross-sectional view of the current sensor according to a fifth embodiment.

In the fifth embodiment, as illustrated in FIG. 9, forms of the first core lateral portions 1121, the first core bottom portion 1131, the second core lateral portions 2122, the second core bottom portion 2132, the third core lateral portion 3123, and the third core bottom portion 3133 are different from those in the fourth embodiment. The fifth embodiment is similar to the fourth embodiment in other respects.

In the fifth embodiment, the length of the first core bottom portion 1131 in the thickness direction DT is equal to the length of each of the first core lateral portions 1121 in the width direction DW. In addition, the magnetic permeability of each of the first core lateral portions 1121 is different from the magnetic permeability of the first core bottom portion 1131. For example, the magnetic permeability of each of the first core lateral portions 1121 may also be larger than the magnetic permeability of the first core bottom portion 1131. Note that the wording "equal to" used herein includes a production error range. Alternatively, the magnetic permeability of each of the first core lateral portions 1121 may also be lower than the magnetic permeability of the first core bottom portion 1131.

The length of the second bottom portion 2132 in the thickness direction DT is equal to the length of each of the second core lateral portions 2122 in the width direction DW. In addition, the magnetic permeability of each of the second core lateral portions 2122 is different from the magnetic permeability of the second core bottom portion 2132. For example, the magnetic permeability of each of the second core lateral portions 2122 may also be larger than the magnetic permeability of the second core bottom portion 2132. Alternatively, the magnetic permeability of each of the second core lateral portions 2122 may also be lower than the magnetic permeability of the second core bottom portion 2132.

The length of the third core bottom portion 3133 in the thickness direction is equal to the length of the third core lateral portion 3123 in the width direction DW. In addition, the magnetic permeability of each of the third core lateral portions 3123 is different from the magnetic permeability of the third core bottom portion 3133. For example, the magnetic permeability of each of the third core lateral portions 3123 may also be larger than the magnetic permeability of the third core bottom portion 3133. Alternatively, the magnetic permeability of each of the third core lateral portions 3123 may also be lower than the magnetic permeability of the third core bottom portion 3133.

As described above, the current sensor 5 in the fifth embodiment is configured. In the fifth embodiment also, the same effects as those achieved in the fourth embodiment are achieved. In addition, the fifth embodiment also achieves effects described below.

[4] Since the magnetic permeability of each of the first core lateral portions 1121 is different from the magnetic permeability of the first core bottom portion 1131, the magnetic permeability of either of the first core lateral portion 1121 and the first core bottom portion 1131 is higher. Accordingly, in either of the first core lateral portions 1121 and the first core bottom portion 1131, the linear region of the magnetic flux density with respect to the strength of the magnetic field can be increased in size. As a result, the magnetic saturation of either of the first core lateral portions 1121 and the first core bottom portion 1131 is suppressed. Consequently, either of the first core lateral portions 1121 and the first core bottom portion 1131 can be reduced in size. Meanwhile, since the magnetic permeability of each of the second core lateral portions 2122 is different from the magnetic permeability of the second core bottom portion 2132, the magnetic permeability of either of the second core lateral portions 2122 and the second core bottom portion 2132 can be increased. Accordingly, in either of the second core lateral portions 2122 and the second core bottom portion 2132, the linear region of the magnetic flux density with respect to the strength of the magnetic field can be increased in size. As a result, the magnetic saturation of either of the second core lateral portions 2122 and the second core bottom portion 2132 is suppressed. Consequently, either of the second core lateral portions 2122 and the second core bottom portion 2132 can be reduced in size. Meanwhile, since the magnetic permeability of each of the third core lateral portions 3123 is different from the magnetic permeability of the third core bottom portion 3133, the magnetic permeability of either of the third core lateral portions 3123 and the second core bottom portion 3133 can be increased. Accordingly, in either of the third core lateral portions 3123 or the third core bottom portion 3133, the linear region of the magnetic flux density with respect to the strength of the magnetic field can be increased in size. As a result, the magnetic saturation of either of the third core lateral portions 3123 and the third core bottom portion 3133 is suppressed. Consequently, either of the third core lateral portions 3123 and the third core bottom portion 3133 can be reduced in size.

Sixth Embodiment

Figure 10:
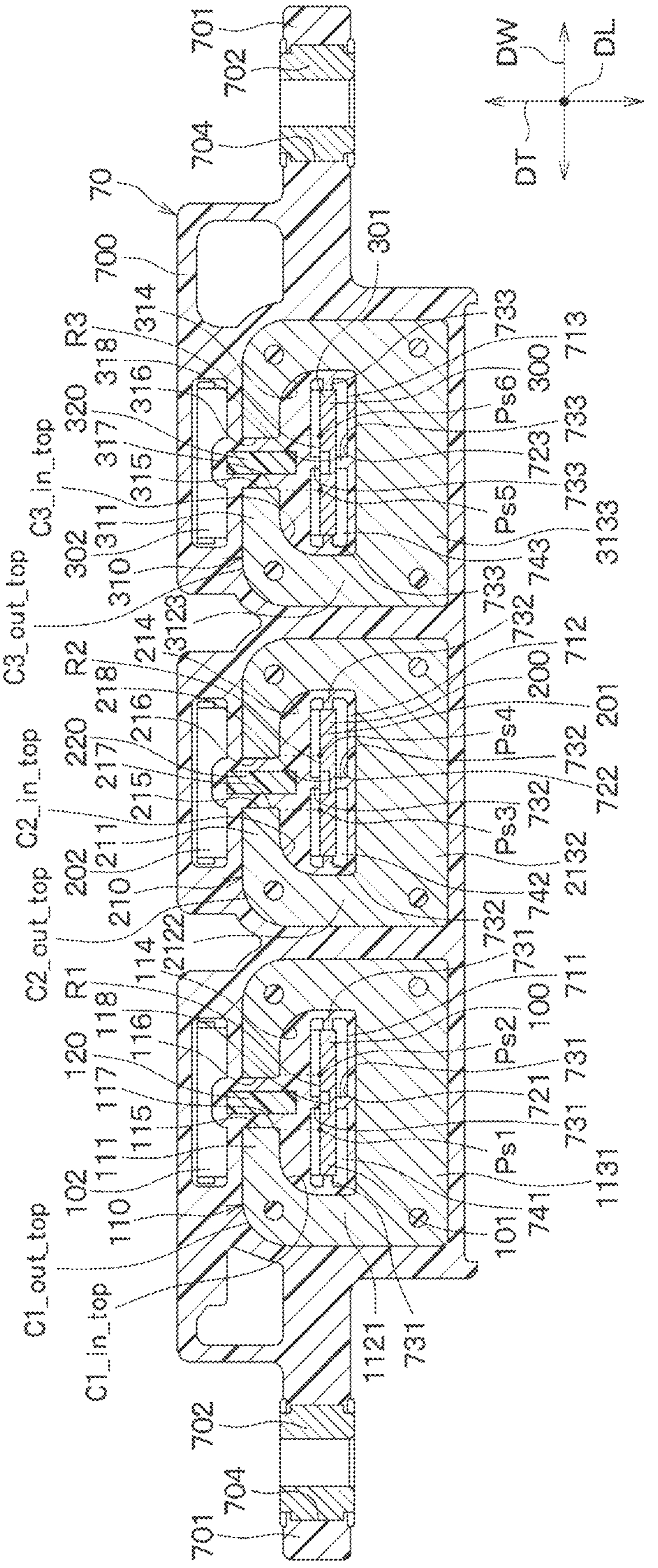
FIG. 10 is a cross-sectional view of the current sensor according to a sixth embodiment.

In the sixth embodiment, as illustrated in FIG. 10, forms of the first core 110, the second core 210, and the third core 310 are different from those in the first embodiment. The sixth embodiment is similar to the first embodiment in other respects.

The first core 110 includes, instead of the first easy axis portions 112 and the first hard axis portion 113, the first core lateral portion 1121 and the first core bottom portion 1131.

The first core lateral portions 1121 are connected to the first gap forming portion 111. In addition, each of the first core lateral portions 1121 extends from the boundary portion between the first core lateral portion 1121 and the first gap forming portion 111 in the thickness direction DT. Furthermore, the first lateral inner corner portion C1_in_top inside the boundary portion between each of the first core lateral portion 1121 and the first gap portion 111 has an R-shape. Furthermore, each of the first core lateral portions 1121 is away from the first bus bar 100 in the width direction DW. Note that, in the same manner as described above, the first gap forming portion 111 is away from the first bus bar 100 in the thickness direction DT.

The first core bottom portions 1131 are connected to the first core lateral portion 1121. Additionally, the first core bottom portion 1131 extends in the width direction DW. A magnetic permeability of the first core bottom portion 1131 is lower than a magnetic permeability of each of the first core bottom portions 1121. In addition, a saturation magnetic flux density of the first core bottom portion 1131 is lower than a saturation magnetic flux density of each of the first easy axis portions 1121. In addition, a length of the first core bottom portion 1131 in the thickness direction DT is longer than a length of each of the first core lateral portions 1121 in the width direction DW. Note that, in the same manner as described above, the first core hole 114 is formed of the first gap forming portion 111, the first core lateral portion 1121, and the first core bottom portion 1131.

The second core 210 includes, instead of the second easy axis portions 212 and the second hard axis portion 213, the second core lateral portion 2122 and the second core bottom portion 2132.

The second core lateral portions 2122 are connected to the second gap forming portion 211. In addition, each of the second core lateral portions 2122 extends in the thickness direction DT from the boundary portion between the second core lateral portion 2122 and the second gap forming portion 211. Furthermore, the second lateral inner corner portion C2_in_top inside the boundary portion between each of the second core lateral portion 2122 and the second gap portion 211 has an R-shape. Furthermore, each of the second core lateral portions 2122 is away from the second bus bar 200 in the width direction DW. Note that, in the same manner as described above, the second gap forming portion 211 is away from the second bus bar 200 in the thickness direction DT.

The second core bottom portions 2132 are connected to the second core lateral portion 2122. Additionally, the second core bottom portion 2132 extends in the width direction DW. A magnetic permeability of the second core bottom portion 2132 is lower than a magnetic permeability of each of the second core bottom portions 2122. In addition, a saturation magnetic flux density of the second core bottom portion 2132 is lower than a saturation magnetic flux density of each of the second easy axis portions 2122. In addition, a length of the second core bottom portion 2132 in the thickness direction DT is longer than a length of each of the second core lateral portions 2122 in the width direction DW. Note that, in the same manner as described above, the second core hole 214 is formed of the second gap forming portion 211, the second core lateral portion 2122, and the second core bottom portion 2132.

The third core 310 includes, instead of the third easy axis portions 312 and the third hard axis portion 313, the third core lateral portions 3123 and the third core bottom portion 3133.

The third core lateral portions 3123 are connected to the third gap forming portion 311. Moreover, each of the third core lateral portions 3123 extends in the thickness direction DT from the boundary portion between the third core lateral portion 3123 and the third gap forming portion 311. Furthermore, the third lateral inner corner portion C3_in_top inside the boundary portion between each of the third core lateral portion 3123 and the third gap portion 311 has an R-shape. In addition, each of the third core lateral portions 3123 is away from the third bus bar 300 in the width direction DW. Note that, in the same manner as described above, the third gap forming portion 311 is away from the third bus bar 300 in the thickness direction DT.

The third core bottom portions 3133 are connected to the third core lateral portion 3123. Additionally, the third core bottom portion 3133 extends in the width direction DW. A magnetic permeability of the third core bottom portion 3133 is lower than a magnetic permeability of each of the third core bottom portions 3123. In addition, a saturation magnetic flux density of the third core bottom portion 3133 is lower than a saturation magnetic flux density of each of the third easy axis portions 3123. In addition, a length of the third core bottom portion 3133 in the thickness direction DT is longer than a length of each of the third core lateral portions 3123 in the width direction DW. Note that, in the same manner as described above, the third core hole 314 is formed of the third gap forming portion 311, the third core lateral portions 3123, and the third core bottom portion 3133.

As described above, the current sensor 5 in the sixth embodiment is configured. In the sixth embodiment also, the same effects as those achieved in the first embodiment are achieved. In addition, the sixth embodiment also achieves effects described below.

[5-1] Each of the first lateral inner corner portions C1_in_top, the second lateral inner corner portions C2_in_top, and the third lateral inner corner portions C3_in_top has an R-shape. This reduces respective magnetic path lengths inside the first core 110, the second core 210, and the third core 310 and accordingly increases respective strengths of demagnetizing fields inside the first core 110, the second core 210, and the third core 310. Consequently, the respective magnetic flux densities of the first core 110, the second core 210, and the third core 310 are reduced. Therefore, the magnetic saturation of each of the first core 110, the second core 210 and the third core 310 is suppressed.

[5-2] The first gap forming portion 111 is away from the first bus bar 100 in the thickness direction DT, and the first core lateral portions 1121 are away from the first bus bar 100 in the width direction DW. This suppresses contact between the first bus bar 100 and the first core 110. Meanwhile, the second gap forming portion 211 is away from the second bus bar 200 in the thickness direction DT, and the second core lateral portions 2122 are away from the second bus bar 200 in the width direction DW. This suppresses contact between the second bus bar 200 and the second core 210. Furthermore, the third gap forming portion 311 is away from the third bus bar 300 in the thickness direction DT, and the third core lateral portion 3123 is away from the third bus bar 300 in the width direction DW. This suppresses contact between the third bus bar 300 and the third core 310.

Seventh Embodiment

Figure 11:
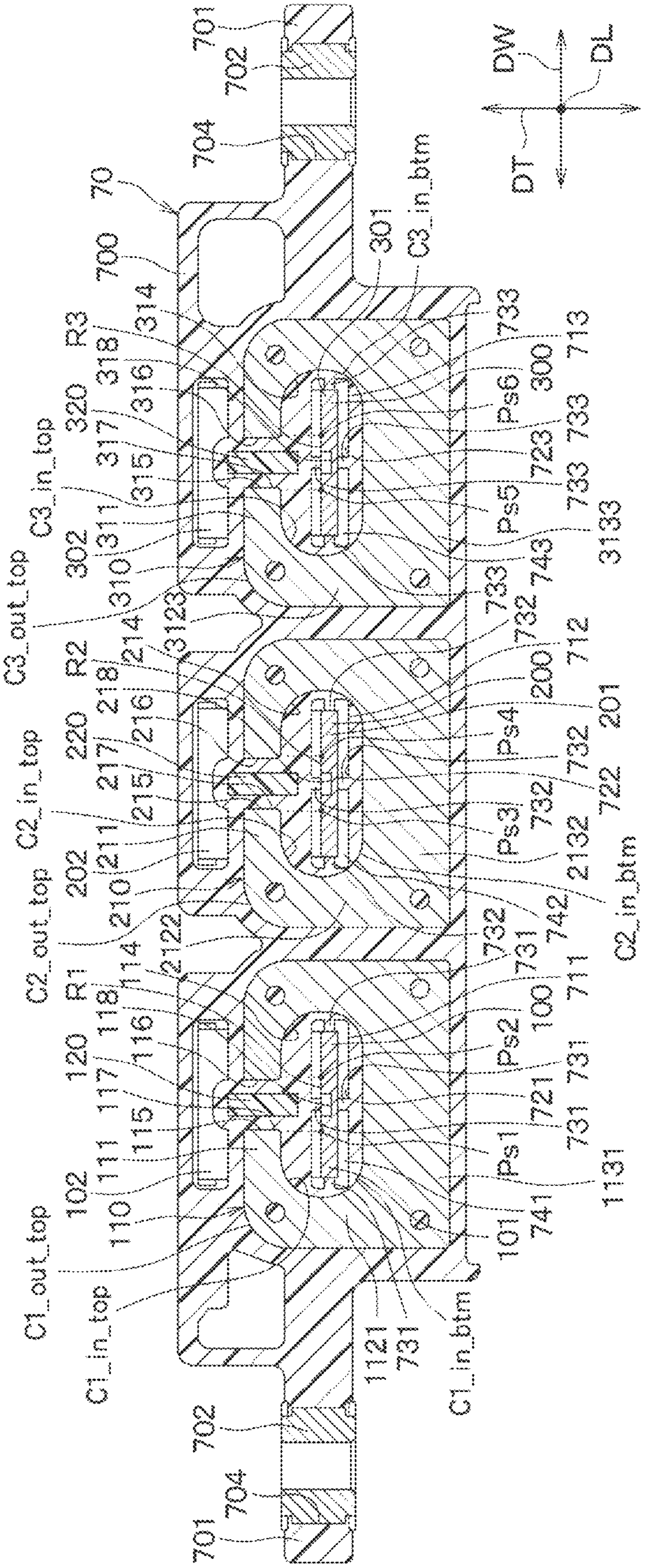
FIG. 11 is a cross-sectional view of v current sensor according to a seventh embodiment.

In the seventh embodiment, as illustrated in FIG. 11, forms of the first core 110, the second core 210, and the third core 310 are different from those in the first embodiment. The seventh embodiment is similar to the sixth embodiment in other respects.

The first core 110 has, in addition to the first lateral inner corner portions C1_in_top, first bottom outer corner portions C1_in_btm. Each of the first bottom inner corner portions C1_in_btm is an inner corner portion at a boundary portion between each of the first core lateral portions 1121 and the first core bottom portion 1131, and is formed in an R-shape. In addition, the first core bottom portion 1131 is away from the first bus bar 100 in the thickness direction DT.

The second core 210 has, in addition to the second lateral inner corner portions C2_in_top, second bottom inner corner portions C2_in_btm. Each of the second bottom inner corner portions C2_in_btm is an inner corner portion at a boundary portion between each of the second core lateral portions 2122 and the second core bottom portion 2132, and is formed in an R-shape. In addition, the second core bottom portion 2132 is away from the second bus bar 200 in the thickness direction DT.

The third core 310 has, in addition to the third lateral inner corner portions C3_in_top, third bottom inner corner portions C3_in_btm. Each of the third bottom inner corner portions C3_in_btm is an inner corner portion at a boundary portion between each of the third core lateral portions 3123 and the third core bottom portion 3133, and is formed in an R-shape. In addition, the third core bottom portion 3133 is away from the third bus bar 300 in the thickness direction DT.

As described above, the current sensor 5 in the seventh embodiment is configured. In the seventh embodiment also, the same effects as those achieved in the sixth embodiment are achieved. In addition, the seventh embodiment also achieves effects described below.

[6-1] Each of the first bottom inner corner portions C1_in_btm, the second bottom inner corner portions C2_in_btm, and the third bottom inner corner portions C3_in_btm has an R-shape. This reduces respective magnetic path lengths inside the first core 110, the second core 210, and the third core 310 and accordingly increases respective strengths of demagnetizing fields inside the first core 110, the second core 210, and the third core 310. Consequently, the respective magnetic flux densities of the first core 110, the second core 210, and the third core 310 are reduced. Therefore, the magnetic saturation of each of the first core 110, the second core 210 and the third core 310 is suppressed.

[6-2] The first core bottom portion 1131 is away from the first bus bar 100 in the thickness direction DT. This suppresses contact between the first bus bar 100 and the first core bottom portion 1131. The second core bottom portion 2132 is away from the second bus bar 200 in the thickness direction DT. This suppresses contact between the second bus bar 200 and the second core bottom portion 2132. Additionally, the third core bottom portion 3133 is away from the third bus bar 300 in the thickness direction DT. This suppresses contact between the third bus bar 300 and the third core bottom portion 3133.

Eighth Embodiment

Figure 12:
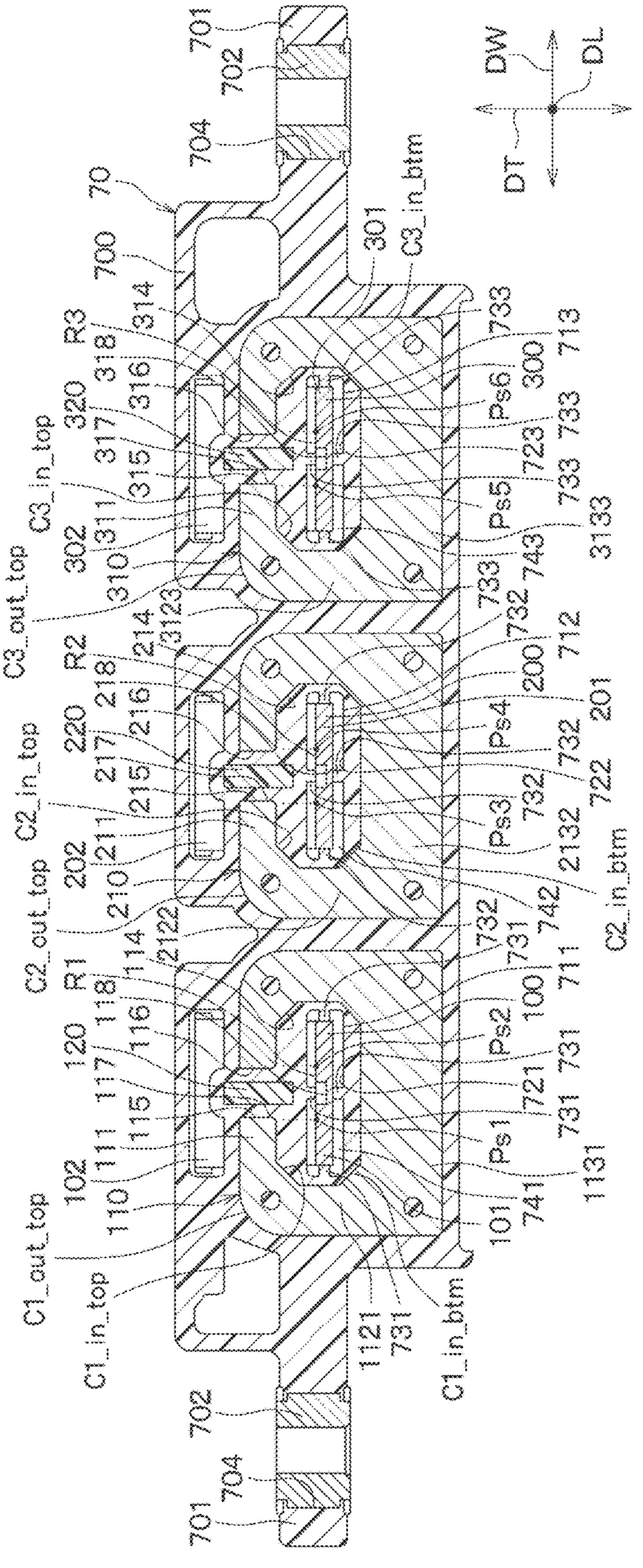
FIG. 12 is a cross-sectional view of the current sensor according to an eighth embodiment.

In the eighth embodiment, as illustrated in FIG. 12, respective forms of the first lateral inner corner portions C1_in_top and the first bottom inner corner portions C1_in_btm are different from those in the seventh embodiment. The respective forms of the second lateral inner corner portions C2_in_top and the second bottom inner corner portions C2_in_btm are different from those in the seventh embodiment. The respective forms of the third lateral inner corner portions C3_in_top and the third bottom inner corner portions C3_in_btm are different from those in the seventh embodiment. The eighth embodiment is similar to the seventh embodiment in other respects.

Each of the first lateral inner corner portions C1_in_top has an inclined surface connected to each of an inner surface of the first gap forming portion 111 and inner surfaces of the first core lateral portions 1121 and also inclined with respect to each of the width direction DW and the thickness direction DT. Each of the first bottom inner corner portions C1_in_btm has an inclined surface connected to each of the inner surfaces of the first core lateral portions and an inner surface of the first core bottom portion 1131 and also inclined with respect to each of the width direction DW and the thickness direction DT.

Each of the second lateral inner corner portions C2_in_top has an inclined surface connected to each of an inner surface of the second gap forming portion 211 and inner surfaces of the second core lateral portions 2122 and also inclined with respect to each of the width direction DW and the thickness direction DT. Each of the second bottom inner corner portions C2_in_btm has an inclined surface connected to each of the inner surfaces of the second core lateral portions 2122 and an inner surface of the second core bottom portion 2132 and also inclined with respect to each of the width direction DW and the thickness direction DT.

Each of the third lateral inner corner portions C3_in_top has an inclined surface connected to each of an inner surface of the third gap forming portion 311 and inner surfaces of the third core lateral portions 3123 and also inclined with respect to each of the width direction DW and the thickness direction DT. Each of the third bottom inner corner portions C3_in_btm has an inclined surface connected to each of the inner surfaces of the third core lateral portions 3123 and an inner surface of the third core bottom portion 3133 and also inclined with respect to each of the width direction DW and the thickness direction DT.

As described above, the current sensor 5 in the eighth embodiment is configured. In the eighth embodiment also, the same effects as those achieved in the seventh embodiment are achieved.

Ninth Embodiment

Figure 13:
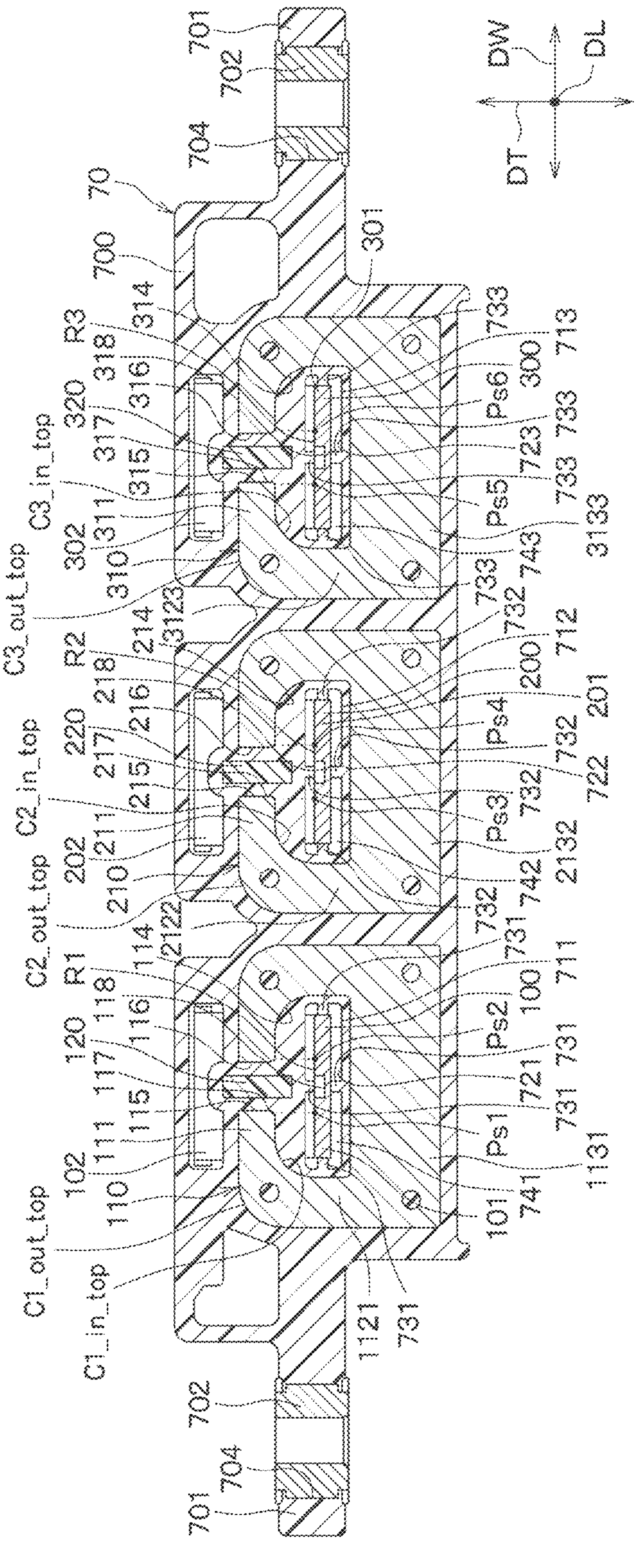
FIG. 13 is a cross-sectional view of the current sensor according to a ninth embodiment.

In the ninth embodiment, as illustrated in FIG. 13, forms of the first core 110, the second core 210, and the third core 310 are different from those in the first embodiment. The ninth embodiment is similar to the first embodiment in other respects.

The first core 110 includes the first gap forming portion 111 and the first core hole 114 and also includes, instead of the first easy axis portions 112 and the first hard axis portion 113, the first core lateral portions 1121 and the first core bottom portion 1131.

The first core lateral portions 1121 are connected to the first gap forming portion 111. In addition, each of the first core lateral portions 1121 extends from the boundary portion between the first core lateral portion 1121 and the first gap forming portion 111 in the thickness direction DT. Note that, in the same manner as described above, each of the first lateral outer corner portions C1_out_top, which are the outer corner portions of the first gap forming portion 111 in the width direction DW, has an R-shape.

The first core bottom portions 1131 are connected to the first core lateral portion 1121. Additionally, the first core bottom portion 1131 extends in the width direction DW. A magnetic permeability of the first core bottom portion 1131 is lower than a magnetic permeability of each of the first core bottom portions 1121. In addition, a saturation magnetic flux density of the first core bottom portion 1131 is lower than a saturation magnetic flux density of each of the first easy axis portions 1121. In addition, a length of the first core bottom portion 1131 in the thickness direction DT is longer than a length of each of the first core lateral portions 1121 in the width direction DW. Note that, in the same manner as described above, the first core hole 114 is formed of the first gap forming portion 111, the first core lateral portions 1121, and the first core bottom portion 1131.

The second core 210 includes the second gap forming portion 211 and the second core hole 214 and also includes, instead of the second easy axis portions 212 and the second hard axis portion 213, the second core lateral portions 2122 and the second core bottom portion 2132.

The second core lateral portions 2122 are connected to the second gap forming portion 211. In addition, each of the second core lateral portions 2122 extends in the thickness direction DT from the boundary portion between the second core lateral portion 2122 and the second gap forming portion 211. Note that, in the same manner as described above, each of the second lateral outer corner portions C2_out_top, which are the outer corner portions of the second gap forming portion 211 in the width direction DW, has an R-shape. The second lateral outer corner portion C2_out_top and the first lateral outer corner portion C1_out_top face each other in the width direction DW.

The second core bottom portions 2132 are connected to the second core lateral portion 2122. Additionally, the second core bottom portion 2132 extends in the width direction DW. A magnetic permeability of the second core bottom portion 2132 is lower than a magnetic permeability of each of the second core bottom portions 2122. In addition, a saturation magnetic flux density of the second core bottom portion 2132 is lower than a saturation magnetic flux density of each of the second easy axis portions 2122. In addition, a length of the second core bottom portion 2132 in the thickness direction DT is longer than a length of each of the second core lateral portions 2122 in the width direction DW. Note that, in the same manner as described above, the second core hole 214 is formed of the second gap forming portion 211, the second core lateral portions 2122, and the second core bottom portion 2132.

The third core 310 includes the third gap forming portion 311 and the third core hole 314 and also includes, instead of the third easy axis portions 312 and the third hard axis portion 313, the third core lateral portions 3123 and the third core bottom portion 3133.

The third core lateral portions 3123 are connected to the third gap forming portion 311. Moreover, each of the third core lateral portions 3123 extends in the thickness direction DT from the boundary portion between the third core lateral portion 3123 and the third gap forming portion 311. Note that, in the same manner as described above, each of the third lateral outer corner portions C3_out_top, which are the outer corner portions of the third gap forming portion 311 in the width direction DW, has an R-shape. In addition, the third lateral outer corner portion C3_out_top and the second lateral outer corner portion C2_out_top face each other in the width direction DW.

The third core bottom portions 3133 are connected to the third core lateral portion 3123. Additionally, the third core bottom portion 3133 extends in the width direction DW. A magnetic permeability of the third core bottom portion 3133 is lower than a magnetic permeability of each of the third core bottom portions 3123. In addition, a saturation magnetic flux density of the third core bottom portion 3133 is lower than a saturation magnetic flux density of each of the third easy axis portions 3123. In addition, a length of the third core bottom portion 3133 in the thickness direction DT is longer than a length of each of the third core lateral portions 3123 in the width direction DW. Note that, in the same manner as described above, the third core hole 314 is formed of the third gap forming portion 311, the third core lateral portions 3123, and the third core bottom portion 3133.

As described above, the current sensor 5 in the ninth embodiment is configured. In the ninth embodiment also, the same effects as those achieved in the first embodiment are achieved. In addition, the ninth embodiment also achieves effects described below.

[7] The first core 110, the second core 210, and the third core 310 are arranged in the order of the first core 110, the second core 210, and the third core 310 in the width direction DW. Meanwhile, each of the first lateral outer corner portion C1_out_top and the second lateral outer corner portion C2_out_top which face each other in the width direction DW has an R-shape. Accordingly, a maximum distance in the width direction DW between the first gap forming portion 111 and the second gap forming portion 211 is increased compared to that in a case where neither the first lateral outer corner portion C1_out_top nor the second lateral outer corner portion C2_out_top has the R-shape. Each of the second lateral outer corner portion C2_out_top and the third lateral outer corner portion C3_out_top which face each other in the width direction DW has an R-shape. Accordingly, a maximum distance in the width direction DW between the second gap forming portion 211 and the third gap forming portion 311 is increased compared to that in a case where neither the first lateral outer corner portion C2_out_top nor the second lateral outer corner portion C3_out_top has the R-shape. Accordingly, magnetic resistances between the first core 110 and the second core 210, which are adjacent to each other, and between the second core 210 and the third core 310, which are adjacent to each other, become high. Consequently, magnetic paths are less likely to be formed by the first core 110 and the second core 210, which are adjacent to each other, and by the second core 210 and the third core 310, which are adjacent to each other. This suppresses a reduction in magnetic resistance in the first core 110, the second core 210, and the third core 310 as a whole. This suppresses an increase in the magnetic flux density of each of the first core 110, the second core 210, and the third core 310 due to influence between the cores adjacent to each other, and thus suppresses magnetic saturation of each of the first core 110, the second core 210, and the third core 310.

Tenth Embodiment

Figure 14:
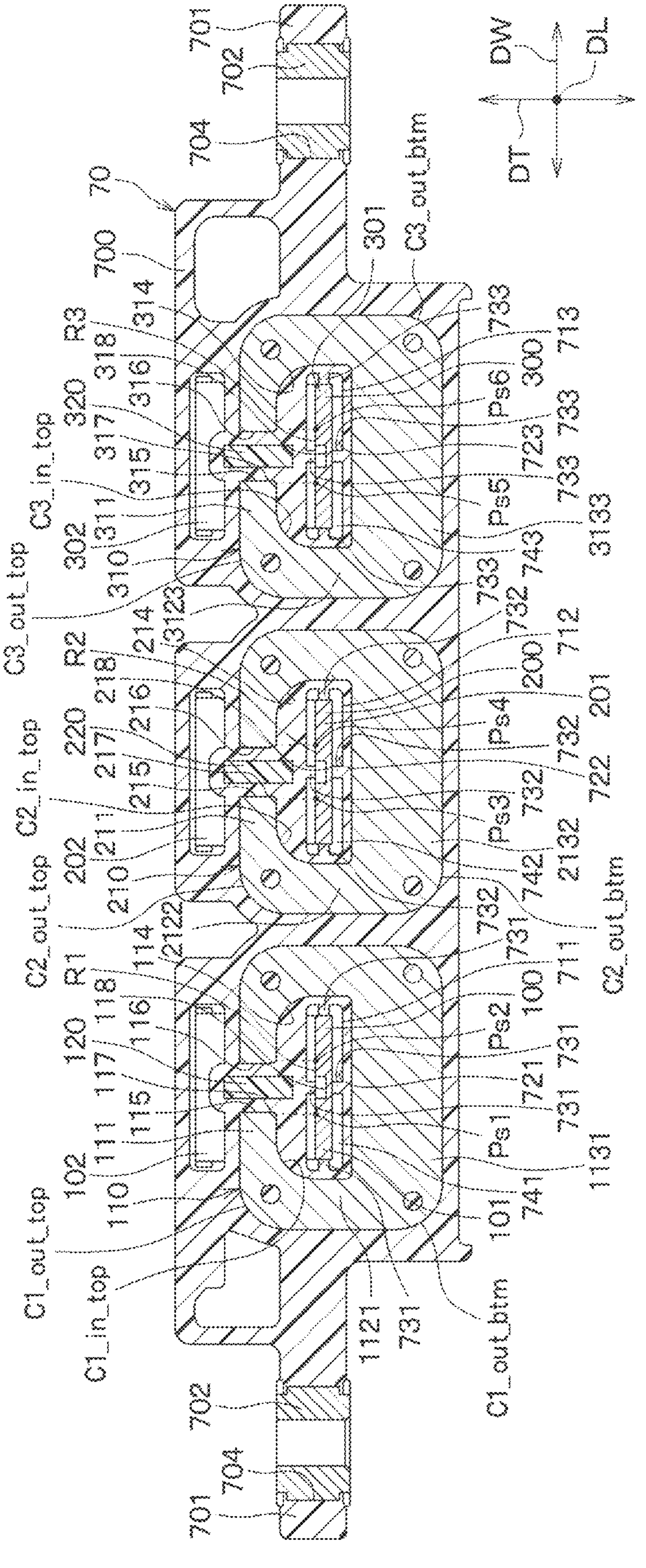
FIG. 14 is a cross-sectional view of the current sensor according to a tenth embodiment.

In the fourth embodiment, as illustrated in FIG. 14, forms of the first core 110, the second core 210, and the third core 310 are different from those in the ninth embodiment. The tenth embodiment is similar to the ninth embodiment in other respects.

The first core 110 has, in addition to the first lateral outer corner portions C1_out_top, first bottom outer corner portions C1_out_btm. Each of the first bottom outer corner portions C1_out_btm is the outer corner portion of the first core bottom portion 1131 in the width direction DW, and is formed in an R-shape.

The second core 210 has, in addition to the second lateral outer corner portions C2_out_top, second bottom outer corner portions C2_out_btm. Each of the second bottom outer corner portions C2_out_btm is the outer corner portion of the second core bottom portion 2132 in the width direction DW, and is formed in an R-shape. The second bottom outer corner portion C2_out_btm and the first bottom outer corner portion C1_out_btm face each other in the width direction DW.

The third core 310 has, in addition to the third lateral outer corner portions C3_out_top, third bottom outer corner portions C3_out_btm. Each of the third bottom outer corner portions C3_out_btm is the outer corner portion of the third core bottom portion 3133 in the width direction DW, and is formed in an R-shape. The third bottom outer corner portion C3_out_btm and the second bottom outer corner portion C2_out_btm face each other in the width direction DW.

As described above, the current sensor 5 in the tenth embodiment is configured. In the tenth embodiment also, the same effects as those achieved in the ninth embodiment are achieved. In addition, the tenth embodiment also achieves effects described below.

[8] Each of the first bottom outer corner portion C1_out_btm and the second bottom outer corner portion C2_out_btm which face each other in the width direction DW has an R-shape. Accordingly, a maximum distance in the width direction DW between the first core bottom portion 1131 and the second core bottom portion 2132 is increased compared to that in a case where neither the first core bottom portion 1131 nor the second core bottom portion 2132 has the R-shape. Each of the second bottom outer corner portion C2_out_btm and the third bottom outer corner portion C3_out_btm which face each other in the width direction DW has an R-shape. Accordingly, a maximum distance in the width direction DW between the second core bottom portion 2132 and the third core bottom portion 3133 is increased compared to that in a case where neither the second core bottom portion 2132 nor the third core bottom portion 3133 has the R-shape. Accordingly, magnetic resistances between the first core 110 and the second core 210, which are adjacent to each other, and between the second core 210 and the third core 310, which are adjacent to each other, become high. Consequently, magnetic paths are less likely to be formed by the first core 110 and the second core 210, which are adjacent to each other, and by the second core 210 and the third core 310, which are adjacent to each other. This suppresses a reduction in magnetic resistance in the first core 110, the second core 210, and the third core 310 as a whole. This suppresses an increase in the magnetic flux density of each of the first core 110, the second core 210, and the third core 310 due to influence between the cores adjacent to each other, and thus suppresses magnetic saturation of each of the first core 110, the second core 210, and the third core 310.

Eleventh Embodiment

Figure 15:
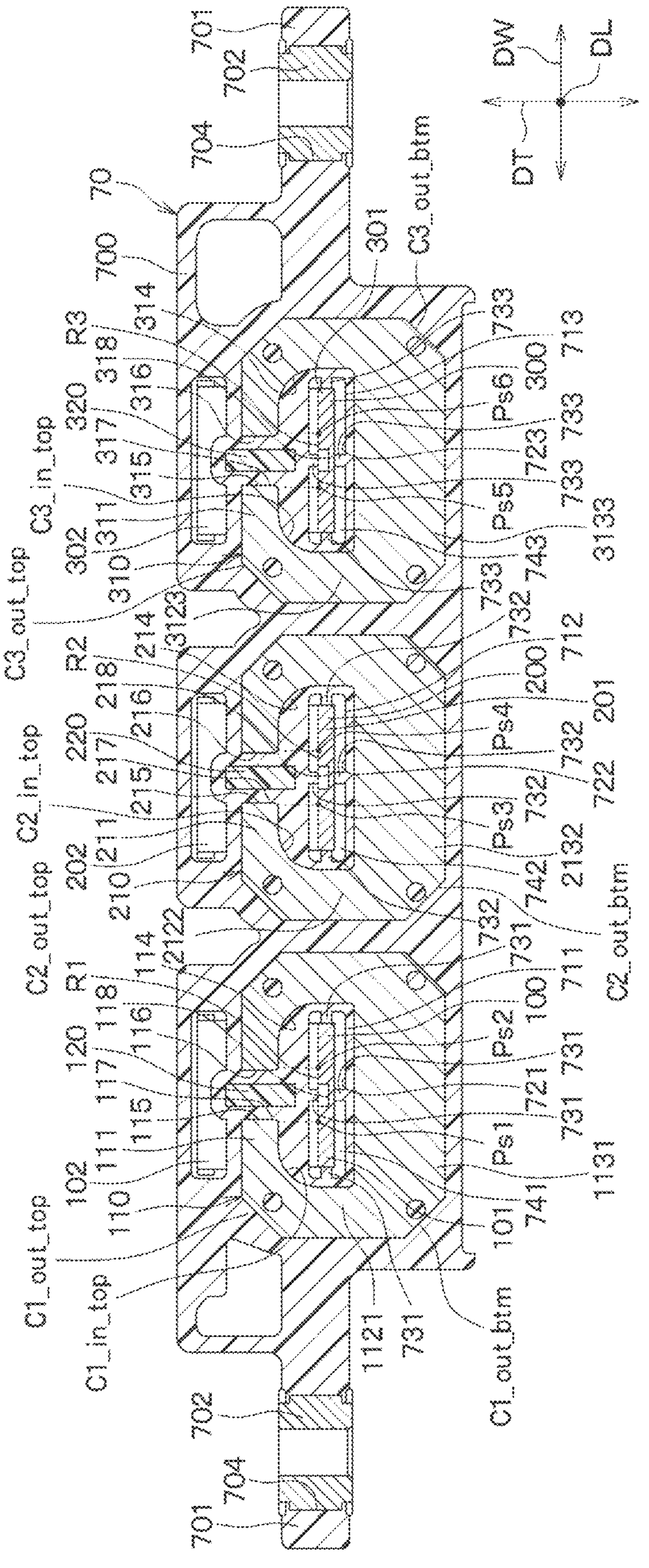
FIG. 15 is a cross-sectional view of the current sensor according to an eleventh embodiment.

In the eleventh embodiment, as illustrated in FIG. 15, the first lateral outer corner portions C1_out_top and the first bottom outer corner portions C1_out_btm are different from those in the tenth embodiment. In addition, the second lateral outer corner portions C2_out_top and the second bottom outer corner portions C2_out_btm are different from those in the tenth embodiment. The respective forms of the third lateral outer corner portions C3_out_top and the third bottom outer corner portions C3_out_btm are different from those in the tenth embodiment. The eleventh embodiment is similar to the tenth embodiment in other respects.

Each of the first lateral outer corner portions C1_out_top has an inclined surface connected to each of an outer surface of the first gap forming portion 111 and outer surfaces of the first core lateral portions 1121 and also inclined with respect to each of the width direction DW and the thickness direction DT. Each of the first bottom outer corner portions C1_out_btm has an inclined surface connected to each of an outer surface of the first core lateral portion 1121 and outer surfaces of the first core bottom portions 1131 and also inclined with respect to each of the width direction DW and the thickness direction DT.

Each of the second lateral outer corner portions C2_out_top has an inclined surface connected to each of an outer surface of the second gap forming portion 211 and outer surfaces of the second core lateral portions 2122 and also inclined with respect to each of the width direction DW and the thickness direction DT. Each of the second bottom outer corner portions C2_out_btm has an inclined surface connected to each of an outer surface of the second core lateral portion 2122 and outer surfaces of the second core bottom portions 2132 and also inclined with respect to each of the width direction DW and the thickness direction DT.

Each of the third lateral outer corner portions C3_out_top has an inclined surface connected to each of an outer surface of the third gap forming portion 311 and outer surfaces of the third core lateral portions 3123 and also inclined with respect to each of the width direction DW and the thickness direction DT. Each of the third bottom outer corner portions C3_out_btm has an inclined surface connected to each of an outer surface of the third core lateral portion 3123 and outer surfaces of the third core bottom portions 3133 and also inclined with respect to each of the width direction DW and the thickness direction DT.

As described above, the current sensor 5 in the eleventh embodiment is configured. In the eleventh embodiment also, the same effects as those achieved in the tenth embodiment are achieved.

Twelfth Embodiment

Figure 16:
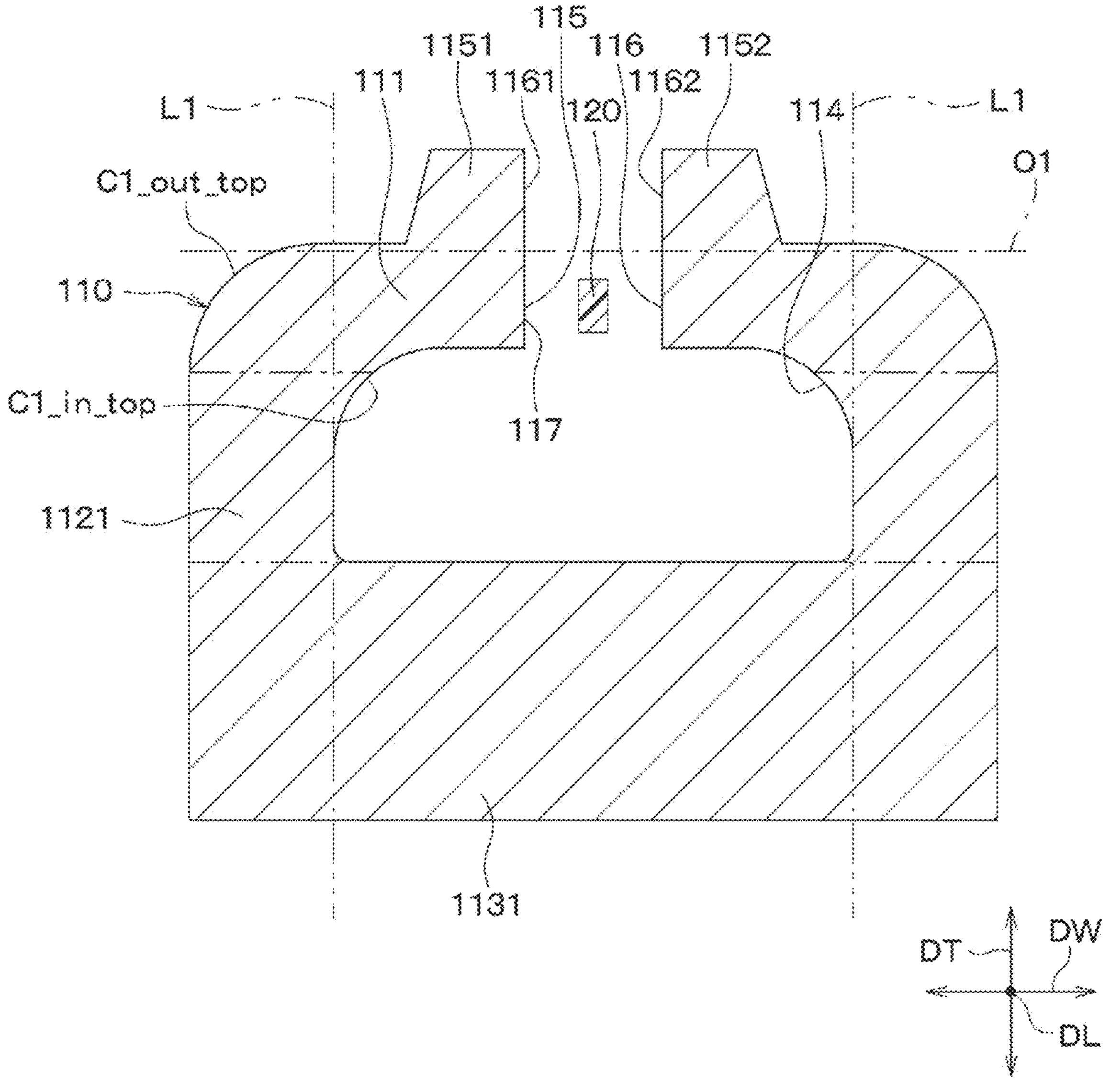
FIG. 16 is a cross-sectional view of a first core and a first detection unit in the current sensor in a twelfth embodiment.
Figure 17:
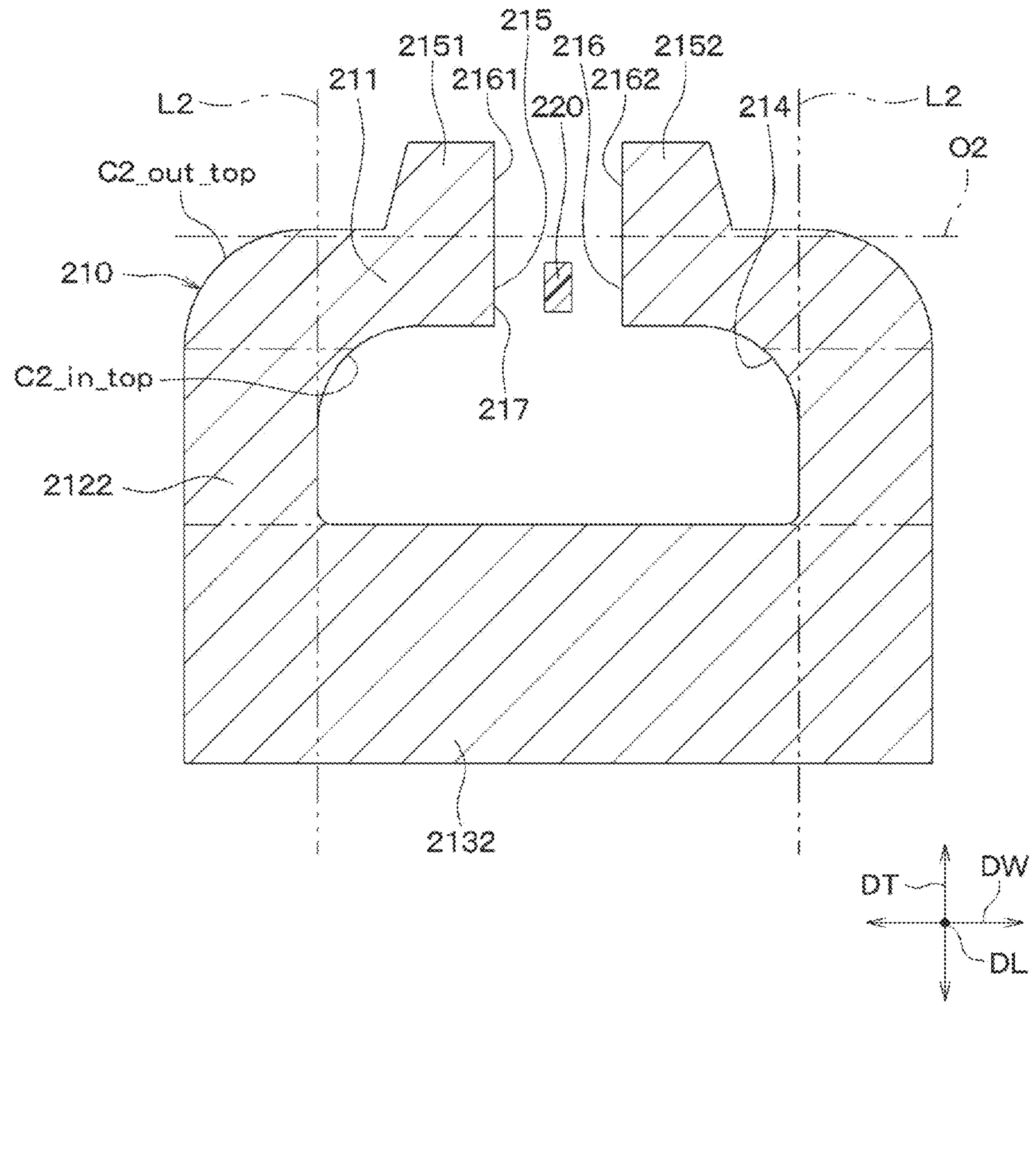
FIG. 17 is a cross-sectional view of a second core and a second detection unit in the current sensor.
Figure 18:
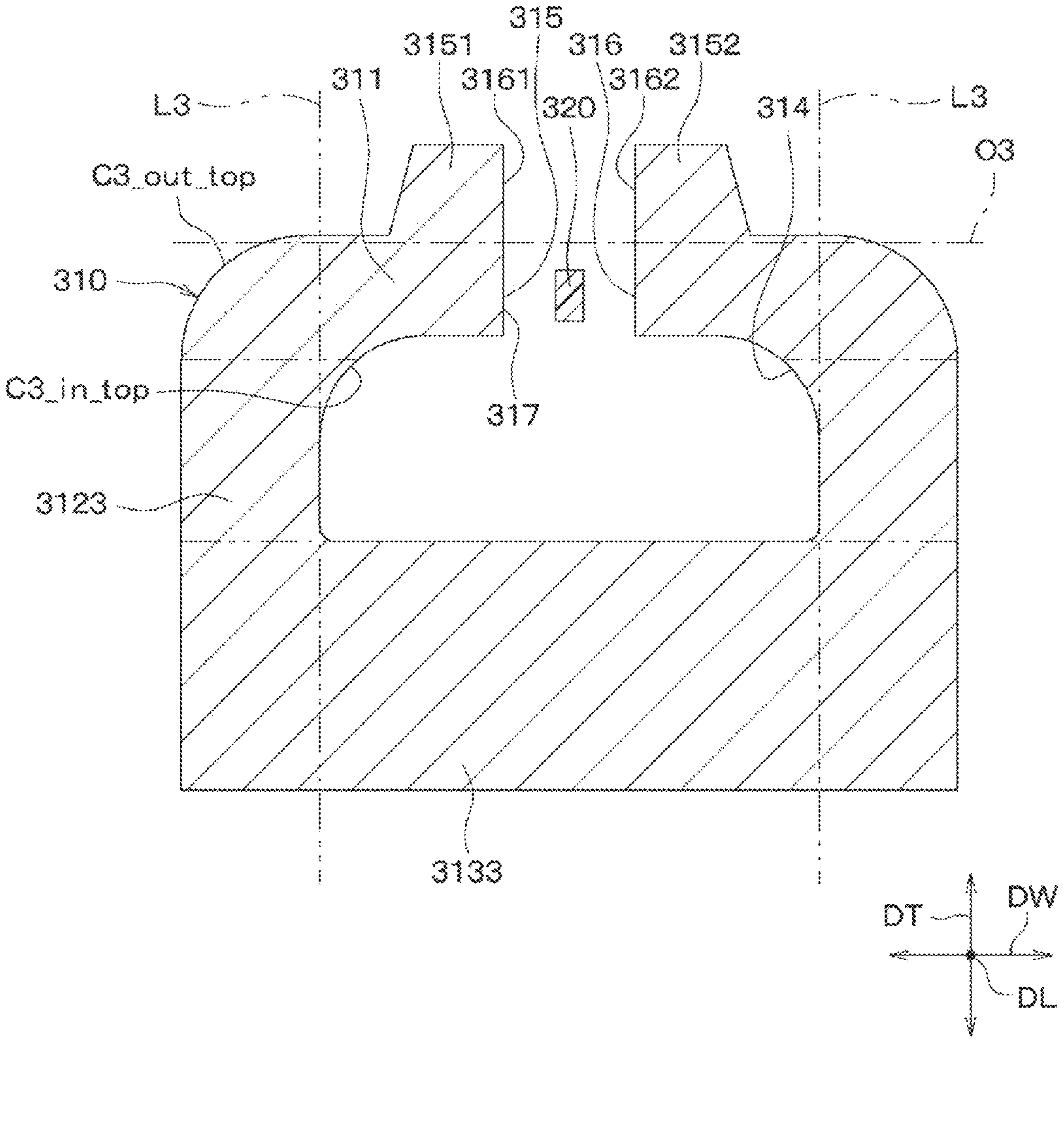
FIG. 18 is a cross-sectional view of a third core and a third detection unit in the current sensor.

In the twelfth embodiment, as illustrated in FIGS. 16 to 18, the forms of the first core 110, the second core 210, and the third core 310 are different from those in the sixth embodiment. The twelfth embodiment is similar to the sixth embodiment in other respects. Note that, in FIG. 16 to 18, to avoid complication, illustration of the first bus bar 100, the second bus bar 200, the third bus bar 300, the case 70, and the like is omitted.

As illustrated in FIG. 16, the first core 110 includes, in addition to the first gap forming portion 111, the first core lateral portions 1121, the first core bottom portion 1131, and the first core hole 114, a first protruding portion 1151 and a second protruding portion 1152.

The first protruding portion 1151 and the second protruding portion 1152 protrude in the thickness direction DT from an outer surface of the first gap forming portion 111 facing outwardly in the thickness direction DT. Meanwhile, a first protruding surface 1161, which is a surface of the first protruding portion 1151 facing inwardly in the width direction DW, is connected to the first core end surface 115. Meanwhile, a second protruding surface 1162, which is a surface of the second protruding portion 1152 facing inwardly in the width direction DW, is connected to the second core end surface 116. Accordingly, the first gap 117 is formed not only by the first core end surface 115 and the second end surface 116, but also by the first protruding surface 1161 and the second protruding surface 1162. Note that each of the number of the first protruding portions 1151 and the number of the second protruding portions 1152 is 1, but is not limited thereto, and each of these numbers may also be 2 or more. In addition, a shape of each of the first protruding portion 1151 and the second protruding portion 1152 is a quadrangular prism, but is not limited thereto, and each of the protruding portions may also have a polygonal prism shape, a cylindrical shape, or the like.

As illustrated in FIG. 17, the second core 210 includes, in addition to the second gap forming portion 211, the second core lateral portions 2122, the second core bottom portion 2132, and the second core hole 214, a third protruding portion 2151 and a fourth protruding portion 2152.

The third protruding portion 2151 and the fourth protruding portion 2152 protrude in the thickness direction DT from an outer surface of the second gap forming portion 211 facing outwardly in the thickness direction DT. Meanwhile, a third protruding surface 2161, which is a surface of the third protruding portion 2151 facing inwardly in the width direction DW, is connected to the third core end surface 215. Meanwhile, a fourth protruding surface 2162, which is a surface of the fourth protruding portion 2152 facing inwardly in the width direction DW, is connected to the fourth core end surface 216. Accordingly, the second gap 217 is formed not only by the third core end surface 215 and the fourth end surface 216, but also by the third protruding surface 2161 and the fourth protruding surface 2162. Note that each of the number of the third protruding portions 2151 and the number of the fourth protruding portions 2152 is 1, but is not limited thereto, and each of these numbers may also be 2 or more. In addition, a shape of each of the third protruding portion 2151 and the fourth protruding portion 2152 is a quadrangular prism, but is not limited thereto, and each of the protruding portions may also have a polygonal prism shape, a cylindrical shape, or the like.

As illustrated in FIG. 18, the third core 310 includes, in addition to the third gap forming portion 311, the third core lateral portions 3123, the third core bottom portion 3133, and the third core hole 314, a fifth protruding portion 3151 and a sixth protruding portion 3152.

The fifth protruding portion 3151 and the sixth protruding portion 3152 protrude in the thickness direction DT from an outer surface of the third gap forming portion 311 facing outwardly in the thickness direction DT. Meanwhile, a fifth protruding surface 3161, which is a surface of the fifth protruding portion 3151 facing inwardly in the width direction DW, is connected to the fifth core end surface 315. Meanwhile, a sixth protruding surface 3162, which is a surface of the sixth protruding portion 3152 facing inwardly in the width direction DW, is connected to the sixth core end surface 316. Accordingly, the third gap 317 is formed not only by the fifth core end surface 315 and the sixth end surface 316, but also by the third protruding surface 3161 and the sixth protruding surface 3162. Note that each of the number of the fifth protruding portions 3151 and the number of the sixth protruding portions 3152 is 1, but is not limited thereto, and each of these numbers may also be 2 or more. In addition, a shape of each of the fifth protruding portion 3151 and the sixth protruding portion 3152 is a quadrangular prism, but is not limited thereto, and each of the protruding portions may also have a polygonal prism shape, a cylindrical shape, or the like.

It is assumed herein that, in a cross section of the first core 110 when the first core 110 is cut in a direction perpendicular to the longitudinal direction DL, lines passing through respective inner edges of the first core lateral portions 1121, which extend in the thickness direction DT, and extending in the thickness direction DT are first virtual lines L1. It is assumed herein that, in a cross section of the second core 210 when the second core 210 is cut in a direction perpendicular to the longitudinal direction DL, lines passing through respective inner edges of the second core lateral portions 2122, which extend in the thickness direction DT, and extending in the thickness direction DT are second virtual lines L2. It is assumed herein that, in a cross section of the third core 310 when the third core 310 is cut in a direction perpendicular to the longitudinal direction DL, lines passing through respective inner edges of the third core lateral portions 3123, which extend in the thickness direction DT, and extending in the thickness direction DT are third virtual lines L3.

The first protruding portion 1151 and the second protruding portion 1152 are located inwardly of the first virtual lines L1 in the width direction DW. The third protruding portion 2151 and the fourth protruding portion 2152 are located inwardly of the second virtual lines L2 in the width direction DW. The fifth protruding portion 3151 and the sixth protruding portion 3152 are located inwardly of the third virtual lines L3 in the width direction DW.

It is also assumed herein that a line passing through a center of a surface obtained by combining the first protruding surface 1161 with the first core end surface 115 in the thickness direction DT and extending in the width direction DW is a first center line O1. The first center line O1 further passes through a center of a surface obtained by combining the second protruding surface 1162 with the second core end surface 116 in the thickness direction DT. It is also assumed herein that a line passing through a center of a surface obtained by combining the third protruding surface 2161 with the third core end surface 215 in the thickness direction DT and extending in the width direction DW is a second center line O2. The second center line O2 further passes through a center of a surface obtained by combining the fourth protruding surface 2162 with the fourth core end surface 216 in the thickness direction DT. It is also assumed herein that a line passing through a center of a surface obtained by combining the fifth protruding surface 3161 with the fifth core end surface 315 in the thickness direction DT and extending in the width direction DW is a third center line O3. The third center line O3 further passes through a center of a surface obtained by combining the sixth protruding surface 3162 with the sixth core end surface 316 in the thickness direction DT.

In addition, since the first detection unit 120 is located on the first core hole 114 side of the first center line O1, the first detection unit 120 is located between the first center line O1 and the first bus bar 100 in the thickness direction DT. In addition, since the second detection unit 220 is located on the second core hole 214 side of the second center line O2, the second detection unit 220 is located between the second center line O2 and the second bus bar 200 in the thickness direction DT. In addition, since the third detection unit 320 is located on the third core hole 314 side of the third center line O3, the third detection unit 320 is located between the third center line O3 and the third bus bar 300 in the thickness direction DT.

As described above, the current sensor 5 in the twelfth embodiment is configured. In the twelfth embodiment also, the same effects as those achieved in the sixth embodiment are achieved. In addition, the twelfth embodiment also achieves effects described below.

[9-1] The first detection unit 120, which detects herein a strength of a magnetic field in the first gap 117, may erroneously detect a strength of a disturbance magnetic field, e.g., a strength of a magnetic field due to magnetic force lines leaking from the second core 210. The second detection unit 220, which detects herein a strength of a magnetic field in the second gap 217, may erroneously detect a strength of a disturbance magnetic field, e.g., a strength of a magnetic field due to magnetic force lines leaking from the first core 110 and the third core 310. The third detection unit 320, which detects herein a strength of a magnetic field in the third gap 317, may erroneously detect a strength of a disturbance magnetic field, e.g., a strength of a magnetic field due to magnetic force lines leaking from the second core 210.

Meanwhile, it may be considered to reduce sizes of the first gap 117, the second gap 217, and the third gap 317 and thereby reduce susceptibility to influence of the disturbance magnetic field. However, when the sizes of the first gap 117, the second gap 217, and the third gap 317 are reduced, sizes of the first core 110, the second core 210, and the third core 310 are reduced. Consequently, magnetic resistances of the first core 110, the second core 210, and the third core 310 are reduced to increase magnetic flux densities applied to the first core 110, the second core 210, and the third core 310. As a result, magnetic saturation of each of the first core 110, the second core 210, and the third core 310 is more likely to occur.

Accordingly, the first core 110 has the first protruding portion 1151 and the second protruding portion 1152. The first protruding portion 1151 and the second protruding portion 1152 protrude from the first gap forming portion 111 in the thickness direction DT. Consequently, compared to a case where the first protruding portion 1151 and the second protruding portion 1152 are not present, the magnetic resistance of the first gap forming portion 111 with respect to the magnetic resistance of the entire first core 110 is reduced. As a result, magnetic force lines due to the disturbance magnetic field, e.g., magnetic force lines leaking from the second core 210 are likely to pass through the first gap forming portion 111 through the first protruding portion 1151 and the second protruding portion 1152 without passing through the first detection unit 120. Consequently, the first detection unit 120 is less susceptible to the influence of the disturbance magnetic field, and therefore accuracy of detection by the first detection unit 120 is improved. In addition, due to the first protruding portion 1151 and the second protruding portion 1152, the size the first gap 117 is increased compared to that in a case where the first protruding portion 1151 and the second protruding portion 1152 are not present, and accordingly the magnetic resistance of the first core 110 is increased. This suppresses an increase in the magnetic flux density of the first core 110. Moreover, due to the first protruding portion 1151 and the second protruding portion 1152, the size of the entire first core 110 need not be increased. This suppresses an increase in the size of the first core 110, and the magnetic saturation of the first core 110 is suppressed.

Accordingly, the second core 210 has the third protruding portion 2151 and the fourth protruding portion 2152. The third protruding portion 2151 and the fourth protruding portion 2152 protrude from the second gap forming portion 211 in the thickness direction DT. Consequently, compared to a case where the third protruding portion 2151 and the fourth protruding portion 2152 are not present, the magnetic resistance of the second gap forming portion 211 with respect to the magnetic resistance of the entire second core 210 is reduced. As a result, magnetic force lines due to the disturbance magnetic field, e.g., magnetic force lines leaking from the first core 110 and the third core 310 are likely to pass through the second gap forming portion 211 through the third protruding portion 2151 and the fourth protruding portion 2152 without passing through the second detection unit 220. Consequently, the second detection unit 220 is less susceptible to the influence of the disturbance magnetic field, and therefore accuracy of detection by the second detection unit 220 is improved. In addition, due to the third protruding portion 2151 and the fourth protruding portion 2152, the size the second gap 217 is increased compared to that in a case where the third protruding portion 2151 and the fourth protruding portion 2152 are not present, and accordingly the magnetic resistance of the second core 210 is increased. This suppresses an increase in the magnetic flux density of the second core 210. Furthermore, due to the third protruding portion 2151 and the fourth protruding portion 2152, the size of the entire second core 210 need not be increased. This suppresses an increase in the size of the second core 210, and the magnetic saturation of the second core 210 is suppressed.

Accordingly, the third core 310 has the fifth protruding portion 3151 and the sixth protruding portion 3152. The fifth protruding portion 3151 and the sixth protruding portion 3152 protrude from the third gap forming portion 311 in the thickness direction DT. Consequently, compared to a case where the fifth protruding portion 3151 and the sixth protruding portion 3152 are not present, the magnetic resistance of the third gap forming portion 311 with respect to the magnetic resistance of the entire third core 310 is reduced. As a result, magnetic force lines due to the disturbance magnetic field, e.g., magnetic force lines leaking from the second core 210 are likely to pass through the third gap forming portion 311 through the fifth protruding portion 3151 and the sixth protruding portion 3152 without passing through the third detection unit 320. Consequently, the third detection unit 320 is less susceptible to the influence of the disturbance magnetic field, and therefore accuracy of detection by the third detection unit 320 is improved. In addition, due to the fifth protruding portion 3151 and the sixth protruding portion 3152, the size the third gap 317 is increased compared to that in a case where the fifth protruding portion 3151 and the sixth protruding portion 3152 are not present, and accordingly the magnetic resistance of the third core 310 is increased. This suppresses an increase in the magnetic flux density of the third core 310. Furthermore, due to the fifth protruding portion 3151 and the sixth protruding portion 3152, the size of the entire third core 310 need not be increased. This suppresses an increase in the size of the third core 310, and the magnetic saturation of the third core 310 is suppressed.

[9-2] The first detection unit 120 is located between the first center line O1 and the first bus bar 100 in the thickness direction DT. Consequently, in the thickness direction DT, the first detection unit 120 is away from the outside of the first core 110, and accordingly the magnetic force lines due to the disturbance magnetic field are less likely to pass through the first detection unit 120. Consequently, the first detection unit 120 is less susceptible to the influence of the disturbance magnetic field, and therefore accuracy of detection by the first detection unit 120 is improved. The second detection unit 220 is located between the second center line O2 and the second bus bar 200 in the thickness direction DT. Consequently, in the thickness direction DT, the second detection unit 220 is away from the outside of the second core 210, and accordingly the magnetic force lines due to the disturbance magnetic field are less likely to pass through the second detection unit 220. Consequently, the second detection unit 220 is less susceptible to the influence of the disturbance magnetic field, and therefore accuracy of detection by the second detection unit 220 is improved. Furthermore, the third detection unit 320 is located between the third center line O3 and the third bus bar 300 in the thickness direction DT. Consequently, in the thickness direction DT, the third detection unit 320 is away from the outside of the third core 310, and accordingly the magnetic force lines due to the disturbance magnetic field are less likely to pass through the third detection unit 320. Consequently, the third detection unit 320 is less susceptible to the influence of the disturbance magnetic field, and therefore accuracy of detection by the third detection unit 320 is improved.

Thirteenth Embodiment

Figure 19:
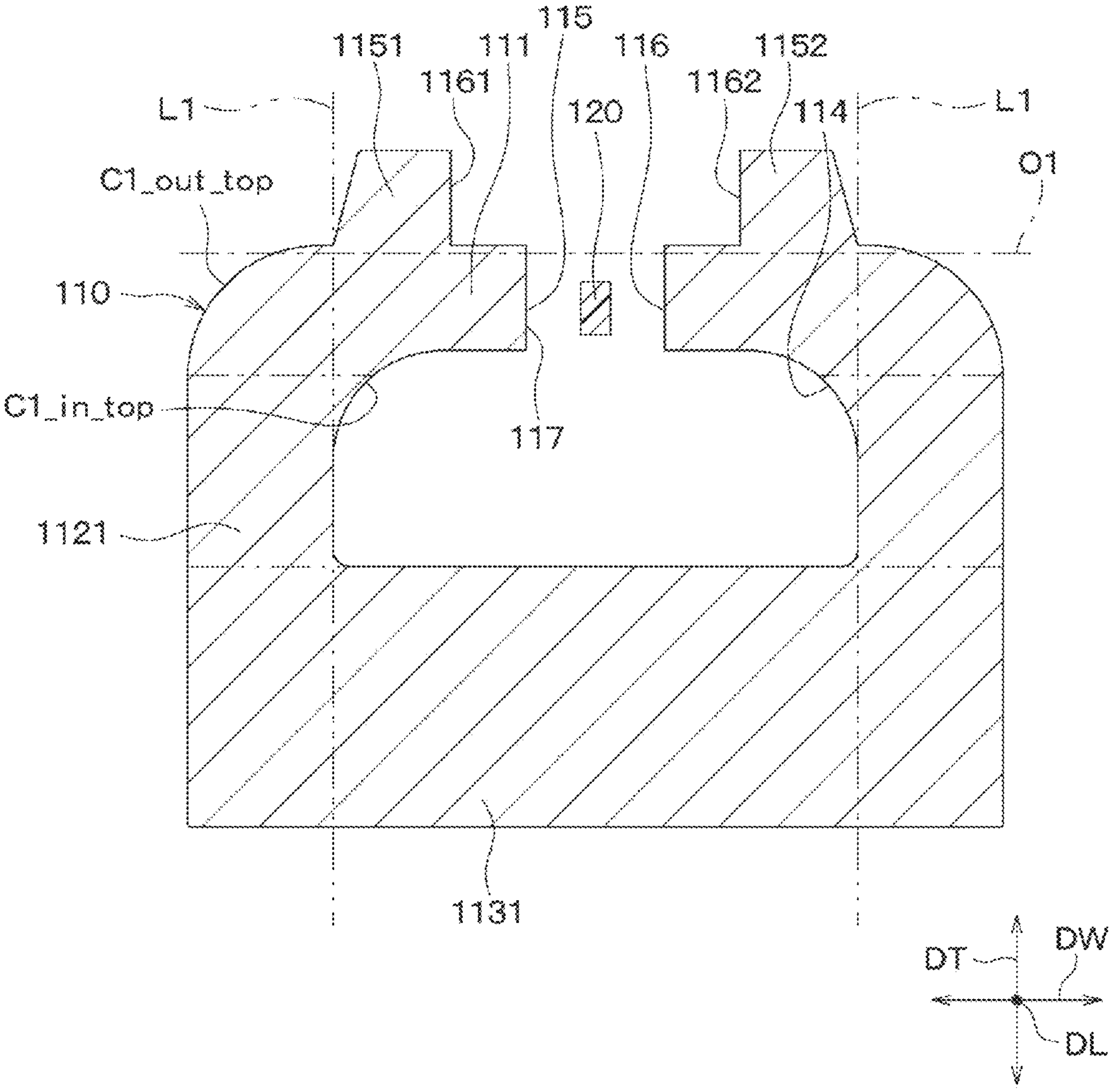
FIG. 19 is a cross-sectional view of the first core and the first detection unit in the current sensor in a thirteenth embodiment.
Figure 20:
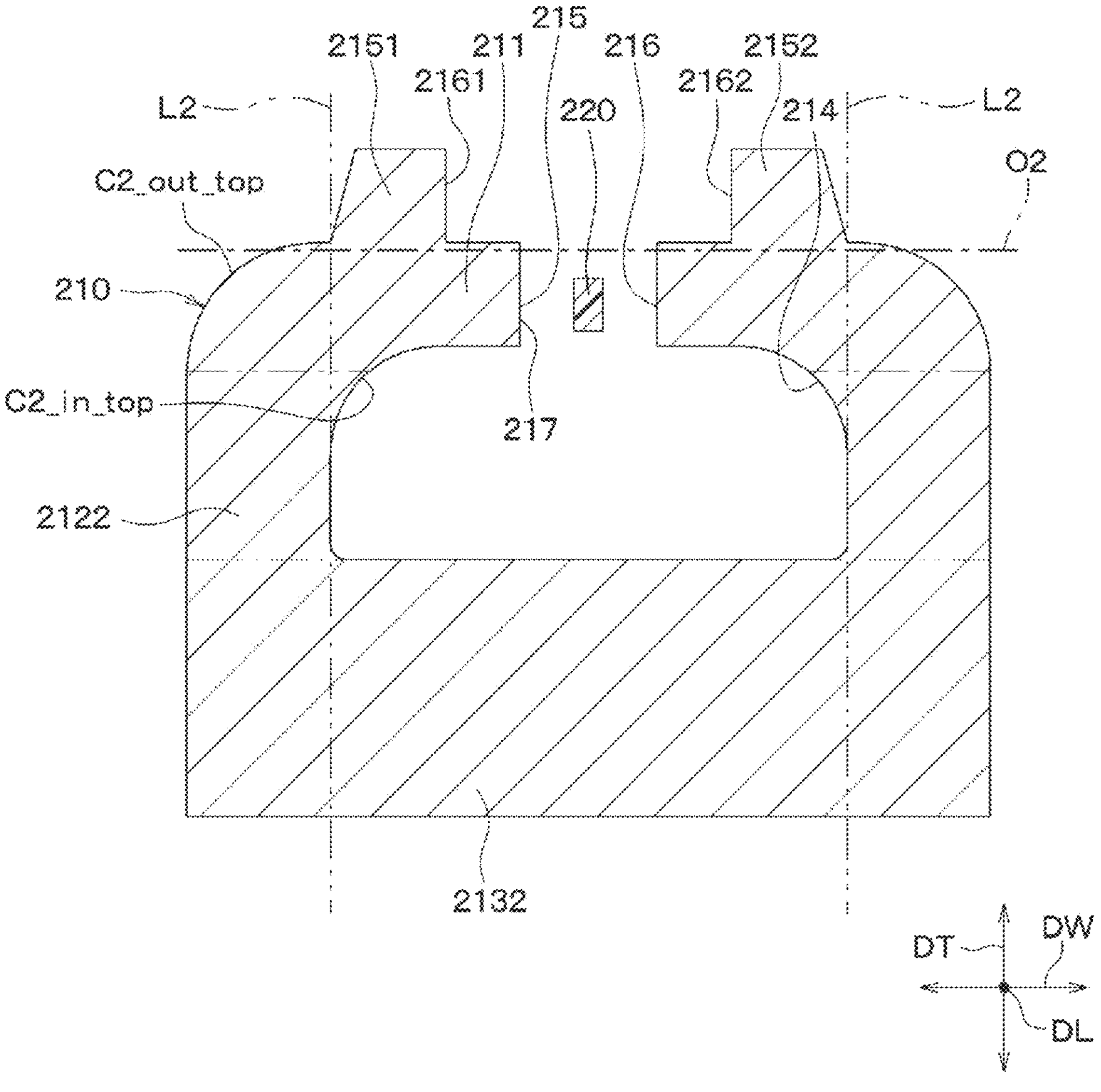
FIG. 20 is a cross-sectional view of the second core and the second detection unit in the current sensor.
Figure 21:
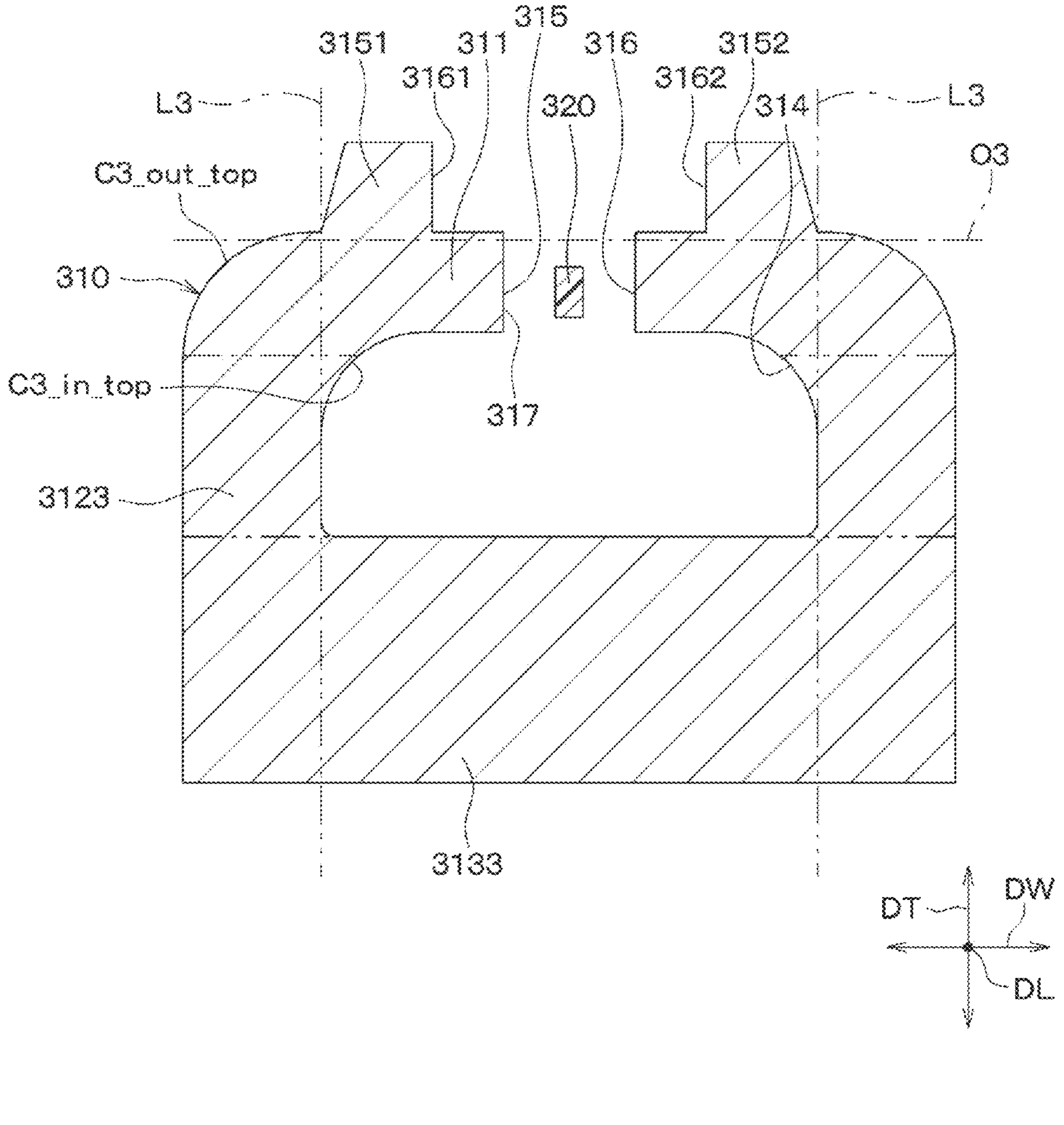
FIG. 21 is a cross-sectional view of the third core and the third detection unit in the current sensor.

In the thirteenth embodiment, as illustrated in FIGS. 19 to 21, the forms of the first protruding portion 1151, the second protruding portion 1152, the third protruding portion 2151, the fourth protruding portion 2152, the fifth protruding portion 3151 and the sixth protruding portion 3152 are different from those in the twelfth embodiment. The thirteenth embodiment is similar to the twelfth embodiment in other respects. Note that, in FIGS. 19 to 21, to avoid complication, illustration of the first bus bar 100, the second bus bar 200, the third bus bar 300, the case 70, and the like is omitted.

The first protruding surface 1161 and the second protruding surface 1162 are not connected to the first core end surface 115 and the second core end surface 116, but are connected to an outer surface of the first gap forming portion 111 facing outwardly in the thickness direction DT. The third protruding portion 2151 and the fourth protruding portion 2152 are not connected to the third core end surface 215 and the fourth core end surface 216, but are connected to an outer surface of the second gap forming portion 211 facing outwardly in the thickness direction DT. The fifth protruding portion 3151 and the sixth protruding portion 3152 are not connected to the fifth core end surface 315 and the sixth core end surface 316, but are connected to an outer surface of the third gap forming portion 311 facing outwardly in the thickness direction DT.

As described above, the current sensor 5 in the thirteenth embodiment is configured. In the thirteen embodiment also, the same effects as those achieved in the twelfth embodiment are achieved.

Fourteenth Embodiment

Figure 22:
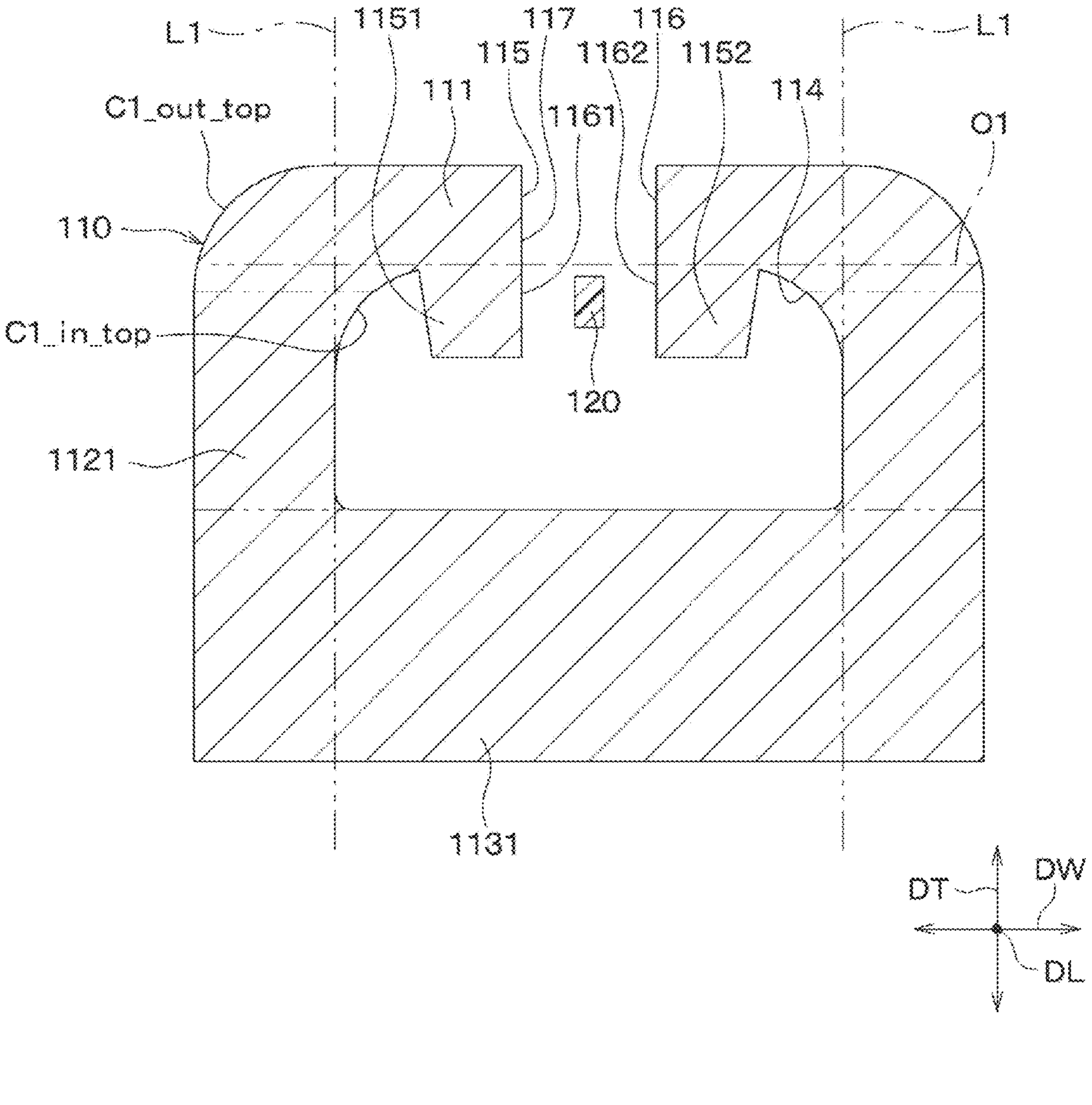
FIG. 22 is a cross-sectional view of the first core and the first detection unit in the current sensor in a fourteenth embodiment.
Figure 23:
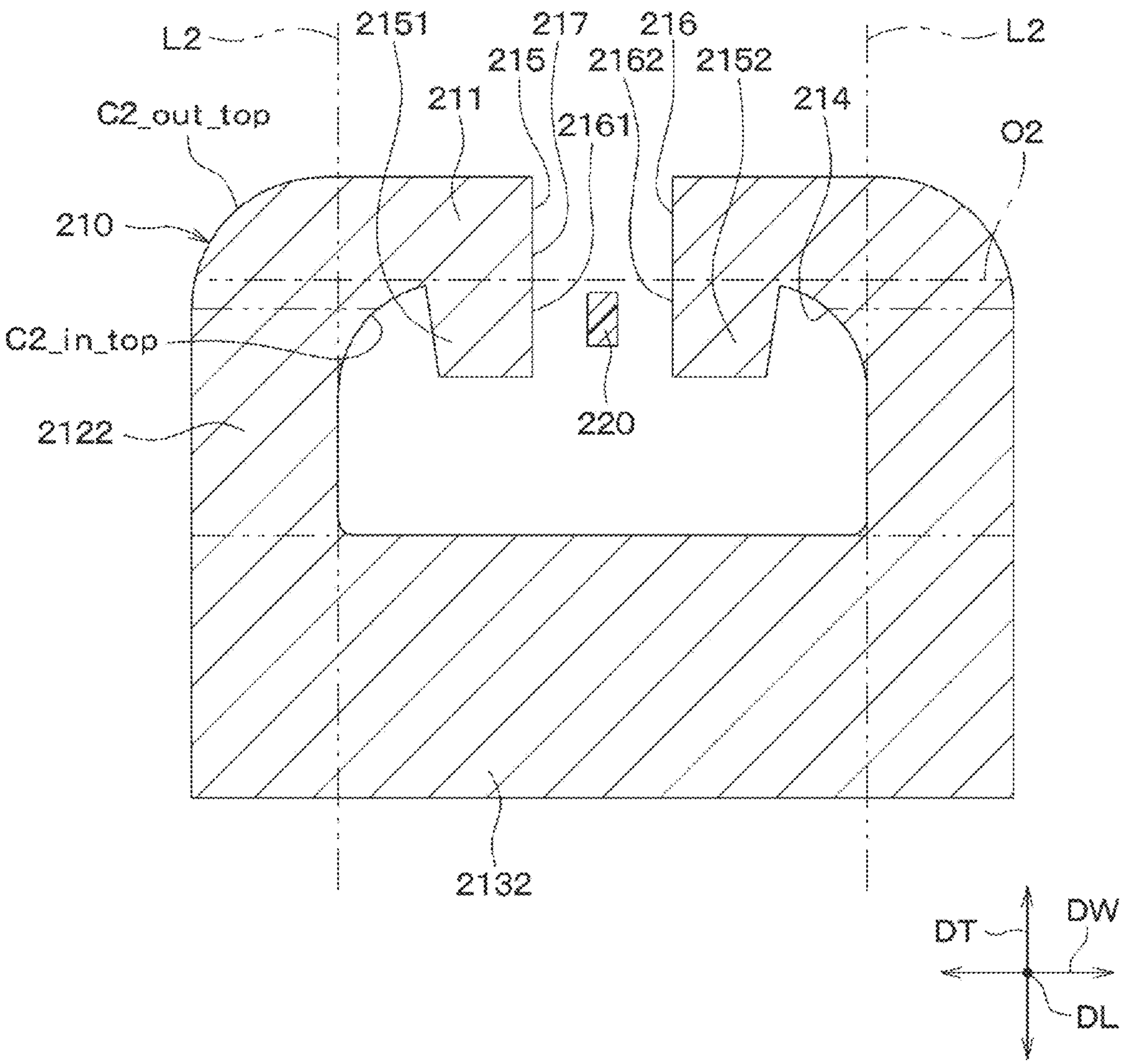
FIG. 23 is a cross-sectional view of the second core and the second detection unit in the current sensor.
Figure 24:
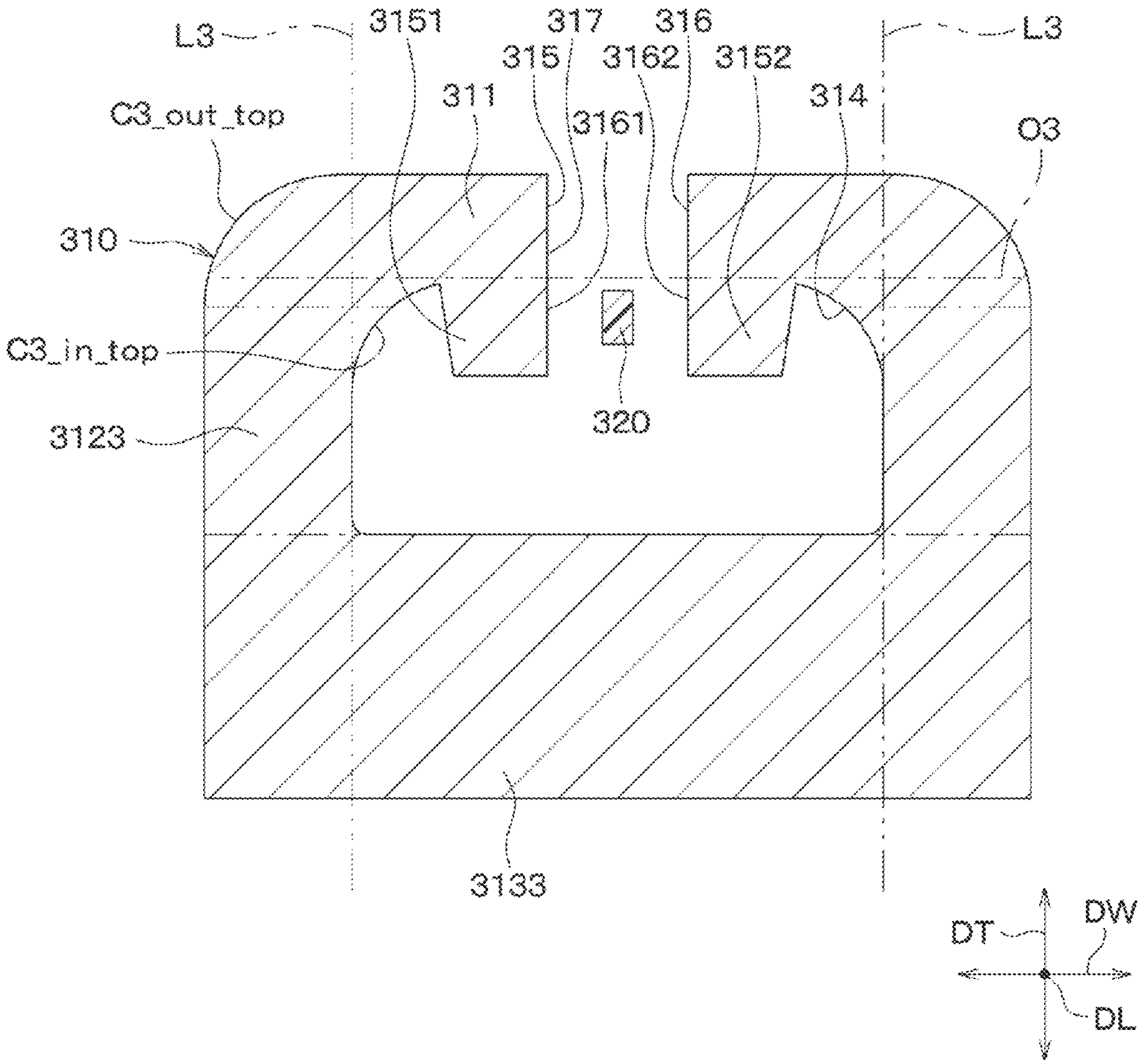
FIG. 24 is a cross-sectional view of the third core and the third detection unit in the current sensor.

In the fourteenth embodiment, as illustrated in FIGS. 22 to 24, the forms of the first protruding portion 1151, the second protruding portion 1152, the third protruding portion 2151, the fourth protruding portion 2152, the fifth protruding portion 3151 and the sixth protruding portion 3152 are different from those in the twelfth embodiment. The fourteenth embodiment is similar to the twelfth embodiment in other respects. Note that, in FIGS. 22 to 24, to avoid complication, illustration of the first bus bar 100, the second bus bar 200, the third bus bar 300, the case 70, and the like is omitted.

The first protruding portion 1151 and the second protruding portion 1152 protrude in the thickness direction DT from an inner surface of the first gap forming portion 111 facing inwardly in the thickness direction DT. The third protruding portion 2151 and the fourth protruding portion 2152 protrude in the thickness direction DT from an inner surface of the second gap forming portion 211 facing inwardly in the thickness direction DT. Furthermore, the fifth protruding portion 3151 and the sixth protruding portion 3152 protrude in the thickness direction DT from an inner surface of the third gap forming portion 311 facing inwardly in the thickness direction DT.

As described above, the current sensor 5 in the fourteenth embodiment is configured. In this case, the magnetic force lines due to the disturbance magnetic field are likely to pass through the first gap forming portion 111 without passing through the first protruding portion 1151 and the second protruding portion 1152 from the outside. The magnetic force lines due to the disturbance magnetic field are likely to pass through the second gap forming portion 211 without passing through the third protruding portion 2151 and the fourth protruding portion 2152 from the outside. The magnetic force lines due to the disturbance magnetic field are likely to pass through the third gap forming portion 311 without passing through the fifth protruding portion 3151 and the sixth protruding portion 3152. In the fourteenth embodiment also, the same effects as those achieved in the twelfth embodiment are achieved.

Fifteenth Embodiment

Figure 25:
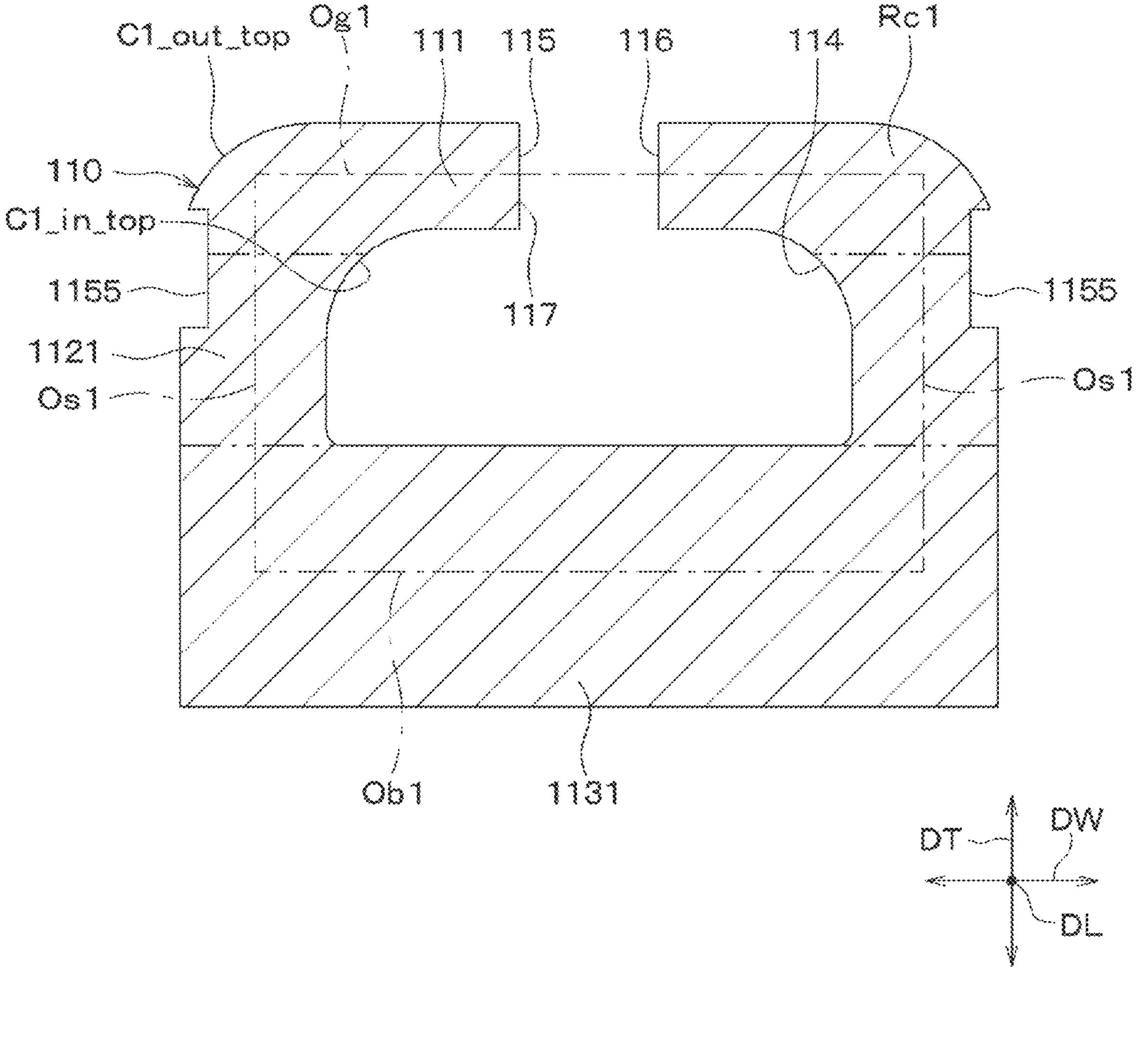
FIG. 25 is a cross-sectional view of the first core in the current sensor in a fifteenth embodiment.
Figure 26:
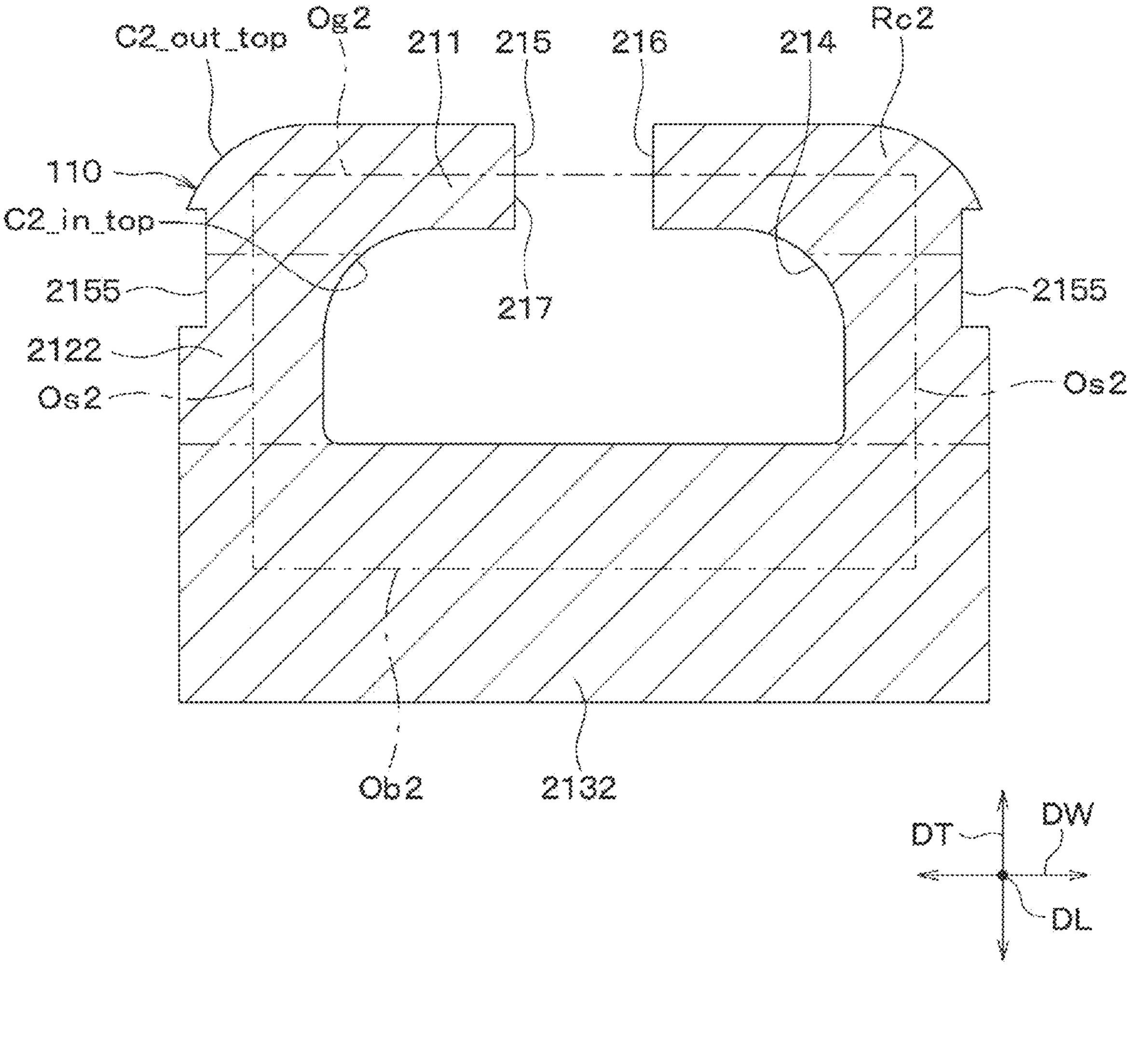
FIG. 26 is a cross-sectional view of the second core in the current sensor.
Figure 27:
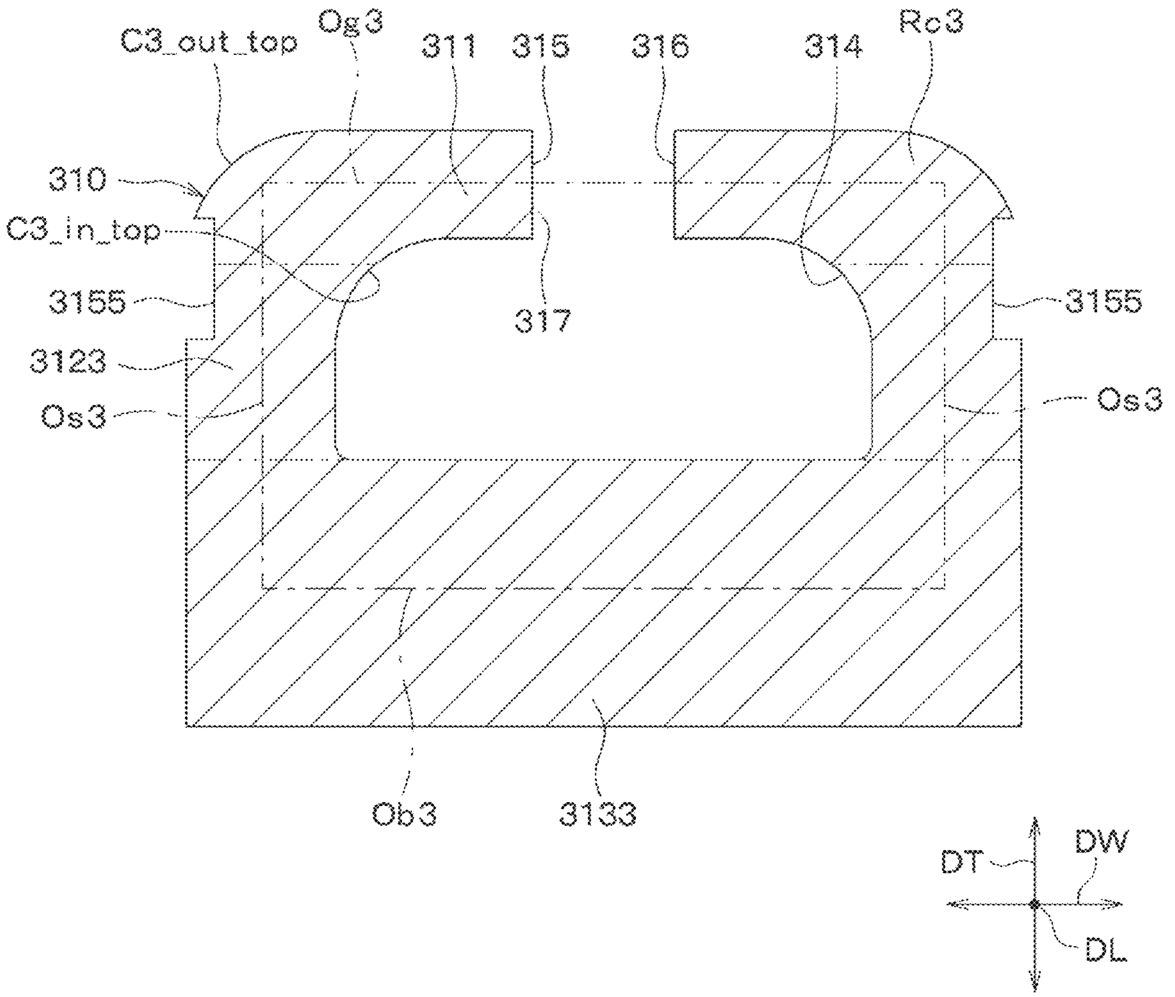
FIG. 27 is a cross-sectional view of the third core in the current sensor.

In the fifteenth embodiment, as illustrated in FIGS. 25 to 27, forms of the first core 110, the second core 210, and the third core 310 are different from those in the sixth embodiment. The fifteenth embodiment is similar to the sixth embodiment in other respects. Note that, in FIGS. 25 to 27, to avoid complication, illustration of the first bus bar 100, the second bus bar 200, the third bus bar 300, the first detection unit 120, the second detection unit 220, the third detection unit 320, the case 70, and the like is omitted.

As illustrated in FIG. 25, the first core 110 includes first core recessed portions 1155 in addition to the first gap forming portion 111, the first core lateral portions 1121, the first core bottom portion 1131, and the first core hole 114.

The first core recessed portions 1155 are recessed from outer edges of the first core 110 located externally in the width direction DW and the thickness direction DT toward an inner portion of the first core 110 in a cross section of the first core 110 when the first core 110 is cut in the direction perpendicular to the longitudinal direction DL. For example, the first core recessed portions 1155 are recessed, in the cross section, from the respective outer edges of the first gap forming portion 111 and the first core lateral portions 1121 located externally in the width direction DW toward the inner portion of the first core 110. Note that the first core recessed portions 1155, which are recessed from the outer edges of the first gap forming portion 111 and the first core lateral portions 1121 in the cross section, are not limited thereto. The first core recessed portions 1155 may also be recessed from outer edges of the first core bottom portion 1131 in the cross section. The number of the first core recessed portions 1155, which is 2, is not limited thereto, and needs only to be at least 1. Furthermore, a cross-sectional shape of each of the first core recessed portions 1155, which is a quadrilateral shape, is not limited thereto, and may also be, e.g., a polygonal shape, an arcuate shape, or the like.

As illustrated in FIG. 26, the second core 210 includes second core recessed portions 2155 in addition to the second gap forming portion 211, the second core lateral portions 2122, the second core bottom portion 2132, and the second core hole 214.

The second core recessed portions 2155 are recessed from outer edges of the second core 210 located externally in the width direction DW and the thickness direction DT toward an inner portion of the second core 210 in a cross section of the second core 210 when the second core 210 is cut in the direction perpendicular to the longitudinal direction DL. For example, the second core recessed portions 2155 are recessed, in the cross section, from the respective outer edges of the second gap forming portion 211 and the second core lateral portions 2122 located externally in the width direction DW toward the inner portion of the second core 210. Note that the second core recessed portions 2155, which are recessed from the outer edges of the second gap forming portion 211 and the second core lateral portions 2122 in the cross section, are not limited thereto. The second core recessed portions 2155 may also be recessed, in the cross section, from outer edges of the second core bottom portion 2132. The number of the second core recessed portions 2155, which is 2, is not limited thereto, and needs only to be at least 1. Furthermore, a cross-sectional shape of each of the second core recessed portions 2155, which is a quadrilateral shape, is not limited thereto, and may also be, e.g., a polygonal shape, an arcuate shape, or the like.

As illustrated in FIG. 27, the third core 310 includes third core recessed portions 3155 in addition to the third gap forming portion 311, the third core lateral portion 3123, the third core bottom portion 3133, and the third core hole 314.

The third core recessed portions 3155 are recessed from outer edges of the third core 310 located externally in the width direction DW and the thickness direction DT toward an inner portion of the third core 310 in a cross section of the third core 310 when the third core 310 is cut in the direction perpendicular to the longitudinal direction DL. For example, the third core recessed portions 3155 are recessed, in the cross section, from the respective outer edges of the third gap forming portion 311 and the third core lateral portions 3123 located externally in the width direction DW toward the inner portion of the third core 310. Note that the third core recessed portions 3155, which are recessed from the outer edges of the third gap forming portion 311 and the third core lateral portions 3123 in the cross section, are not limited thereto. The third core recessed portion 3155 may also be recessed, in the cross section, outer edges of the third bottom portion 3133. The number of the third core recessed portions 3155, which is 2, is not limited thereto, and needs only to be at least 1. Furthermore, a cross-sectional shape of each of the third core recessed portions 3155, which is a quadrilateral shape, is not limited thereto, and may also be, e.g., a polygonal shape, an arcuate shape, or the like.

As illustrated in FIG. 25, it is assumed herein that, in a cross section of the first core 110 when the first core 110 is cut in the direction perpendicular to the longitudinal direction DL, a line segment passing through a center of the first gap forming portion 111 in the thickness direction DT and extending in the width direction DW is a first gap center line segment Og1. It is also assumed that each of line segments passing through centers of the first core lateral portions 1121 in the width direction DW and extending in the thickness direction DT is a first lateral center line segment Os1. It is further assumed that a line segment passing through a center of the first core bottom portion 1131 in the thickness direction DT and extending in the width direction DW is a first bottom center line segment Ob1. In addition, the first gap center line segment Og1 is a line segment connecting the first lateral center line segments Os1 arranged in the width direction DW. Furthermore, each of the first lateral center line segments Os1 is a line segment connecting the first gap center line segment Og1 and the first bottom center line segment Ob1. Moreover, the first bottom center line segment Ob1 is a line segment connecting the first lateral center line segments Os1 arranged in the width direction DW. It is further assumed that a region outside the first gap center line segment Og1, the first lateral center line segments Os1, and the first bottom center line segment Ob1 is a first core region Rc1.

As illustrated in FIG. 26, it is assumed herein that, in a cross section of the second core 210 when the second core 210 is cut in the direction perpendicular to the longitudinal direction DL, a line segment passing through a center of the second gap forming portion 211 in the thickness direction DT and extending in the width direction DW is a second gap center line segment Og2. Furthermore, it is assumed that each of line segments passing through centers of the second core lateral portions 2122 in the width direction and extending in the thickness direction DT is a second lateral center line segment Os2. In addition, it is assumed that a line segment passing through a center of the second core bottom portion 2132 in the thickness direction DT and extending in the width direction DW is a second bottom center line segment Ob2. Furthermore, the second gap center line segment Og2 is a line segment connecting the second lateral center line segments Os2 arranged in the width direction DW. In addition, each of the second lateral center line segments Os2 is a line segment connecting the second gap center line segment Og2 and the second bottom center line segment Ob2. Furthermore, the second bottom center line segment Ob2 is a line segment connecting the second lateral center line segments Os2 arranged in the with direction DW. It is also assumed that a region outside the second gap center line segment Og2, the second lateral center line segments Os2, and the second bottom center line segment Ob2 is a second core region Rc2.

As illustrated in FIG. 27, it is assumed herein that, in a cross section of the third core 310 when the third core 310 is cut in the direction perpendicular to the longitudinal direction DL, a line segment passing through a center of the third gap forming portion 311 in the thickness direction DT and extending in the width direction DW is a third gap center line segment Og3. It is also assumed that each of line segments passing through centers of the third core lateral portions 3123 in the width direction DW and extending in the thickness direction DT is a third lateral center line segment Os3. It is further assumed that a line segment passing through a center of the third core bottom portion 3133 in the thickness direction and extending in the width direction DW is a third bottom center line segment Ob3. In addition, the third gap center line segment Og3 is a line segment connecting the third lateral center line segments Os3 arranged in the width direction DW. Furthermore, each of the third lateral center line segments Os3 is a line segment connecting the third gap center line segment Og3 and the third bottom center line segment Ob3. Moreover, the third bottom center line segment Ob3 is a line segment connecting the third lateral center line segments Os3 arranged in the width direction DW. It is further assumed that a region outside the third gap center line segment Og3, the third lateral center line segments Os3, and the third bottom center line segment Ob3 is a third core region Rc3.

The first core recessed portions 1155 are located in the first core region Rc1. The second core recessed portions 2155 are located in the second core region Rc2. The third core recessed portions 3155 are located in the third core region Rc3.

As described above, the current sensor 5 in the fifteenth embodiment is configured. In the fifteenth embodiment also, the same effects as those achieved in the sixth embodiment are achieved. In addition, the fifteenth embodiment also achieves effects described below.

[10-1] When mold injection of the case 70 or the like is performed, a stress is applied to each of the first core 110, the second core 210, and the third core 310. Accordingly, a crystal structure of each of the first core 110, the second core 210, and the third core 310 may be changed. This may deteriorate a magnetic property, such as a BH property, of each of the first core 110, the second core 210, and the third core 310, e.g., may reduce a size of the linear region of the magnetic flux density with respect to the strength of the magnetic field. Note that "B" in the BH property means the magnetic flux density. Meanwhile, "H" in the BH property means the magnetic field.

By contrast, the first core 110 includes the first core recessed portions 1155. The first core recessed portions 1155 are recessed from outer edges of the first core 110 located externally in the width direction DW and the thickness direction DT toward an inner portion of the first core 110 in a cross section of the first core 110 when the first core 110 is cut in the direction perpendicular to the longitudinal direction DL. This reduces the stress applied to the first core 110. As a result, the crystal structure of the first core 110 is inhibited from being changed, and consequently the deterioration of the magnetic property of the first core 110 is suppressed. The second core 210 includes the second core recessed portions 2155. The second core recessed portions 2155 are recessed from outer edges of the second core 210 located externally in the width direction DW and the thickness direction DT toward an inner portion of the second core 210 in a cross section of the second core 210 when the second core 210 is cut in the direction perpendicular to the longitudinal direction DL. This reduces the stress applied to the second core 210. As a result, the crystal structure of the second core 210 is inhibited from being changed, and consequently the deterioration of the magnetic property of the second core 210 is suppressed. The third core 310 includes the third core recessed portions 3155. The third core recessed portions 3155 are recessed from outer edges of the third core 310 located externally in the width direction DW and the thickness direction DT toward an inner portion of the third core 310 in a cross section of the third core 310 when the third core 310 is cut in the direction perpendicular to the longitudinal direction DL. This reduces the stress applied to the third core 310. As a result, the crystal structure of the third core 310 is inhibited from being changed, and consequently the deterioration of the magnetic property of the third core 310 is suppressed.

[10-2] When the magnetic force lines of the first core 110 are likely to pass through the inside of the first core 110, the first core recessed portions 1155 are located in the first core region Rc1. As a result, the position of each of the first core recessed portions 1155 corresponds to a position in the first core 110 where the magnetic force lines are less likely to pass therethrough, and consequently prevention of the passage of the magnetic force lines through the inside of the first core 110 by the first core recessed portion 1155 is suppressed. In addition, when the magnetic force lines of the second core 210 are likely to pass through the inside of the second core 210, the second core recessed portions 2155 are located in the second core region Rc2. As a result, the position of each of the second core recessed portions 2155 corresponds to a position in the second core 210 where the magnetic force lines are less likely to pass therethrough, and consequently prevention of the passage of the magnetic force lines through the second core 210 by the second core recessed portion 2155 is suppressed.

Furthermore, when the magnetic force lines of the third core 310 are likely to pass through the inside of the third core 310, the third core recessed portions 3155 are located in the third core region Rc3. As a result, the position of each of the third core recessed portions 3155 corresponds to a position in the third core 310 where the magnetic force lines are less likely to pass therethrough, and consequently prevention of the passage of the magnetic force lines through the inside of the third core 310 by the third core recessed portion 3155 is suppressed.

[10-3] The case 70 covers the first core 110, the second core 210, and the third core 310, while coming into contact with each of the first core recessed portions 1155, the second core recessed portions 2155, and the third core recessed portions 3155. Consequently, compared to a case where the first core recessed portions 1155, the second core recessed portions 2155, and third core recessed portions 3155 are not present, contact areas between the case 70 and the first core 110, between the case 70 and the second core 210, and between the case 70 and the third core 310 are increased. As a result, the case 70, the first core 110, the second core 210, and the third core 310 are more easily supported, and therefore deviation of relative positions of the first core 110, the second core 210, and the third core 310 with respect to the case 70 in the width direction DW and in the thickness direction DT is suppressed.

Sixteenth Embodiment

Figure 28:
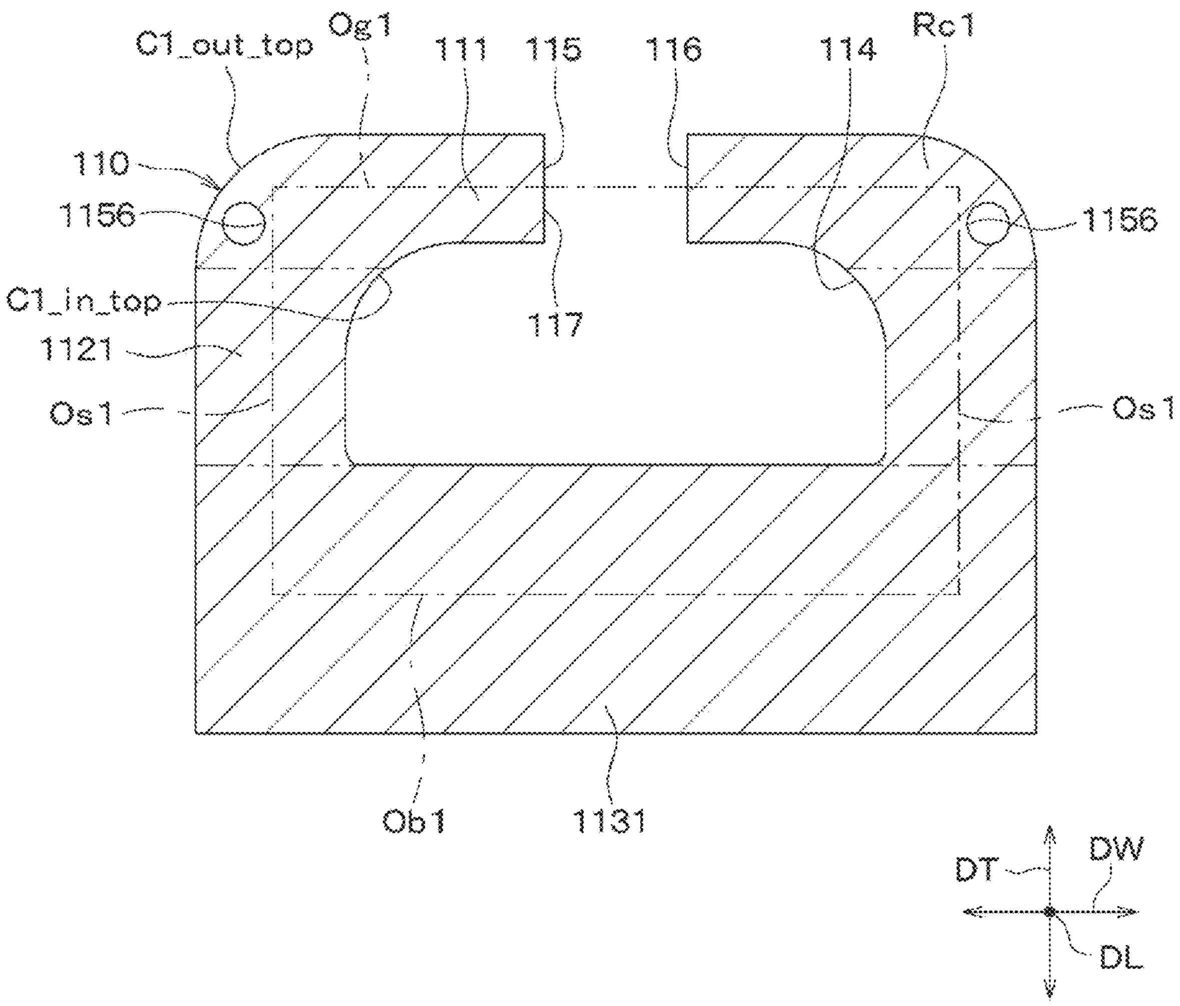
FIG. 28 is a cross-sectional view of the first core in the current sensor in a sixteenth embodiment.
Figure 29:
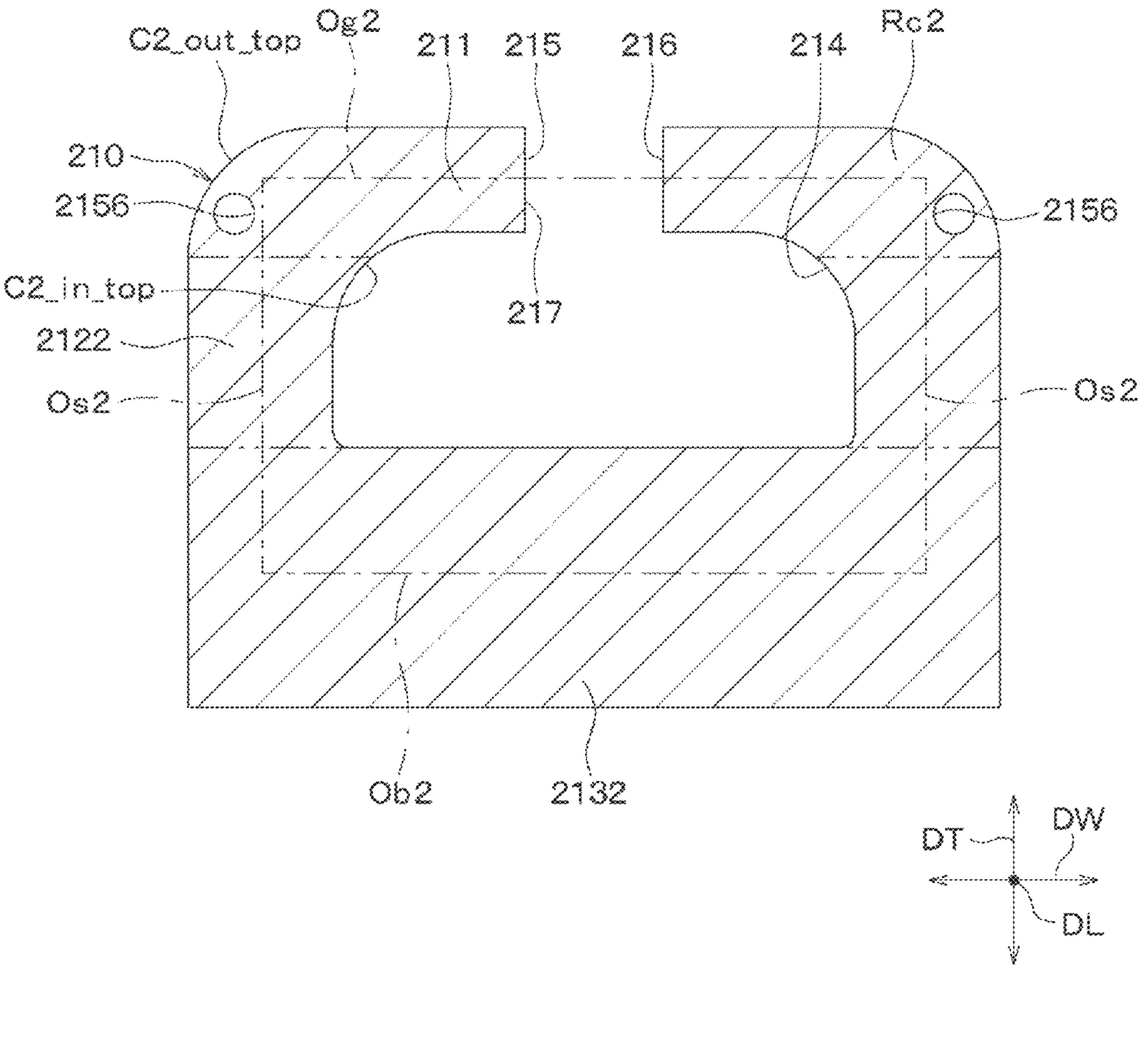
FIG. 29 is a cross-sectional view of the second core in the current sensor.
Figure 30:
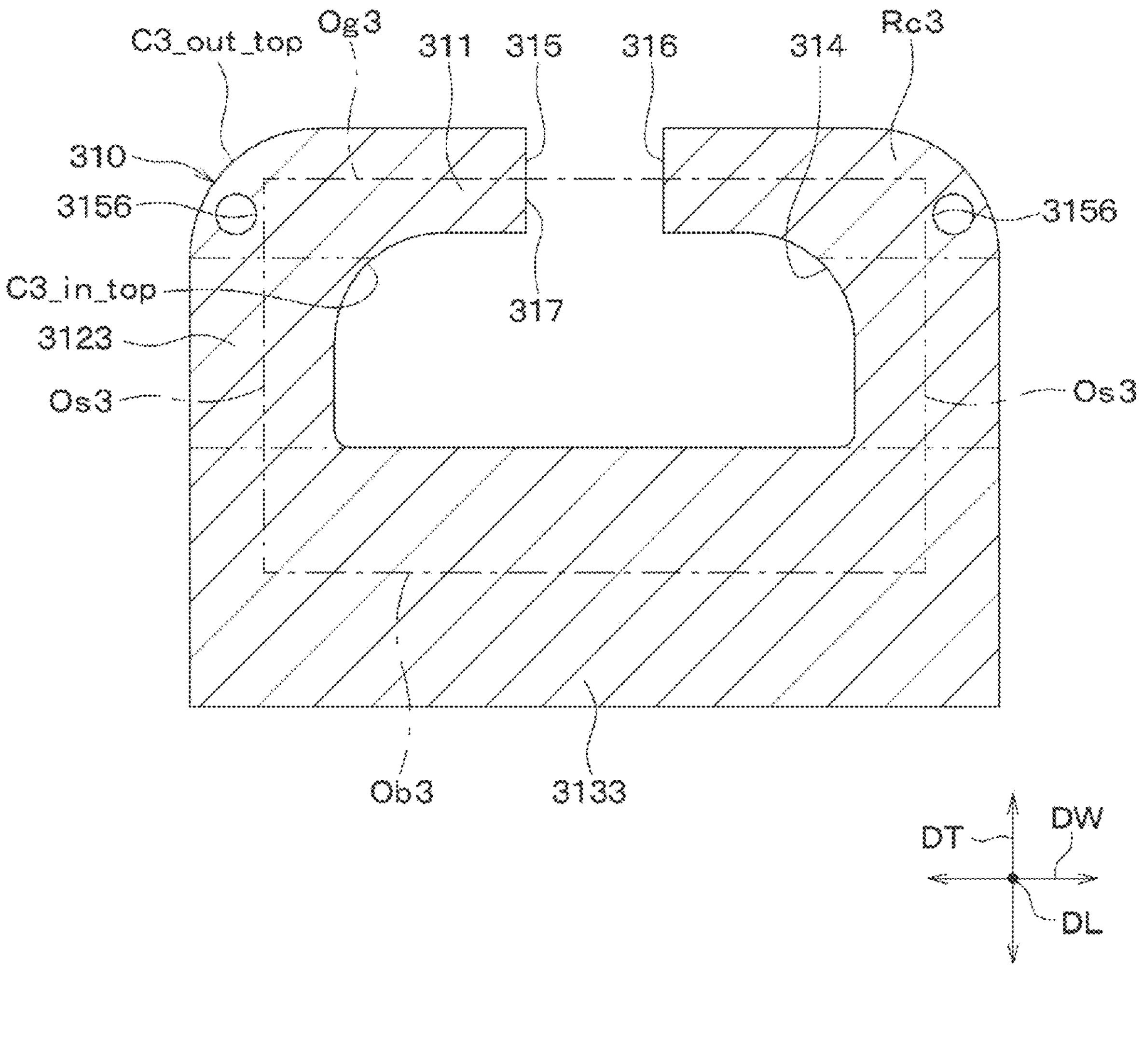
FIG. 30 is a cross-sectional view of the third core in the current sensor.

In the sixteenth embodiment, as illustrated in FIGS. 28 to 30, the first core 110 includes first core through holes 1156 instead of the first core recessed portions 1155. The second core 210 includes second core through holes 2156 instead of the second core recessed portion 2155. The third core 310 includes the third core through holes 3156 instead of the third core recessed portion 3155. The sixteenth embodiment is similar to the fifteenth embodiment in other respects. Note that, in FIGS. 28 to 30, to avoid complication, illustration of the first bus bar 100, the second bus bar 200, the third bus bar 300, the first detection unit 120, the second detection unit 220, the third detection unit 320, the case 70, and the like is omitted.

Each of the first core through holes 1156 extends therethrough in the longitudinal direction DL. In addition, each of the first core through holes 1156 is located in the first core region Rc1, and is formed in, e.g., the first gap forming portion 111. The first core through hole 1156, which is formed in the first gap forming portion 111, is not limited thereto. The first core through holes 1156 may also be formed in the first core lateral portions 1121 and in the first core bottom portion 1131. Furthermore, the number of the first core through holes 1156, which is 1, is not limited thereto, and may also be 2 or more. Additionally, a cross-sectional shape of each of the first core through holes 1156, which is a circular shape, is not limited thereto, and may also be a polygonal shape, an ellipsoidal shape, or the like.

Each of the second core through holes 2156 extends therethrough in the longitudinal direction DL. In addition, each of the second core through holes 2156 is located in the second core region Rc2, and is formed in, e.g., the second gap forming portion 211. The second core through hole 2156, which is formed in the second gap forming portion 211, is not limited thereto. The second core through holes 2156 may also be formed in the second core lateral portions 2122 and in the second core bottom portion 2132. Furthermore, the number of the second core through holes 2156, which is 1, is not limited thereto, and may also be 2 or more. Additionally, a cross-sectional shape of each of the second core through holes 2156, which is a circular shape, is not limited thereto, and may also be a polygonal shape, an ellipsoidal shape, or the like.

Each of the third core through holes 3156 extends therethrough in the longitudinal direction DL. In addition, each of the third core through holes 3156 is located in the third core region Rc3, and is formed in, e.g., the third gap forming portion 311. The third core through hole 3156, which is formed in the third gap forming portion 311, is not limited thereto. The third core through holes 3156 may also be formed in the third core lateral portions 3123 and in the third core bottom portion 3133. Furthermore, the number of the third core through holes 3156, which is 1, is not limited thereto, and may also be 2 or more. Additionally, a cross-sectional shape of each of the third core through holes 3156, which is a circular shape, is not limited thereto, and may also be a polygonal shape, an ellipsoidal shape, or the like.

As described above, the current sensor 5 in the sixteenth embodiment is configured. In the sixteenth embodiment also, the same effects as those achieved in the fifteenth embodiment are achieved.

Seventeenth Embodiment

Figure 31:
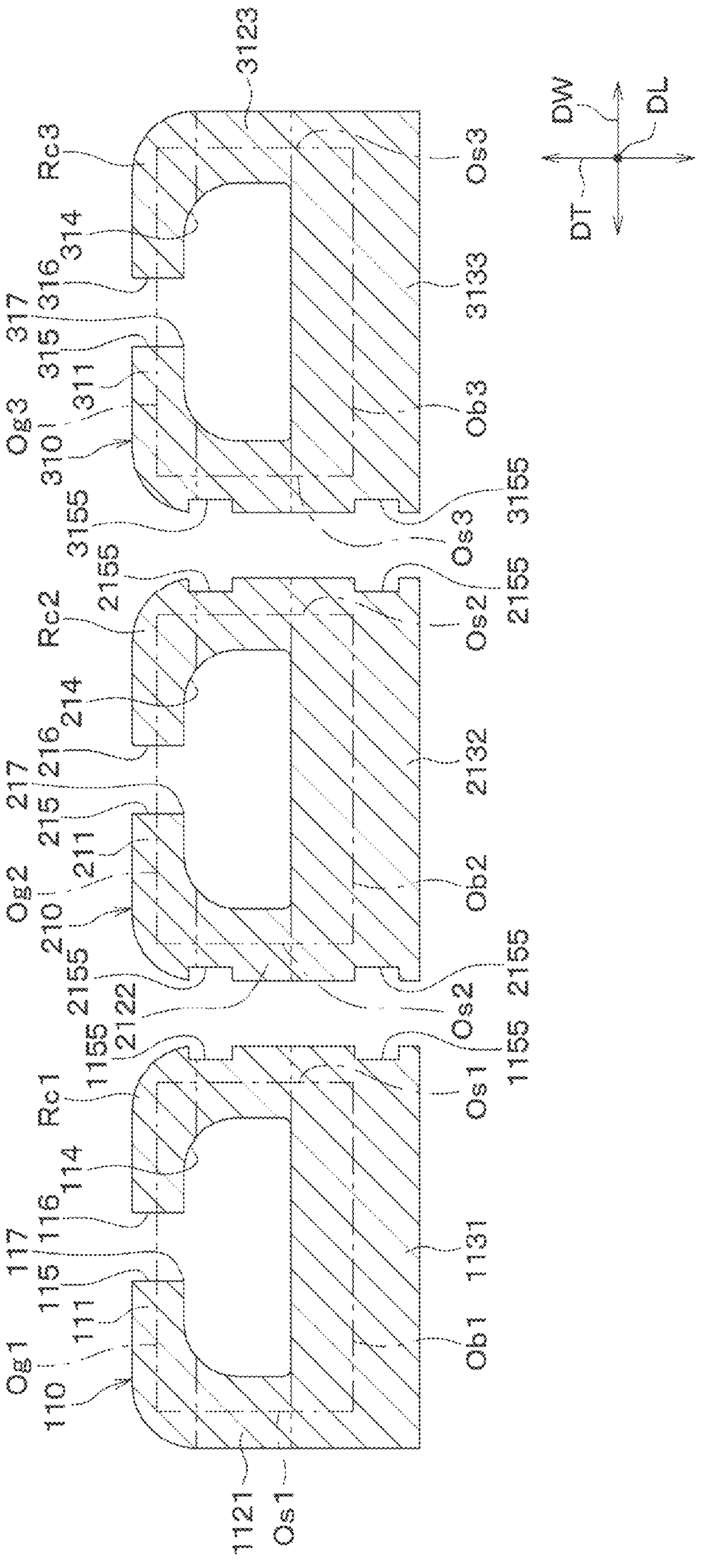
FIG. 31 is a cross-sectional view of the first core, second core and third core in the current sensor in a seventeenth embodiment.

In the seventeenth embodiment, as illustrated in FIG. 31, the forms of the first core recessed portions 1155, the second core recessed portions 2155, and third core recessed portions 3155 are different from those in the fifteenth embodiment. The seventeenth embodiment is similar to the fifteenth embodiment in other respects. Note that, in FIG. 31, to avoid complication, illustration of the first bus bar 100, the second bus bar 200, the third bus bar 300, the first detection unit 120, the second detection unit 220, the third detection unit 320, the case 70, and the like is omitted.

In a cross section of the first core 110 when the first core 110 is cut in the direction perpendicular to the longitudinal direction DL, the first core recessed portions 1155 are recessed from the outer edge of the first core 110 facing the second core 210 in the width direction DW toward the inner portion of the first core 110. Specifically, in the cross section, the first core recessed portions 1155 are recessed from respective outer edges of the first gap forming portion 111, the first core lateral portion 1121, and the first core bottom portion 1131 which face the second core 210 in the width direction DW toward the inner portion of the first core 110. The number of the first core recessed portions 1155, which is 2, is not limited thereto, and needs only to be at least 1. Furthermore, a cross-sectional shape of each of the first core recessed portions 1155, which is a quadrilateral shape, is not limited thereto, and may also be, e.g., a polygonal shape, an arcuate shape, or the like.

In a cross section of the second core 210 when the second core 210 is cut in the direction perpendicular to the longitudinal direction DL, the second core recessed portions 2155 are recessed from the outer edge of the first core 110 facing the second core 210 in the width direction DW toward the inner portion of the second core 210. Specifically, in the cross section, the second core recessed portions 2155 are recessed from respective outer edges of the second gap forming portion 211, the second core lateral portion 2122, and the second core bottom portion 2132 which face the first core 110 in the width direction DW toward the inner portion of the second core 210. Meanwhile, in the cross section, the second core recessed portions 2155 are recessed from the outer edge of the second core 210 facing the third core 310 in the width direction DW toward an inner portion of the second core 210. Specifically, in the cross section, the second core recessed portions 2155 are recessed from the respective outer edges of the second gap forming portion 211, the second core lateral portion 2122, and the second core bottom portion 2132 each facing the third core 310 in the width direction DW toward the inner portion of the second core 210. Note that the number of the second core recessed portions 2155, which is 4, is not limited thereto and it is only necessary for at least one, the second core recessed portion 2155 to be present on each of the first core 110 side and the third core 310 side. Furthermore, a cross-sectional shape of each of the second core recessed portions 2155, which is a quadrilateral shape, is not limited thereto, and may also be, e.g., a polygonal shape, an arcuate shape, or the like.

In a cross section of the third core 310 when the third core 310 is cut in the direction perpendicular to the longitudinal direction DL, the third core recessed portions 3155 are recessed from the outer edge of the third core 310 facing the second core 210 in the width direction DW toward the inner portion of the third core 310. Specifically, in the cross section, the third core recessed portions 3155 are recessed from the respective outer edges of the third gap forming portion 311, the third core lateral portion 3123, and the third core bottom portion 3133 each facing the second core 210 in the width direction DW toward the inner portion of the third core 310. The number of the third core recessed portions 3155, which is 2, is not limited thereto, and needs only to be at least 1. Furthermore, a cross-sectional shape of each of the third core recessed portions 3155, which is a quadrilateral shape, is not limited thereto, and may also be, e.g., a polygonal shape, an arcuate shape, or the like.

The first core recessed portions 1155 are located outside the first lateral center line segments Os1 in the width direction DW. The second core recessed portions 2155 are located outside the second lateral center line segments Os2 in the width direction DW. The third core recessed portions 3155 are located outside the third lateral center line segments Os3 in the width direction DW.

As described above, the current sensor 5 in the seventeenth embodiment is configured. In the seventeenth embodiment also, the same effects as those achieved in the fifteenth embodiment are achieved. In addition, the seventeenth embodiment also achieves effects described below.

[11] It can be considered herein that, to suppress magnetic saturation of each of the first core lateral portions 1121, the second core lateral portions 2122, and the third core lateral portions 3123, a length of each of the first core lateral portions 1121, the second core lateral portions 2122, and the third core lateral portions 3123 in the width direction DW is increased. At this time, when the first core 110, the second core 210, and the third core 310 are arranged in this order in the width direction DW, the cores adjacent to each other are likely to be closer to each other, and accordingly a magnetic resistance between the adjacent cores decreases. As a result, a magnetic path is likely to be formed between the adjacent cores, and consequently a magnetic resistance in the first core 110, the second core 210, and the third core 310 as a whole deteriorates. Accordingly, the magnetic flux density in each of the first core 110, the second core 210, and the third core 310 is likely to increase, and therefore magnetic saturation of each of the first core 110, the second core 210, and the third core 310 is likely to occur.

By contrast, the first core 110 includes the first core recessed portions 1155. In a cross section of the first core 110 when the first core 110 is cut in the direction perpendicular to the longitudinal direction DL, the first core recessed portions 1155 are recessed from the outer edge of the first core 110 facing the second core 210 in the width direction DW toward the inner portion of the first core 110. The second core 210 includes the second core recessed portions 2155. In a cross section of the second core 210 when the second core 210 is cut in the direction perpendicular to the longitudinal direction DL, the second core recessed portions 2155 are recessed from the outer edge of the second core 210 facing the first core 110 or the third core 310 in the width direction DW toward the inner portion of the second core 210. Furthermore, the third core 310 includes the third core recessed portions 3155. In a cross section of the third core 310 when the third core 310 is cut in the direction perpendicular to the longitudinal direction DL, the third core recessed portions 3155 are recessed from the outer edge of the third core 310 facing the second core 210 in the width direction DW toward the inner portion of the third core 310.

This increases maximum distances in the width direction DW between the first core 110 and the second core which are adjacent to each other and between the second core 210 and the third core 310 which are adjacent to each other. Accordingly, magnetic resistances between the first core 110 and the second core 210, which are adjacent to each other, and between the second core 210 and the third core 310, which are adjacent to each other, become high. Consequently, magnetic paths are less likely to be formed by the first core 110 and the second core 210, which are adjacent to each other, and by the second core 210 and the third core 310, which are adjacent to each other. This suppresses a reduction in magnetic resistance in the first core 110, the second core 210, and the third core 310 as a whole. As a result, the increased magnetic flux density of each of the first core 110, the second core 210, and the third core 310 is suppressed to suppress the magnetic saturation of each of the first core 110, the second core 210, and the third core 310.

Eighteenth Embodiment

Figure 32:
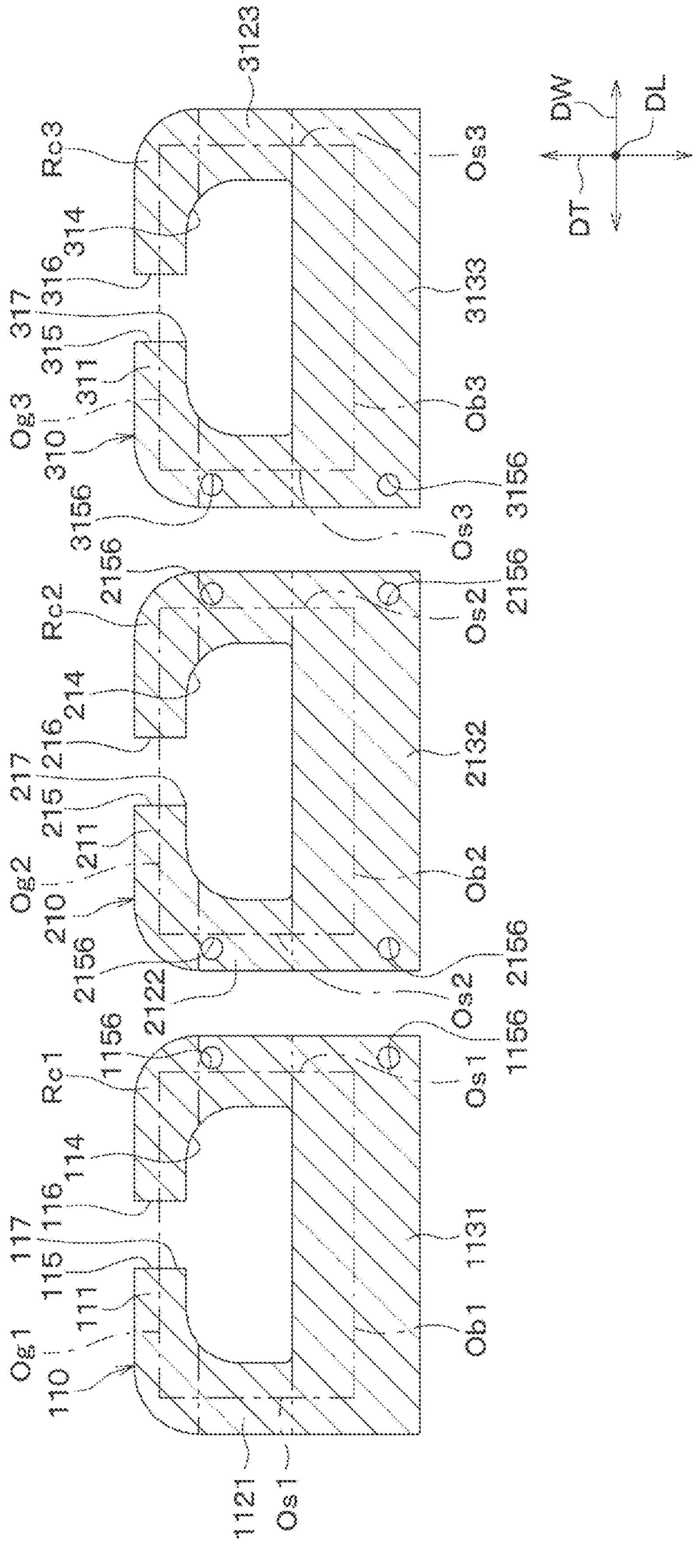
FIG. 32 is a cross-sectional view of the first core, second core and third core in the current sensor in an eighteenth embodiment.

In the eighteenth embodiment, as illustrated in FIG. 32, the first core 110 includes the first core through holes 1156, instead of the first core recessed portions 1155. The second core 210 includes the second core through holes 2156 instead of the second core recessed portion 2155. The third core 310 includes the third core through holes 3156 instead of the third core recessed portion 3155. The eighteenth embodiment is similar to the seventeenth embodiment in other respects. Note that, in FIG. 32, to avoid complication, illustration of the first bus bar 100, the second bus bar 200, the third bus bar 300, the first detection unit 120, the second detection unit 220, the third detection unit 320, the case 70, and the like is omitted.

Each of the first core through holes 1156 extends therethrough in the longitudinal direction DL. In addition, the first core through holes 1156 are located outside the first lateral center line segment Os1 in the width direction DW, and formed in the first core lateral portion 1121 and the first core bottom portion 1131 which face the second core 210 in the width direction DW. Note that the first core through holes 1156, which are formed in the first core lateral portion 1121 and the first core bottom portion 1131, are not limited thereto, and may also be formed in the first gap forming portion 111 facing the second core 210 in the width direction DW. The number of the first core through holes 1156, which is 2, is not limited thereto, and needs only to be at least 1. In addition, a cross-sectional shape of each of the first core through holes 1156, which is a circular shape, is not limited thereto, and may also be a polygonal shape, an ellipsoidal shape, or the like.

Each of the second core through holes 2156 extends therethrough in the longitudinal direction DL. In addition, the second core through holes 2156 are located outside the second lateral center line segment Os2 in the width direction DW, and formed in the second core lateral portion 111 and the second core bottom portion 2132 which face the first core 110 in the width direction DW. In addition, the second core through holes 2156 are located outside the second lateral center line segment Os2 in the width direction DW, and formed in the second core lateral portion 2122 and the second core bottom portion 2132 which face the third core 310 in the width direction DW. Note that the second core through holes 2156, which are formed in the second core lateral portions 2122 and the second core portion 2132, are not limited thereto. The second core through holes 2156 may also be formed in the second gap forming portion 211 facing the first core 110 in the width direction DW. The second core through holes 2156 may also be formed in the second gap forming portion 211 facing the third core 310 in the width direction DW. The number of the second core through holes 2156, which is 4, is not limited thereto, and it is only necessary for at least one, the second core recessed portion 2156 to be present on each of the first core 110 side and the third core 310 side. Additionally, a cross-sectional shape of each of the second core through holes 2156, which is a circular shape, is not limited thereto, and may also be a polygonal shape, an ellipsoidal shape, or the like.

Each of the third core through holes 3156 extends therethrough in the longitudinal direction DL. In addition, the third core through holes 3156 are located outside the third lateral center line segment Os3 in the width direction DW, and formed in the third core lateral portion 3123 and the third core bottom portion 3133 which face the second core 210 in the width direction DW. Note that the third core through holes 3156, which are formed in the third core lateral portion 3123 and the third core bottom portion 3133, are not limited thereto, and may also be formed in the third gap forming portion 311 facing the second core 210 in the width direction DW. The number of the third core through holes 3156, which is 2, is not limited thereto, and needs only to be at least 1. In addition, a cross-sectional shape of each of the third core through holes 3156, which is a circular shape, is not limited thereto, and may also be a polygonal shape, an ellipsoidal shape, or the like.

As described above, the current sensor 5 in the eighteenth embodiment is configured. In the eighteenth embodiment also, the same effects as those achieved in the seventeenth embodiment are achieved.

Nineteenth Embodiment

In the nineteenth embodiment, a form obtained by combining the fifteenth embodiment and the seventeenth embodiment is provided.

Figure 33:
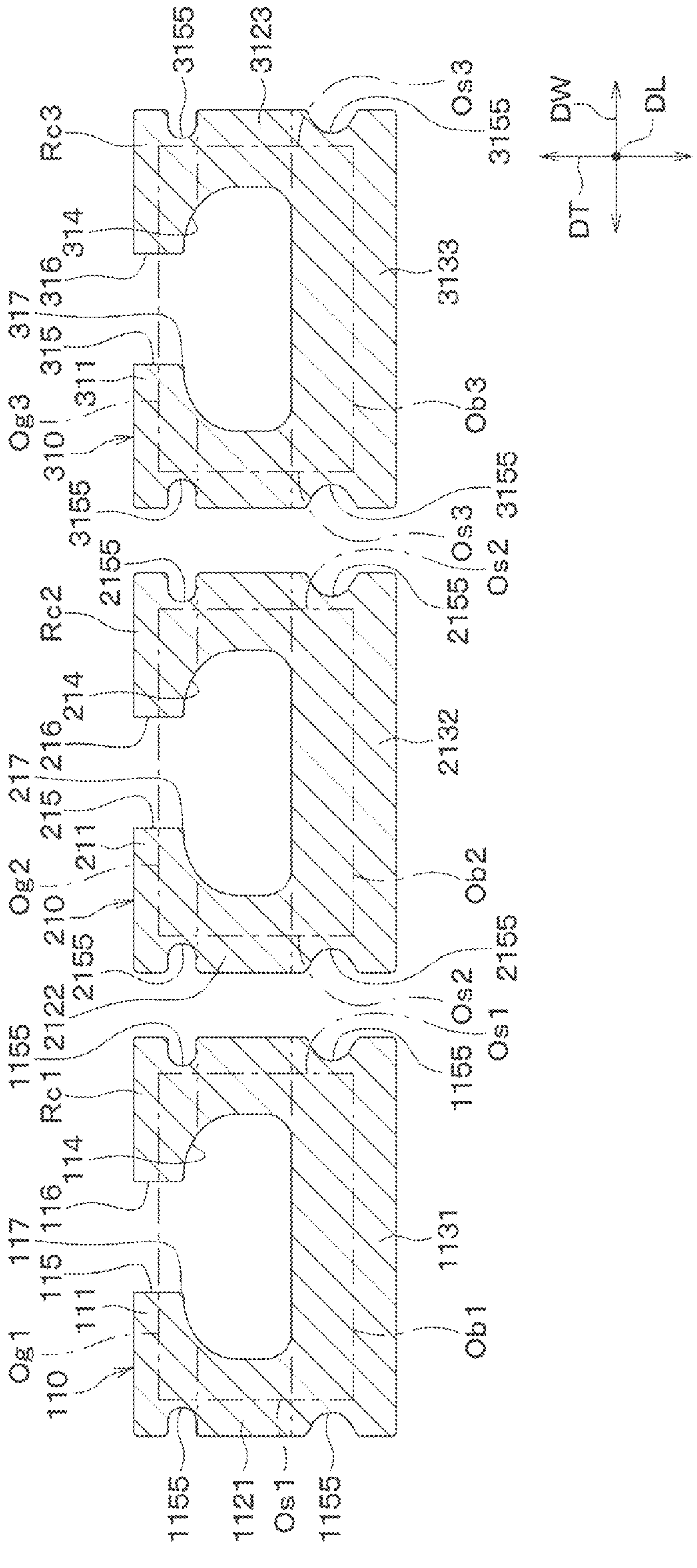
FIG. 33 is a cross-sectional view of the first core, second core and third core in the current sensor in a nineteenth embodiment.

Specifically, as illustrated in FIG. 33, the first core 110 includes the first core recessed portions 1155 in addition to the first gap forming portion 111, the first core lateral portions 1121, the first core bottom portion 1131, and the first core hole 114. Note that, in FIG. 33, to avoid complication, illustration of the first bus bar 100, the second bus bar 200, the third bus bar 300, the first detection unit 120, the second detection unit 220, the third detection unit 320, the case 70, and the like is omitted.

In a cross section of the first core 110 when the first core 110 is cut in the direction perpendicular to the longitudinal direction DL, the first core recessed portions 1155 are recessed from the outer edges of the first gap forming portion 111 and the first core lateral portions 1121 which are located externally in the width direction DW. The first core recessed portions 1155 are located outside the first lateral center line segments Os1 in the width direction DW. In addition, the cross-sectional shape of each of the first core recessed portions 1155 is an arcuate shape. The cross-sectional shape of the first core recessed portion 1155, which is the arcuate shape, is not limited thereto, and may also be, e.g., a polygonal shape or the like.

The second core 210 includes the second core recessed portions 2155 in addition to the second gap forming portion 211, the second core lateral portions 2122, the second core bottom portion 2132, and the second core hole 214.

In a cross section of the second core 210 when the second core 210 is cut in the direction perpendicular to the longitudinal direction DL, the second core recessed portions 2155 are recessed from the outer edges of the second gap forming portion 211 and the second core lateral portions 2122 which are located externally in the width direction DW. The second core recessed portions 2155 are located outside the second lateral center line segments Os2 in the width direction DW. In addition, the cross-sectional shape of each of the second core recessed portions 2155 is the arcuate shape. The cross-sectional shape of the second core recessed portion 2155, which is the arcuate shape, is not limited thereto, and may also be, e.g., a polygonal shape or the like.

The third core 310 includes the third core recessed portions 3155 in addition to the third gap forming portion 311, the third core lateral portion 3123, the third core bottom portion 3133, and the third core hole 314.

In a cross section of the third core 310 when the third core 310 is cut in the direction perpendicular to the longitudinal direction DL, the third core recessed portions 3155 are recessed from the outer edges of the third gap forming portion 311 and the third core lateral portions 3123 which are located externally in the width direction DW. The third core recessed portions 3155 are located outside the third lateral center line segments Os3 in the width direction DW. In addition, the cross-sectional shape of each of the third core recessed portions 3155 is the arcuate shape. The cross-sectional shape of the third core recessed portion 3155, which is the arcuate shape, is not limited thereto, and may also be, e.g., a polygonal shape or the like.

The first core 110, the second core 210, and the third core 310 are formed in the same shape. The second core 210 is located between the first core 110 and the third core 310 in the width direction DW. When the second core recessed portions 2155 on the first core 110 side are projected in the width direction DW, the first core recessed portions 1155 on the second core 210 side overlap the projected second core recessed portions 2155. When the second core recessed portions 2155 on the third core 310 side are projected in the width direction DW, the third core recessed portions 3155 on the second core 210 side overlap the projected second core recessed portions 2155. As a result, compared to a case where there is no overlap therebetween, maximum distances in the width direction DW between the first core 110 and the second core 210 which are adjacent to each other and between the second core 210 and the third core 310 adjacent to each other are increased Accordingly, magnetic resistances between the first core 110 and the second core 210, which are adjacent to each other, and between the second core 210 and the third core 310, which are adjacent to each other, become high. Consequently, magnetic paths are less likely to be formed by the first core 110 and the second core 210, which are adjacent to each other, and by the second core 210 and the third core 310, which are adjacent to each other. This suppresses a reduction in magnetic resistance in the first core 110, the second core 210, and the third core 310 as a whole. As a result, the increased magnetic flux density of each of the first core 110, the second core 210, and the third core 310 is suppressed to suppress the magnetic saturation of each of the first core 110, the second core 210, and the third core 310.

As described above, the current sensor 5 in the nineteenth embodiment is configured. In the nineteenth embodiment also, the same effects as those achieved in the fifteenth and seventeenth embodiments are achieved. In addition, the nineteenth embodiment also achieves effects described below.

[12] The first core 110, the second core 210, and the third core 310 are formed in the same shape.

Consequently, when the current sensor 5 is produced, the first core 110, the second core 210, and the third core 310 are more easily produced. This allows the current sensor 5 to be more easily produced.

Twentieth Embodiment

A twentieth embodiment is in a form obtained by combining the sixteenth embodiment with the eighteenth embodiment.

Figure 34:
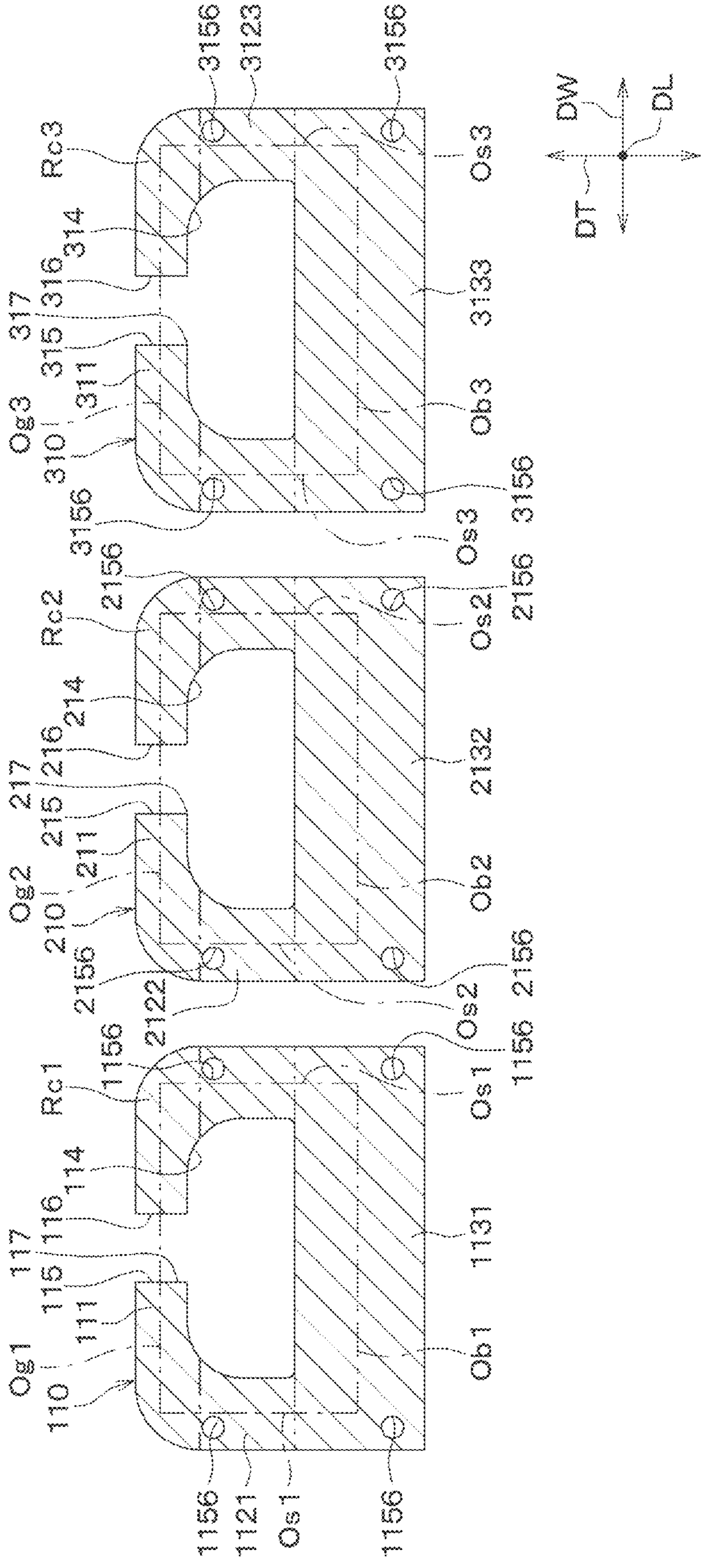
FIG. 34 is a cross-sectional view of the first core, second core and third core in the current sensor in a twentieth embodiment.

Specifically, as illustrated in FIG. 34, the first core 110 includes the first core through holes 1156 instead of the first core recessed portions 1155. Each of the first core through holes 1156 extends therethrough in the longitudinal direction DL. In addition, the first core through holes 1156 are located outside the first lateral center line segments Os1 in the width direction DW. In addition, a cross-sectional shape of each of the first core through holes 1156, which is a circular shape, is not limited thereto, and may also be a polygonal shape, an ellipsoidal shape, or the like. Note that, in FIG. 34, to avoid complication, illustration of the first bus bar 100, the second bus bar 200, the third bus bar 300, the first detection unit 120, the second detection unit 220, the third detection unit 320, the case 70, and the like is omitted.

The second core 210 includes the second core through holes 2156 instead of the second core recessed portion 2155. Each of the second core through holes 2156 extends therethrough in the longitudinal direction DL. In addition, the second core through holes 2156 are located outside the second lateral center line segments Os2 in the width direction DW. The cross-sectional shape of each of the second core through holes 2156, which is the circular shape, is not limited thereto, and may also be a polygonal shape, an ellipsoidal shape, or the like.

The third core 310 includes the third core through holes 3156 instead of the third core recessed portion 3155. Each of the third core through holes 3156 extends therethrough in the longitudinal direction DL. In addition, the third core through holes 3156 are located outside the third lateral center line segments Os3 in the width direction DW. In addition, a cross-sectional shape of each of the third core through holes 3156, which is a circular shape, is not limited thereto, and may also be a polygonal shape, an ellipsoidal shape, or the like.

The first core 110, the second core 210, and the third core 310 are formed in the same shape. The second core 210 is located between the first core 110 and the third core 310 in the width direction DW. When the second core through holes 2156 on the first core 110 side are projected in the width direction DW, the first core through holes 1156 on the second core 210 side overlap the projected second through holes 2156. When the second core through holes 2156 on the third core 310 side are projected in the width direction DW, the third core through holes 3156 on the second core 210 side overlap the projected second through holes 2156.

As described above, the current sensor 5 in the twentieth embodiment is configured. In the twentieth embodiment also, the same effects as those achieved in the sixteenth and eighteenth embodiments are achieved. In the twentieth embodiment, the first core 110, the second core 210, and the third core 310 are formed in the same shape.

As a result, as described above, when the current sensor 5 is produced, the first core 110, the second core 210, and the third core 310 are more easily produced. This allows the current sensor 5 to be more easily produced.

Twenty-First Embodiment

In the twenty-first embodiment, as illustrated in FIGS. 35 to 43, the forms of the first protruding portion 731, the second protruding portion 732 and the third protruding portion 733 are different from those in the sixth embodiment. Additionally, in the twenty-first embodiment, the first recessed portion 118, the second recessed portion 218, and the third recessed portion 318 are not formed. The twenty-first embodiment is similar to the sixth embodiment in other respects.

Figure 35:
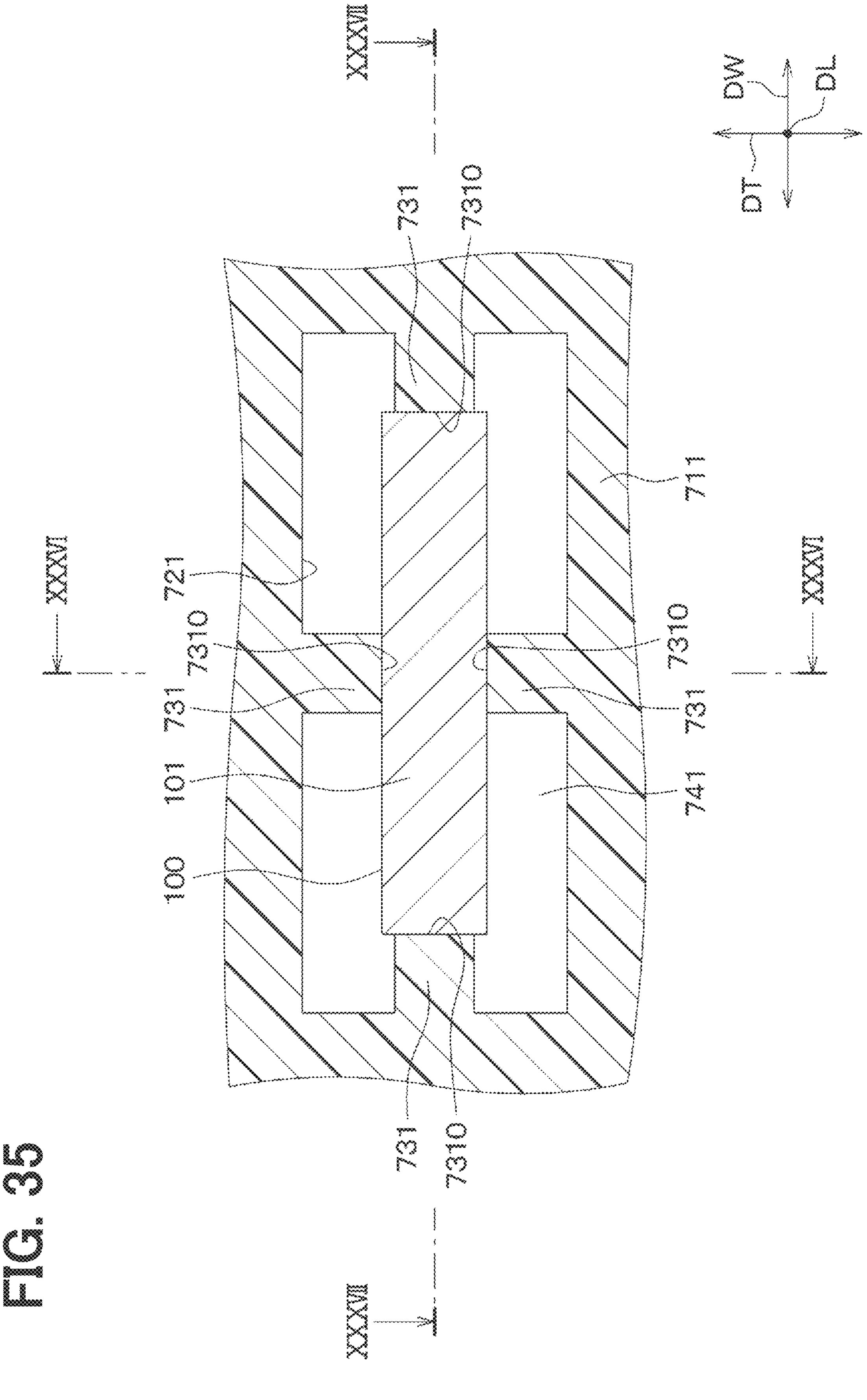
FIG. 35 is a cross-sectional view of the first plate portion of the first bus bar and the first opening portion of the case in the current sensor according to a twenty-first embodiment.
Figure 36:
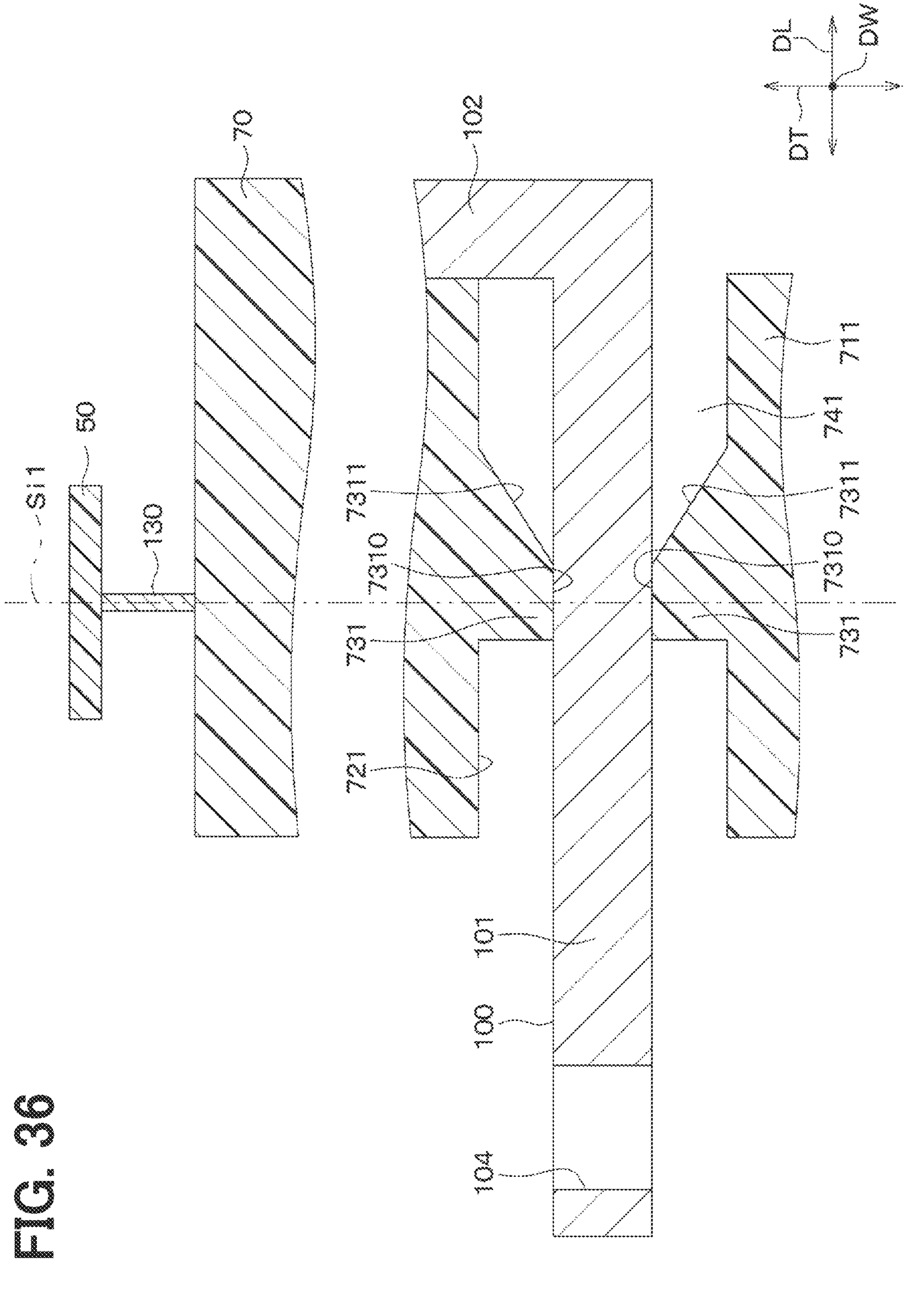
FIG. 36 is a cross-sectional view along a line XXXVI-XXXVI in FIG. 35.
Figure 37:
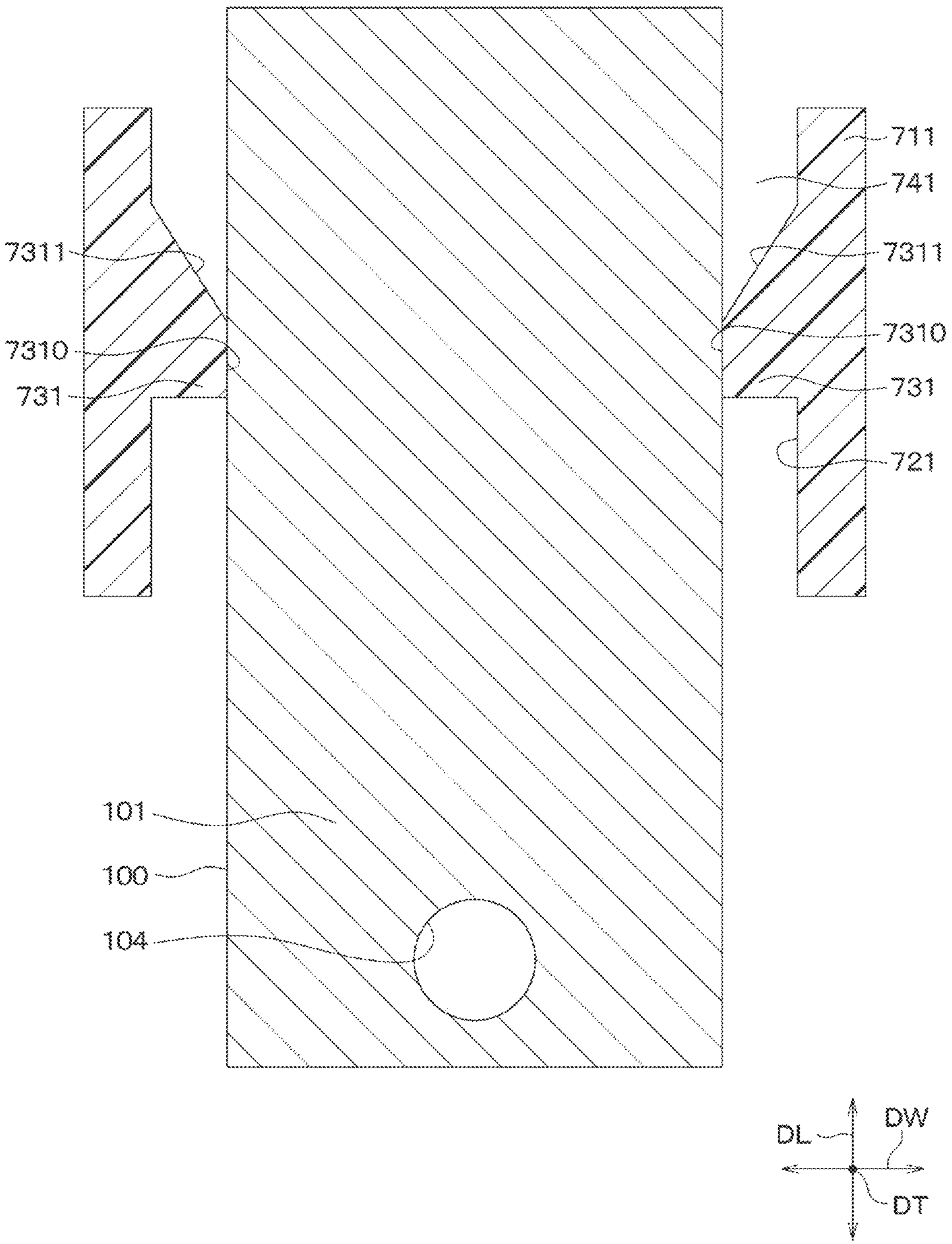
FIG. 37 is a cross-sectional view along a line XXXVII-XXXVII in FIG. 35.

As illustrated in FIG. 35, the first protruding portions 731 protrude from the first facing surfaces 721 in the thickness direction DT and in the width direction DW. As illustrated in FIGS. 36 and 37, each of the first protruding portions 731 includes a first contact surface 7310 and a first-protruding-portion inclined surface 7311.

The first contact surface 7310 is in contact with the first plate portion 101. The first-protruding-portion inclined surface 7311 is connected to a side of the first contact surface 7310 which is opposite to the first bolt hole 104, which is the first extending portion 102 side herein. In addition, the first-protruding-portion inclined surface 7311 is inclined in a direction in which a size of a space in the first opening portion 711 increases with distance from a boundary portion between the first-protruding-portion inclined surface 7311 and the first contact surface 7310. Consequently, the first-protruding-portion inclined surface 7311 is formed in a tapered shape.

Figure 38:
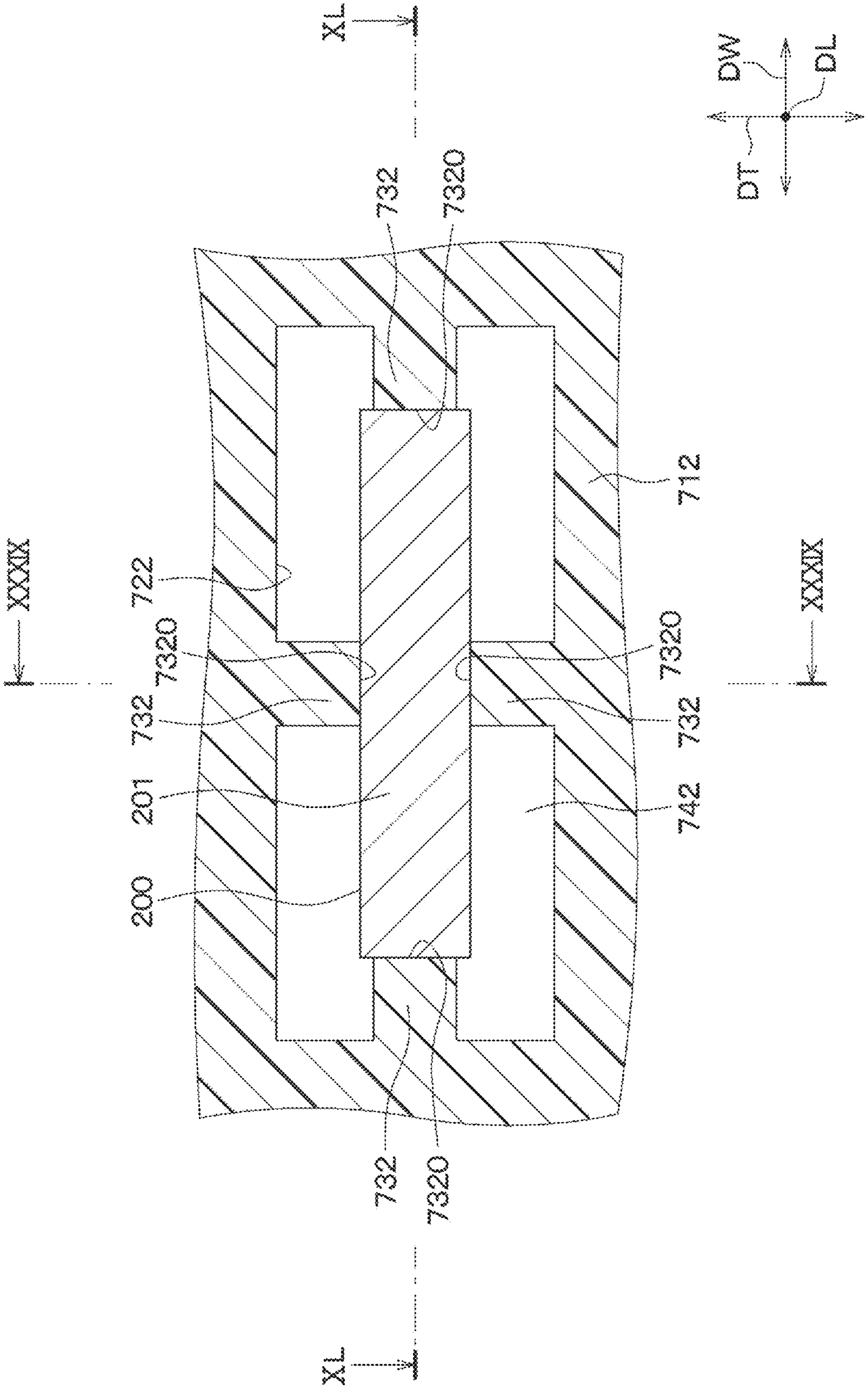
FIG. 38 is a cross-sectional view of the second plate portion of the second bus bar and the second opening portion of the case in the current sensor.
Figure 39:
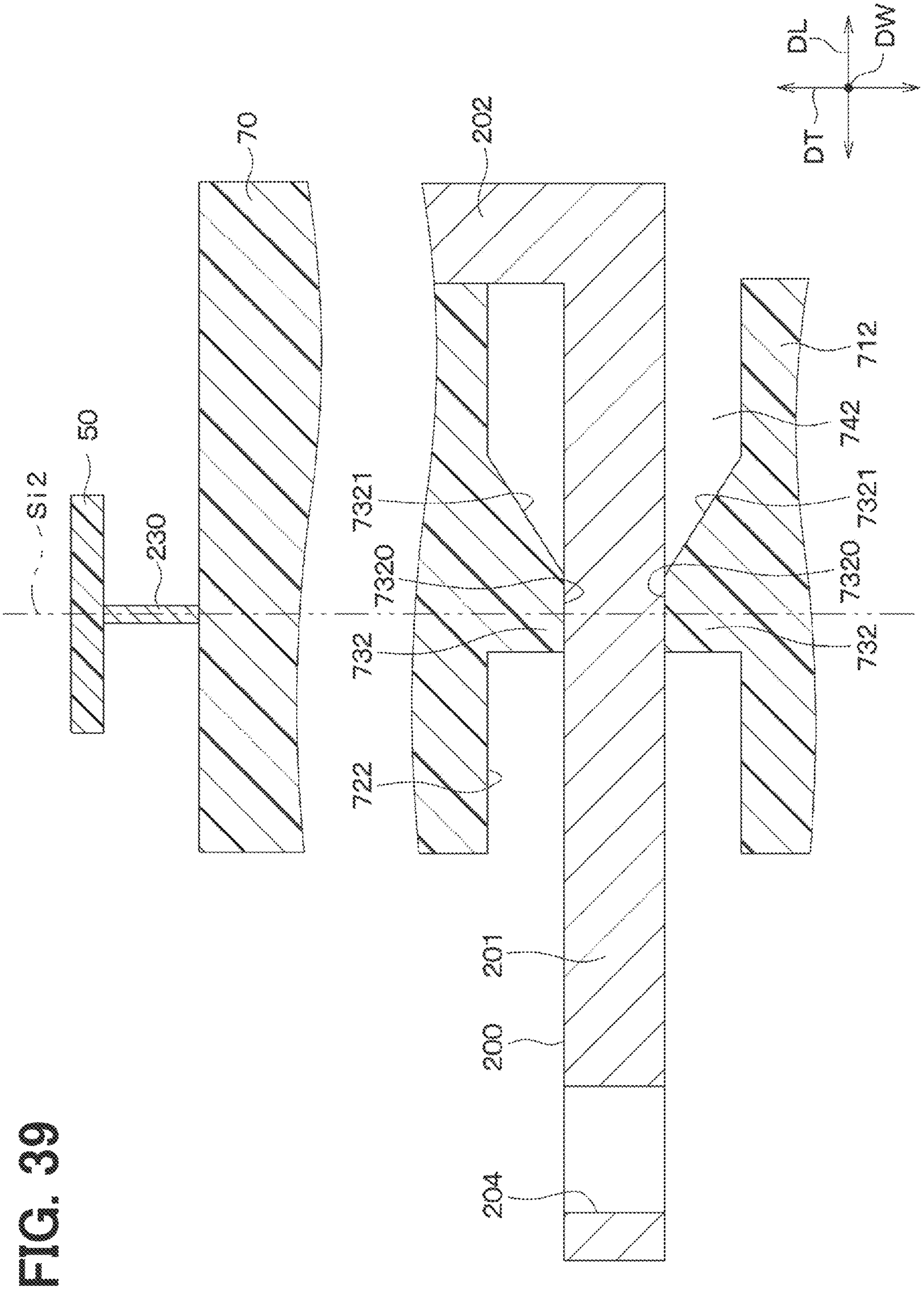
FIG. 39 is a cross-sectional view along a line XXXIX-XXXIX in FIG. 38.
Figure 40:
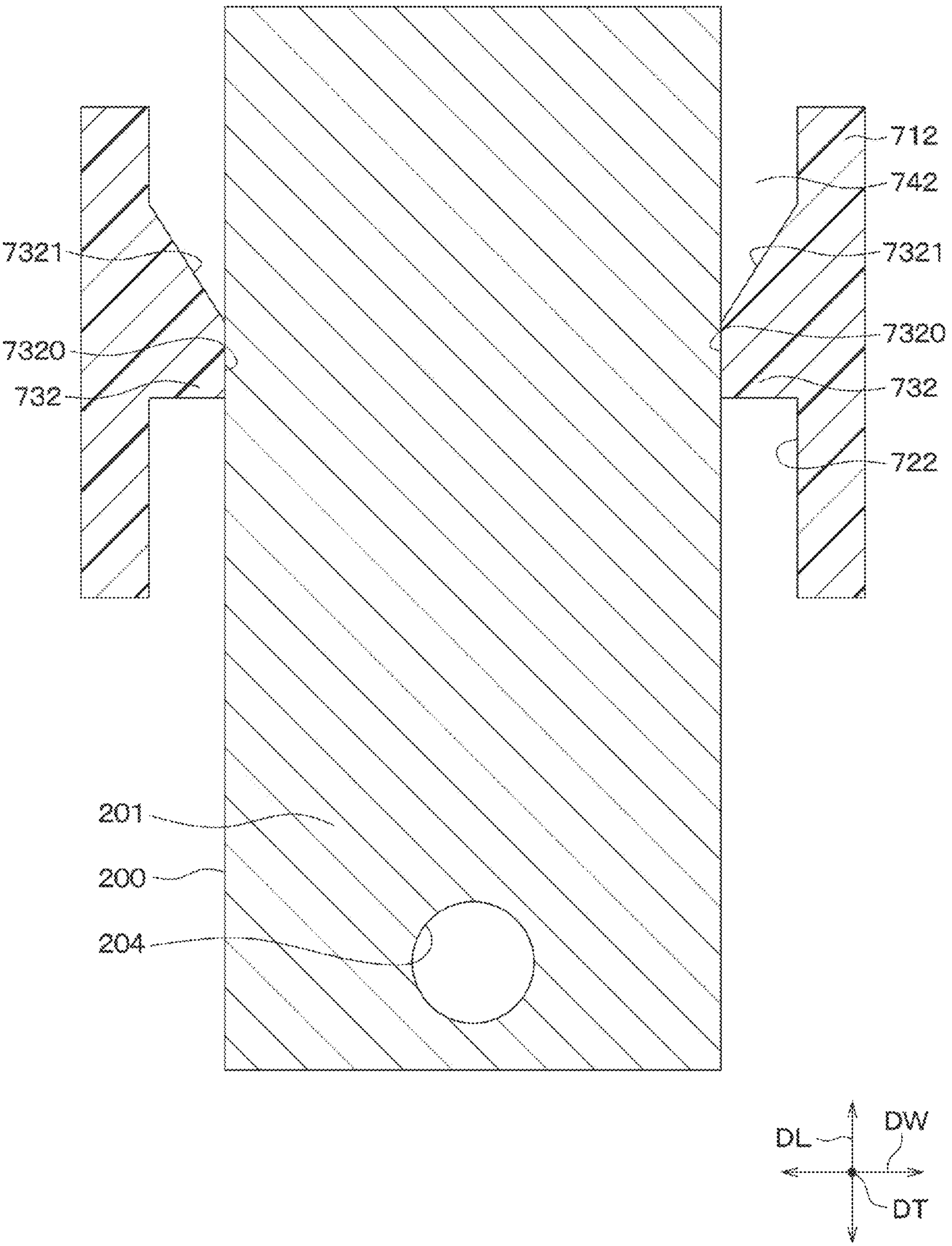
FIG. 40 is a cross-sectional view along a line XL-XL in FIG. 38.

As illustrated in FIG. 38, the second protruding portions 732 protrude from the second facing surfaces 722 in the thickness direction DT and in the width direction DW. As illustrated in FIGS. 39 and 40, each of the second protruding portions 732 includes a second contact surface 7320 and a second-protruding-portion inclined surface 7321.

The second contact surface 7320 is in contact with the second plate portion 201. The second-protruding-portion inclined surface 7321 is connected to a side of the second contact surface 7320 which is opposite to the second bolt hole 204, which is the third extending portion 202 side herein. In addition, the second-protruding-portion inclined surface 7321 is inclined in a direction in which a size of a space in the second opening portion 712 increases with distance from a boundary portion between the second-protruding-portion inclined surface 7321 and the second contact surface 7320. Consequently, the second-protruding-portion inclined surface 7321 is formed in a tapered shape.

Figure 41:
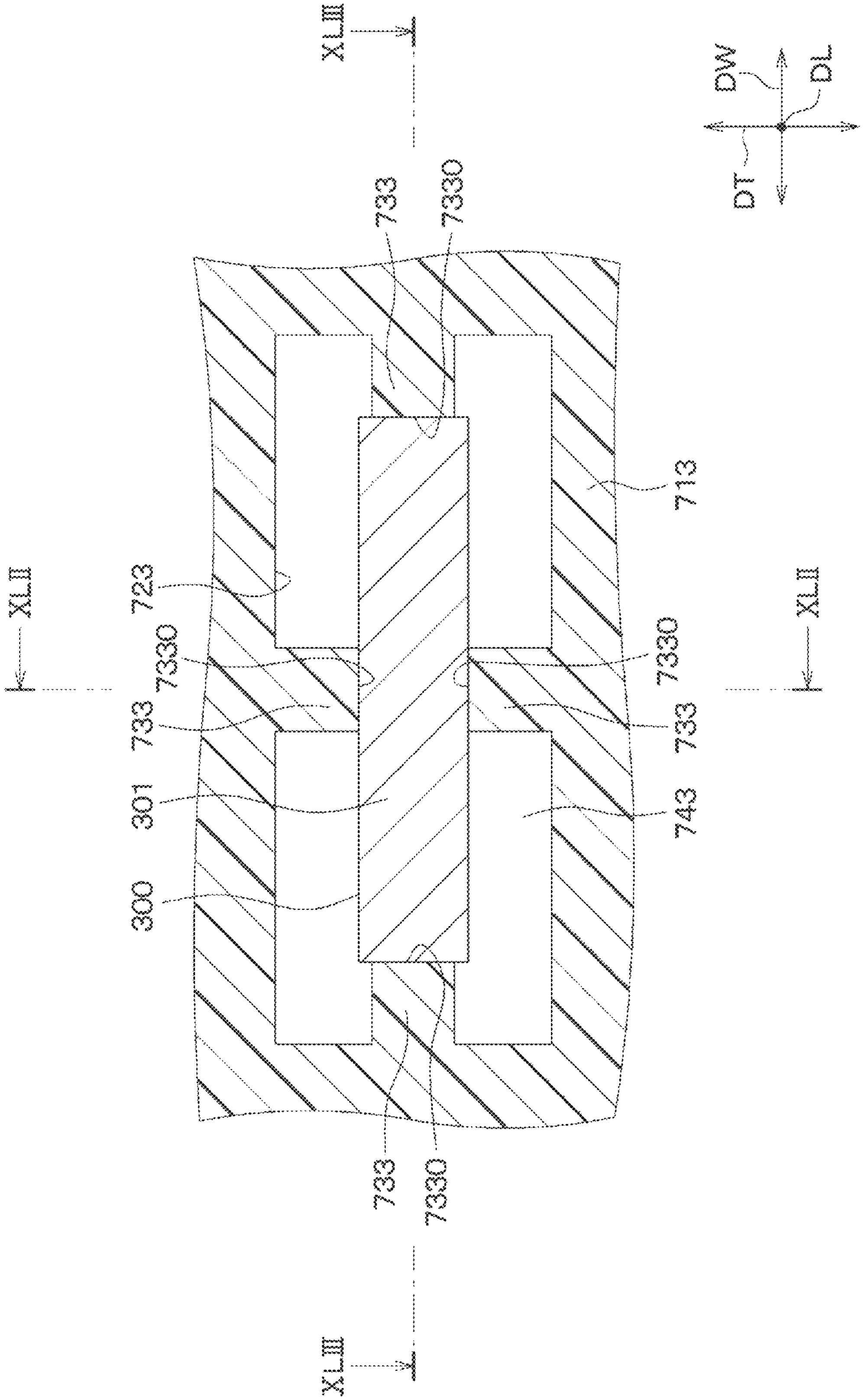
FIG. 41 is a cross-sectional view of the third plate portion of the third bus bar and the third opening portion of the case in the current sensor.
Figure 42:
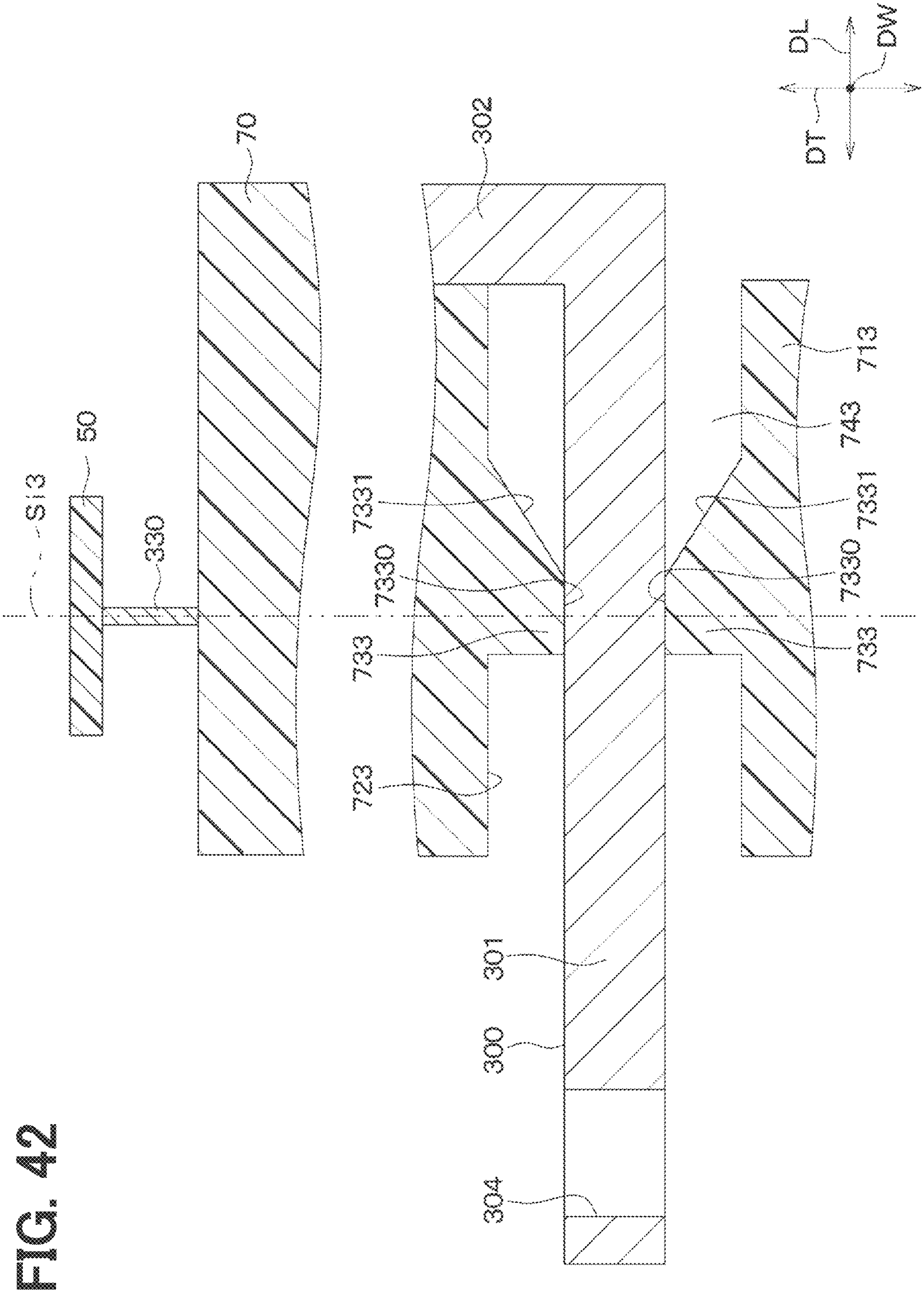
FIG. 42 is a cross-sectional view along a line XLII-XLII in FIG. 41.
Figure 43:
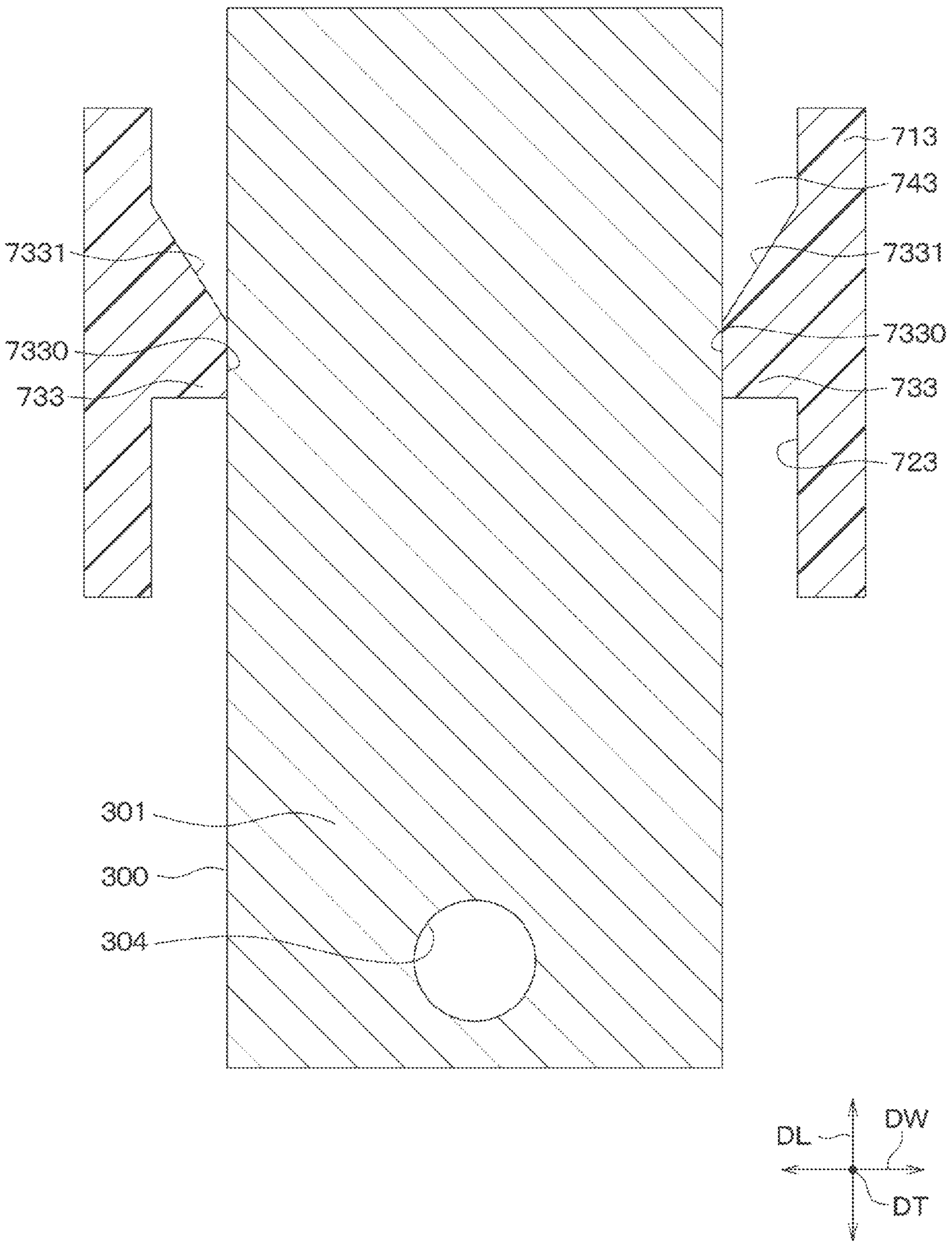
FIG. 43 is a cross-sectional view along a line XLIII-XLIII in FIG. 41.

As illustrated in FIG. 41, the third protruding portions 733 protrude from the third facing surfaces 723 in the thickness direction DT and in the width direction DW. As illustrated in FIGS. 42 and 43, each of the third protruding portions 733 includes a third contact surface 7330 and a third-protruding-portion inclined surface 7331.

The third contact surface 7330 is in contact with the third plate portion 301. The third-protruding-portion inclined surface 7331 is connected to a side of the third contact surface 7330 which is opposite to the third bolt hole 304, which is the fifth extending portion 302 side herein. In addition, the third-protruding-portion inclined surface 7331 is inclined in a direction in which a size of a space in the third opening portion 713 increases with distance from a boundary portion between the third-protruding-portion inclined surface 7331 and the third contact surface 7330. Consequently, the third-protruding-portion inclined surface 7331 is formed in a tapered shape.

It is assumed herein that, as illustrated in FIG. 36, a plane which is perpendicular to the longitudinal direction DL, while passing through the circuit board 50 and the first lead wire 130, is a first virtual plane Si1. It is also assumed that, as illustrated in FIG. 39, a plane which is perpendicular to the longitudinal direction DL, while passing through the circuit board 50 and the second lead wire 230, is a second virtual plane Si2. It is also assumed that, as illustrated in FIG. 42, a plane which is perpendicular to the longitudinal direction DL, while passing through the circuit board 50 and the third lead wire 330, is a third virtual plane Si3.

As illustrated in FIG. 36, the first protruding portions 731 are located on the first virtual plane Si1. As illustrated in FIG. 39, the second protruding portions 732 are located on the second virtual plane Si2. As illustrated in FIG. 42, the third protruding portions 733 are located on the third virtual plane Si3.

As described above, the current sensor 5 in the twenty-first embodiment is configured. In the twenty-first embodiment also, the same effects as those achieved in the sixth embodiment are achieved. In addition, the twenty-first embodiment also achieves effects described below.

[13-1] The first protruding portion 731 includes the first contact surface 7310 and the first-protruding-portion inclined surface 7311. The first contact surface 7310 is in contact with the first plate portion 101. The first-protruding-portion inclined surface 7311 is connected to a side of the first contact surface 7310 which is opposite to the first bolt hole 104. In addition, the first-protruding-portion inclined surface 7311 is inclined in a direction in which a size of a space in the first opening portion 711 increases with distance from the boundary portion between the first-protruding-portion inclined surface 7311 and the first contact surface 7310.

Accordingly, when the first plate portion 101 is inserted into the space in the first opening portion 711 from the first extending portion 102 side, the first plate 101 is easily guided by the first-protruding-portion inclined surface 7311 to be easily inserted therein. This suppresses abrasion resulting from contact between the first plate portion 101 and the first protruding portions 731. Consequently, abrasion powder resulting from the contact between the first plate portion 101 and the first protruding portions 731 is inhibited from entering the first bolt hole 104. As a result, when the first plate portion 101 is connected to the outside thereof such as a portion of the inverter by inserting a bolt into each of the first bolt hole 104 and a hole provided in the inverter, it is possible to suppress damage caused to the first plate portion 101 by entrapped abrasion powder.

The second protruding portion 732 includes the second contact surface 7320 and the second-protruding-portion inclined surface 7321. The second contact surface 7320 is in contact with the second plate portion 201. The second-protruding-portion inclined surface 7321 is connected to a side of the second contact surface 7320 which is opposite to the second bolt hole 204. In addition, the second-protruding-portion inclined surface 7321 is inclined in a direction in which a size of a space in the second opening portion 712 increases with distance from the boundary portion between the second-protruding-portion inclined surface 7321 and the second contact surface 7320.

Accordingly, when the second plate portion 201 is inserted into the space in the second opening portion 712 from the third extending portion 202 side, the second plate 201 is easily guided by the second-protruding-portion inclined surface 7321 to be easily inserted therein. This suppresses abrasion resulting from contact between the second plate portion 201 and the second protruding portions 732. Consequently, abrasion powder resulting from the contact between the second plate portion 201 and the second protruding portions 732 is inhibited from entering the second bolt hole 204. As a result, when the second plate portion 201 is connected to the outside thereof such as a portion of the inverter by inserting a bolt into each of the second bolt hole 204 and a hole provided in the inverter, it is possible to suppress damage caused to the second plate portion 201 by entrapped abrasion powder.

The third protruding portion 733 includes the third contact surface 7330 and the third-protruding-portion inclined surface 7331. The third contact surface 7330 is in contact with the third plate portion 301. The third-protruding-portion inclined surface 7331 is connected to a side of the third contact surface 7330 which is opposite to the third bolt hole 304. In addition, the third-protruding-portion inclined surface 7331 is inclined in a direction in which a size of a space in the third opening portion 713 increases with distance from the boundary portion between the third-protruding-portion inclined surface 7331 and the third contact surface 7330.

Accordingly, when the third plate portion 301 is inserted into the space in the third opening portion 713 from the fifth extending portion 302 side, the third plate 301 is easily guided by the third-protruding-portion inclined surface 7331 to be easily inserted therein. This suppresses abrasion resulting from contact between the third plate portion 301 and the third protruding portions 733. Consequently, abrasion powder resulting from the contact between the third plate portion 301 and the third protruding portions 733 is inhibited from entering the third bolt hole 304. As a result, when the third plate portion 301 is connected to the outside thereof such as a portion of the inverter by inserting a bolt into each of the third bolt hole 304 and a hole provided in the inverter, it is possible to suppress damage caused to the third plate portion 301 by entrapped abrasion powder.

[13-2] The first protruding portions 731 are located on the first virtual plane Si1. Accordingly, compared to a case where the first protruding portions 731 are not located on the first virtual plane Si1, cross-sectional areas of the circuit board 50, the first lead wire 130, and the case 70 when cut in the direction which is perpendicular to the longitudinal direction DL, while passing through the circuit board 50, the first lead wire 130, and the case 70, are increased. As a result, compared to the case where the first protruding portions 731 are not located on the first virtual plane Si1, a section modulus and rigidity of each of the circuit board 50, the first lead wire 130, and the case 70 are increased. In addition, in a case where the first plate portion 101 is connected to the outside thereof such as a portion of the inverter, a stress applied to each of the circuit board 50 and the first lead wire 130 when the first plate portion 101 is displaced is reduced. This suppresses deformation of or damage to each of the circuit board 50 and the first lead wire 130.

Meanwhile, the second protruding portions 732 are located on the second virtual plane Si2. Accordingly, compared to a case where the second protruding portions 732 are not located on the second virtual plane Si2, cross-sectional areas of the circuit board 50, the second lead wire 230, and the case 70 when cut in the direction which is perpendicular to the longitudinal direction DL, while passing through the circuit board 50, the second lead wire 230, and the case 70, are increased. As a result, compared to the case where the second protruding portions 732 are not located on the second virtual plane Si2, a section modulus and rigidity of each of the circuit board 50, the second lead wire 230, and the case 70 are increased. In addition, in a case where the second plate portion 201 is connected to the outside thereof such as a portion of the inverter, a stress applied to each of the circuit board 50 and the second lead wire 230 when the second plate portion 201 is displaced is reduced. This suppresses deformation of or damage to each of the circuit board 50 and the second lead wire 230.

Meanwhile, each of the third protruding portions 733 is located on the third virtual plane Si3. Accordingly, compared to a case where the third protruding portions 733 are not located on the third virtual plane Si3, cross-sectional areas of the circuit board 50, the third lead wire 330, and the case 70 when cut in the direction which is perpendicular to the longitudinal direction DL, while passing through the circuit board 50, the third lead wire 330, and the case 70, are increased. As a result, compared to the case where the third protruding portions 733 are not located on the third virtual plane Si3, a section modulus and rigidity of each of the circuit board 50, the third lead wire 330, and the case 70 are increased. In addition, in a case where third first plate portion 301 is connected to the outside thereof such as a portion of the inverter, a stress applied to each of the circuit board 50 and the third lead wire 230 when the third plate portion 301 is displaced is reduced. This suppresses deformation of or damage to each of the circuit board 50 and the third lead wire 330.

Twenty-Second Embodiment

Figure 44:
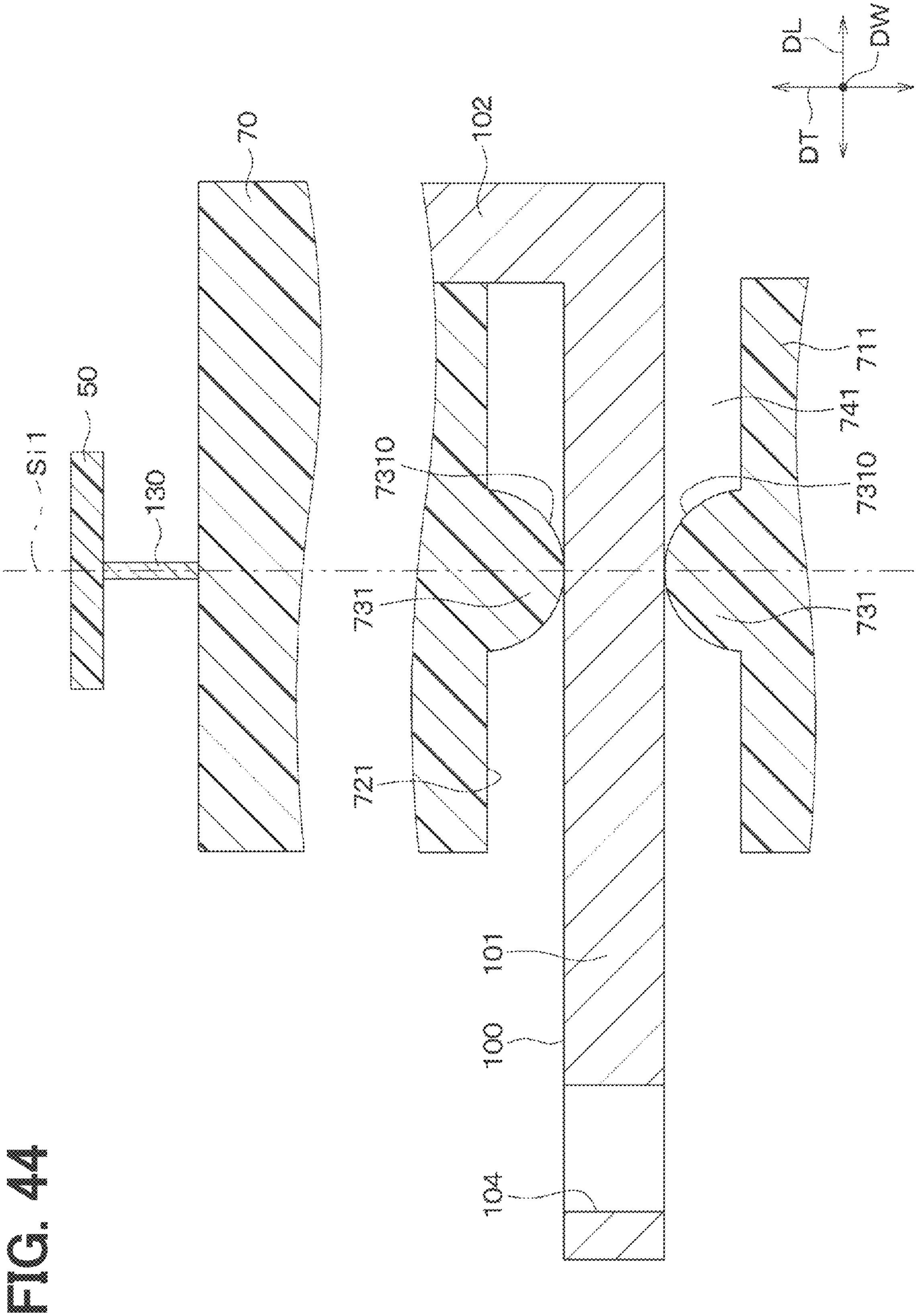
FIG. 44 is a cross-sectional view of the first plate portion of the first bus bar and the first opening portion of the case in the current sensor.
Figure 45:
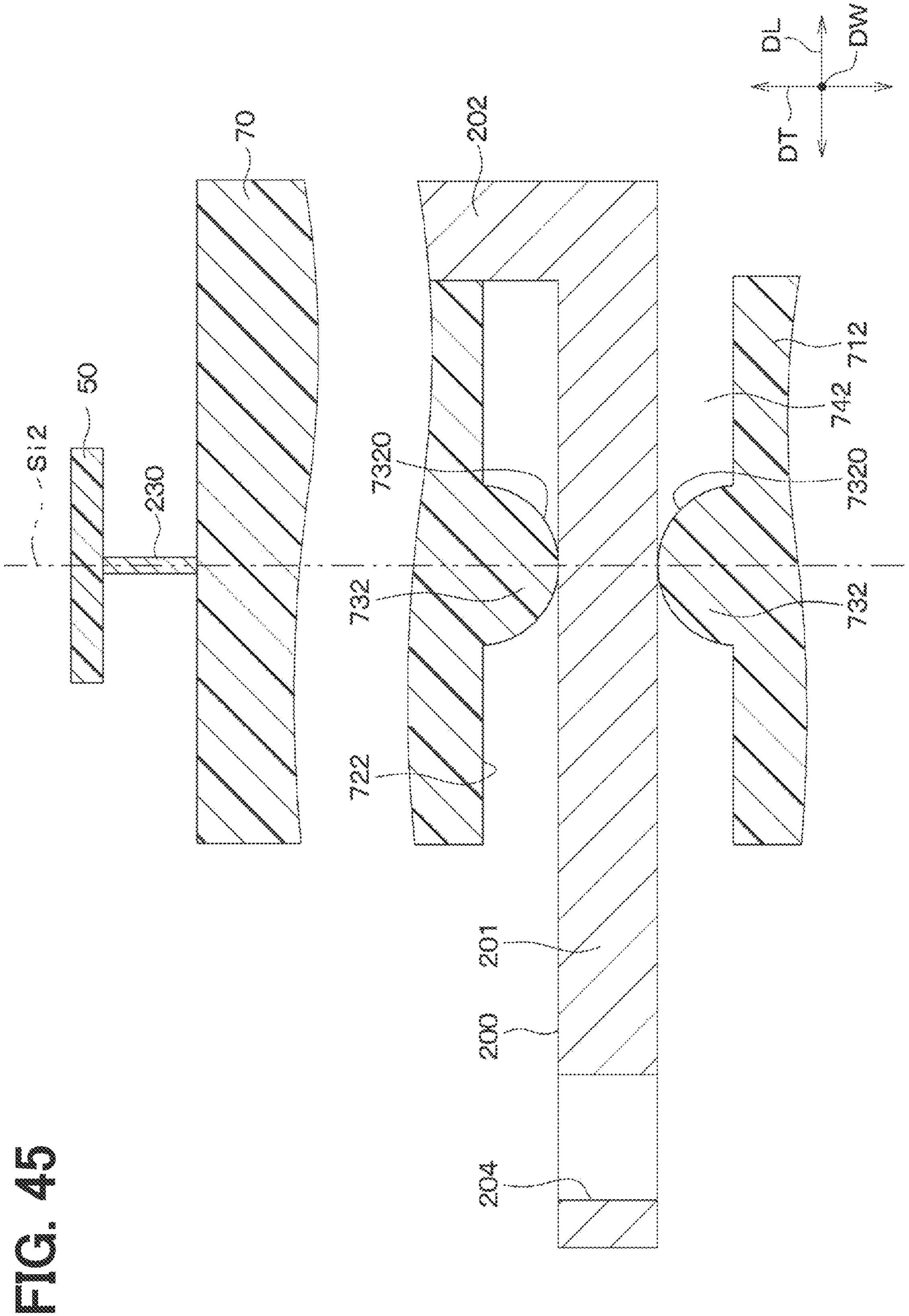
FIG. 45 is a cross-sectional view of the second plate portion of the second bus bar and the second opening portion of the case in the current sensor.
Figure 46:
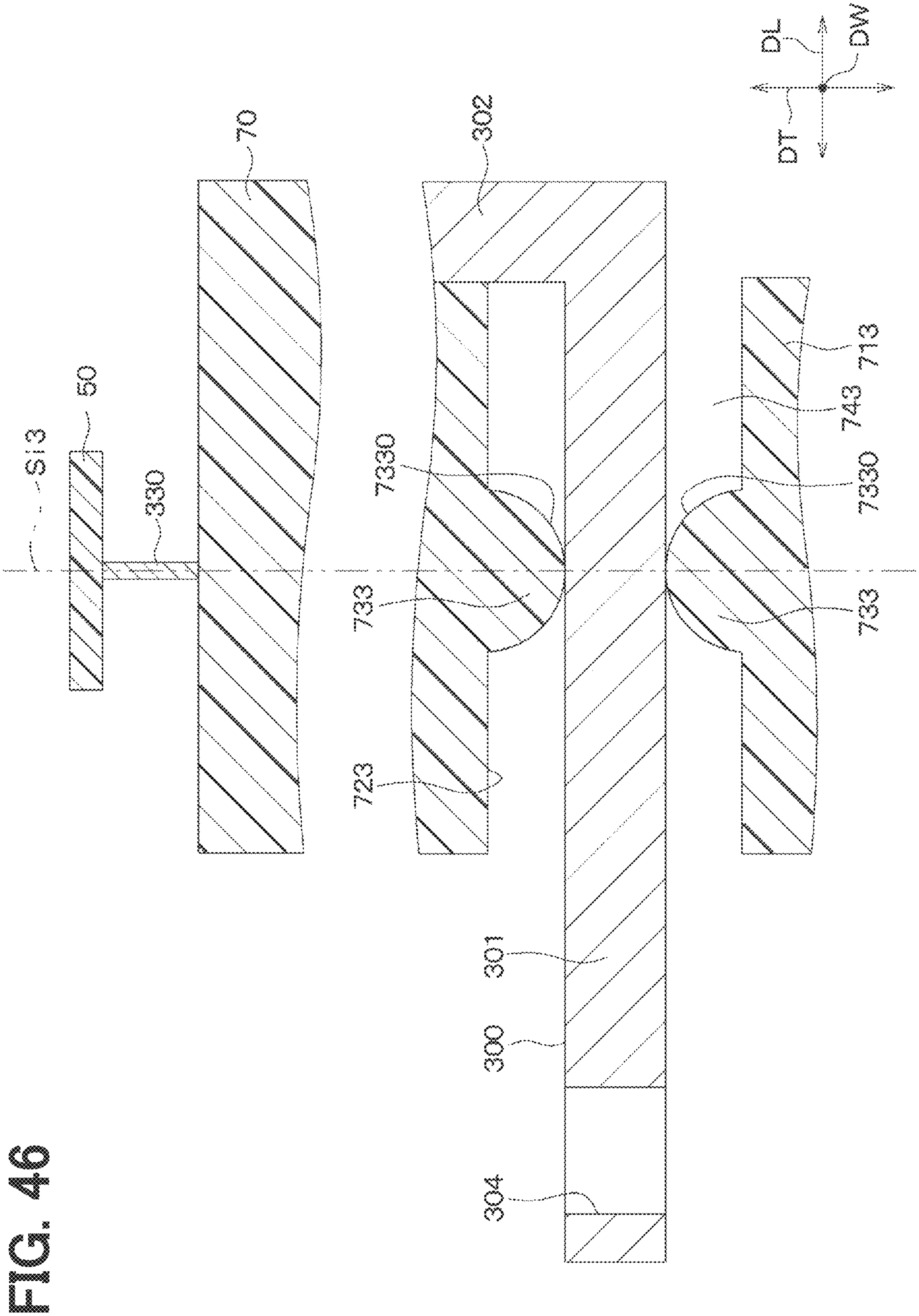
FIG. 46 is a cross-sectional view of the third plate portion of the third bus bar and the third opening portion of the case in the current sensor.

In the twenty-second embodiment, as illustrated in FIGS. 44 to 46, the forms of the first protruding portion 731, the second protruding portion 732 and the third protruding portion 733 are different from those in the twenty-first embodiment. The twenty-second embodiment is similar to the twenty-first embodiment in other respects.

As illustrating in FIG. 44, the first protruding portions 731 protrude from the first facing surfaces 721 in the thickness direction DT and in the width direction DW. In addition, each of the first protruding portions 731 does not include the first-protruding-portion inclined surface 7311, but includes the first contact surface 7310. The first contact surface 7310 is in contact with the first plate portion 101. The first contact surface 7310 is formed in a protruding shape protruding on the first plate portion 101 side, e.g., a hemispherical shape. As a result, the first contact surface 7310 and the first plate portion 101 are in point contact with each other. The first contact surface 7310, which is formed in the hemispherical shape, is not limited thereto, and may also be formed in an arc-column side shape, a long spheric shape, an elliptical-arc-column side shape, or the like.

As illustrated in FIG. 45, each of the second protruding portions 732 protrudes from the second facing surfaces 722 in the thickness direction DT and in the width direction DW. In addition, each of the second protruding portions 732 does not include the second-protruding-portion inclined surface 7321, but includes the second contact surface 7320. The second contact surface 7320 is in contact with the second plate portion 201. The second contact surface 7320 is formed in a protruding shape protruding on the second plate portion 201 side, e.g., a hemispherical shape. As a result, the second contact surface 7320 and the second plate portion 101 are in point contact with each other. The second contact surface 7320, which is formed in the hemispherical shape, is not limited thereto, and may also be formed in an arc-column side shape, a long spheric shape, an elliptical-arc-column side shape, or the like.

As illustrated in FIG. 46, each of the third protruding portions 733 protrudes from the third facing surfaces 723 in the thickness direction DT and in the width direction DW. In addition, each of the third protruding portions 733 does not include the third-protruding-portion inclined surface 7331, but includes the third contact surface 7330. The third contact surface 7330 is in contact with the third plate portion 301. The third contact surface 7330 is formed in a protruding shape protruding on the third plate portion 301 side, e.g., a hemispherical shape. As a result, the third contact surface 7330 and the third plate portion 301 are in point contact with each other. The third contact surface 7330, which is formed in the hemispherical shape, is not limited thereto, and may also be formed in an arc-column side shape, a long spheric shape, an elliptical-arc-column side shape, or the like.

As described above, the current sensor 5 in the twenty-second embodiment is configured. In the twenty-second embodiment also, the same effects as those achieved in the twenty-first embodiment are achieved.

Twenty-Third Embodiment

Figure 47:
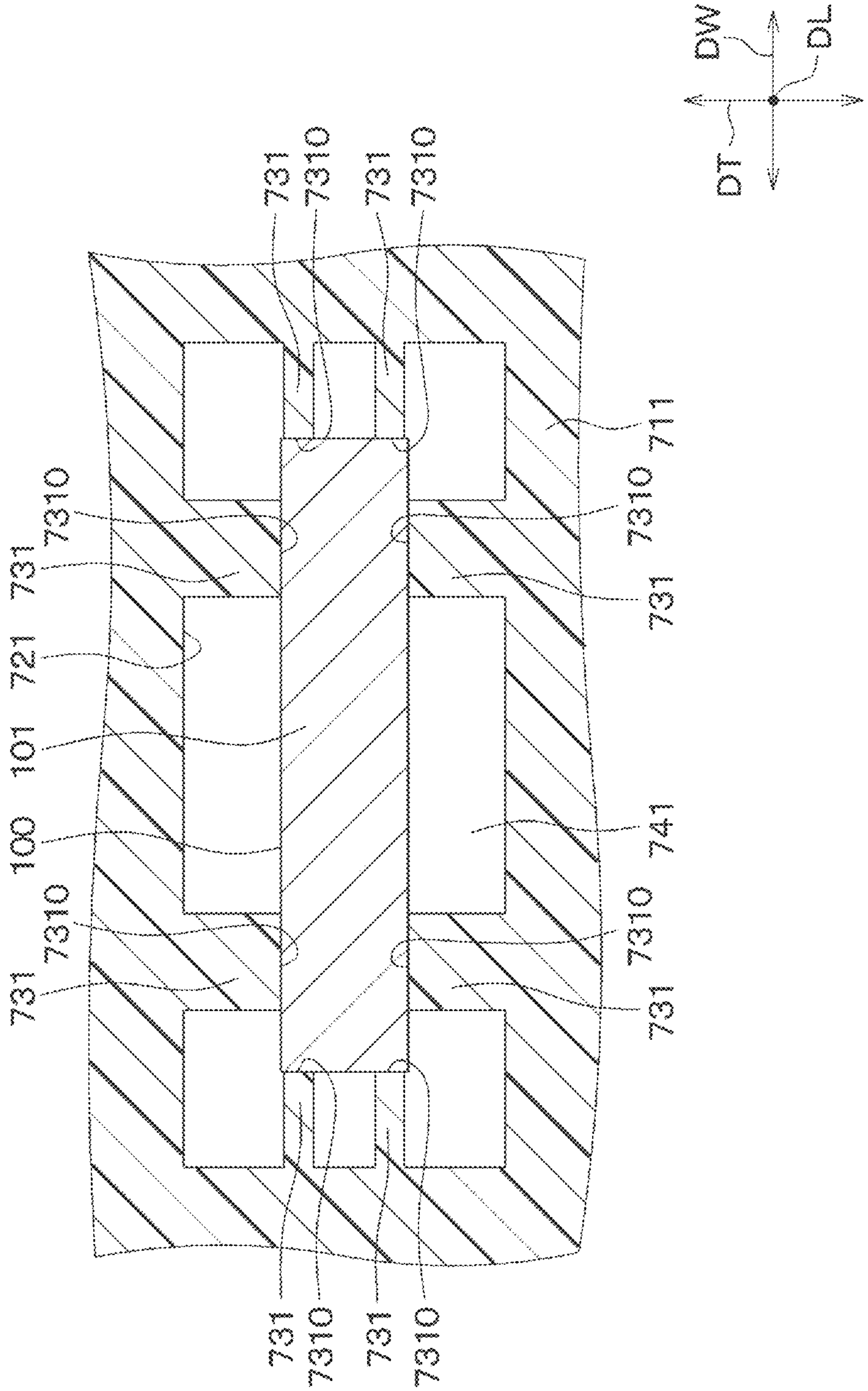
FIG. 47 is a cross-sectional view of the first plate portion of the first bus bar and the first opening portion of the case in the current sensor according to a twenty-third embodiment.
Figure 48:
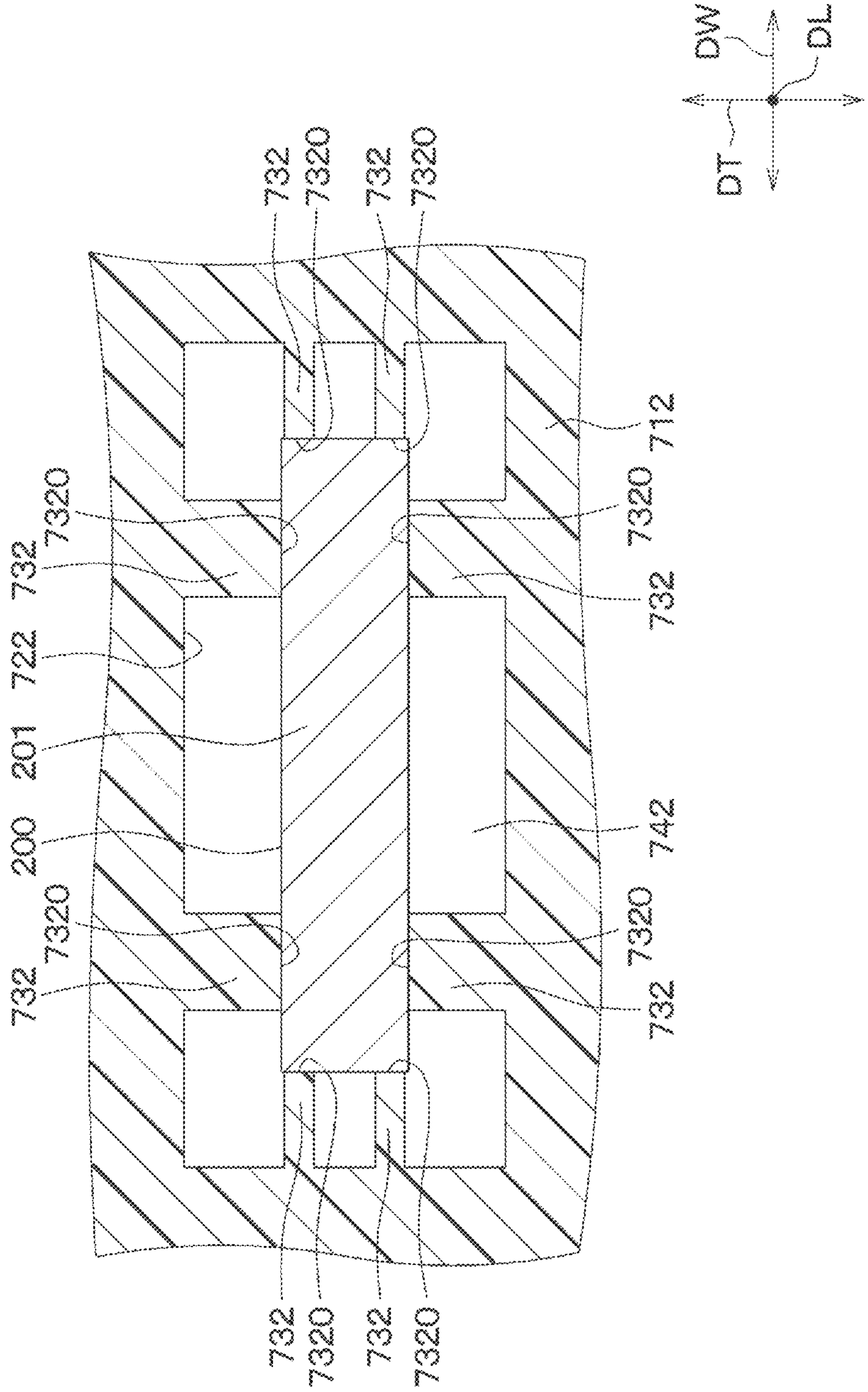
FIG. 48 is a cross-sectional view of the second plate portion of the second bus bar and the second opening portion of the case in the current sensor.
Figure 49:
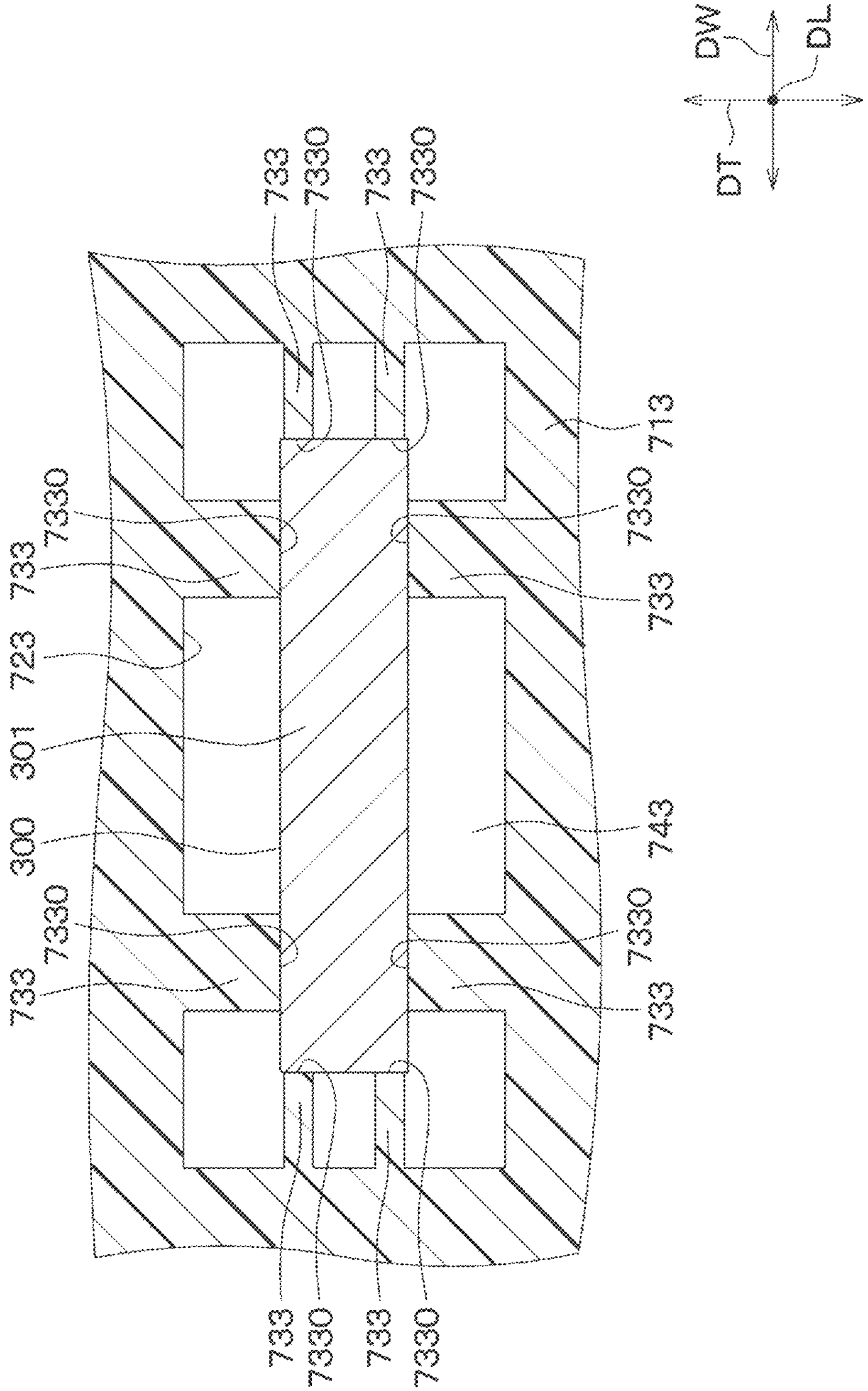
FIG. 49 is a cross-sectional view of the third plate portion of the third bus bar and the third opening portion of the case in the current sensor.

In the twenty-third embodiment, as illustrated in FIGS. 47 to 49, the forms of the first protruding portion 731, the second protruding portion 732 and the third protruding portion 733 are different from those in the twenty-first embodiment. The twenty-third embodiment is similar to the twenty-first embodiment.

As illustrated in FIG. 47, each of the first protruding portions 731 is formed at a position away from a center of the first plate portion 101 instead of being formed at a position passing through a center of the first plate portion 101 in each of the thickness direction DT and the width direction DW. In addition, each of the first protruding portions 731 protruding in the thickness direction DT is located outside the first bolt hole 104 in the width direction DW. Consequently, each of the first protruding portions 731 protruding in the thickness direction DT does not pass through a plane which is perpendicular to the width direction DW, while passing through the first bolt hole 104. As a result, each of the first protruding portions 731 protruding in the thickness direction DT is more easily separated from the first bolt hole 104.

As illustrated in FIG. 48, each of the second protruding portions 732 is formed at a position away from a center of the second plate portion 201 instead of being formed at a position passing through a center of the second plate portion 201 in each of the thickness direction DT and the width direction DW. In addition, each of the second protruding portions 732 protruding in the thickness direction DT is located outside the second bolt hole 204 in the width direction DW. Consequently, each of the second protruding portions 732 protruding in the thickness direction DT does not pass through a plane which is perpendicular to the width direction DW, while passing through the second bolt hole 204. As a result, each of the second protruding portions 732 protruding in the thickness direction DT is more easily separated from the second bolt hole 204.

As illustrated in FIG. 49, each of the third protruding portions 733 is formed at a position away from a center of the third plate portion 301 instead of being formed at a position passing through a center of the third plate portion 301 in each of the thickness direction DT and the width direction DW. In addition, each of the third protruding portions 733 protruding in the thickness direction DT is located outside the third bolt hole 304 in the width direction DW. Consequently, each of the third protruding portions 733 protruding in the thickness direction DT does not pass through a plane which is perpendicular to the width direction DW, while passing through the third bolt hole 304. As a result, each of the third protruding portions 733 protruding in the thickness direction DT is more easily separated from the third bolt hole 304.

As described above, the current sensor 5 in the twenty-third embodiment is configured. In the twenty-third embodiment also, the same effects as those achieved in the twenty-first embodiment are achieved.

Twenty-Fourth Embodiment

Figure 50:
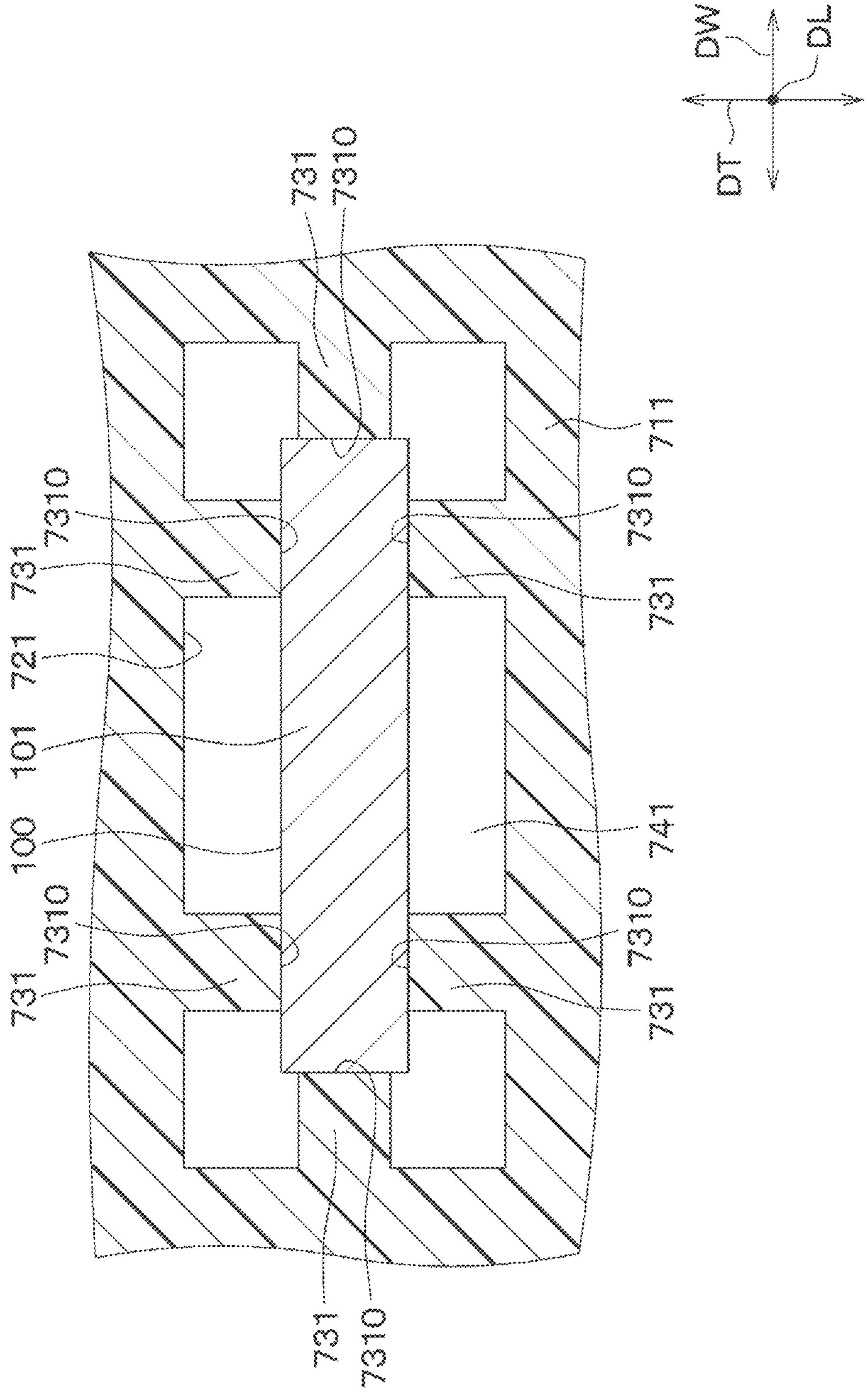
FIG. 50 is a cross-sectional view of the first plate portion of the first bus bar and the first opening portion of the case in the current sensor according to a twenty-fourth embodiment.
Figure 51:
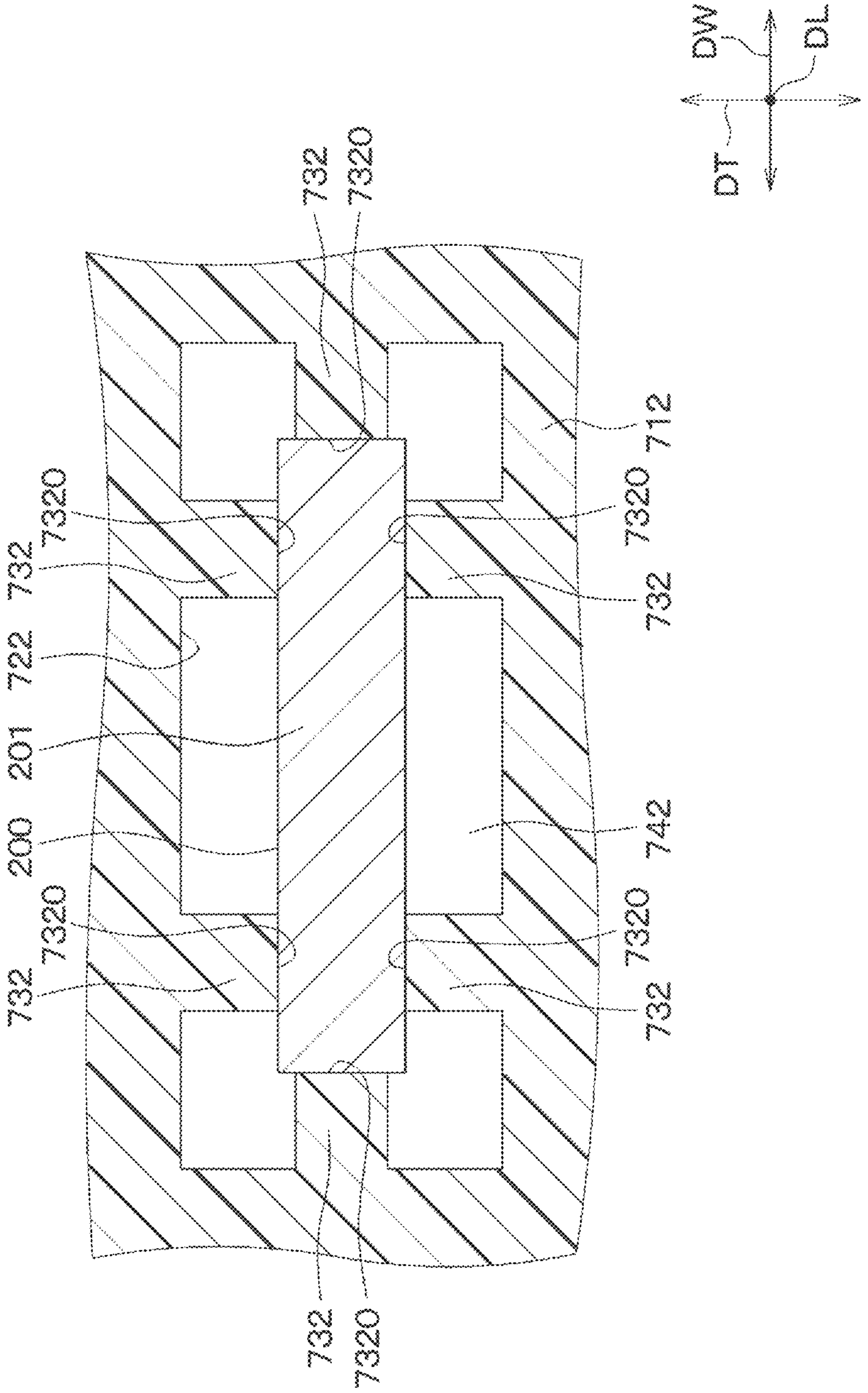
FIG. 51 is a cross-sectional view of the second plate portion of the second bus bar and the second opening portion of the case in the current sensor.
Figure 52:
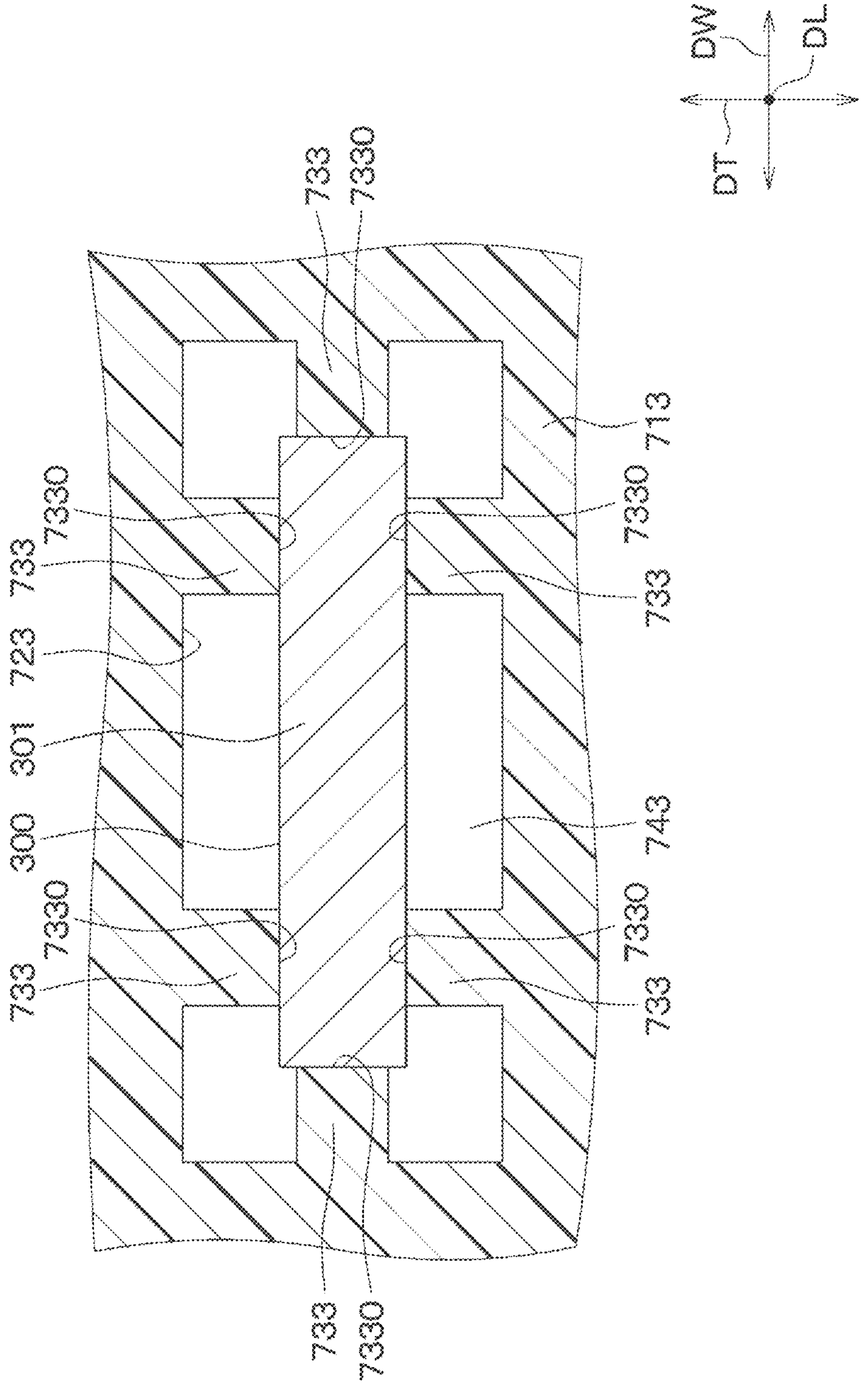
FIG. 52 is a cross-sectional view of the third plate portion of the third bus bar and the third opening portion of the case in the current sensor.

In the twenty-fourth embodiment, as illustrated in FIGS. 50 to 52, the forms of the first protruding portion 731, the second protruding portion 732 and the third protruding portion 733 are different from those in the twenty-first embodiment. The twenty-third embodiment is similar to the twenty-first embodiment.

As illustrated in FIG. 50, each of the first protruding portions 731 is formed at a position away from the center of the first plate portion 101 instead of being formed at a position passing through the center of the first plate portion 101 in each of the thickness direction DT and the width direction DW. In addition, each of the first protruding portions 731 protruding in the thickness direction DT is located outside the first bolt hole 104 in the width direction DW. Thus, each of the first protruding portions 731 protruding in the thickness direction DT does not pass through the plane which is perpendicular to the width direction DW while passing through the first bolt hole 104, and is consequently easily separated from the first bolt hole 104.

As illustrated in FIG. 51, each of the second protruding portions 732 is formed at a position away from the center of the second plate portion 201 instead of being formed at a position passing through the center of the second plate portion 201 in each of the thickness direction DT and the width direction DW. In addition, each of the second protruding portions 732 protruding in the thickness direction DT is located outside the second bolt hole 204 in the width direction DW. Thus, each of the second protruding portions 732 protruding in the thickness direction DT does not pass through the plane which is perpendicular to the width direction DW while passing through the second bolt hole 204, and is consequently easily separated from the second bolt hole 204.

As illustrated in FIG. 52, each of the third protruding portions 733 is formed at a position away from the center of the third plate portion 301 instead of being formed at a position passing through the center of the third plate portion 301 in each of the thickness direction DT and the width direction DW. In addition, each of the third protruding portions 733 protruding in the thickness direction DT is located outside the third bolt hole 304 in the width direction DW. Thus, each of the third protruding portions 733 protruding in the thickness direction DT does not pass through the plane which is perpendicular to the width direction DW while passing through the third bolt hole 304, and is consequently easily separated from the third bolt hole 304.

As described above, the current sensor 5 in the twenty-fourth embodiment is configured. In the twenty-fourth embodiment also, the same effects as those achieved in the twenty-first embodiment are achieved.

Twenty-Fifth Embodiment

Figure 53:
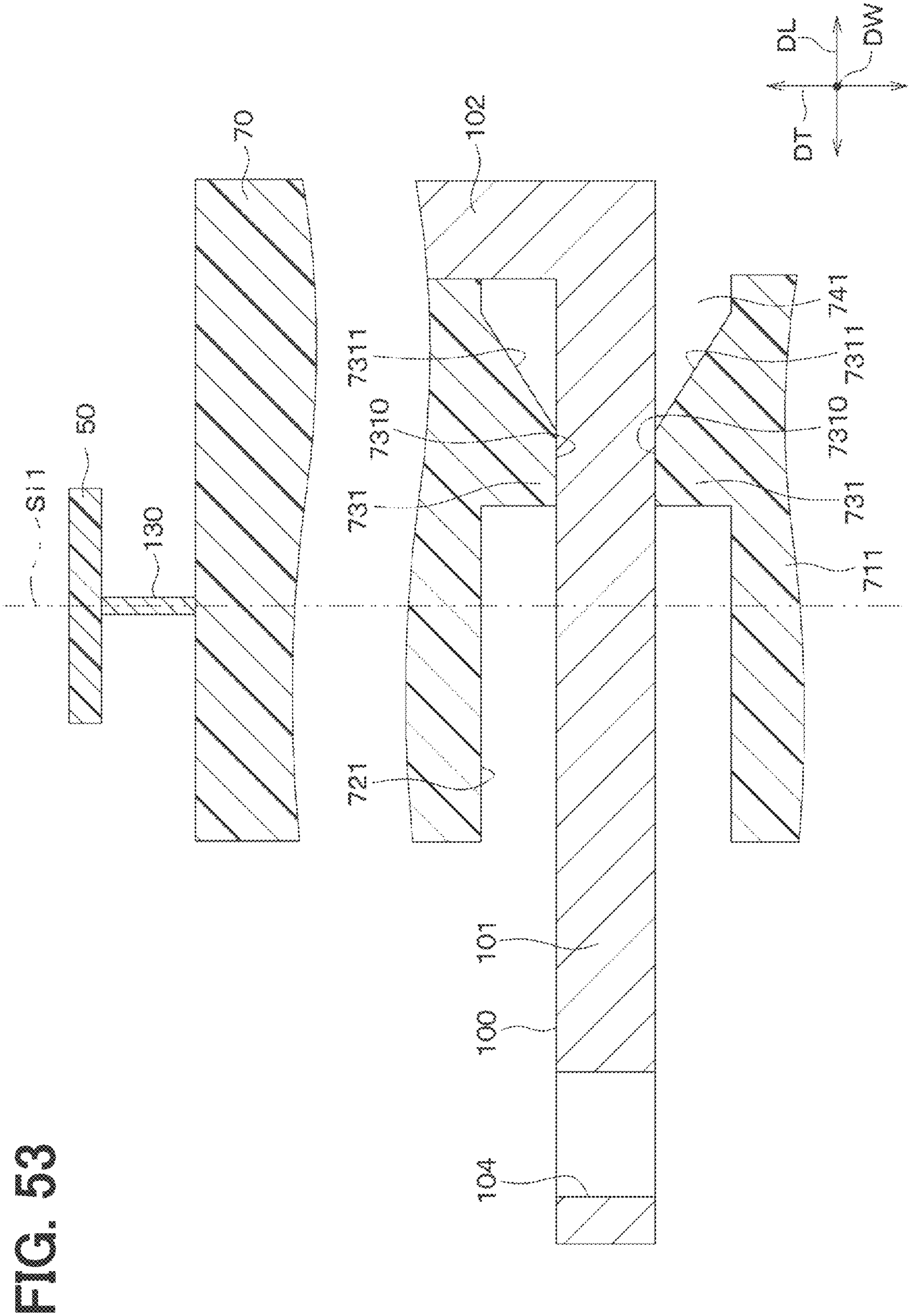
FIG. 53 is a cross-sectional view of the first plate portion of the first bus bar and the first opening portion of the case in the current sensor according to a twenty-fifth embodiment.
Figure 54:
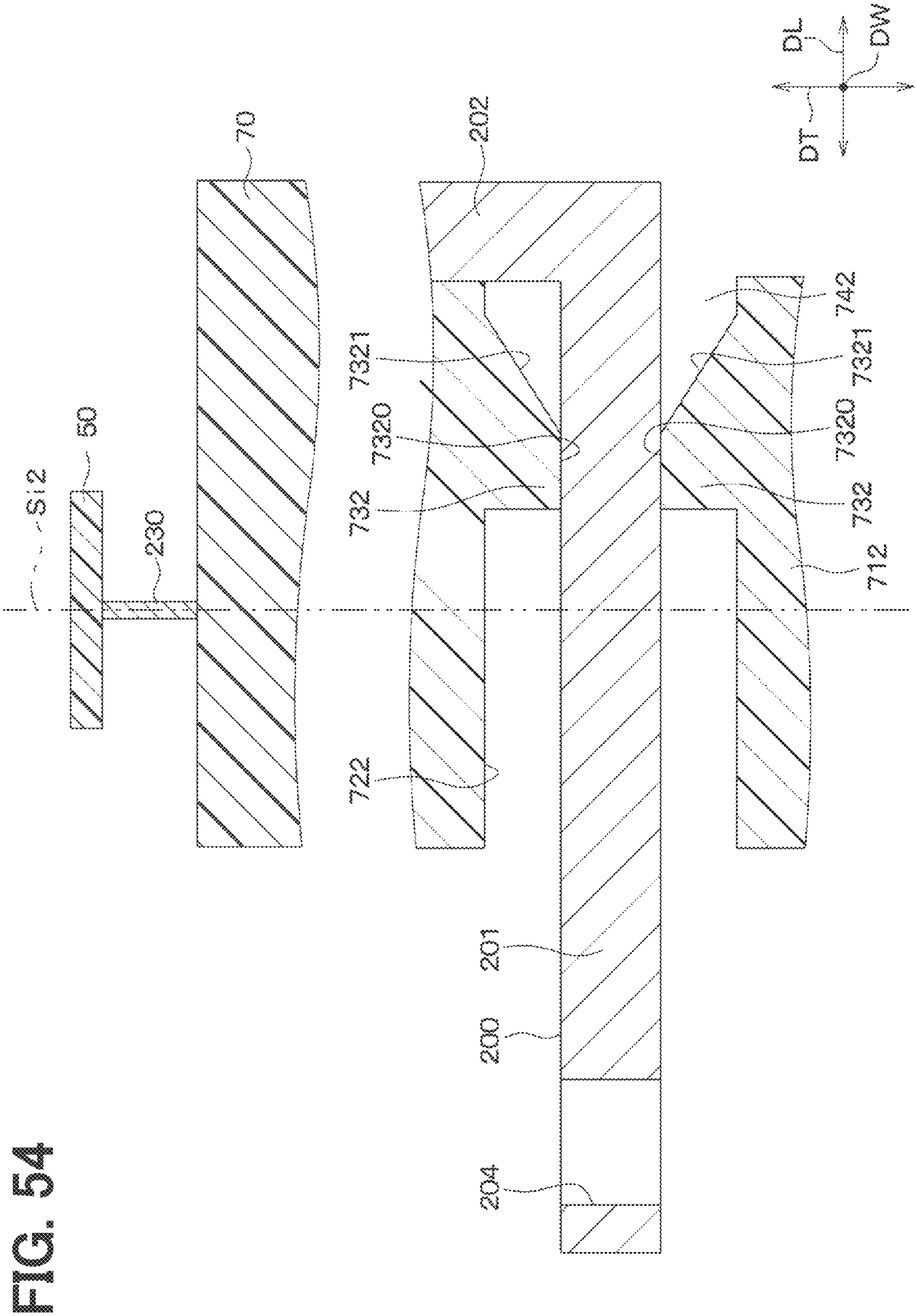
FIG. 54 is a cross-sectional view of the second plate portion of the second bus bar and the second opening portion of the case in the current sensor.
Figure 55:
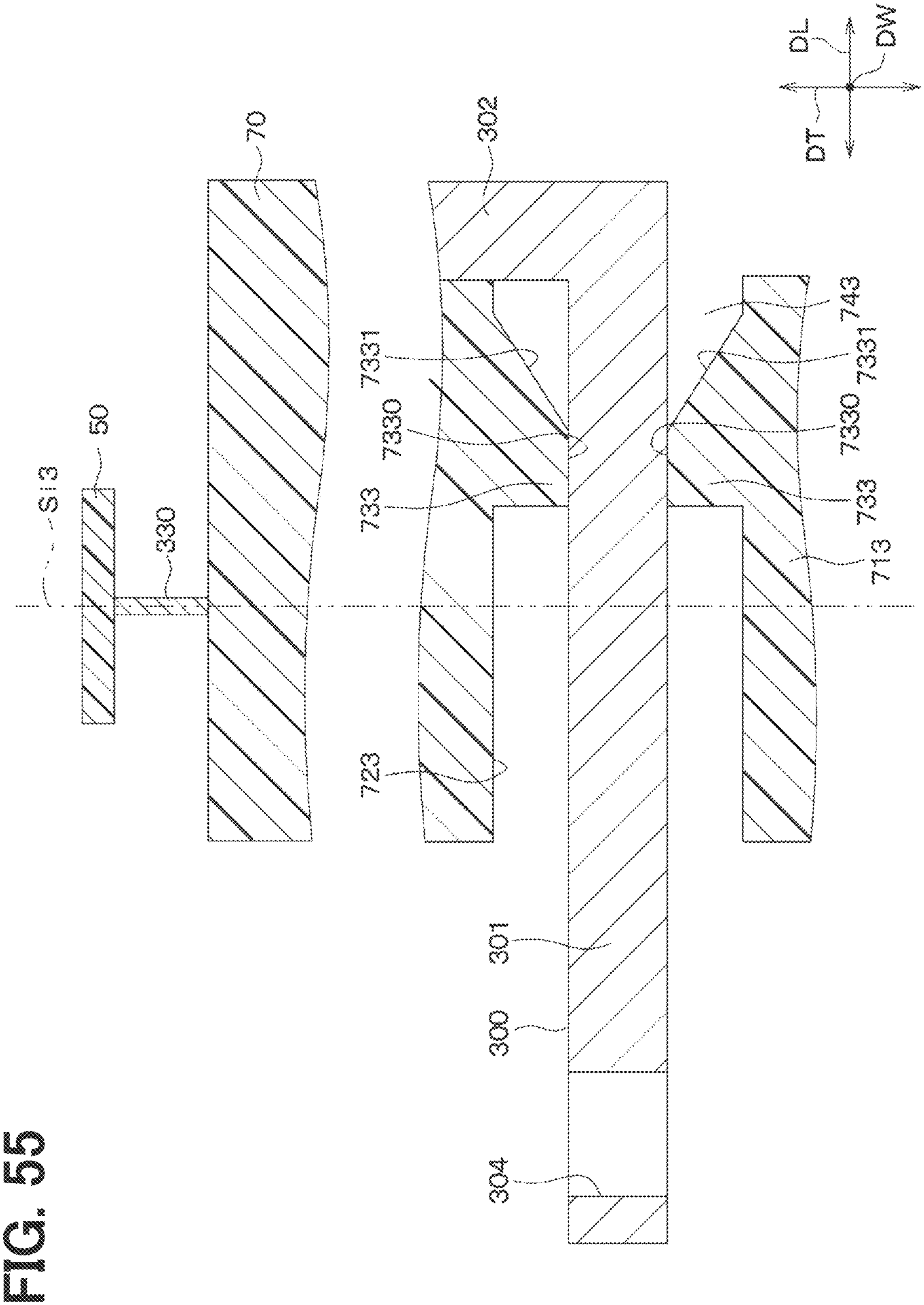
FIG. 55 is a cross-sectional view of the third plate portion of the third bus bar and the third opening portion of the case in the current sensor.

In the twenty-fifth embodiment, as illustrated in FIGS. 53 to 55, the forms of the first protruding portion 731, the second protruding portion 732 and the third protruding portion 733 are different from those in the twenty-first embodiment. The twenty-third embodiment is similar to the twenty-first embodiment.

As illustrated in FIG. 53, instead of being located on the first virtual plane Si1, each of the first protruding portions 731 is located on the opposite side of the first bolt hole 104 with respect to the first virtual plane Si1, i.e., on the first extending portion 102 side. Meanwhile, as illustrated in FIG. 54, instead of being located on the second virtual plane Si2, each of the second protruding portions 732 is located on the opposite side of the second bolt hole 204 with respect to the second virtual plane Si2, i.e., on the third extending portion 202 side. Meanwhile, as illustrated in FIG. 55, instead of being located on the third virtual plane Si3, each of the third protruding portions 733 is located on the opposite side of the third bolt hole 304 with respect to the third virtual plane Si3, i.e., on the fifth extending portion 302 side.

As described above, the current sensor 5 in the twenty-fifth embodiment is configured. In the twenty-fifth embodiment also, the same effects as those achieved in the twenty-first embodiment are achieved. In addition, in the twenty-fifth embodiment, the effects described below are also achieved.

[14] Each of the first protruding portions 731 is located on the opposite side of the first bolt hole 104 with respect to the first virtual plane Si1, i.e., on the first extending portion 102 side.

Consequently, each of the first protruding portions 731 is more easily separated from the first bolt hole 104. Accordingly, when it is assumed that an amount of displacement of the first plate portion 101 is constant when the first plate portion 101 is connected to the outside thereof, such as a portion of the inverter, a rotation angle of the first plate portion 101 is reduced compared to that in a case where each of the first protruding portions 731 is located on the first bolt hole 104 side of the first virtual plane Si1. As a result, when the first plate portion 101 is displaced in a case where the first plate portion 101 is connected the outside thereof, such as a portion of the inverter, a rotative force applied to the first plate portion 101 is reduced. This reduces a rotative force and a stress which are applied to the case 70, the circuit board 50, and the first lead wire 130 when the first plate portion 101 is displaced in a case where the first plate portion 101 is connected to the outside thereof, such as a portion of the inverter. This suppresses deformation of or damage to each of the circuit board 50 and the first lead wire 130.

Meanwhile, each of the second protruding portions 732 is located on the opposite side of the second bolt hole 204 with respect to the second virtual plane Si2, i.e., on the third extending portion 202 side.

Consequently, each of the second protruding portions 732 is more easily separated from the third bolt hole 204. Accordingly, when it is assumed that an amount of displacement of the second plate portion 201 is constant when the second plate portion 201 is connected to the outside thereof, such as a portion of the inverter, a rotation angle of the second plate portion 201 is reduced compared to that in a case where each of the second protruding portions 732 is located on the second bolt hole 204 side of the second virtual plane Si2. As a result, when the second plate portion 201 is displaced in a case where the second plate portion 201 is connected the outside thereof, such as a portion of the inverter, a rotative force applied to the second plate portion 201 is reduced. This reduces a rotative force and a stress which are applied to the case 70, the circuit board 50, and the second lead wire 230 when the second plate portion 201 is displaced in a case where the second plate portion 201 is connected to the outside thereof, such as a portion of the inverter. This suppresses deformation of or damage to each of the circuit board 50 and the second lead wire 230.

Meanwhile, each of the third protruding portions 733 is located on the opposite side of the third bolt hole 304 with respect to the third virtual plane Si3, i.e., on the fifth extending portion 302 side.

Consequently, each of the second protruding portions 733 is more easily separated from the third bolt hole 304. Accordingly, when it is assumed that an amount of displacement of the third plate portion 301 is constant when the third plate portion 301 is connected to the outside thereof, such as a portion of the inverter, a rotation angle of the third plate portion 301 is reduced compared to that in a case where each of the third protruding portions 733 is located on the third bolt hole 304 side of the third virtual plane Si3. As a result, when the third plate portion 301 is displaced in a case where the third plate portion 301 is connected the outside thereof, such as a portion of the inverter, a rotative force applied to the third plate portion 301 is reduced. This reduces a rotative force and a stress which are applied to the case 70, the circuit board 50, and the third lead wire 330 when the third plate portion 301 is displaced in a case where the third plate portion 301 is connected to the outside thereof, such as a portion of the inverter. This suppresses deformation of or damage to each of the circuit board 50 and the third lead wire 330.

Twenty-Sixth Embodiment

Figure 56:
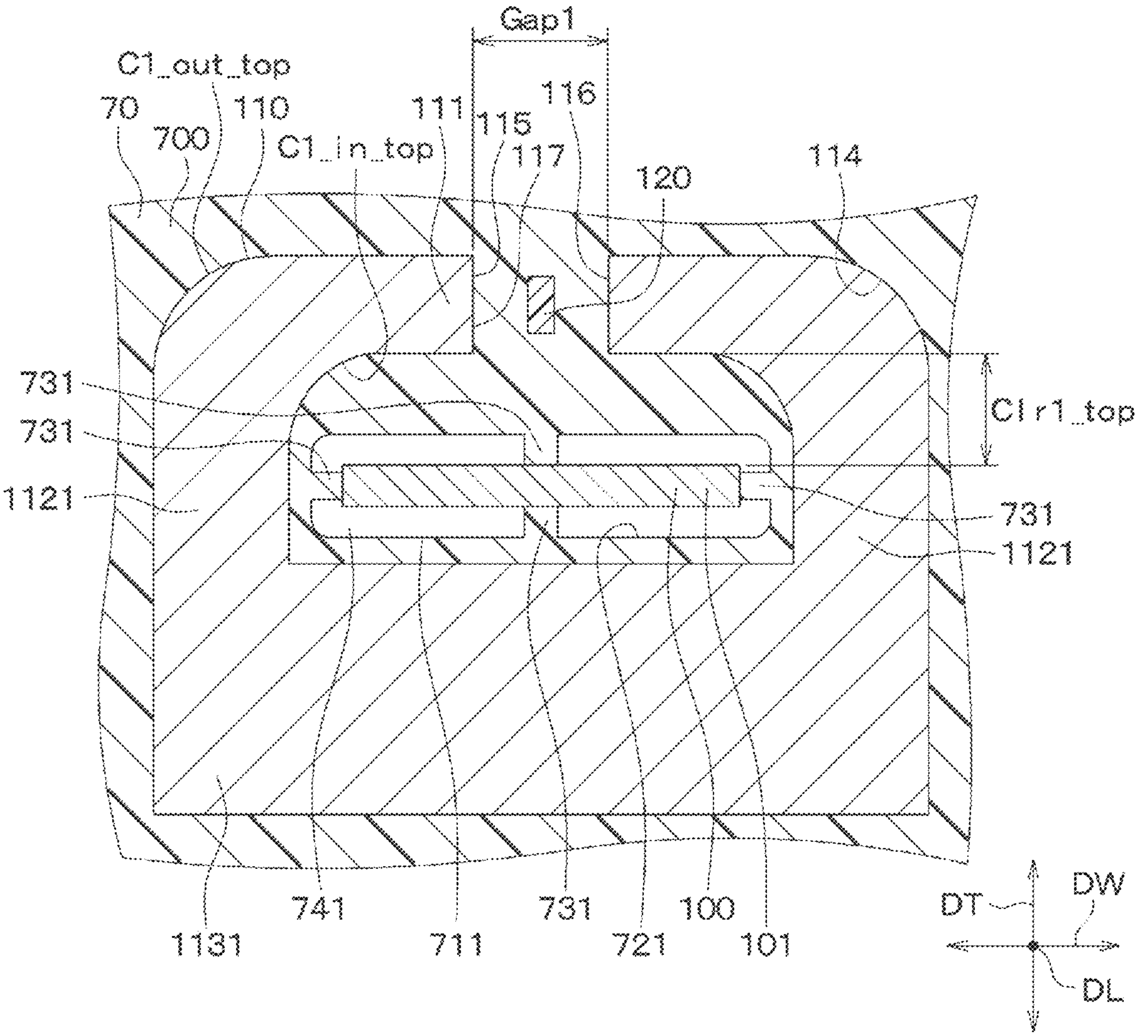
FIG. 56 is a cross-sectional view of the first bus bar, the first core, the first detection unit, and the case in the current sensor according to a twenty-sixth embodiment.
Figure 57:
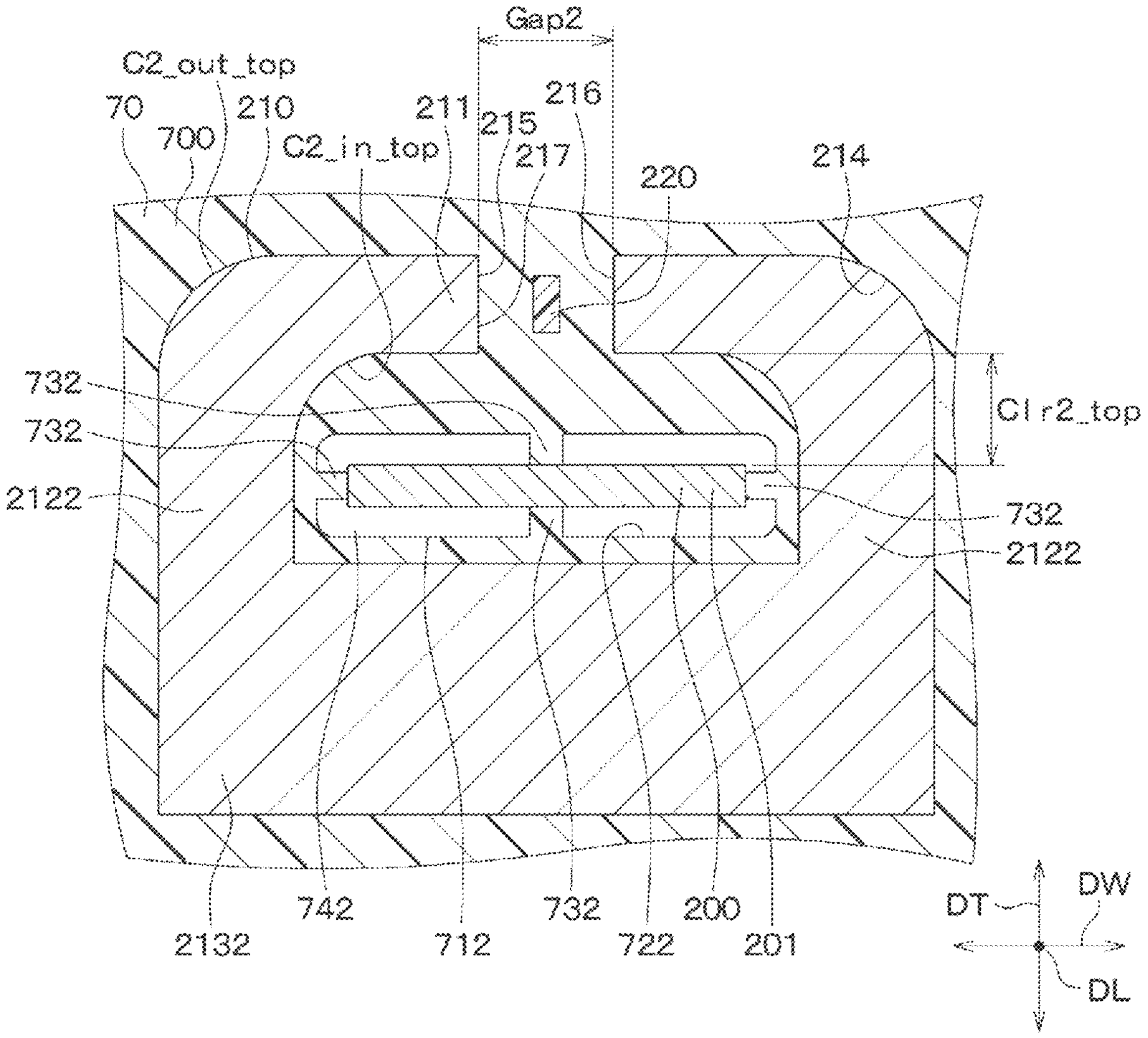
FIG. 57 is a cross-sectional view of the second bus bar, the second core, the second detection unit, and the case in the current sensor.
Figure 58:
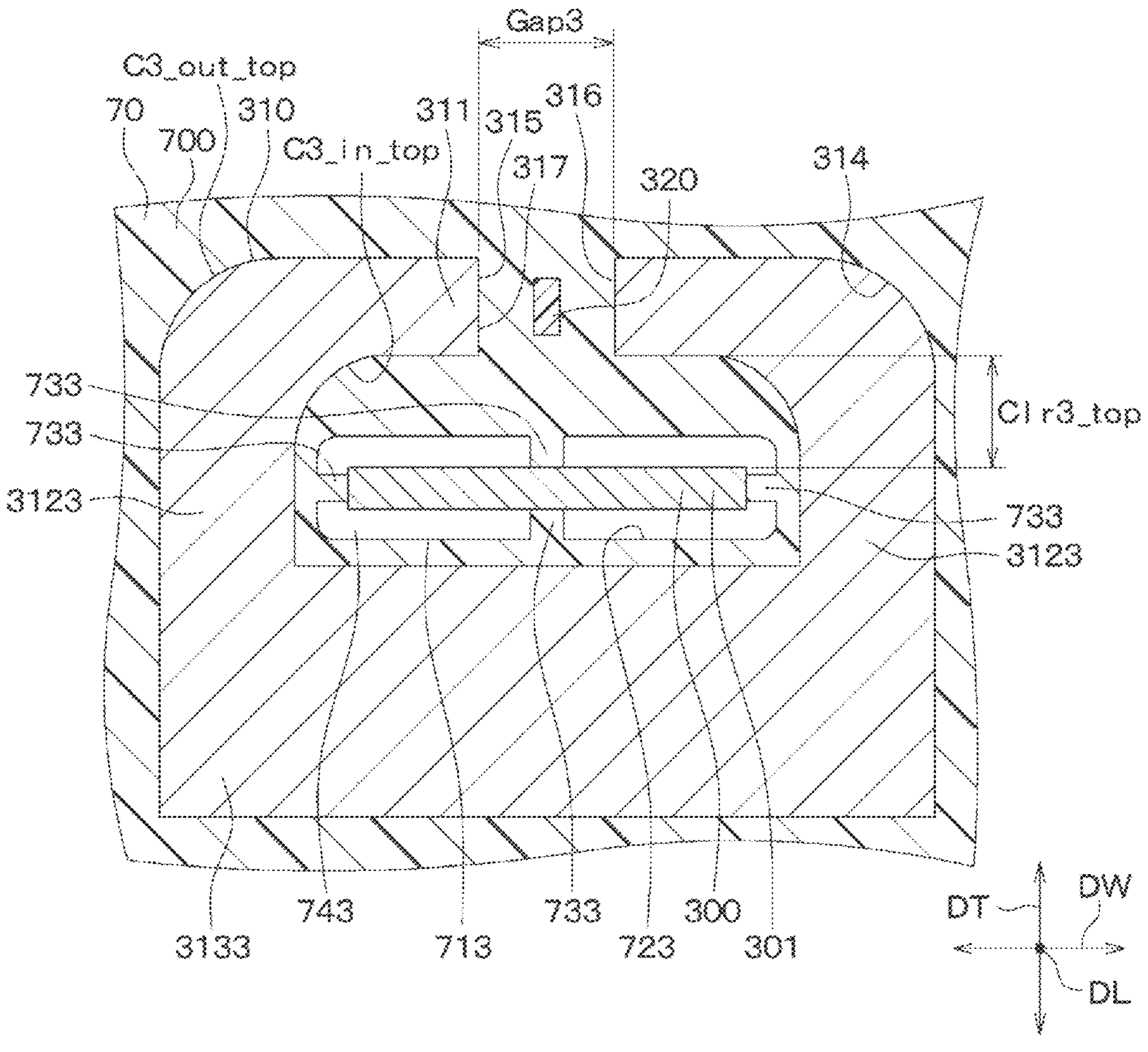
FIG. 58 is a cross-sectional view of the third bus bar, the third core, the third detection unit, and the case in the current sensor.

In the twenty-sixth embodiment, as illustrated in FIGS. 56 to 58, the forms of the first core 110, the second core 210, the third core 310, the first bus bar 100, the second bus bar 200 and the third bus bar 300 are different from those in the sixth embodiment. Additionally, in the twenty-sixth embodiment, the first recessed portion 118, the second recessed portion 218, and the third recessed portion 318 are not formed. The twenty-sixth embodiment is similar to the sixth embodiment in other respects.

As illustrated in FIG. 56, it is assumed that a minimum distance from the first core end surface 115 to the second core end surface 116 in the width direction DW is a first distance Gap1. It is assumed that a maximum distance from the first plate portion 101 to the first gap forming portion 111 in the thickness direction DT is a first clearance distance Clr1_top. It is assumed that a value obtained by dividing the first clearance distance Clr1_top by the first distance Gap1 is a first ratio Clr1/Gap1. Meanwhile, as illustrated in FIG. 57, it is assumed that a minimum distance from the third core end surface 215 to the fourth core end surface 216 in the with direction DW is a second distance Gap2. It is assumed that a maximum distance from the second plate portion 201 to the second gap forming portion 211 in the thickness direction DT is a second clearance distance Clr2_top. It is assumed that a value obtained by dividing the second clearance distance Clr2_top by the second distance Gap2 is a second ratio Clr2/Gap2. In addition, as illustrated in FIG. 58, a minimum distance from the fifth core end surface 315 to the sixth core end surface 316 in the width direction DW is a third distance Gap3. It is assumed that a maximum distance from the third plate portion 301 to the third gap forming portion 311 in the thickness direction DT is a third clearance distance Clr3_top. It is assumed that a value obtained by dividing the third clearance distance Clr3_top by the third distance Gap3 is a third ratio Clr3/Gap3.

For example, the first distance Gap1 is set to 5.0 to 10.0 mm. For example, the first clearance distance Clr1_top is set to 2.0 to 6.0 mm. The first ratio Clr1/Gap1 is set to 0.20 or more and 1.00 or less. For example, the second distance Gap2 is set to 5.0 to 10.0 mm. For example, the second clearance distance Clr2_top is set to 2.0 to 6.0 mm. The second ratio Clr2/Gap2 is set to 0.20 or more and 1.00 or less. For example, the third distance Gap3 is set to 5.0 to 10.0 mm. For example, the third clearance distance Clr3_top is set to 2.0 to 6.0 mm. The third ratio Clr3/Gap3 is set to 0.20 or more and 1.00 or less.

As described above, the current sensor 5 in the twenty-sixth embodiment is configured. In the twenty-sixth embodiment also, the same effects as those achieved in the sixth embodiment are achieved. In addition, in the twenty-sixth embodiment, the effects described below are also achieved.

[15] It is assumed herein that an ac current at a frequency of 1 Hz to several kilohertz and with an amplitude of 0 to 2000 A has flown in the first bus bar 100. It is also assumed that a dc current having the same value as that of the amplitude of the ac current has flown in the first bus bar 100. It is further assumed that the amplitude of the ac current is Ia. It is also assumed that a value of a dc current which is the same as that of the amplitude of the ac current is Id. It is assumed that a value obtained by dividing the Ia by the Id is an amplitude ratio Ia/Id. It is also assumed that the Ia and the Id are detected by the first detection unit 120.

It is further assumed that a value of the first distance Gap1 is fixed, while the first ratio Clr1/Gap1 is less than 0.20. At this time, the first clearance distance Clr1_top is relatively short, and accordingly the first plate portion 101 and the first gap forming portion 111 are relatively close to each other. Thus, the first plate portion 101 and the first gap 117 are relatively close to each other, and accordingly a magnetic field leaking from the first gap 117 easily enters the first plate portion 101. As a result, due to the magnetic field leaking from the first gap 117 and entering the first plate portion 101, the frequency of the ac current in the inverter changes to cause a time change in the magnetic field, and consequently an induced electromotive force in a direction reverse to a direction of the current flowing from the inverter into the first plate portion 101 tends to be generated. Due to the magnetic field generated by a current resulting from the induced electromotive force and flowing in the first plate portion 101, the magnetic field applied to the first gap 117 easily changes. Therefore, an error is more likely to occur in the current detected by the current sensor 5. As the frequency of the ac current from the inverter increases, due to a skin effect, the current caused by the dielectric electromotive force described above to flow across a surface of the first plate portion 101 increases, and accordingly the magnetic field applied to the first gap 117 is more likely to vary. Consequently, an error is more likely to occur in the current detected by the current sensor 5.

By contrast, in the twenty-sixth embodiment, the first ratio Clr1/Gap1 is set to 0.20 or more.

Accordingly, the first clearance distance Clr1_top is longer than in a case where the value of the first distance Gap1 is fixed and the first ratio Clr1/Gap1 is less than 0.20. As a result, the first plate portion 101 and the first gap forming portion 111 are farther away from each other than in the case where the value of the first distance Gap1 is fixed and the first ratio Clr1/Gap1 is less than 0.20. Thus, the first plate portion 101 and the first gap 117 are farther away from each other than in the case where the value of the first distance Gap1 is fixed and the first ratio Clr1/Gap1 is less than 0.20, and therefore the magnetic force lines entering the first plate portion 101 from the first gap 117 are suppressed. This suppresses generation of the induced electromotive force in the direction reverse to the direction of the current flowing in the first plate portion 101. Consequently, an error is less likely to occur in the current detected by the current sensor 5 to accordingly improve the frequency characteristic of the current sensor 5.

Figure 59:
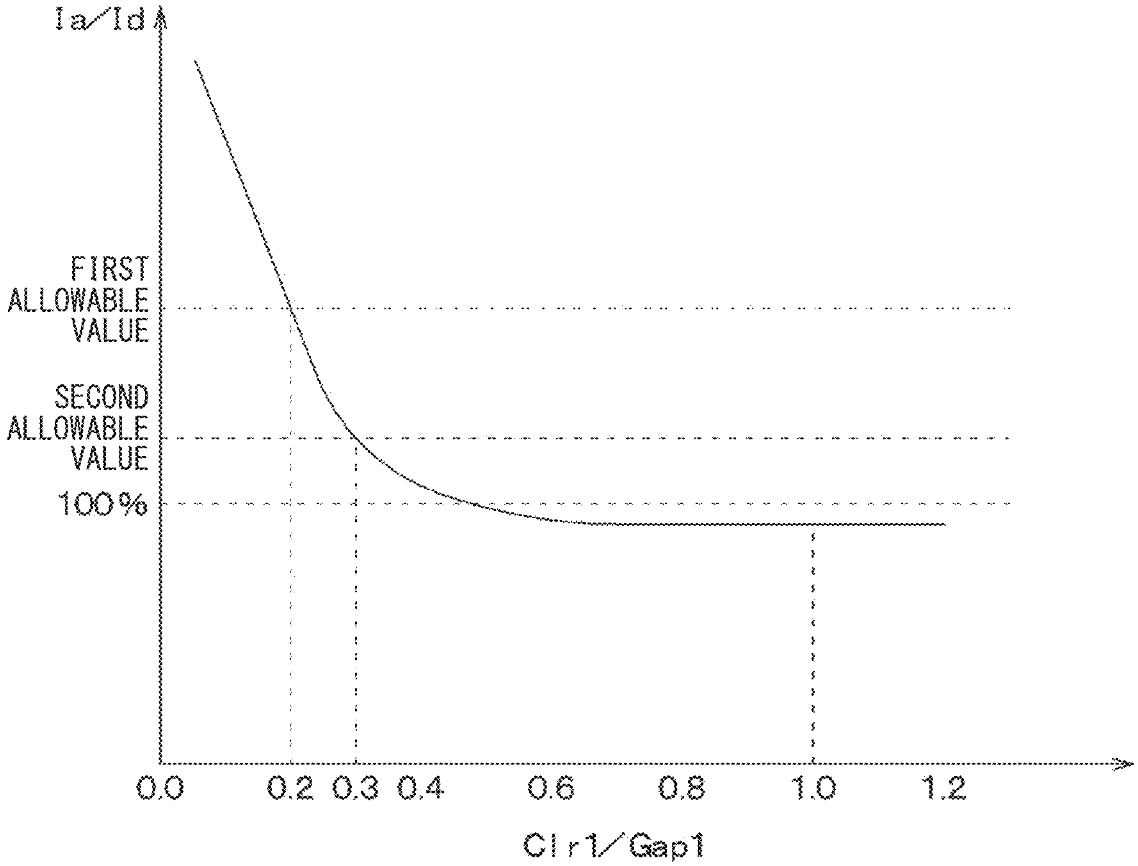
FIG. 59 is a relationship diagram of a first ratio and an amplitude ratio in the current sensor.

As a result, as illustrated in FIG. 59, the amplitude ratio Ia/Id when the first ratio Clr1/Gap1 is 0.20 or more is closer to 100% than the amplitude ratio Ia/Id when the first ratio Clr1/Gap1 is less than 0.20, which is not more than a first allowable value. More preferably, the first ratio Clr1/Gap1 is set to 0.30 or more. Since the first ratio Clr1/Gap1 is set to 0.30 or more, the amplitude ratio Ia/Id is closer to 100% than in a case where the first ratio Clr1/Gap1 is 0.20 or more and less than 0.30. Thus, the first ratio Clr1/Gap1 is set to 0.30 or more, and accordingly an error in the current detected by the current sensor 5 is closer to 0 than in the case where the first ratio Clr1/Gap1 is 0.20 or more and less than 0.30. Note that the first allowable value and a second allowable value are values related to an error allowed for the current sensor 5. For example, the first allowable value is 100.03%. For example, the second allowable value is 100.01%.

It is assumed herein that the first ratio Clr1/Gap1 is larger than 1.00, i.e., Clr1/Gap1>1 is satisfied. At this time, the first clearance distance Clr1_top is larger than the first distance Gap1. Accordingly, a size of the first core 110 in the thickness direction DT is larger than in a case where the first ratio Clr1/Gap1 is 1.00 or less. As a result, a size of the current sensor 5 is larger than that in a case where the first ratio Clr1/Gap1 is 1.00 or less.

Therefore, in the twenty-sixth embodiment, the first ratio Clr1/Gap1 is set to 1.00 or less.

Accordingly, the size of the first core 110 in the thickness direction DT is smaller than that in a case where the first ratio Clr1/Gap1 is larger than 1.00. As a result, the size of the current sensor 5 is smaller than that in the case where the first ratio Clr1/Gap1 is larger than 1.00. This suppresses an increase in the size of the current sensor 5.

In the twenty-sixth embodiment, the second ratio Clr2/Gap2 is set to 0.20 or more and 1.00 or less.

Consequently, in the same manner as described above, an error is less likely to occur in the current detected by the current sensor 5 than in a case where a value of the second distance Gap2 is fixed and the second ratio Clr2/Gap2 is less than 0.20 to accordingly improve the frequency characteristic of the current sensor 5. In addition, the size of the current sensor 5 is inhibited from becoming larger than that in a case where the second ratio Clr2/Gap2 is larger than 1.00.

Moreover, in the twenty-sixth embodiment, the third ratio Clr3/Gap3 is set to 0.20 or more and 1.00 or less.

Consequently, in the same manner as described above, an error is less likely to occur in the current detected by the current sensor 5 than in a case where a value of the third distance Gap3 is fixed and the third ratio Clr3/Gap3 is less than 0.20 to accordingly improve the frequency characteristic of the current sensor 5. In addition, the size of the current sensor 5 is inhibited from becoming larger than that in a case where the third ratio Clr3/Gap3 is larger than 1.00.

Twenty-Seventh Embodiment

Figure 60:
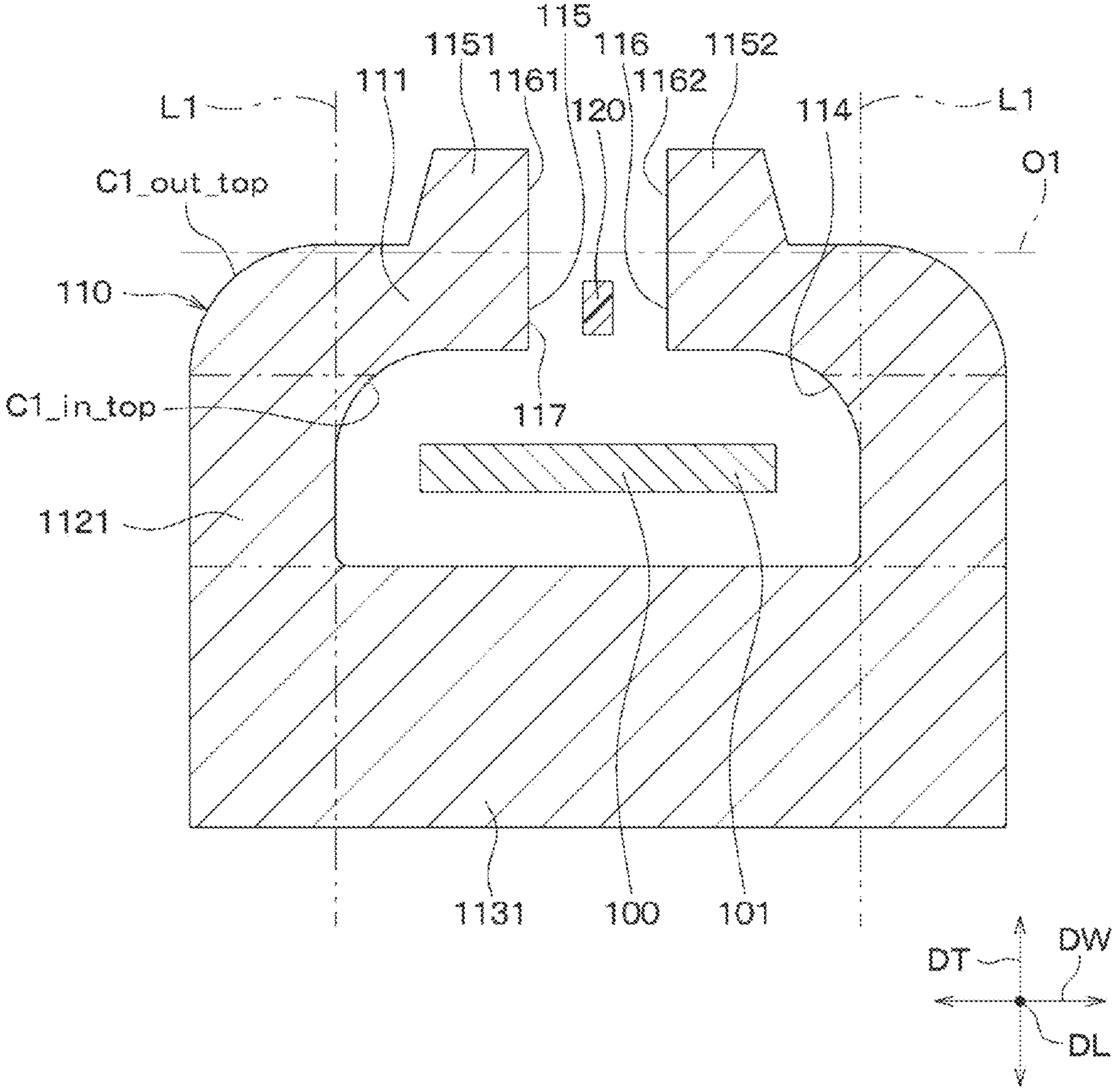
FIG. 60 is a cross-sectional view of the first bus bar, the first core, and the first detection unit in the current sensor in a twenty-seventh embodiment.
Figure 61:
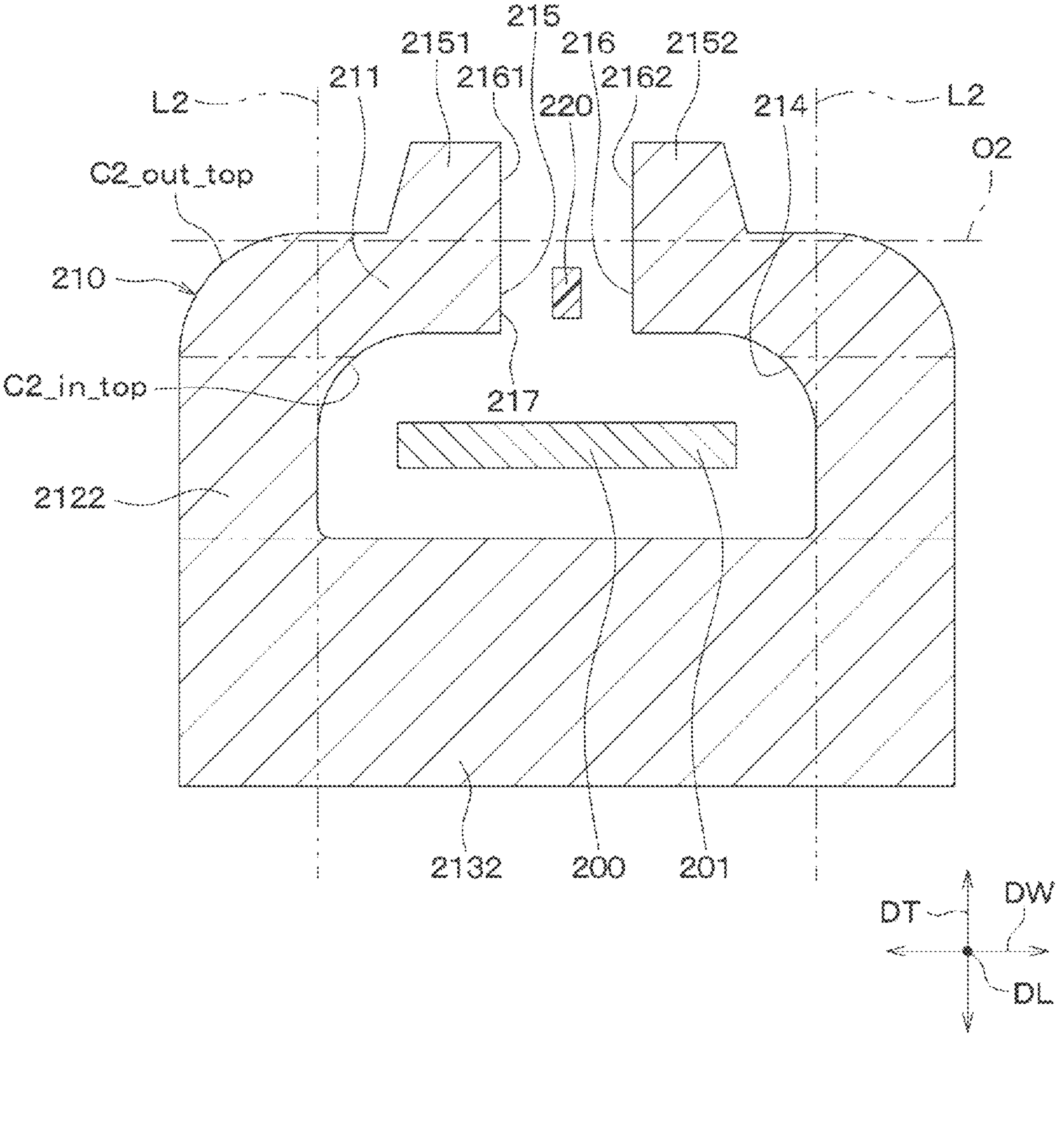
FIG. 61 is a cross-sectional view of the second bus bar, the second core, and the second detection unit in the current sensor.
Figure 62:
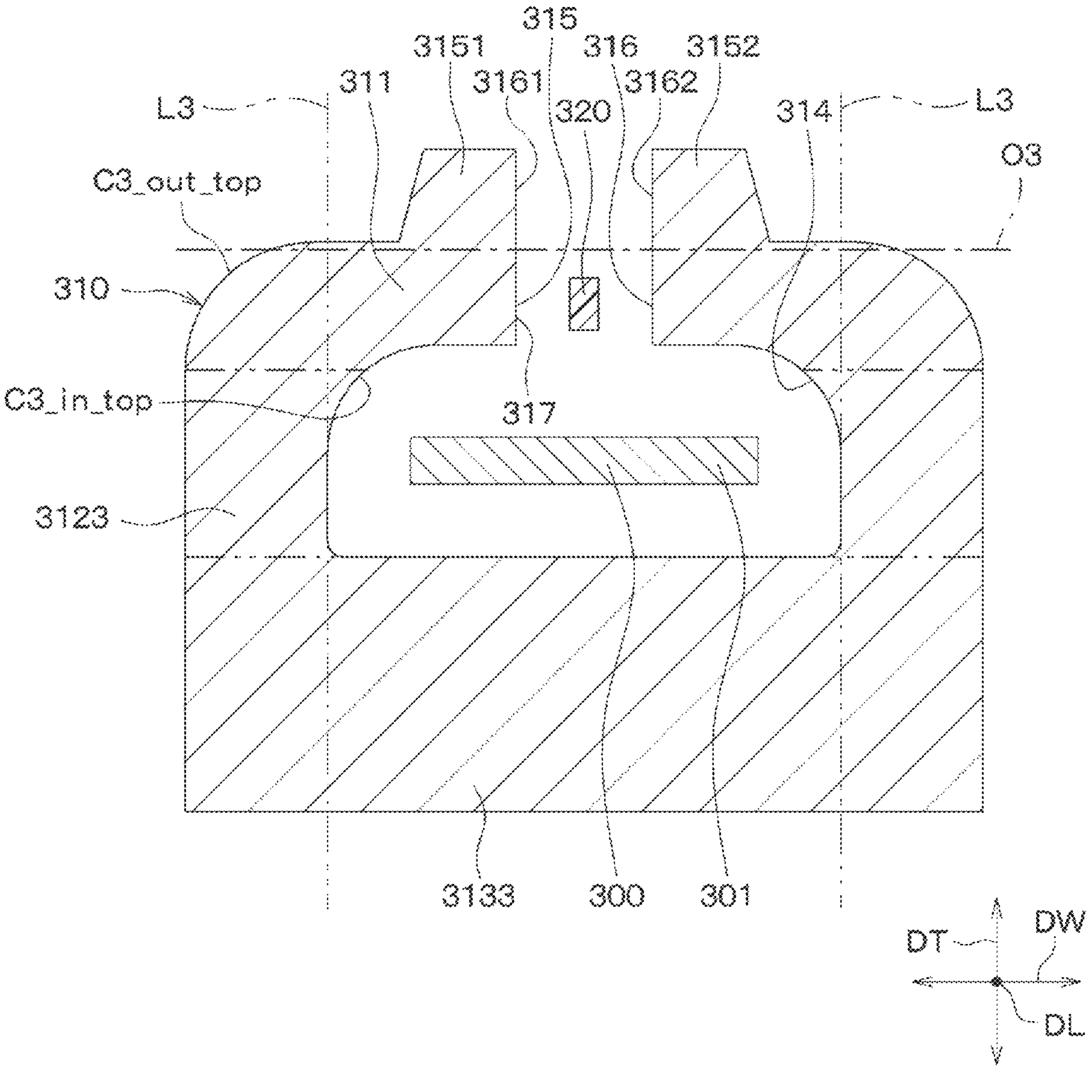
FIG. 62 is a cross-sectional view of the third bus bar, the third core, and the third detection unit in the current sensor.

As illustrated in FIGS. 60 to 62, the twenty-seventh embodiment has the same configuration as that of the twelfth embodiment. In addition, in the twenty-seventh embodiment, the effects described below are also achieved. Note that, in FIG. 60 to 62, to avoid complication, illustration of the case 70 and the like is omitted.

[16] The first protruding portion 1151 and the second protruding portion 1152 protrude in the thickness direction DT from an outer surface of the first gap forming portion 111 facing outwardly in the thickness direction DT. Consequently, the first protruding portion 1151 and the second protruding portion 1152 protrude in the thickness direction DT from a surface of the first gap forming portion 111 which is opposite to the first plate portion 101.

It is to be noted herein that the magnetic force lines passing through the first gap forming portion 111 are more likely to pass through the first protruding portion 1151 and the second protruding portion 1152 than to go to the outside of the first core 110. As described above, the first protruding portion 1151 and the second protruding portion 1152 protrude in the thickness direction DT from an outer surface of the first gap forming portion 111 facing outwardly in the thickness direction DT. Accordingly, the first protruding portion 1151 and the second protruding portion 1152 are farther away from the first plate portion 101 than in a case where the first protruding portion 1151 and the second protruding portion 1152 protrude from an inner surface of the first gap forming portion 111 facing inwardly in the thickness direction DT toward the first plate portion 101. Consequently, the magnetic force lines passing through the first protruding portion 1151 and the second protruding portion 1152 are less likely to pass through the first plate portion 101. This suppresses the magnetic force lines entering the first plate portion 101 from the first gap 117. This suppresses generation of the induced electromotive force in a direction reverse to the direction of the current flowing in the first plate portion 101. Consequently, an error is less likely to occur in the current detected by the current sensor 5 to accordingly improve the frequency characteristic of the current sensor 5.

The third protruding portion 2151 and the fourth protruding portion 2152 protrude in the thickness direction DT from an outer surface of the second gap forming portion 211 facing outwardly in the thickness direction DT. Consequently, the third protruding portion 2151 and the fourth protruding portion 2152 protrude in the thickness direction DT from a surface of the second gap forming portion 211 which is opposite to the second plate portion 201.

It is to be noted herein that the magnetic force lines passing through the second gap forming portion 211 are more likely to pass through the third protruding portion 2151 and the fourth protruding portion 2151 than to go to the outside of the second core 210. As described above, the third protruding portion 2151 and the fourth protruding portion 2152 protrude in the thickness direction DT from an outer surface of the second gap forming portion 211 facing outwardly in the thickness direction DT. Accordingly, the third protruding portion 2151 and the fourth protruding portion 2152 are farther away from the second plate portion 201 than in a case where the third protruding portion 2151 and the fourth protruding portion 2152 protrude from an inner surface of the second gap forming portion 211 facing inwardly in the thickness direction DT toward the second plate portion 201. Consequently, the magnetic force lines passing through the third protruding portion 2151 and the fourth protruding portion 2152 are less likely to pass through the second plate portion 201. This suppresses the magnetic force lines entering the second plate portion 201 from the second gap 217. This suppresses generation of the induced electromotive force in a direction reverse to a direction of the current flowing in the second plate portion 201. Consequently, an error is less likely to occur in the current detected by the current sensor 5 to accordingly improve the frequency characteristic of the current sensor 5.

The fifth protruding portion 3151 and the sixth protruding portion 3152 protrude in the thickness direction DT from an outer surface of the third gap forming portion 311 facing outwardly in the thickness direction DT. Accordingly, the fifth protruding portion 3151 and the sixth protruding portion 3152 protrude in the thickness direction DT from a surface of the third gap forming portion 311 which is opposite to the third plate portion 301.

It is to be noted herein that the magnetic force lines passing through the third gap forming portion 311 are more likely to pass through the fifth protruding portion 3151 and the sixth protruding portion 3152 than to go to the outside of the third core 310. As described above, the fifth protruding portion 3151 and the sixth protruding portion 3152 protrude in the thickness direction DT from an outer surface of the third gap forming portion 311 facing outwardly in the thickness direction DT. Accordingly, the fifth protruding portion 3151 and the sixth protruding portion 3152 are farther away from the third plate portion 301 than in a case where the fifth protruding portion 3151 and the sixth protruding portion 3152 protrude from an inner surface of the third gap forming portion 311 which faces inwardly in the thickness direction DT toward the third plate portion 301. Consequently, the magnetic force lines passing through the fifth protruding portion 3151 and the sixth protruding portion 3152 are less likely to pass through the third plate portion 301. This suppresses the magnetic force lines entering the third plate portion 301 from the third gap 317. This suppresses generation of the induced electromotive force in a direction reverse to a direction of the current flowing in the third plate portion 301. Consequently, an error is less likely to occur in the current detected by the current sensor 5 to accordingly improve the frequency characteristic of the current sensor 5.

Twenty-Eighth Embodiment

In the twenty-eighth embodiment, as illustrated in FIGS. 63 to 68, the forms of the first bus bar 100, the second bus bar 200 and the third bus bar 300 are different from those in the twenty-fourth embodiment. In addition, the first protruding portions 731, the second protruding portions 732, and the third protruding portions 733 have shapes different from those in the twenty-fourth embodiment. The twenty-eighth embodiment is similar to the twenty-fourth embodiment in other respects.

Figure 63:
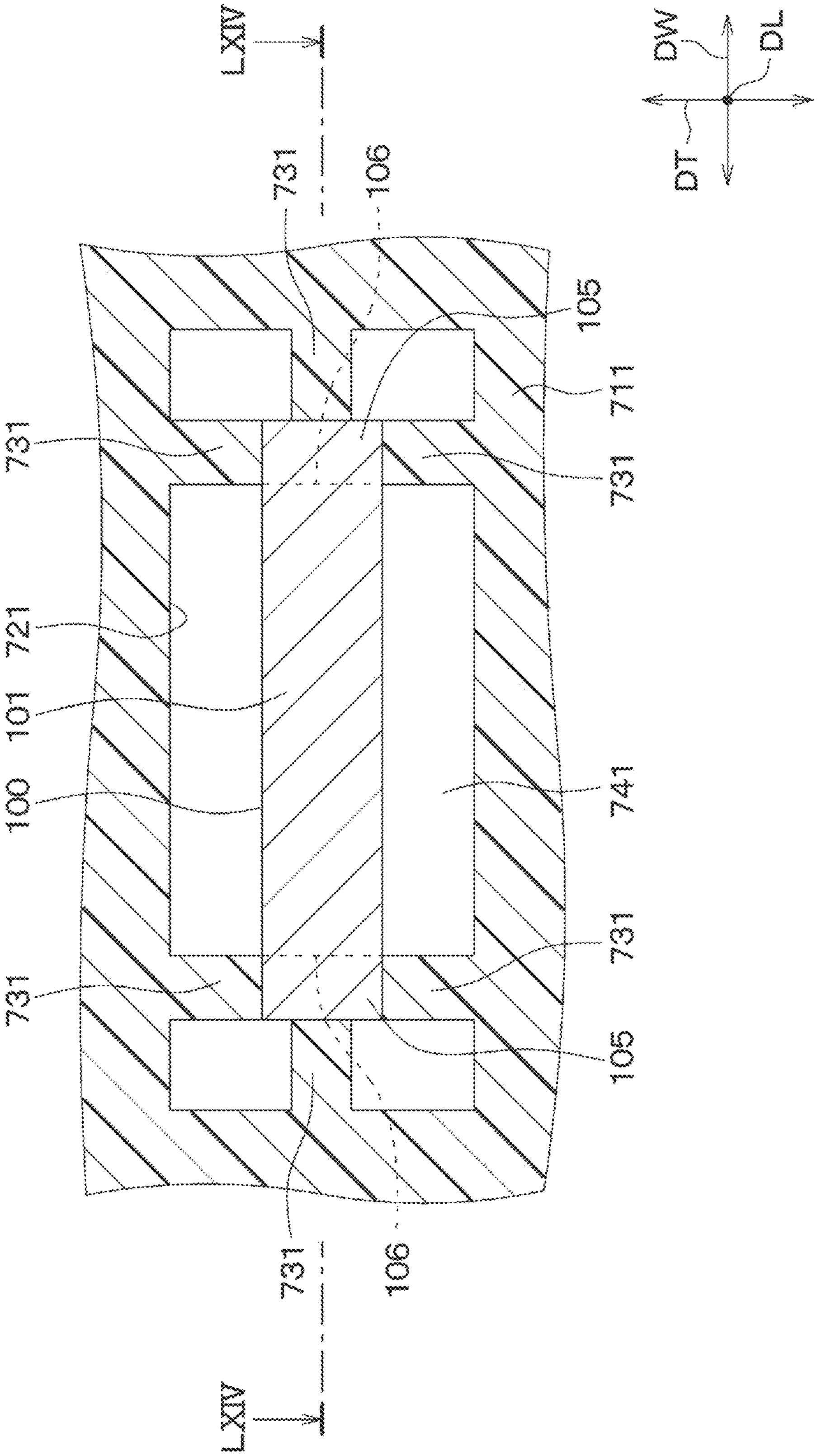
FIG. 63 is a cross-sectional view of the first bus bar and the first opening portion of the case in the current sensor according to a twenty-eighth embodiment.
Figure 64:
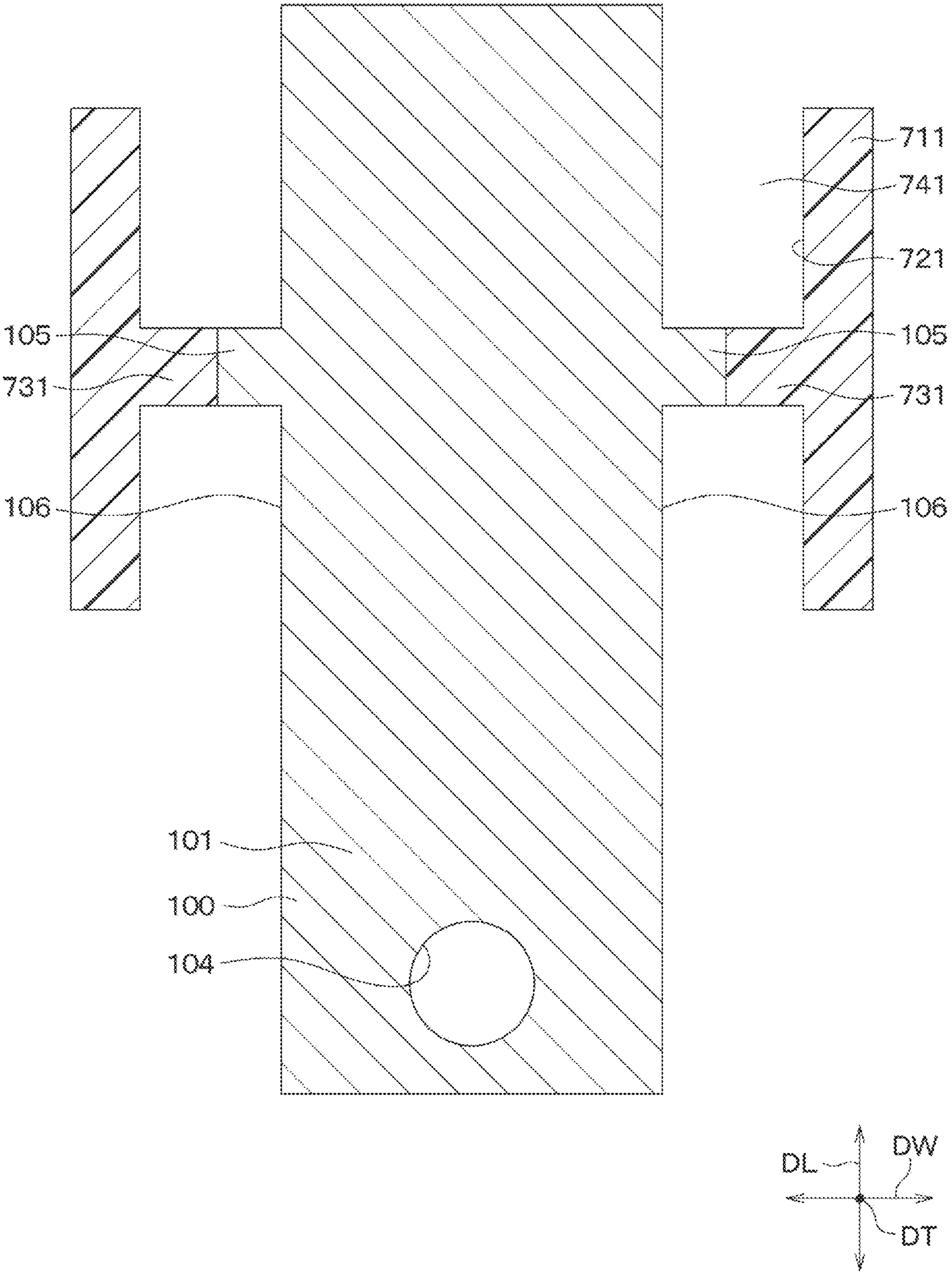
FIG. 64 is a cross-sectional view along a line LXIV-LXIV in FIG. 63.

As illustrated in FIGS. 63 and 64, the first bus bar 100 has first-bus-bar protruding portions 105 in addition to the first plate portion 101, the first extending portion 102, and the second extending portion 103.

The first-bus-bar protruding portions 105 protrude from surfaces of the first bus bar 100 which face the first opening portion 711 toward the first opening portion 711. Specifically, the first-bus-bar protruding portions 105 protrude in the width direction DW from first side surfaces 106 of the first plate portion 101. Note that the first side surfaces 106 are surfaces of the first plate portion 101 which are perpendicular to the width direction DW, and correspond to surfaces of the first plate portion 101 which cross the width direction DW. Each of the first-bus-bar protruding portions 105, which is formed herein in a quadrangular prism, is not limited thereto. The first-bus-bar protruding portion 105 may also be formed in a polygonal prism shape, a cylindrical shape, a hemispherical shape, or the like.

Each of the first protruding portions 731 protruding in the width direction DW is in contact with the first-bus-bar protruding portion 105 in the width direction DW. Furthermore, the first protruding portions 731 protruding in the thickness direction DT are in contact with the first-bus-bar protruding portions 105 in the thickness direction DT. Each of the first protruding portions 731 has a Young's modulus lower than a Young's modulus of each of the first-bus-bar protruding portions 105. Accordingly, each of the first protruding portions 731 is more likely to be deformed than each of the first-bus-bar protruding portions 105. Note that the Young's modulus of the first protruding portion 731 is estimated from, e.g., a Young's modulus of a material of the case 70. Note that the Young's modulus of the first-bus-bar protruding portion 105 is estimated from, e.g., a Young's modulus of a material of the first bus bar 100.

Figure 65:
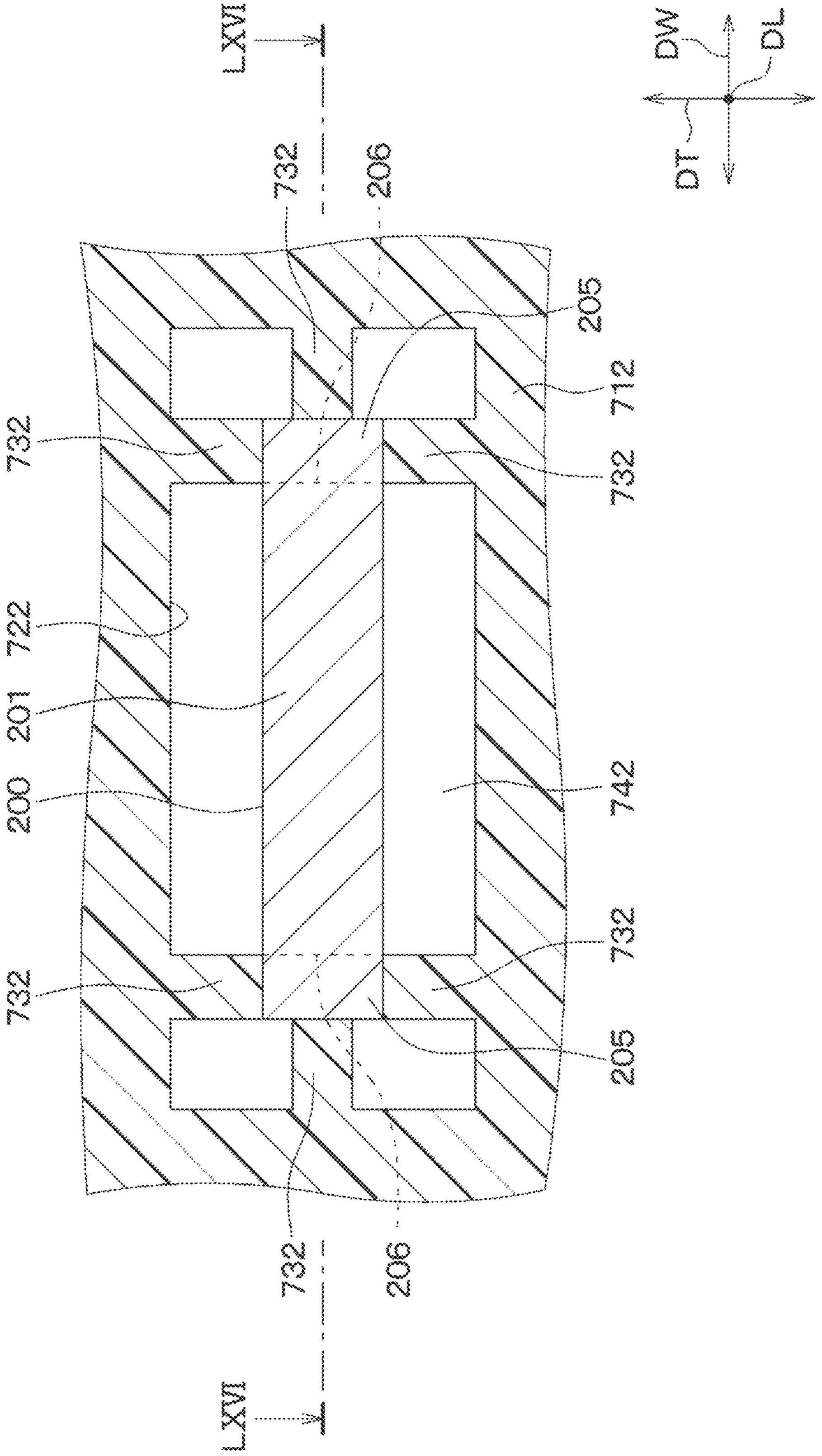
FIG. 65 is a cross-sectional view of the second bus bar and the second opening portion of the case in the current sensor.
Figure 66:
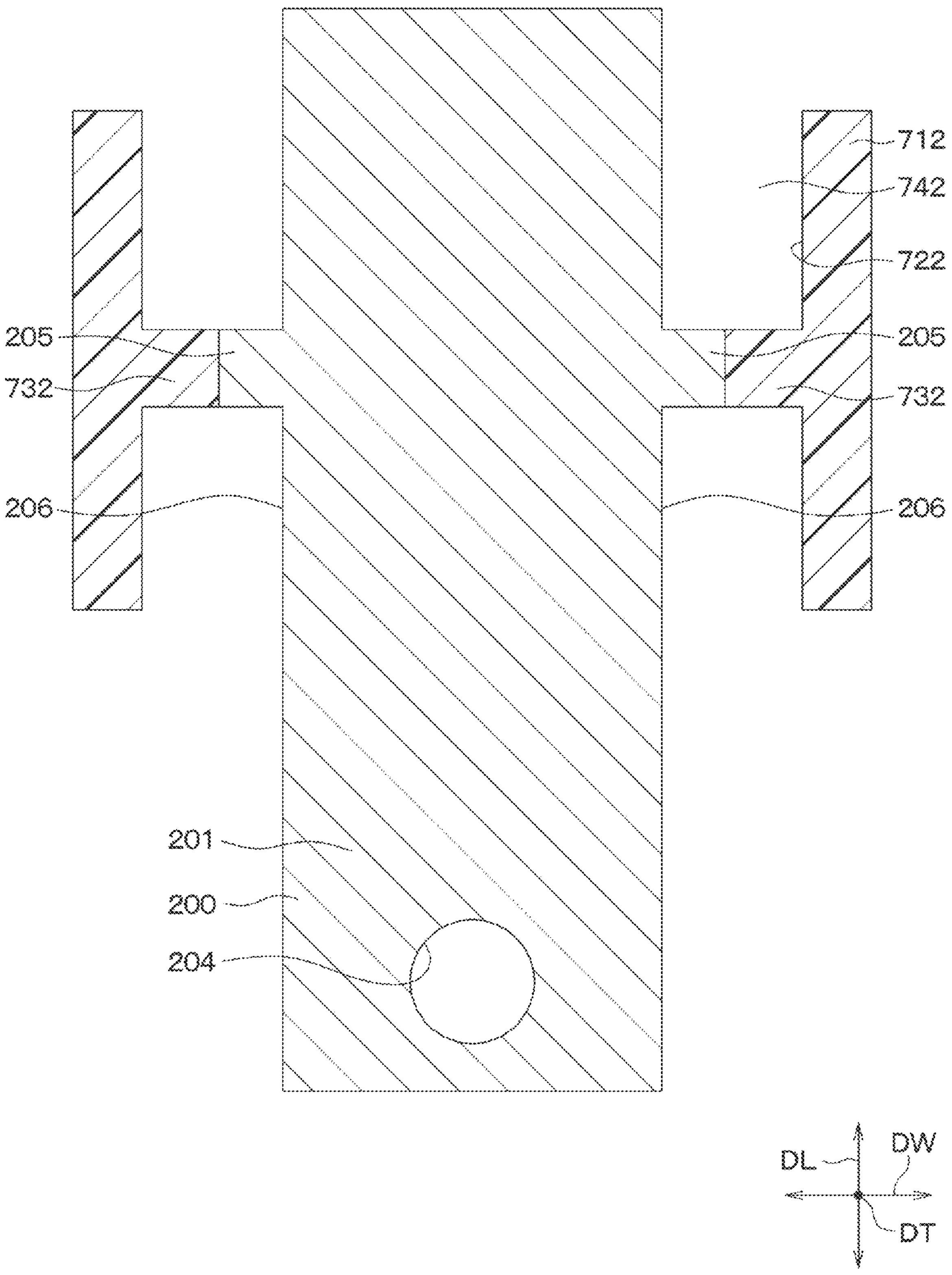
FIG. 66 is a cross-sectional view along a line LXVI-LXVI in FIG. 65.

As illustrated in FIGS. 65 and 66, the second bus bar 200 has second-bus-bar protruding portions 205 in addition to the second plate portion 201, the third extending portion 202, and the fourth extending portion 203.

The second-bus-bar protruding portions 205 protrude from surfaces of the second bus bar 200 which face the second opening portion 712 toward the second opening portion 712. Specifically, the second-bus-bar protruding portions 205 protrude in the width direction DW from second side surfaces 206 of the second plate portion 201. Note that the second side surfaces 206 are surfaces of the second plate portion 201 which are perpendicular to the width direction DW, and correspond to surfaces of the second plate portion 201 which cross the width direction DW. Each of the second-bus-bar protruding portions 205, which is formed herein in a quadrangular prism, is not limited thereto. The second-bus-bar protruding portion 205 may also be formed in a polygonal prism shape, a cylindrical shape, a hemispherical shape, or the like.

Each of the second protruding portions 732 protruding in the width direction DW is in contact with the second-bus-bar protruding portion 205 in the width direction DW. Furthermore, the second protruding portions 733 protruding in the thickness direction DT are in contact with the second-bus-bar protruding portions 205 in the thickness direction DT. Each of the second protruding portions 732 has a Young's modulus lower than a Young's modulus of each of the second-bus-bar protruding portions 205. Accordingly, each of the second protruding portions 732 is more likely to be deformed than each of the second-bus-bar protruding portions 205. Note that the Young's modulus of the second protruding portion 732 is estimated from, e.g., a Young's modulus of a material of the case 70. Note that the Young's modulus of the second-bus-bar protruding portion 205 is estimated from, e.g., a Young's modulus of a material of the first bus bar 200.

Figure 67:
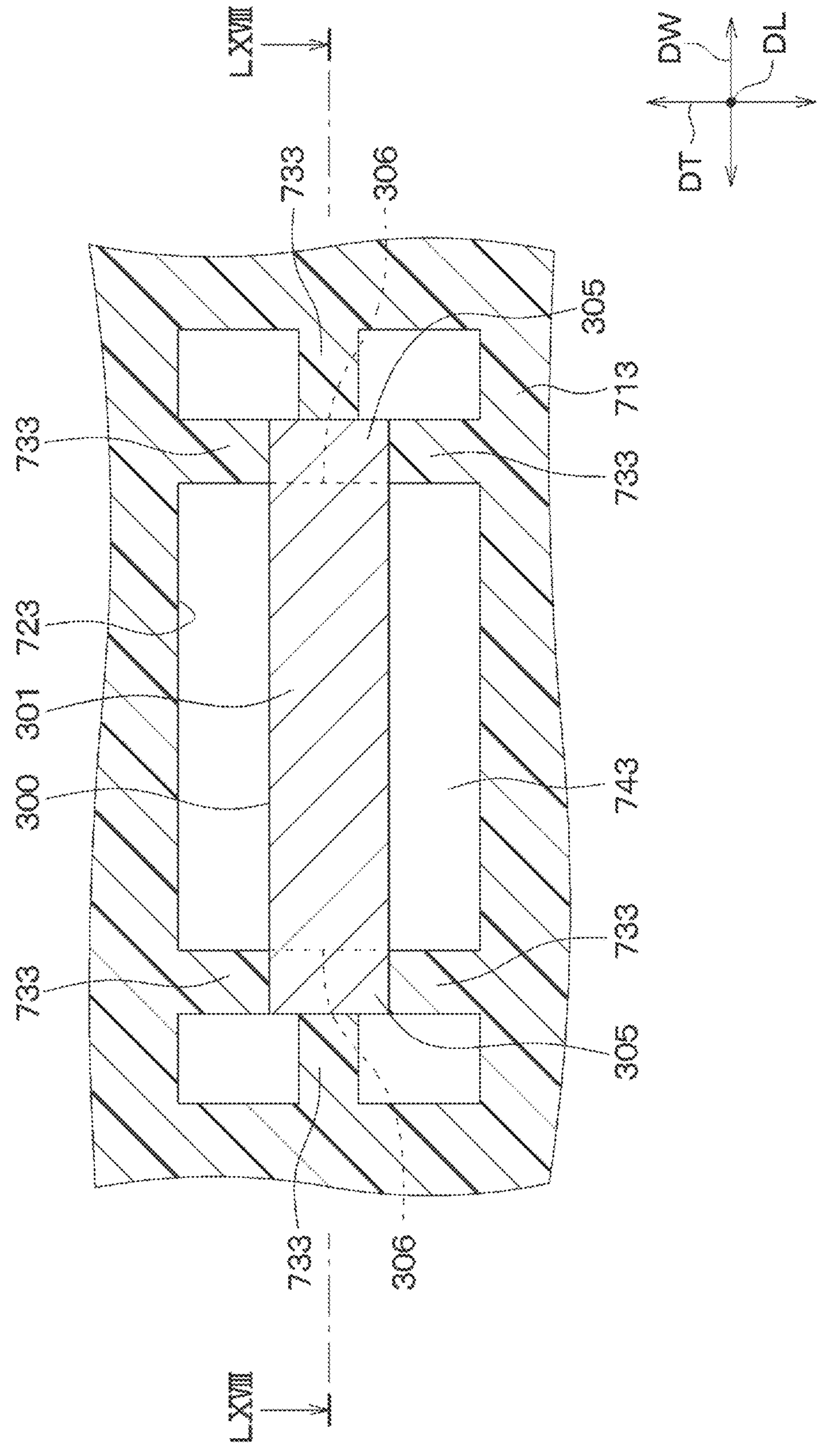
FIG. 67 is a cross-sectional view of the third bus bar and the third opening portion of the case in the current sensor.
Figure 68:
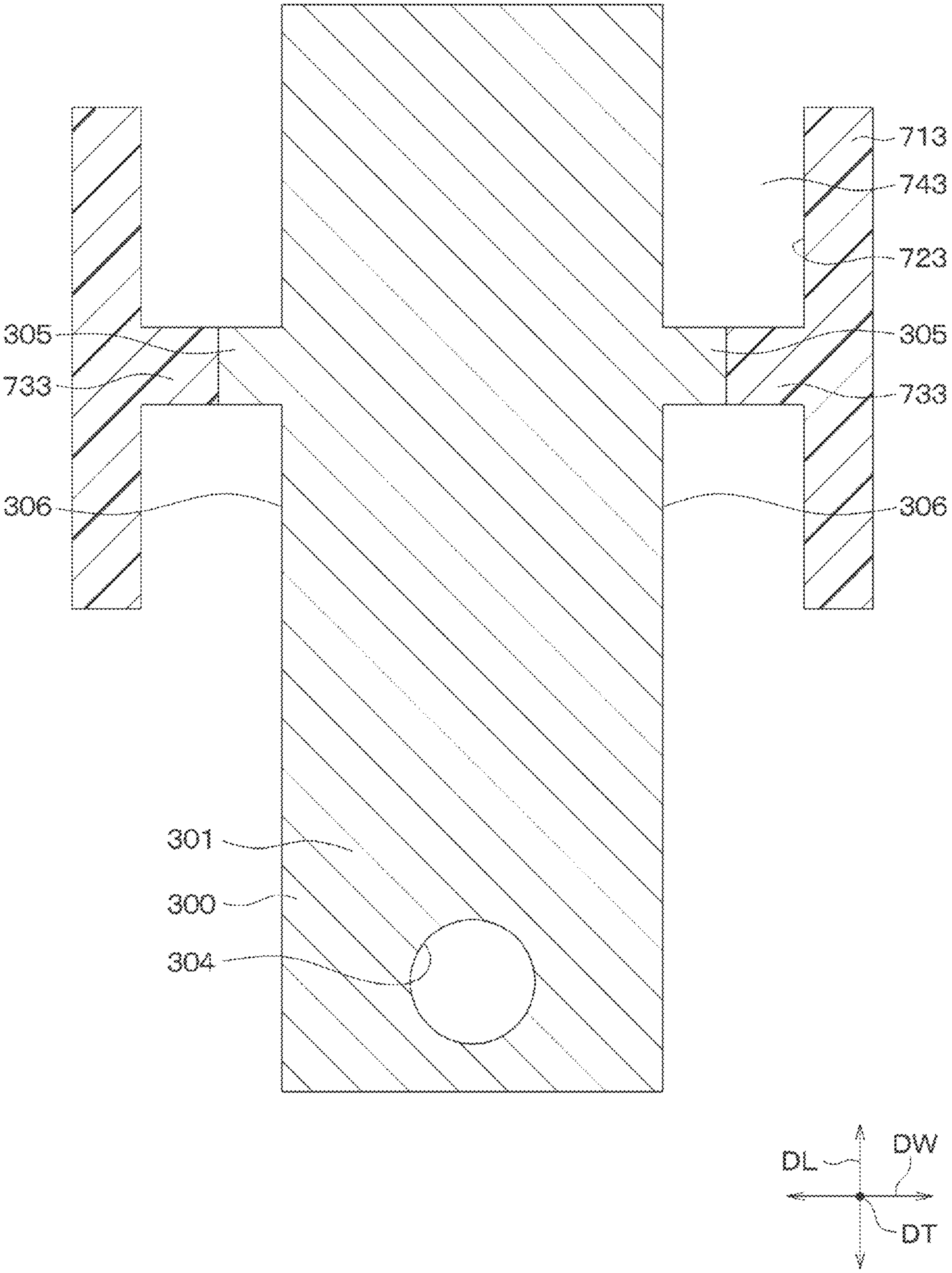
FIG. 68 is a cross-sectional view along a line LXVIII-LXVIII in FIG. 67.

As illustrated in FIGS. 67 and 68, the third bus bar 300 has third-bus-bar protruding portions 305 in addition to the third plate portion 301, the fifth extending portion 302, and the sixth extending portion 303.

The third-bus-bar protruding portions 305 protrude from surfaces of the third bus bar 300 which face the third opening portion 713 toward the third opening portion 713. Specifically, the third-bus-bar protruding portions 305 protrude in the width direction DW from third side surfaces 306 of the third plate portion 301. Note that the third side surfaces 306 are surfaces of the third plate portion 301 which are perpendicular to the width direction DW, and correspond to surfaces of the third plate portion 301 which cross the width direction DW. Each of the third-bus-bar protruding portions 305, which is formed herein in a quadrangular prism, is not limited thereto. The third-bus-bar protruding portion 305 may also be formed in a polygonal prism shape, a cylindrical shape, a hemispherical shape, or the like.

Each of the third protruding portions 733 protruding in the width direction DW is in contact with the third-bus-bar protruding portion 305 in the width direction DW. Furthermore, the third protruding portions 733 protruding in the thickness direction DT are in contact with the third-bus-bar protruding portions 305 in the thickness direction DT. Each of the third protruding portions 733 has a Young's modulus lower than a Young's modulus of each of the third-bus-bar protruding portions 305. Accordingly, each of the third protruding portions 733 is more likely to be deformed than each of the third-bus-bar protruding portions 305. Note that the Young's modulus of the third protruding portion 733 is estimated from, e.g., a Young's modulus of a material of the case 70. Note that the Young's modulus of the third-bus-bar protruding portion 305 is estimated from, e.g., a Young's modulus of a material of the third bus bar 300.

As described above, the current sensor 5 in the twenty-eighth embodiment is configured. In the twenty-eighth embodiment also, the same effects as those achieved in the twenty-fourth embodiment are achieved. In addition, in the twenty-eighth embodiment, the effects described below are also achieved.

[17-1] The first bus bar 100 has the first-bus-bar protruding portions 105. The first-bus-bar protruding portions 105 protrude from the first side surfaces 106 in the width direction DW to come into contact with the first protruding portions 731 in the width direction DW. The second bus bar 200 has the second-bus-bar protruding portions 205. The second-bus-bar protruding portions 205 protrude from the second side surfaces 206 in the width direction DW to come into contact with the second protruding portions 732 in the width direction DW. The third bus bar 300 has the third-bus-bar protruding portions 305. The third-bus-bar protruding portions 305 protrude from the third side surfaces 306 in the width direction DW to come into contact with the third protruding portions 733 in the width direction DW.

A current flows in the first bus bar 100, the second bus bar 200, and the third bus bar 300 to thereby cause the first bus bar 100, the second bus bar 200, and the third bus bar 300 to generate heat. Accordingly, in the twenty-eighth embodiment, the first space 741 is defined by the first protruding portions 731 and the first-bus-bar protruding portions 105. Meanwhile, the second space 742 is defined by the second protruding portions 732 and the second-bus-bar protruding portions 205. Meanwhile, the third space 743 is defined by the third protruding portions 733 and the third-bus-bar protruding portions 305. A size of the first space 741 when the first-bus-bar protruding portions 105 are in contact with the first protruding portions 731 in the width direction DW is larger than a size of the first space 741 when the first side surfaces 106 are in contact with the first protruding portions 731 in the width direction DW. Further, a size of the second space 742 when the second-bus-bar protruding portions 205 are in contact with the second protruding portions 732 in the width direction DW is larger than a size of the second space 742 when the second side surfaces 206 are in contact with the second protruding portions 742 in the width direction DW. A size of the third space 743 when the third-bus-bar protruding portions 305 are in contact with the third protruding portions 733 in the width direction DW is larger than a size of the third space 743 when the third side surfaces 306 are in contact with the third protruding portions 733 in the width direction DW.

As a result, the heat generated by the first bus bar 100, the second bus bar 200 and the third bus bar 300 is less likely to be transferred to the case. Consequently, heat is less likely to be transferred from the case 70 to the first detection unit 120, the second detection unit 220, and the third detection unit 320. This suppresses characteristic changes and failures in the first detection unit 120, the second detection unit 220, and the third detection unit 320.

In addition, since the first-bus-bar protruding portions 105 are in contact with the first protruding portions 731 in the width direction DW, the case 70 is easily positioned with respect to the first bus bar 100 in the width direction DW. In addition, since the second-bus-bar protruding portions 205 are in contact with the second protruding portions 732 in the width direction DW, the case 70 is easily positioned with respect to the first bus bar 100 in the width direction DW. In addition, since the third-bus-bar protruding portions 305 are in contact with the third protruding portions 733 in the width direction DW, the case 70 is easily positioned with respect to the third bus bar 300 in the width direction DW.

[17-2] The first protruding portions 731 protrude from the first facing surfaces 721 in the thickness direction DT. The first protruding portions 731 protruding in the thickness direction DT are in contact with the first-bus-bar protruding portions 105 in the thickness direction DT.

This allows the case 70 to be easily positioned with respect to the first bus bar 100 in the thickness direction DT.

The second protruding portions 732 protrude from the second facing surfaces 722 in the thickness direction DT. The second protruding portions 732 protruding in the thickness direction DT are in contact with the second-bus-bar protruding portions 205 in the thickness direction DT.

This allows the case 70 to be easily positioned with respect to the second bus bar 200 in the thickness direction DT.

The third protruding portions 733 protrude from the third facing surfaces 723 in the thickness direction DT. The third protruding portions 733 protruding in the thickness direction DT are in contact with the third-bus-bar protruding portions 305 in the thickness direction DT.

This allows the case 70 to be easily positioned with respect to the third bus bar 300 in the thickness direction DT.

[17-3] Each of the first protruding portions 731 has a Young's modulus lower than a Young's modulus of each of the first-bus-bar protruding portions 105.

Accordingly, each of the first protruding portions 731 is more likely to be deformed than each of the first-bus-bar protruding portions 105. As a result, the first protruding portions 731 are likely to absorb a stress energy generated by the first plate portion 101 when displaced in a case where the first plate portion 101 is connected to the outside thereof, such as a portion of the inverter. This suppresses damage to a main body of the case 70.

Each of the second protruding portions 732 has a Young's modulus lower than a Young's modulus of each of the second-bus-bar protruding portions 205.

Accordingly, each of the second protruding portions 732 is more likely to be deformed than each of the second-bus-bar protruding portions 205. As a result, the second protruding portions 732 are likely to absorb a stress energy generated by the second plate portion 201 when displaced in a case where the second plate portion 201 is connected to the outside thereof, such as a portion of the inverter. This suppresses damage to a main body of the case 70.

Each of the third protruding portions 733 has a Young's modulus lower than a Young's modulus of each of the third-bus-bar protruding portions 305.

Accordingly, each of the third protruding portions 733 is more likely to be deformed than each of the third-bus-bar protruding portions 305. As a result, the third protruding portions 733 are likely to absorb a stress energy generated by the third plate portion 301 when displaced in a case where the third plate portion 301 is connected to the outside thereof, such as a portion of the inverter. This suppresses damage to a main body of the case 70.

Twenty-Ninth Embodiment

Figure 69:
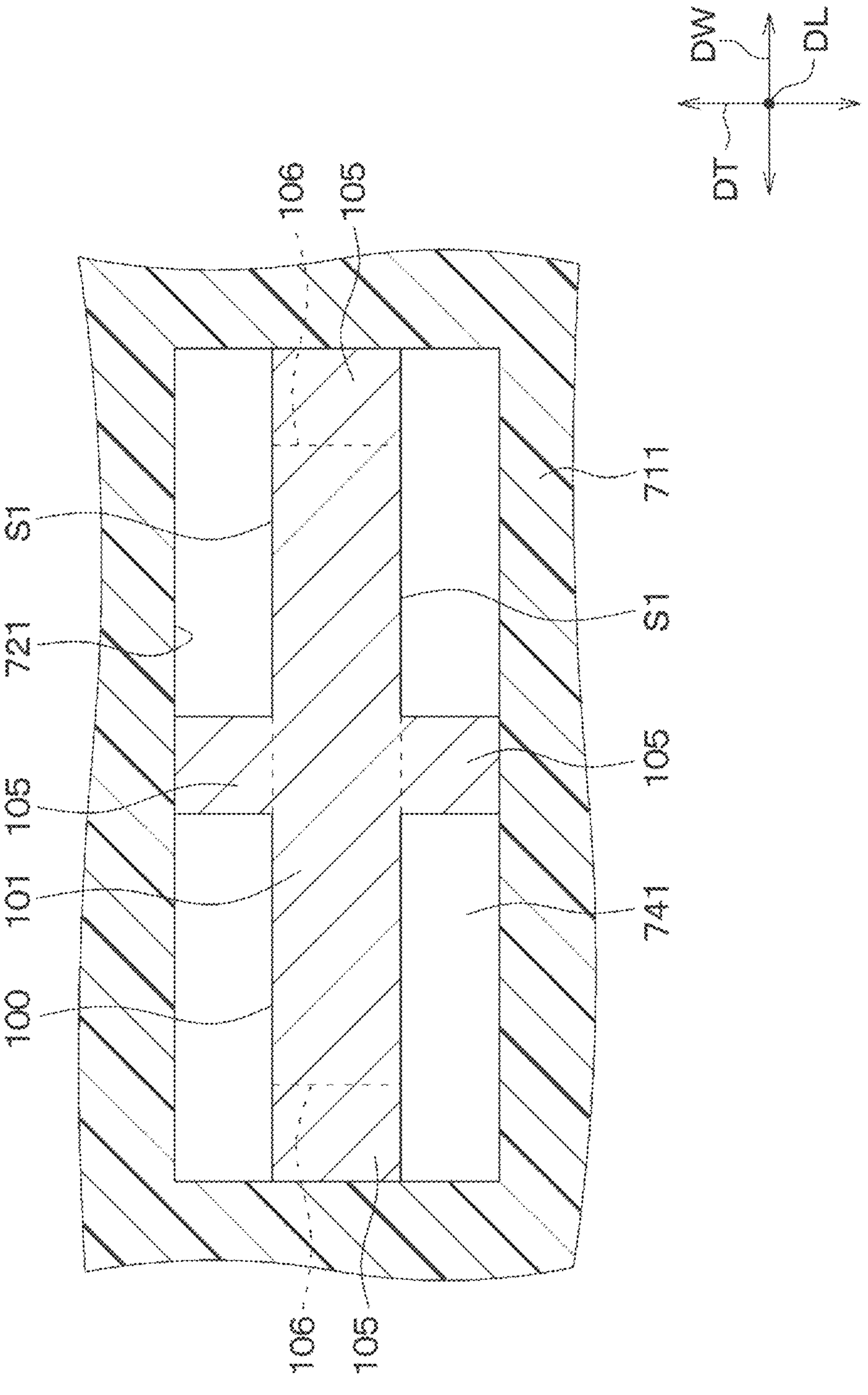
FIG. 69 is a cross-sectional view of the first bus bar and the first opening portion of the case in the current sensor according to a twenty-ninth embodiment.
Figure 70:
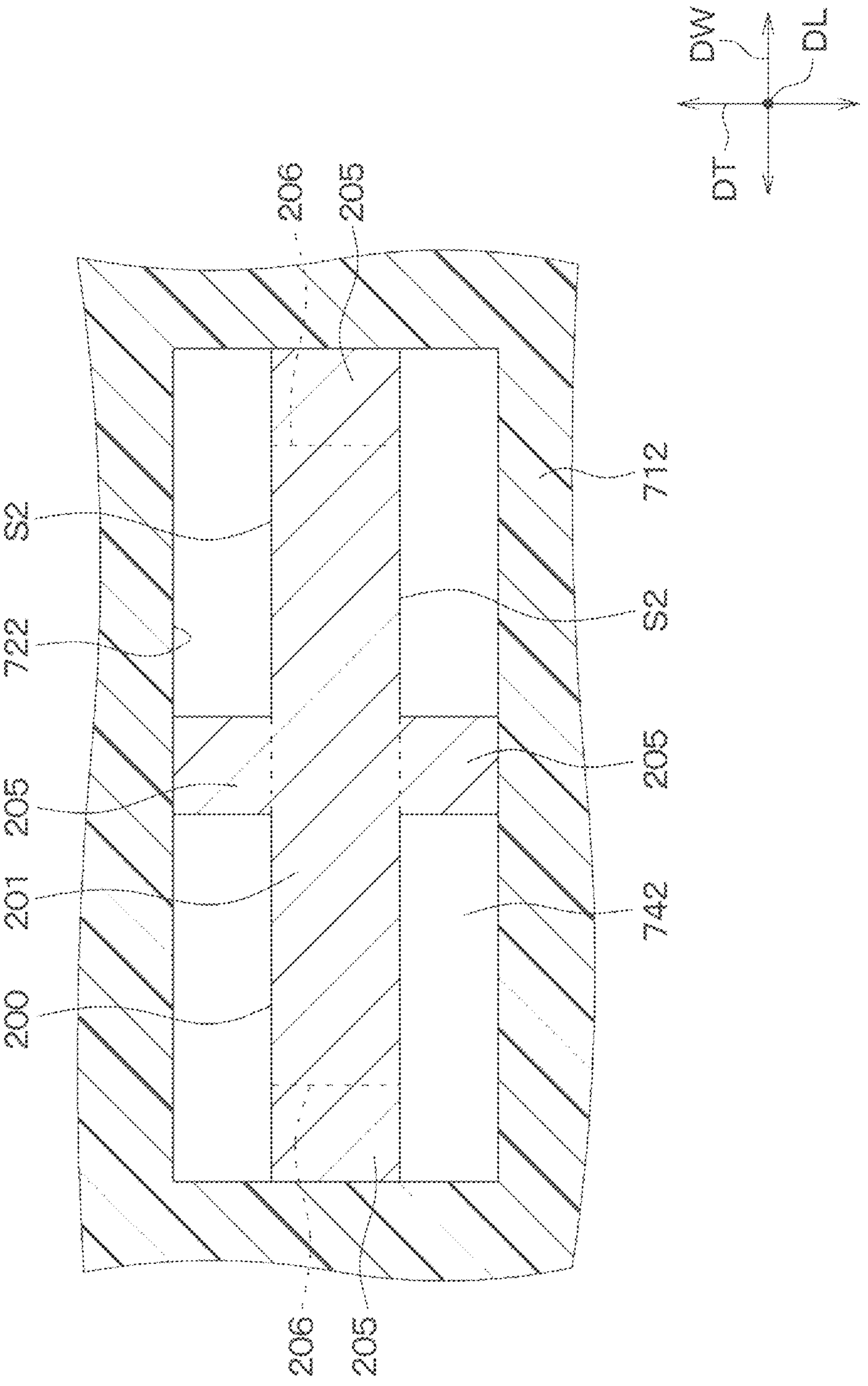
FIG. 70 is a cross-sectional view of the second bus bar and the second opening portion of the case in the current sensor.
Figure 71:
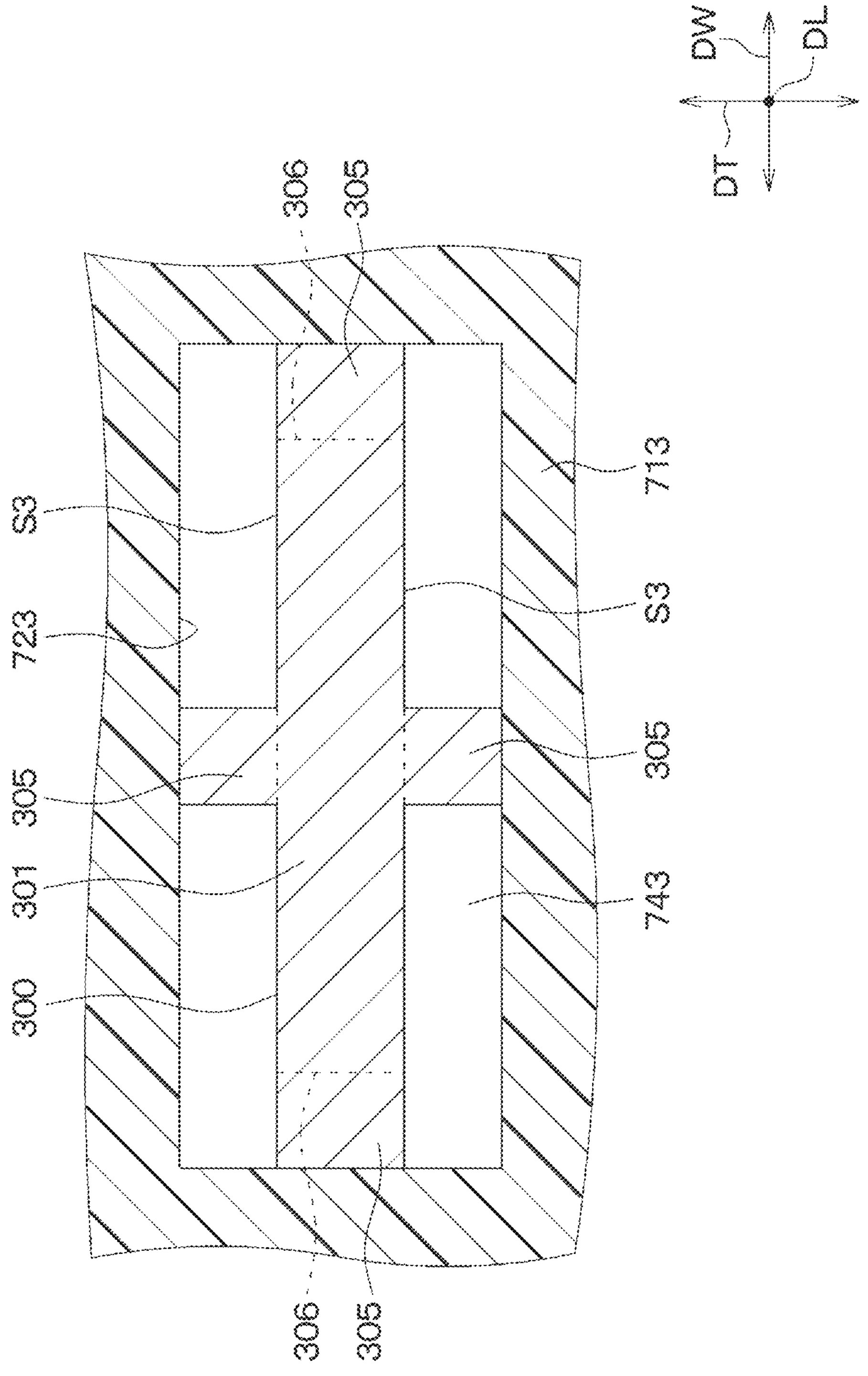
FIG. 71 is a cross-sectional view of the third bus bar and the third opening portion of the case in the current sensor.

In the twenty-ninth embodiment, as illustrated in FIGS. 69 to 71, the first opening portion 711 does not include the first protruding portions 731. The second opening portion 712 does not include the second protruding portions 732. The third opening portion 713 does not include the third protruding portions 733. In addition, the first-bus-bar protruding portion 105, the second-bus-bar protruding portion 205, and the third-bus-bar protruding portion 305 have shapes different from those in the twenty-eighth embodiment. The twenty-ninth embodiment is similar to the twenty-eighth embodiment in other respects.

As illustrated in FIG. 69, the first-bus-bar protruding portions 105 protrude in the width direction DW from the first side surfaces 106 to come into contact with the first facing surfaces 721. In addition, the first-bus-bar protruding portions 105 protrude in the thickness direction from the first plate surface S1 to come into contact with the first facing surfaces 721. Note that the first plate surface S1 mentioned herein corresponds to surfaces of the first plate portion 101 which are perpendicular to the thickness direction DT and cross the thickness direction DT.

As illustrated in FIG. 70, the second-bus-bar protruding portions 205 protrude in the width direction DW from the second side surfaces 206 to come into contact with the second facing surfaces 722. In addition, the second-bus-bar protruding portions 205 protrude in the thickness direction from the second plate surface S2 to come into contact with the second facing surfaces 722. Note that the second plate surface S2 mentioned herein corresponds to surfaces of the second plate portion 201 which are perpendicular to the thickness direction DT and cross the thickness direction DT.

As illustrated in FIG. 71, the third-bus-bar protruding portions 305 protrude in the width direction DW from the third side surfaces 306 to come into contact with the third facing surfaces 723. In addition, the third-bus-bar protruding portions 305 protrude in the thickness direction from the third plate surface S3 to come into contact with the third facing surfaces 723. Note that the third plate surface S3 mentioned herein corresponds to surfaces of the third plate portion 301 which are perpendicular to the thickness direction DT and cross the thickness direction DT.

As described above, the current sensor 5 in the twenty-ninth embodiment is configured. In the twenty-ninth embodiment also, the same effects as those achieved in the twenty-eighth embodiment are achieved. In addition, in the twenty-ninth embodiment, the effects described below are also achieved.

[18] The first-bus-bar protruding portions 105 protrude from surfaces of the first bus bar 100 which face the first opening portion 711 toward the first opening portion 711 to come into contact with the first facing surfaces 721 of the first opening portion 711. Meanwhile, the second-bus-bar protruding portions 205 protrude from surfaces of the second bus bar 200 which face the second opening portion 712 toward the second opening portion 712 to come into contact with the second facing surfaces 722 of the second opening portion 712. Meanwhile, the third-bus-bar protruding portions 305 protrude from surfaces of the third bus bar 300 which face the third opening portion 713 toward the third opening portion 713 to come into contact with the third facing surfaces 723 of the third opening portion 713.

As a result, in the same manner as described above, the first space 741, the second space 742, and the third space 743 are formed, and accordingly heat generated from the first bus bar 100, the second bus bar 200, and the third bus bar 300 is less likely to be transferred to the case 70. Additionally, in the same manner as described above, the case 70 is more easily positioned with respect to each of the first bus bar 100, the second bus bar 200, and the third bus bar 300.

Thirtieth Embodiment

Figure 72:
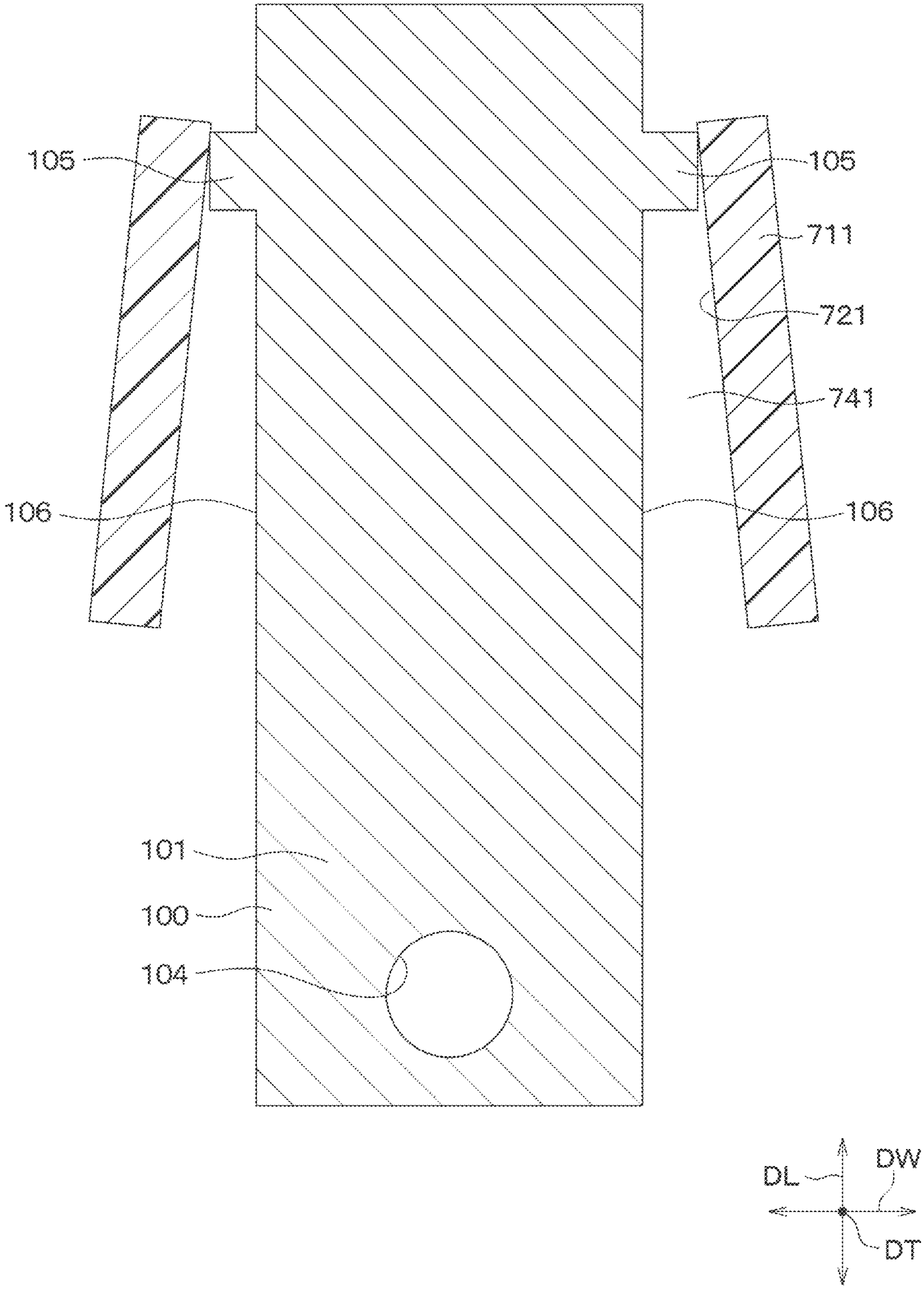
FIG. 72 is a cross-sectional view of the first bus bar and the first opening portion of the case in the current sensor according to a thirtieth embodiment.
Figure 73:
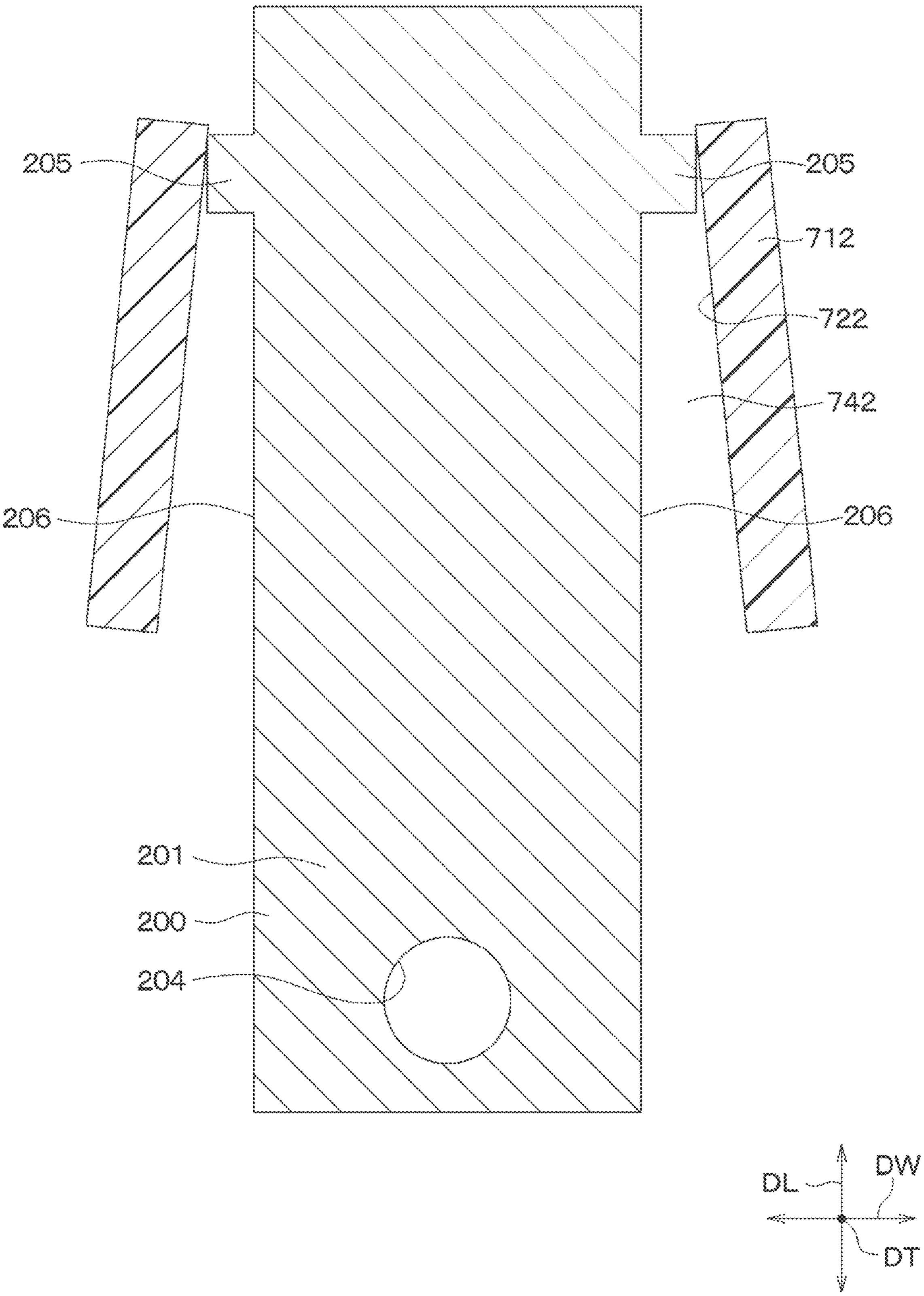
FIG. 73 is a cross-sectional view of the second bus bar and the second opening portion of the case in the current sensor.
Figure 74:
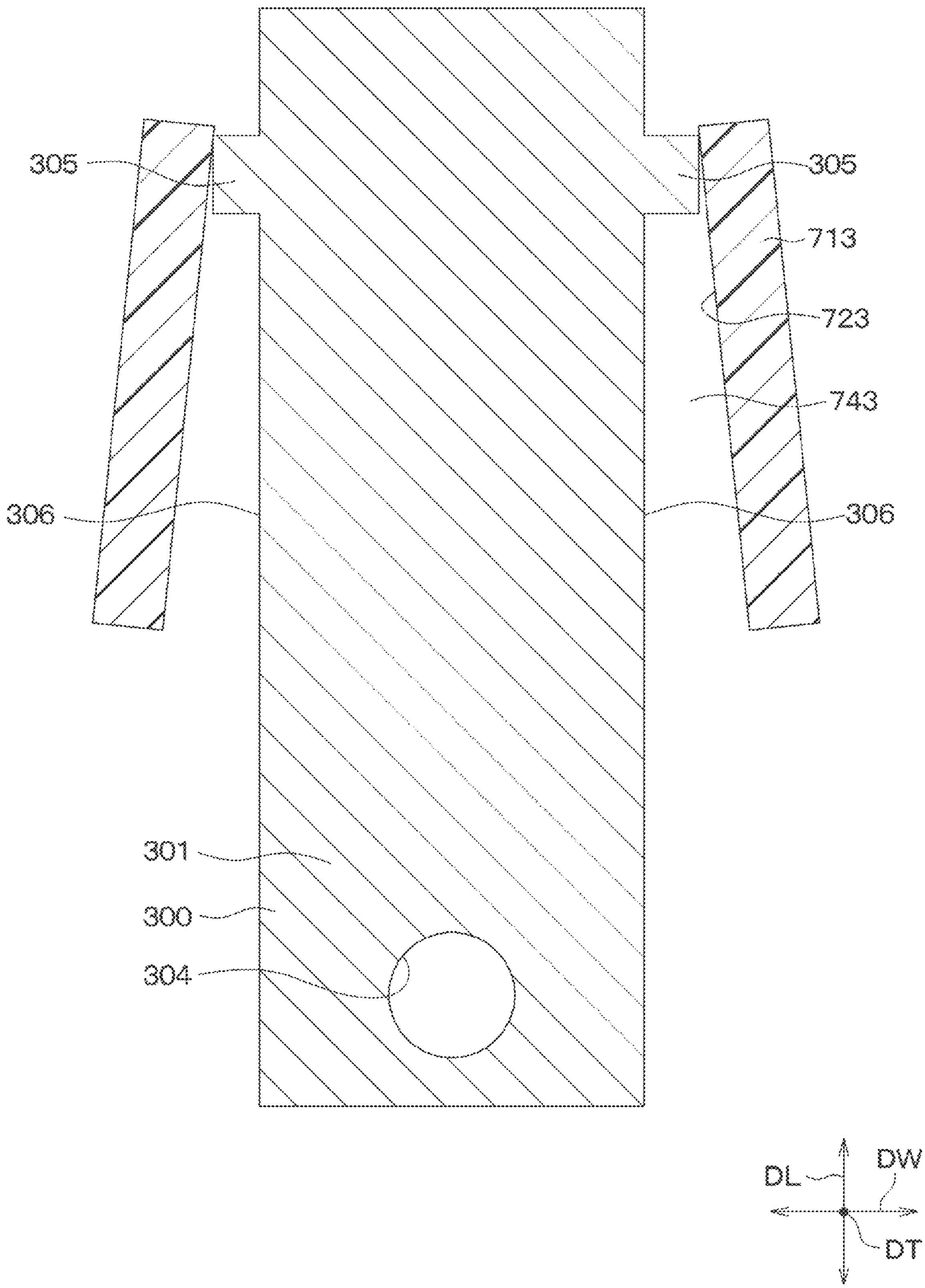
FIG. 74 is a cross-sectional view of the third bus bar and the third opening portion of the case in the current sensor.

In the thirtieth embodiment, as illustrated in FIGS. 72 to 74, the forms of the first facing surfaces 721, the second facing surfaces 722, and the third facing surfaces 723 are different from those in the twenty-ninth embodiment. The thirtieth embodiment is similar to the twenty-ninth embodiment in other respects.

In the thirtieth embodiment, each of the first facing surfaces 721 is inclined with respect to the longitudinal direction DL to be formed in a tapered shape. Each of the second facing surfaces 722 is inclined with respect to the longitudinal direction DL to be formed in a tapered shape. Each of the third facing surfaces 723 is inclined with respect to the longitudinal direction DL to be formed in a tapered shape.

As described above, the current sensor 5 in the thirtieth embodiment is configured. In the thirtieth embodiment also, the same effects as those achieved in the twenty-ninth embodiment are achieved.

Thirty-First Embodiment

Figure 75:
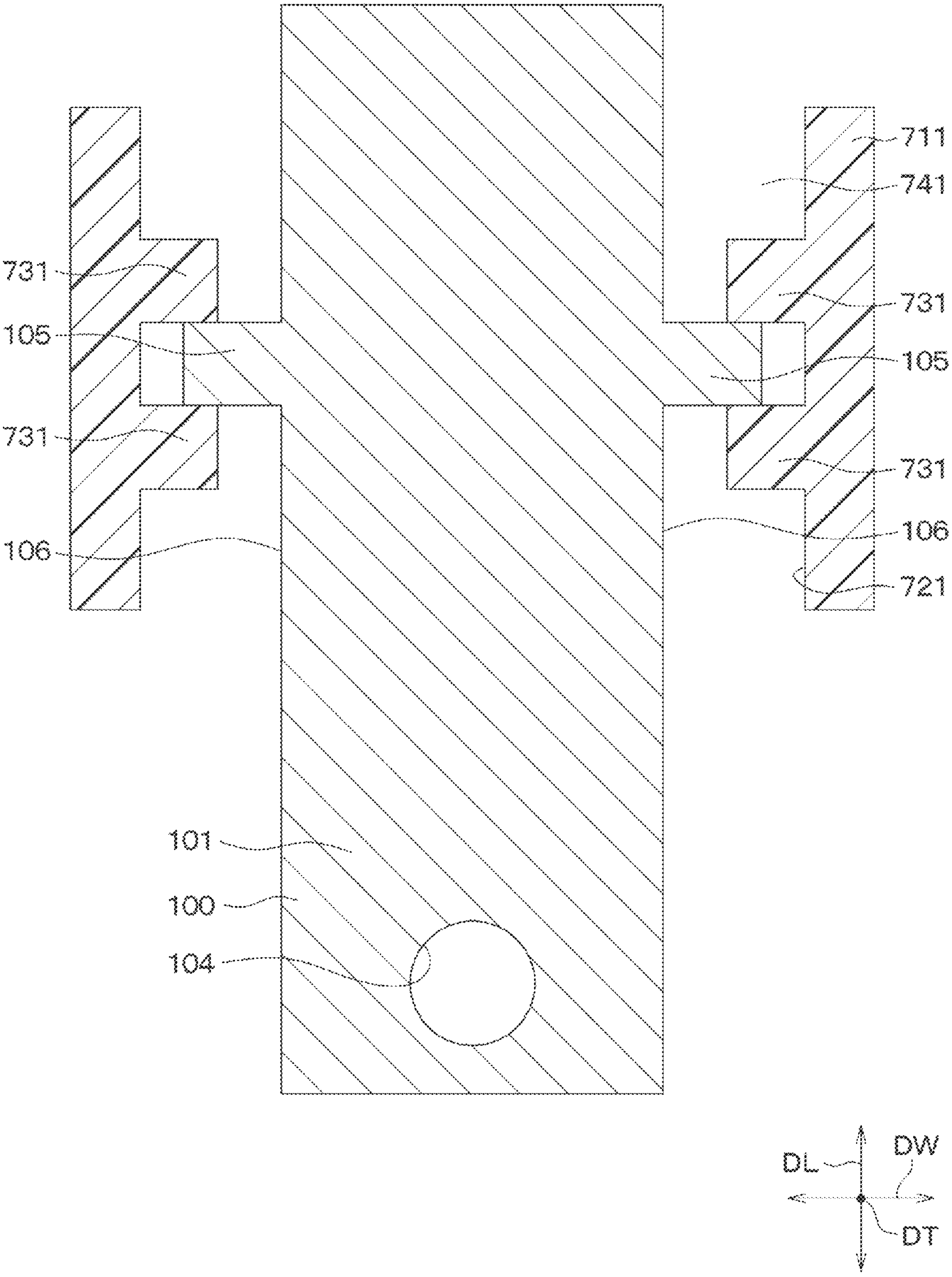
FIG. 75 is a cross-sectional view of the first bus bar and the first opening portion of the case in the current sensor according to a thirty-first embodiment.
Figure 76:
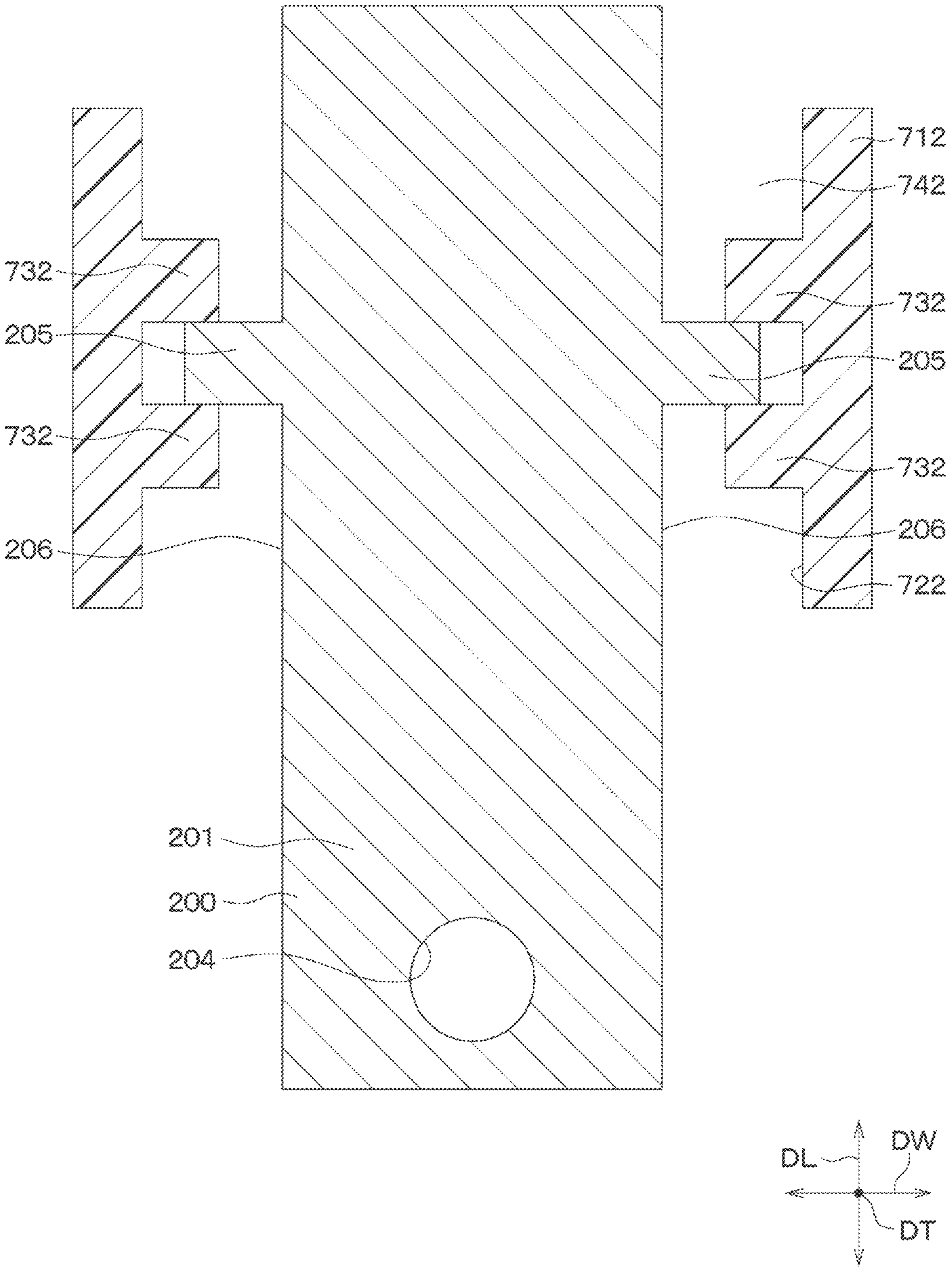
FIG. 76 is a cross-sectional view of the second bus bar and the second opening portion of the case in the current sensor.
Figure 77:
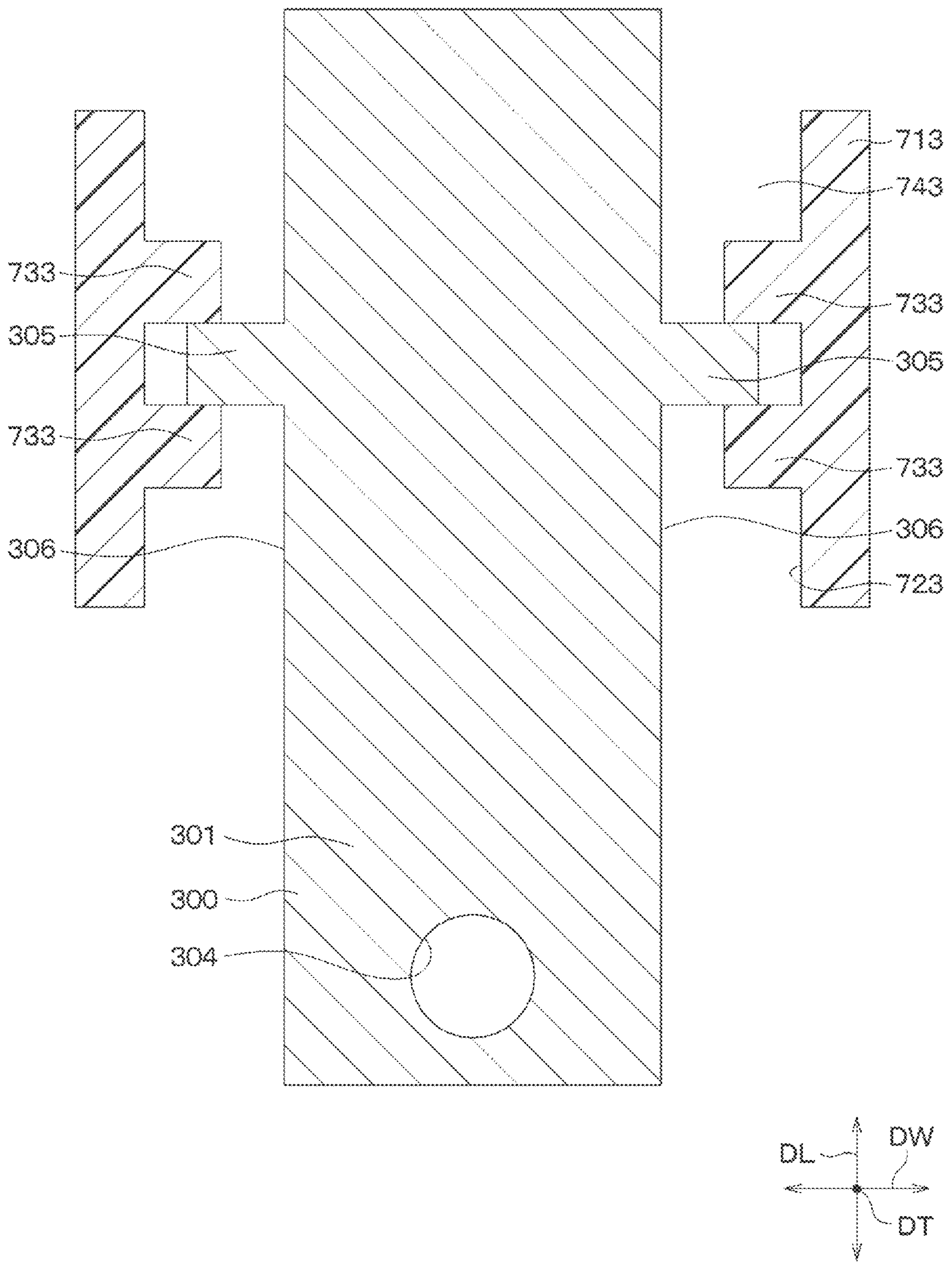
FIG. 77 is a cross-sectional view of the third bus bar and the third opening portion of the case in the current sensor.

In the thirty-first embodiment, as illustrated in FIGS. 75 to 77, the forms of the first protruding portion 731, second protruding portion 732, the third protruding portion 733, the first-bus-bar protruding portion 105, the second-bus-bar protruding portion 205, and the third-bus-bar protruding portion 305 are different from those in the twenty-eighth embodiment. The thirty-first embodiment is similar to the twenty-eighth embodiment in other respects.

The first protruding portions 731 protruding in the width direction DW are arranged in the longitudinal direction DL. Meanwhile, the first-bus-bar protruding portions 105 are interposed between the first protruding portions 731 adjacent to each other. Consequently, the first-bus-bar protruding portions 105 and the first protruding portions 731 protruding in the width direction DW are in contact with each other in the longitudinal direction DL.

The second protruding portions 732 protruding in the width direction DW are arranged in the longitudinal direction DL. Meanwhile, the second-bus-bar protruding portions 205 are interposed between the second protruding portions 732 adjacent to each other. Consequently, the second-bus-bar protruding portions 205 and the second protruding portions 732 protruding in the width direction DW are in contact with each other in the longitudinal direction DL.

The third protruding portions 733 protruding in the width direction DW are arranged in the longitudinal direction DL. Meanwhile, the third-bus-bar protruding portions 305 are interposed between the third protruding portions 733 adjacent to each other. Consequently, the third-bus-bar protruding portions 305 and the third protruding portions 733 protruding in the width direction DW are in contact with each other in the longitudinal direction DL.

As described above, the current sensor 5 in the thirty-first embodiment is configured. In the thirty-first embodiment also, the same effects as those achieved in the twenty-eighth embodiment are achieved.

Other Embodiment

The present disclosure is not limited to the embodiments described above, and the embodiments described above can be modified as appropriate. It goes without saying that, in each of the embodiments described above, a component of the embodiment is not necessarily indispensable unless it is particularly clearly shown that the component is indispensable or the component can be considered to be obviously indispensable in principle.

In the embodiments described above, the current sensor 5 detects the three-phase ac current in the inverter. Meanwhile, the number of phases in the inverter detected by the current sensor 5 is not limited to 3, and needs only to be 1 or more.

In the embodiments described above, the first core 110, the second core 210, and the third core 310 are formed by bending a plate-like soft magnetic material into a letter-C shape. Meanwhile, the first core 110, the second core 210, and the third core 310 are not limited to being formed by bending a plate-like soft magnetic material into a letter-C shape. For example, the first core 110, the second core 210, and the third core 310 may also be formed by performing wire cutting on a plate-shaped soft magnetic material. Alternatively, the first core 110, the second core 210, and the third core 310 may also be formed by winding a sheet-like soft magnetic material. In this case, an adhesive material is used to prevent delamination between wound portions of the soft magnetic material. Still alternatively, the first core 110, the second core 210, and the third core 310 may also be formed by stacking sheet-like soft magnetic materials in layers. In this case, the plurality of soft magnetic materials are press-worked to be formed into a sheet shape, and the sheet-like soft magnetic materials are dowel-crimped to be stacked in layers.

It is assumed that the first core 110, the second core 210, and the third core 310 are stacked in layers using a plate-like permalloy. At this time, the first core 110, the second core 210, and the third core 310 have improved hysteresis properties compared to those when the first core 110, the second core 210, and the third core 310 are stacked in layers by using plate-like oriented electromagnetic steel sheets. It is also assumed that the first core 110, the second core 210, and the third core 310 are formed of the plate-like oriented electromagnetic steel sheets. At this time, material cost is reduced compared to that when the first core 110, the second core 210, and the third core 310 are formed of a permalloy, and accordingly it is possible to reduce cost of the current sensor 5.

In the foregoing embodiments, each of the first opening portion 711, the second opening portion 712, and the third opening portion 713 is formed in a quadrangular tube shape. Meanwhile, each of the first opening portion 711, the second opening portion 712, and the third opening portion 713 is not limited to being formed in a quadrangular tube shape, and may also be formed into a polygonal tube shape, a cylindrical shape, or the like.

In the foregoing embodiments, each of the first protruding portion 731, the second protruding portion 732, and the third protruding portion 733 is formed in a quadrangular tube shape. Meanwhile, each of the first protruding portion 731, the second protruding portion 732, and the third protruding portion 733 is not limited to being formed in a quadrangular tube shape, and may also be formed into a polygonal prism shape, a cylindrical shape, a hemispherical shape, or the like.

In the embodiments described above, each of the first core end surface 115, the second core end surface 116, the third core end surface 215, the fourth core end surface 216, the fifth core end surface 315, and the sixth core end surface 316 is formed in a planar shape. Meanwhile, each of the first core end surface 115, the second core end surface 116, the third core end surface 215, the fourth core end surface 216, the fifth core end surface 315, and the sixth core end surface 316 is not limited to being formed in a planar shape. Each of the first core end surface 115, the second core end surface 116, the third core end surface 215, the fourth core end surface 216, the fifth core end surface 315, and the sixth core end surface 316 may also be formed into a spherical shape or a curved shape.

In the first and third embodiments described above, each of the numbers of the first recessed portions 118, the second recessed portions 218, and the third recessed portions 318 is 1. Meanwhile, each of the numbers of the first recessed portions 118, the second recessed portions 218, and the third recessed portions 318 is not limited to 1. Each of the numbers of the first recessed portions 118, the second recessed portions 218, and the third recessed portions 318 may also be 2 or more.

In the second embodiment described above, each of the numbers of the first through holes 119, the second through holes 219, and the third through holes 319 is 1. Meanwhile, each of the numbers of the first through holes 119, the second through holes 219, and the third through holes 319 is not limited to 1. Each of the numbers of the first through hole 119, the second through hole 219, and the third through hole 319 may also be 2 or more.

In each of the embodiments, the current sensor 5 is used in the inverter, but is not limited thereto, and may also be used in a BMS. Note that BMS is an abbreviation of Battery Management System.

In each of the first embodiments, each of the first bus bar 100, the second bus bar 200, and the third bus bar 300 has a width larger than a thickness, but is not limited thereto, and may also have a thickness larger than a width.

The individual embodiments described above may also be combined with each other as appropriate.

Features of Present Disclosure (Task)

According to the study conducted by the present inventors, it is required to expand a range of a magnitude of a current detected by a current sensor. However, when the magnitude of the current detected by the current sensor increases, in a current sensor, core magnetic saturation occurs, and accordingly it is difficult to expand the range of the magnitude of the current detected by the current sensor.

The present disclosure aims at providing a current sensor that suppresses magnetic saturation.

First Aspect

A current sensor including:

a bus bar (100, 200, 300) formed in a plate shape;

a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion; and a detection unit (120, 220, 320) located in the gap to detect a strength of a magnetic field generated in the gap by a current flowing in the bus bar, wherein a magnetic permeability of the core lateral portion is higher than a magnetic permeability of the core bottom portion.

Second Aspect

A current sensor including:

a bus bar (100, 200, 300) formed in a plate shape;

a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (1121, 2122, 3123) connected to the gap forming portion and extends in a thickness direction (DT) of the bus bar, and a core bottom portion (1131, 2132, 3133) connected to the core lateral portion, extends in the width direction, and forms the core hole together with the gap forming portion and the core lateral portion; and a detection unit (120, 220, 320) located in the gap to detect a strength of a magnetic field generated in the gap by a current flowing in the bus bar, wherein a magnetic permeability of the core lateral portion is lower than a magnetic permeability of the core bottom portion.

Third Aspect

A current sensor including:

a bus bar (100, 200, 300) formed in a plate shape;

a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (1121, 2122, 3123) connected to the gap forming portion and extends in a thickness direction (DT) of the bus bar, and a core bottom portion (1131, 2132, 3133) connected to the core lateral portion, extends in the width direction, and forms the core hole together with the gap forming portion and the core lateral portion; and a detection unit (120, 220, 320) located in the gap to detect a strength of a magnetic field generated in the gap by a current flowing in the bus bar, wherein a length of the core bottom portion in the thickness direction is the same as a length of the core lateral portion in the width direction and wherein a magnetic permeability of the core lateral portion is different from a magnetic permeability of the core bottom portion.

Fourth Aspect

The current sensor according to any one of the first to third aspects, wherein the gap forming portion includes:

a first surface (151, 251, 351) connected to an edge of the first end surface and extends in a direction away from the gap from the edge of the first end surface; and a second surface (152, 252, 352) connected to an edge of the second end surface and extends in a direction away from the gap from the edge of the second end surface.

Fifth Aspect

The current sensor according to any one of the first to fourth aspects, wherein a lateral inner corner portion (C1_in_top, C2_in_top, C3_in_top), which is an inner corner portion in a boundary portion between the gap forming portion and the core lateral portion, has an R-shape.

Sixth Aspect

The current sensor according to any one of the first to fourth aspects, wherein a lateral inner corner portion (C1_in_top, C2_in_top, C3_in_top), which is an inner corner portion in a boundary portion between the gap forming portion and the core lateral portion, has an inclined surface which is inclined with respect to each of the width direction and the thickness direction.

Seventh Aspect

The current sensor according to any one of the first to sixth aspects, wherein a bottom inner corner portion (C1_in_btm, C2_in_btm, C3_in_btm), which is an inner corner portion in a boundary portion between the core lateral portion and the core bottom portion, has an R-shape.

Eighth Aspect

The current sensor according to any one of the first to sixth aspects, wherein a bottom inner corner portion (C1_in_btm, C2_in_btm, C3_in_btm), which is an inner corner portion in a boundary portion between the core lateral portion and the core bottom portion, has an inclined surface which is inclined with respect to each of the width direction and the thickness direction.

Ninth Aspect

The current sensor according to any one of the first to eighth aspects, wherein the core includes a core recessed portion (1155, 2155, 3155), and wherein the core recessed portion is recessed from an outer edge of the core which is located externally in each of the width direction and the thickness direction toward an inner portion of the core in a cross section of the core when the core is cut in a direction perpendicular to a longitudinal direction (DL) of the bus bar.

Tenth Aspect

The current sensor according to the ninth aspect, wherein, in the cross section of the core when the core is cut in the direction perpendicular to the longitudinal direction, a line segment passing through a center of the gap forming portion in the thickness direction and extending in the width direction is a gap center line segment (Og1, Og2, Og3), wherein, in the cross section of the core when the core is cut in the direction perpendicular to the longitudinal direction, line segments each passing through a center of the core lateral portion in the width direction and extending in the thickness direction are lateral center line segments (Os1, Os2, Os3), wherein, in the cross section of the core when the core is cut in the direction perpendicular to the longitudinal direction, a line segment passing through a center of the core bottom portion in the thickness direction and extending in the width direction is a bottom center line segment (Ob1, Ob2, Ob3), wherein the gap center line segment is a line segment connecting the lateral center line segments arranged in the width direction, wherein each of the lateral center line segments is a line segment connecting the gap center line segment and the bottom center line segment, wherein the bottom center line segment is a line segment connecting the lateral center line segments arranged in the width direction, and wherein the core recessed portion is located in a region (Rc1, Rc2, Rc3) outside each of the gap center line segment, the lateral center line segments, and the bottom center line segment.

Eleventh Aspect

The current sensor according to any one of the first to eighth aspects, wherein the core includes a core through hole (1156, 2156, 3156) in the inside, and wherein the core through hole extends through the bus bar in the longitudinal direction (DL).

Twelfth Aspect

The current sensor according to the eleventh aspect, wherein, in the cross section of the core when the core is cut in the direction perpendicular to the longitudinal direction, a line segment passing through a center of the gap forming portion in the thickness direction and extending in the width direction is a gap center line segment (Og1, Og2, Og3), wherein, in the cross section of the core when the core is cut in the direction perpendicular to the longitudinal direction, line segments each passing through a center of the core lateral portion in the width direction and extending in the thickness direction are lateral center line segments (Os1, Os2, Os3), wherein, in the cross section of the core when the core is cut in the direction perpendicular to the longitudinal direction, a line segment passing through a center of the core bottom portion in the thickness direction and extending in the width direction is a bottom center line segment (Ob1, Ob2, Ob3), wherein the gap center line segment is a line segment connecting the lateral center line segments arranged in the width direction, wherein each of the lateral center line segments is a line segment connecting the gap center line segment and the bottom center line segment, wherein the bottom center line segment is a line segment connecting the lateral center line segments arranged in the width direction, and wherein the core through hole is located in a region (Rc1, Rc2, Rc3) outside each of the gap center line segment, the lateral center line segments, and the bottom center line segment.

(Task)

In a current sensor, a magnetic field leaking from a core gap enters a bus bar, and a frequency of an ac current changes to cause a time variation in the magnetic field, and consequently an induced electromotive force in a direction reverse to a direction of a current flowing in the bus bar is generated. A magnetic field caused by a current resulting from this dielectric electromotive force and flowing in the bus bar changes the magnetic field applied to the core gap. As a result, an error occurs in the current detected by the current sensor. As a result, the frequency characteristic of the current sensor deteriorates.

The present disclosure aims at providing the current sensor that improves the frequency characteristic.

First Aspect

A current sensor including:

a bus bar (100, 200, 300) formed in a plate shape;

a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion; and a detection unit (120, 220, 320) located in the gap to detect a strength of a magnetic field generated in the gap by a current flowing in the bus bar, wherein the bus bar includes:

a first projection portion (Ps1, Ps3, Ps5) that is a portion of the bus bar which overlaps the projected first end surface when the first end surface is projected on the bus bar in the thickness direction (DT) of the bus bar;

a second projection portion (Ps2, Ps4, Ps6) that is a portion of the bus bar which overlaps the projected second end surface when the second end surface is projected on the bus bar in the thickness direction;

a region (R1, R2, R3) between the first projection portion and the second projection portion; and a recessed portion (118, 218, 318) recessed in the thickness direction from the region.

Second Aspect

A current sensor including:

a bus bar (100, 200, 300) formed in a plate shape;

a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion; and a detection unit (120, 220, 320) located in the gap to detect a strength of a magnetic field generated in the gap by a current flowing in the bus bar, wherein the bus bar includes:

a first projection portion (Ps1, Ps3, Ps5) that is a portion of the bus bar which overlaps the projected first end surface when the first end surface is projected on the bus bar in the thickness direction (DT) of the bus bar;

a second projection portion (Ps2, Ps4, Ps6) that is a portion of the bus bar which overlaps the projected second end surface when the second end surface is projected on the bus bar in the thickness direction;

a region (R1, R2, R3) between the first projection portion and the second projection portion; and a through hole (119, 219, 319) extending therethrough in the thickness direction from the region.

(Task)

In the current sensor, the magnetic field leaking from the core gap enters the bus bar, and a frequency of an ac current changes to cause a time variation in the magnetic field, and consequently an induced electromotive force in a direction reverse to a direction of a current flowing in the bus bar is generated. A magnetic field caused by a current resulting from this dielectric electromotive force and flowing in the bus bar changes the magnetic field applied to the core gap. As a result, an error occurs in the current detected by the current sensor. As a result, the frequency characteristic of the current sensor deteriorates.

The present disclosure aims at providing the current sensor that improves the frequency characteristic.

First Aspect

A current sensor including:

a bus bar (100, 200, 300) formed in a plate shape;

a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion; and a detection unit (120, 220, 320) located in the gap to detect a strength of a magnetic field generated in the gap by a current flowing in the bus bar, wherein a value (Clr1/Gap1, Clr2/Gap2, Clr3/Gap3) obtained by dividing a distance (Clr1_top, Clr2_top, Clr3_top) from the bus bar to the gap forming portion in the thickness direction by a distance (Gap1, Gap2, Gap3) from the first end surface to the second end surface in the width direction is set to 0.20 or more and 1.00 or less.

(Task)

Due to the current flowing in the bus bar, the bus bar generates heat. Accordingly, in such a current sensor, heat generated by a bus bar is transferred to a sensor chip serving as a detection unit via a case containing the bus bar. This may cause a characteristic change or a failure in the sensor chip.

An object of the present disclosure is to provide a current sensor that inhibits heat from being transferred to a detection unit.

First Aspect

A current sensor comprising:
a bus bar (100, 200, 300) formed in a plate shape;
a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion;
a detection unit (120, 220, 320) located in the gap to detect a strength of a magnetic field generated in the gap by a current flowing in the bus bar; and
a case (70) containing the core, wherein
the case has an opening portion (711, 712, 713) which is inserted in the core hole and in which the bus bar is inserted,
the opening portion includes a facing surface (721, 722, 723) facing the bus bar, and a protruding portion (731, 732, 733) protruding from the facing surface toward the bus bar to come in contact with the bus bar, and
a space (741, 742, 743) is formed between the facing surface and the bus bar.

Second Aspect

A current sensor comprising:
a bus bar (100, 200, 300) formed in a plate shape;
a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion;
a detection unit (120, 220, 320) located in the gap to detect a strength of a magnetic field generated in the gap by a current flowing in the bus bar; and
a case (70) containing the core, wherein
the case has an opening portion (711, 712, 713) which is inserted in the core hole and in which the bus bar is inserted, the bus bar has a protruding portion (105, 205, 305) protruding from a surface, which faces the opening portion, toward the opening portion to come in contact with the opening portion, and
a space (741, 742, 743) is formed between the opening portion and the bus bar.

(Task)

In a current sensor, when the current sensor is produced, a stress is applied to a core. This may change a crystalline structure of the core. As a result, a magnetic property such as a BH property of the core deteriorates.

The present disclosure aims at providing a current sensor that inhibits the deterioration of the magnetic property.

First Aspect

A current sensor including:
a bus bar (100, 200, 300) formed in a plate shape;
a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion; and
a detection unit (120, 220, 320) located in the gap to detect a strength of a magnetic field generated in the gap by a current flowing in the bus bar, wherein
the core includes a core recessed portion (1155, 2155, 3155), and
the core recessed portion is recessed from an outer edge of the core which is located externally in each of the width direction and the thickness direction toward an inner portion of the core in a cross section of the core when the core is cut in a direction perpendicular to a longitudinal direction (DL) of the bus bar.

Second Aspect

A current sensor including:
a bus bar (100, 200, 300) formed in a plate shape;
a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion; and
a detection unit (120, 220, 320) located in the gap to detect a strength of a magnetic field generated in the gap by a current flowing in the bus bar, wherein
the core includes a core through hole (1156, 2156, 3156) in the inside, and
the core through hole extends through the bus bar in a longitudinal direction (DL).

(Task)

According to the study conducted by the present inventors, it is required to expand a range of a magnitude of a current detected by a current sensor. However, when the magnitude of the current detected by the current sensor increases, in a current sensor, core magnetic saturation occurs, and accordingly it is difficult to expand the range of the magnitude of the current detected by the current sensor.

The present disclosure aims at providing a current sensor that suppresses magnetic saturation.

First Aspect

A current sensor including:

a bus bar (100, 200, 300) formed in a plate shape;

a core (110, 120, 130) having a core hole (114, 214, 314) in which the bus bar is inserted, a gap forming portion (111, 211, 311) including a first end surface (115, 215, 315) facing a width direction (DW) of the bus bar, a second end surface (116, 216, 316) facing the first end surface in the width direction, and a gap (117, 217, 317) defined by the first end surface and the second end surface to communicate with the core hole and an outside, a core lateral portion (112, 212, 312, 1121, 2122, 3123) connected to the gap forming portion and extends in a thickness direction (DT) of the bus bar, and a core bottom portion (113, 213, 313, 1131, 2132, 3133) connected to the core lateral portion, extends in the width direction, and forms the core hole together with the gap forming portion and the core lateral portion; and a detection unit (120, 220, 320) located in the gap to detect a strength of a magnetic field generated in the gap by a current flowing in the bus bar, wherein the core has a protruding portion (1151, 1152, 2151, 2152, 3151, 3152) protruding from the gap forming portion in the thickness direction.

What is claimed is:

1. A current sensor including:

a bus bar formed in a plate shape;

a core having a core hole in which the bus bar is inserted, a gap forming portion including a first end surface facing a width direction of the bus bar, a second end surface facing the first end surface in the width direction, and a gap defined by the first end surface and the second end surface to communicate with the core hole and an outside, a core lateral portion connected to the gap forming portion and extends in a thickness direction of the bus bar, and a core bottom portion connected to the core lateral portion, extends in the width direction, and forms the core hole together with the gap forming portion and the core lateral portion; and a detection unit located in the gap to detect a strength of a magnetic field generated in the gap by a current flowing in the bus bar, wherein the core is formed of an oriented magnetic steel sheet, such that a magnetic permeability of the core lateral portion is lower than a magnetic permeability of the core bottom portion, the core is in a form stacked in layers, and the gap forming portion, the core lateral portion, and the core bottom portion are integrally formed, the core includes a protruding portion protruding in the thickness direction from an outer surface of the gap forming portion facing outwardly in the thickness direction, the protruding portion has a protruding surface facing inwardly in the width direction and connected to the first end surface, a center line passes through a center of a surface, which is obtained by combining the protruding surface with the first end surface, in the thickness direction and extends in the width direction, and the detection unit is located on a core hole side of the center line.

2. The current sensor according to claim 1, wherein a length of the core bottom portion in the thickness direction is greater than a length of the core lateral portion in the width direction.

3. The current sensor according to claim 1, wherein a lateral outer corner portion, which is an outer corner portion of the gap forming portion in the width direction, has an R-shape, and a bottom outer corner portion, which is an outer corner portion of the core bottom portion in the width direction, is formed in an R-shape.

4. The current sensor according to claim 1, wherein a lateral inner corner portion, which is an inner corner portion in a boundary portion between the gap forming portion and the core lateral portion, has an R-shape, and a bottom inner corner portion, which is an inner corner portion in a boundary portion between the core lateral portion and the core bottom portion, has an R-shape.

5. The current sensor according to claim 1, wherein the bus bar is a first bus bar, the core hole is a first core hole, the gap is a first gap, the gap forming portion is a first gap forming portion, the core lateral portion is a first core lateral portion, the core bottom portion is a first core bottom portion, the core is a first core, the detection unit is a first detection unit, and the protruding portion is a first protruding portion, wherein the current sensor further comprising:

a second bus bar formed in a plate shape;

a second core having a second core hole in which the second bus bar is inserted, a second gap forming portion including a third end surface facing the width direction, a fourth end surface facing the third end surface in the width direction, and a second gap defined by the third end surface and the fourth end surface to communicate with the second core hole and an outside, a second core lateral portion connected to the second gap forming portion and extends in the thickness direction, and a second core bottom portion connected to the second core lateral portion, extends in the width direction, and forms the second core hole together with the second gap forming portion and the second core lateral portion; and a second detection unit located in the second gap to detect a strength of a magnetic field generated in the second gap by a current flowing in the second bus bar, wherein the second core includes a second protruding portion, which protrudes in the thickness direction from an outer surface of the second gap forming portion facing outwardly in the thickness direction, and the first core and the second core are arranged in the width direction.

6. The current sensor according to claim 1, wherein a length of the core bottom portion in the thickness direction is less than a length of the core lateral portion in the width direction.

7. The current sensor according to claim 1, wherein a distance from the bus bar to the gap forming portion in the thickness direction is a clearance distance, a distance from the first end surface to the second end surface in the width direction is a gap distance, and a value obtained by dividing the clearance distance by the gap distance is set to 0.20 or more and 1.00 or less.

8. The current sensor according to claim 1, wherein a saturation magnetic flux density of the core bottom portion is higher than a saturation magnetic flux density of the core lateral portion.

9. The current sensor according to claim 1, wherein the detection unit is entirely located in the gap in the thickness direction and entirely located on the core hole side of the center line in the thickness direction.

* * * * *